US009119288B2

(12) United States Patent
Snider et al.

(10) Patent No.: US 9,119,288 B2
(45) Date of Patent: Aug. 25, 2015

(54) LIGHTWEIGHT AUDIO SYSTEM FOR AUTOMOTIVE APPLICATIONS AND METHOD

(71) Applicant: DELPHI TECHNOLOGIES, INC., Troy, MI (US)

(72) Inventors: Chris R. Snider, Noblesville, IN (US); Vineet Gupta, Noblesville, IN (US); Michael G. Coady, Kokomo, IN (US); Curtis Allen Stapert, Noblesville, IN (US); Donald G. Moeschberger, Kokomo, IN (US); Allen E. Oberlin, Windfall, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 14/620,782

(22) Filed: Feb. 12, 2015

(65) Prior Publication Data
US 2015/0156928 A1 Jun. 4, 2015

Related U.S. Application Data

(62) Division of application No. 14/048,082, filed on Oct. 8, 2013, now Pat. No. 8,988,884.

(51) Int. Cl.
*H05K 5/00* (2006.01)
*H05K 9/00* (2006.01)
*H05K 5/02* (2006.01)

(52) U.S. Cl.
CPC ............ *H05K 9/0007* (2013.01); *H05K 5/0221* (2013.01); *H05K 9/0079* (2013.01); *H05K 9/0081* (2013.01)

(58) Field of Classification Search
USPC ............... 361/756, 727, 752, 679.31, 679.32; 455/277.1, 347, 557, 558, 575.1; 235/472.02, 492; 439/76.1, 160, 218, 439/377, 923; 343/702, 859, 906; 710/301
See application file for complete search history.

(56) References Cited

U.S. PATENT DOCUMENTS

| 3,162,726 A | 12/1964 | Rosenberg et al. |
| 3,399,939 A | 9/1968 | Anderson |
| 3,771,096 A | 11/1973 | Walter |
| 3,940,578 A | 2/1976 | Pointon |
| 4,245,003 A | 1/1981 | Oransky et al. |
| 4,323,755 A | 4/1982 | Nierenberg |

(Continued)

FOREIGN PATENT DOCUMENTS

| EP | 0936045 | 8/1990 |
| EP | 1720048 | 11/2006 |

OTHER PUBLICATIONS

Audio Product Manual 04-RDPD-12-MA-F; "2004 Model Year Ford Freestar Radios", pp. 1-38.

*Primary Examiner* — Xiaoliang Chen
(74) *Attorney, Agent, or Firm* — Lawrence D. Hazelton

(57) ABSTRACT

A lightweight radio/CD player for vehicular application includes a case and frontal interface formed of polymer based material molded to provide details to accept audio devices and radio receivers, as well as the circuit boards required for electrical control and display. The case and frontal interface are of composite structure, including an insert molded electrically conductive wire mesh screen that has been pre-formed to contour with the molding operation. The wire mesh provides shielding and grounding of the circuit boards via exposed wire mesh pads and adjacent ground clips.

11 Claims, 98 Drawing Sheets

(56) References Cited

U.S. PATENT DOCUMENTS

| | | | |
|---|---|---|---|
| 4,514,456 A | 4/1985 | Deal et al. | |
| 4,515,867 A | 5/1985 | Bleacher et al. | |
| 4,588,674 A | 5/1986 | Stewart et al. | |
| 4,639,745 A | 1/1987 | Matsui et al. | |
| 4,683,359 A | 7/1987 | Wojtanek | |
| 4,685,563 A | 8/1987 | Cohen et al. | |
| 4,739,453 A | 4/1988 | Kurodawa | |
| 4,881,295 A * | 11/1989 | Odemer | 16/422 |
| 4,881,910 A * | 11/1989 | Odemer | 439/476.1 |
| 4,939,012 A | 7/1990 | Dust et al. | |
| 5,023,726 A | 6/1991 | Campisi | |
| 5,028,490 A | 7/1991 | Koskenmaki | |
| 5,061,341 A | 10/1991 | Kildal et al. | |
| 5,104,071 A | 4/1992 | Kowalski | |
| 5,175,926 A | 1/1993 | Chapman | |
| 5,361,305 A | 11/1994 | Easley et al. | |
| 5,362,932 A | 11/1994 | Inagake et al. | |
| 5,467,947 A | 11/1995 | Quilling, II | |
| 5,473,111 A | 12/1995 | Hattori et al. | |
| 5,501,608 A * | 3/1996 | Scheer et al. | 439/218 |
| 5,506,563 A | 4/1996 | Jonic | |
| 5,513,071 A | 4/1996 | Laviolette et al. | |
| 5,515,240 A | 5/1996 | Rodeffer et al. | |
| 5,521,342 A | 5/1996 | Bartley et al. | |
| 5,537,300 A | 7/1996 | Kraines et al. | |
| 5,547,272 A | 8/1996 | Paterson et al. | |
| 5,557,064 A | 9/1996 | Isern-Flecha et al. | |
| 5,560,572 A | 10/1996 | Osborn et al. | |
| 5,566,055 A | 10/1996 | Salvi, Jr. | |
| 5,594,200 A | 1/1997 | Ramsey | |
| 5,608,606 A * | 3/1997 | Blaney | 361/679.32 |
| 5,613,011 A | 3/1997 | Chase et al. | |
| 5,628,055 A * | 5/1997 | Stein | 455/575.1 |
| 5,653,518 A | 8/1997 | Hardt | |
| 5,680,633 A * | 10/1997 | Koenck et al. | 235/472.02 |
| 5,708,833 A * | 1/1998 | Kinney et al. | 710/301 |
| 5,727,675 A | 3/1998 | Leveque et al. | |
| 5,727,866 A | 3/1998 | Kraines et al. | |
| 5,739,791 A | 4/1998 | Barefield et al. | |
| 5,757,617 A | 5/1998 | Sherry | |
| 5,760,678 A | 6/1998 | Pavlacka et al. | |
| 5,779,496 A | 7/1998 | Bolinger et al. | |
| 5,784,251 A | 7/1998 | Miller et al. | |
| 5,784,254 A | 7/1998 | Stephan et al. | |
| 5,839,910 A | 11/1998 | Meller et al. | |
| 5,867,131 A | 2/1999 | Camp et al. | |
| 5,889,337 A | 3/1999 | Ito et al. | |
| 5,913,174 A * | 6/1999 | Casarez et al. | 455/557 |
| 5,913,581 A | 6/1999 | Stephan et al. | |
| 5,940,518 A | 8/1999 | Augustyn et al. | |
| 5,966,289 A | 10/1999 | Hustings et al. | |
| 5,974,333 A | 10/1999 | Chen | |
| 5,983,087 A | 11/1999 | Milne et al. | |
| 5,991,151 A | 11/1999 | Capriz | |
| 6,043,981 A | 3/2000 | Markov et al. | |
| 6,054,647 A | 4/2000 | Rider | |
| 6,067,708 A | 5/2000 | Wong et al. | |
| 6,072,135 A | 6/2000 | O'Connor | |
| 6,097,830 A | 8/2000 | Zelinka et al. | |
| 6,102,608 A | 8/2000 | Hogan et al. | |
| 6,104,611 A | 8/2000 | Glover et al. | |
| 6,121,779 A | 9/2000 | Schutten et al. | |
| 6,174,205 B1 * | 1/2001 | Madsen et al. | 439/638 |
| 6,180,436 B1 | 1/2001 | Koors et al. | |
| 6,187,514 B1 | 2/2001 | Kiyosawa et al. | |
| 6,205,033 B1 | 3/2001 | Kelemen | |
| 6,217,182 B1 | 4/2001 | Shepherd et al. | |
| 6,217,351 B1 * | 4/2001 | Fung et al. | 439/131 |
| 6,220,539 B1 | 4/2001 | Anderson et al. | |
| 6,258,438 B1 | 7/2001 | Loveland et al. | |
| 6,262,364 B1 | 7/2001 | Yoshikawa et al. | |
| 6,262,893 B1 | 7/2001 | Liu | |
| 6,286,972 B1 | 9/2001 | Shepherd et al. | |
| 6,288,333 B1 | 9/2001 | Liu et al. | |
| 6,307,742 B1 | 10/2001 | Diaz et al. | |
| 6,343,945 B1 | 2/2002 | Likanen | |
| 6,362,538 B1 | 3/2002 | Reed et al. | |
| 6,381,452 B1 * | 4/2002 | Tien et al. | 455/344 |
| 6,384,355 B1 | 5/2002 | Murphy et al. | |
| 6,407,910 B1 | 6/2002 | Diaz et al. | |
| 6,413,598 B1 | 7/2002 | Motoki et al. | |
| 6,428,340 B2 | 8/2002 | Okabe et al. | |
| 6,431,259 B2 | 8/2002 | Hellbruck et al. | |
| 6,449,238 B2 | 9/2002 | Furukawa et al. | |
| 6,462,940 B1 | 10/2002 | Diaz et al. | |
| 6,499,191 B1 | 12/2002 | Howie, Jr. | |
| 6,522,547 B1 | 2/2003 | Diaz et al. | |
| 6,545,871 B1 | 4/2003 | Ramspacher et al. | |
| 6,578,935 B1 | 6/2003 | Garretson et al. | |
| 6,608,965 B1 | 8/2003 | Tobimatsu et al. | |
| 6,618,013 B1 * | 9/2003 | Aldous | 343/702 |
| 6,621,027 B1 | 9/2003 | Shimizu et al. | |
| 6,639,800 B1 | 10/2003 | Eyman et al. | |
| 6,651,936 B2 | 11/2003 | Upson et al. | |
| 6,663,250 B1 | 12/2003 | Rada et al. | |
| 6,684,084 B1 | 1/2004 | Phillips | |
| 6,693,586 B1 | 2/2004 | Walters et al. | |
| 6,705,005 B1 | 3/2004 | Blazier et al. | |
| 6,709,299 B2 | 3/2004 | Listing et al. | |
| 6,715,850 B1 | 4/2004 | Diaz et al. | |
| 6,785,531 B2 | 8/2004 | Lepley et al. | |
| 6,905,901 B1 | 6/2005 | Fye et al. | |
| 6,930,643 B2 | 8/2005 | Byrne et al. | |
| 6,940,730 B1 | 9/2005 | Berg, Jr. et al. | |
| 6,950,525 B2 | 9/2005 | Harrell et al. | |
| 6,951,365 B2 | 10/2005 | Chase et al. | |
| 6,955,335 B2 | 10/2005 | Kawai et al. | |
| 6,957,134 B2 | 10/2005 | Ramseyer et al. | |
| 6,970,130 B1 | 11/2005 | Walters et al. | |
| 6,984,784 B2 | 1/2006 | Nagasaka et al. | |
| 7,021,811 B2 | 4/2006 | Sylvester et al. | |
| 7,180,745 B2 | 2/2007 | Mandel et al. | |
| 7,208,686 B1 | 4/2007 | Chen et al. | |
| 7,251,131 B2 | 7/2007 | Shah et al. | |
| 7,254,820 B2 | 8/2007 | Bickford et al. | |
| 7,286,943 B2 | 10/2007 | Saito | |
| 7,350,954 B2 | 4/2008 | Snider et al. | |
| 7,393,026 B2 | 7/2008 | Ikeda et al. | |
| 7,404,798 B2 | 7/2008 | Kato et al. | |
| 7,407,085 B2 | 8/2008 | Susheel et al. | |
| 7,450,387 B2 | 11/2008 | Cheng et al. | |
| 7,676,245 B2 * | 3/2010 | Laiho et al. | 455/556.1 |
| 2001/0006902 A1 * | 7/2001 | Ito | 455/558 |
| 2001/0009507 A1 | 7/2001 | Washino et al. | |
| 2001/0019477 A1 | 9/2001 | Murasawa | |
| 2002/0008965 A1 | 1/2002 | Amari et al. | |
| 2002/0021252 A1 * | 2/2002 | Schremmer et al. | 343/702 |
| 2002/0080593 A1 | 6/2002 | Tsuge et al. | |
| 2002/0171774 A1 | 11/2002 | Lee | |
| 2002/0180108 A1 | 12/2002 | Koshiba | |
| 2002/0187751 A1 | 12/2002 | Gierl et al. | |
| 2002/0193138 A1 * | 12/2002 | Chiba et al. | 455/550 |
| 2003/0012999 A1 | 1/2003 | Yoshioka et al. | |
| 2003/0099088 A1 | 5/2003 | Yang et al. | |
| 2003/0109161 A1 | 6/2003 | Fukamachi et al. | |
| 2003/0122457 A1 | 7/2003 | Diaz et al. | |
| 2003/0128167 A1 | 7/2003 | Beard et al. | |
| 2003/0128535 A1 | 7/2003 | Otani et al. | |
| 2003/0210495 A1 * | 11/2003 | Kano et al. | 360/132 |
| 2003/0221498 A1 | 12/2003 | Mere et al. | |
| 2004/0042623 A1 * | 3/2004 | Zapalski et al. | 381/86 |
| 2004/0048503 A1 | 3/2004 | Mills et al. | 439/76.1 |
| 2004/0095728 A1 | 5/2004 | Bird et al. | |
| 2004/0105664 A1 | 6/2004 | Ivankovic | |
| 2004/0121645 A1 | 6/2004 | Postrel et al. | |
| 2004/0145457 A1 | 7/2004 | Schofield et al. | |
| 2004/0172502 A1 | 9/2004 | Lionetta et al. | |
| 2004/0203951 A1 | 10/2004 | Mazzara et al. | |
| 2004/0257756 A1 | 12/2004 | Mills et al. | |
| 2005/0001105 A1 | 1/2005 | Matsuda et al. | |
| 2005/0036631 A1 | 2/2005 | Feit et al. | |
| 2005/0119029 A1 * | 6/2005 | Kinney et al. | 455/558 |
| 2005/0139731 A1 | 6/2005 | Park et al. | |
| 2005/0187677 A1 | 8/2005 | Walker | |

(56) References Cited

U.S. PATENT DOCUMENTS

| | | |
|---|---|---|
| 2005/0201133 A1 | 9/2005 | Oba et al. |
| 2005/0285801 A1 | 12/2005 | Reece et al. |
| 2006/0065510 A1 | 3/2006 | Kiko et al. |
| 2006/0079189 A1 | 4/2006 | Watanabe et al. |
| 2006/0106965 A1 | 5/2006 | Falcon |
| 2006/0126274 A1 | 6/2006 | Iwano et al. |
| 2006/0134959 A1 | 6/2006 | Ellenbogen |
| 2006/0164891 A1 | 7/2006 | Mills et al. |
| 2006/0179446 A1 | 8/2006 | Bickford et al. |
| 2006/0232891 A1 | 10/2006 | Bushnik et al. |
| 2006/0250813 A1 | 11/2006 | Lippmann et al. |
| 2006/0277555 A1 | 12/2006 | Howard et al. |
| 2007/0025096 A1 | 2/2007 | Snider et al. |
| 2007/0067119 A1 * | 3/2007 | Loewen et al. ................. 702/57 |
| 2007/0170910 A1 | 7/2007 | Chang et al. |
| 2007/0245758 A1 | 10/2007 | Binder et al. |
| 2010/0205622 A1 | 8/2010 | Snider et al. |

* cited by examiner

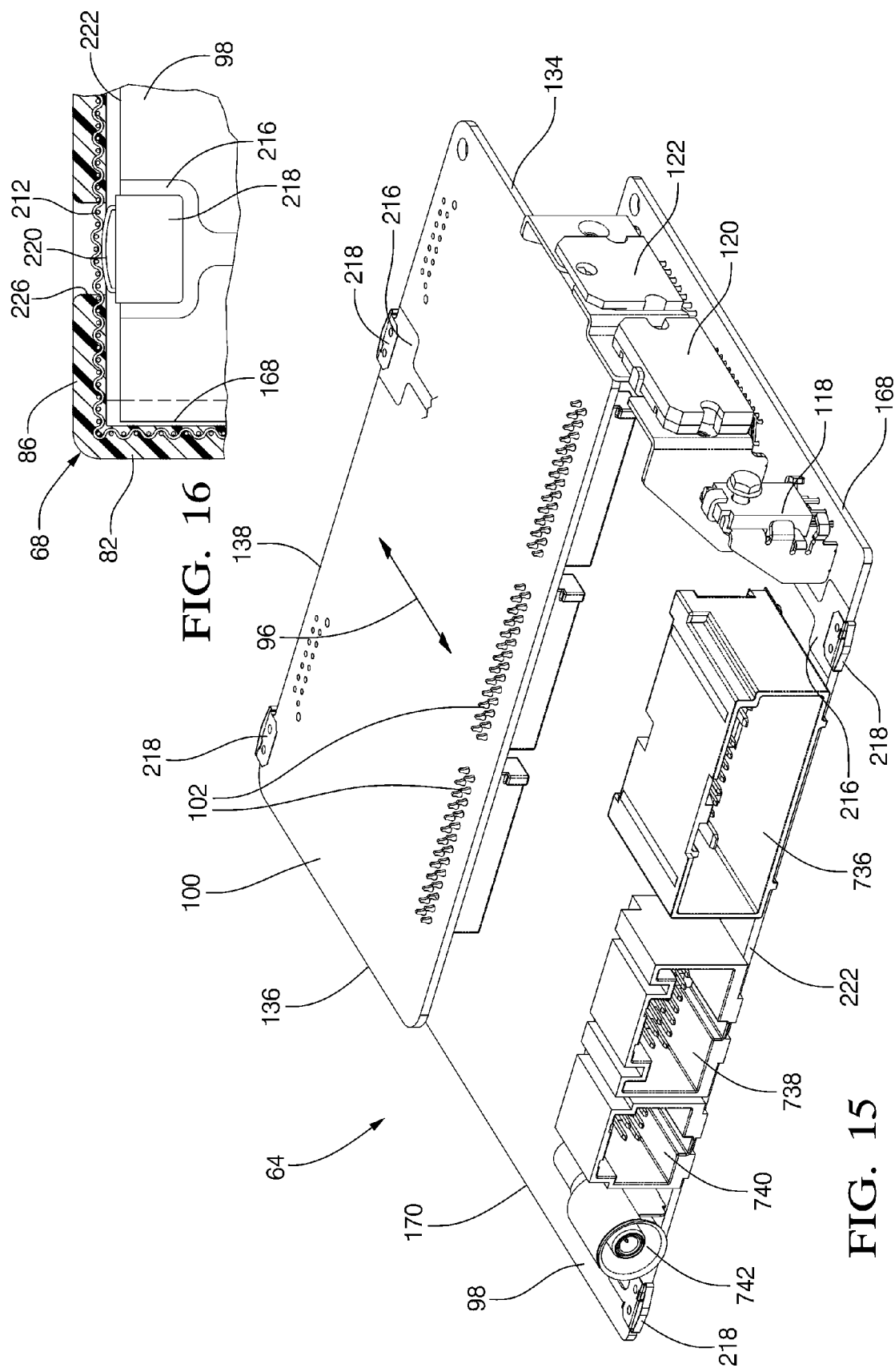

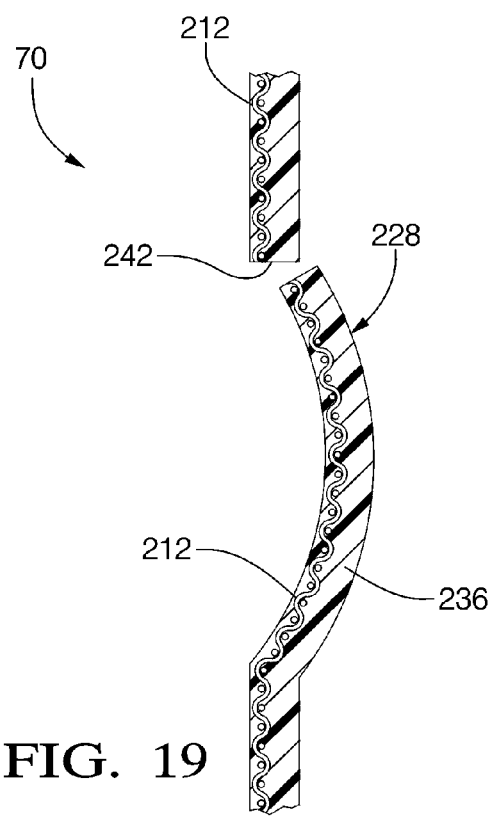
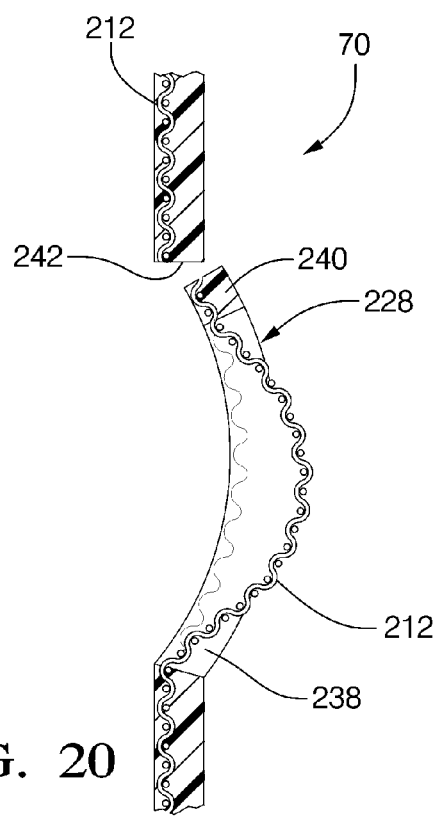
FIG. 19   FIG. 20
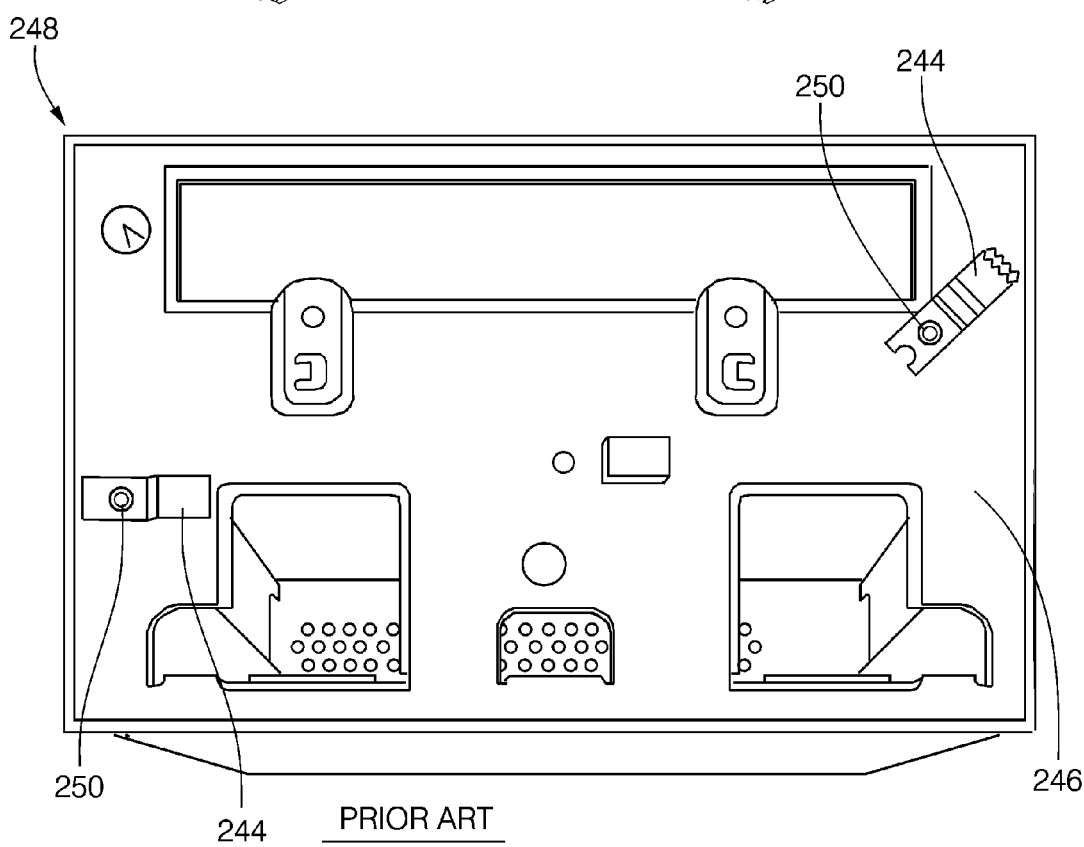
PRIOR ART
FIG. 21

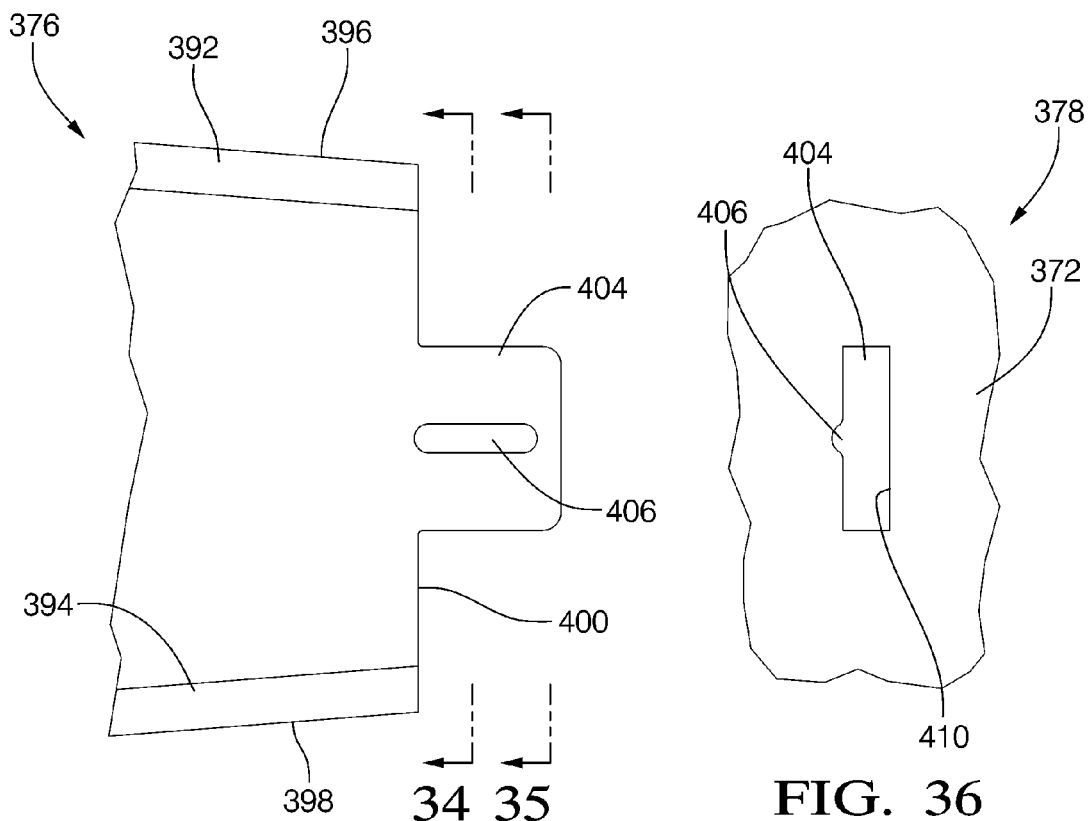
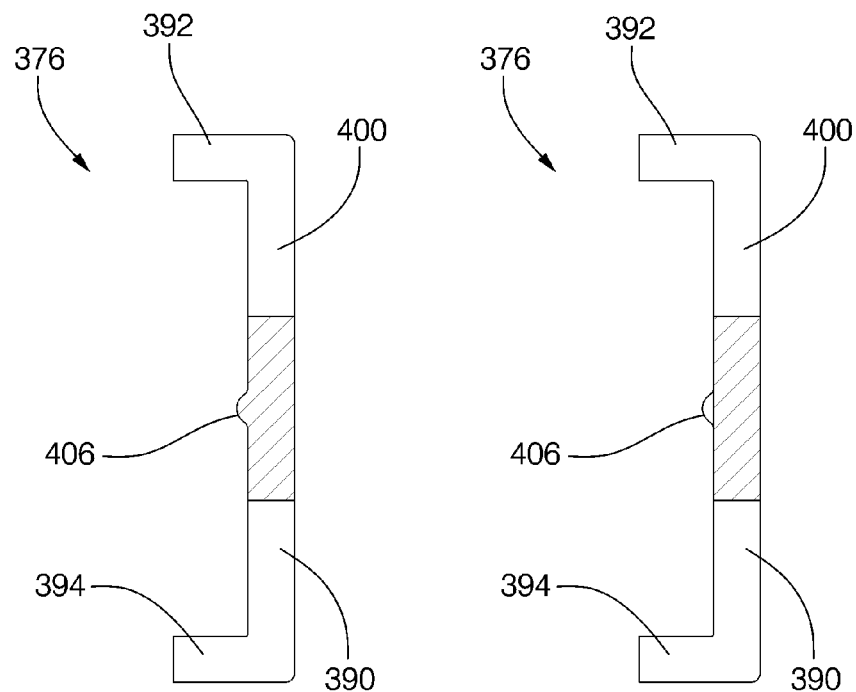
FIG. 33  FIG. 36
FIG. 34  FIG. 35

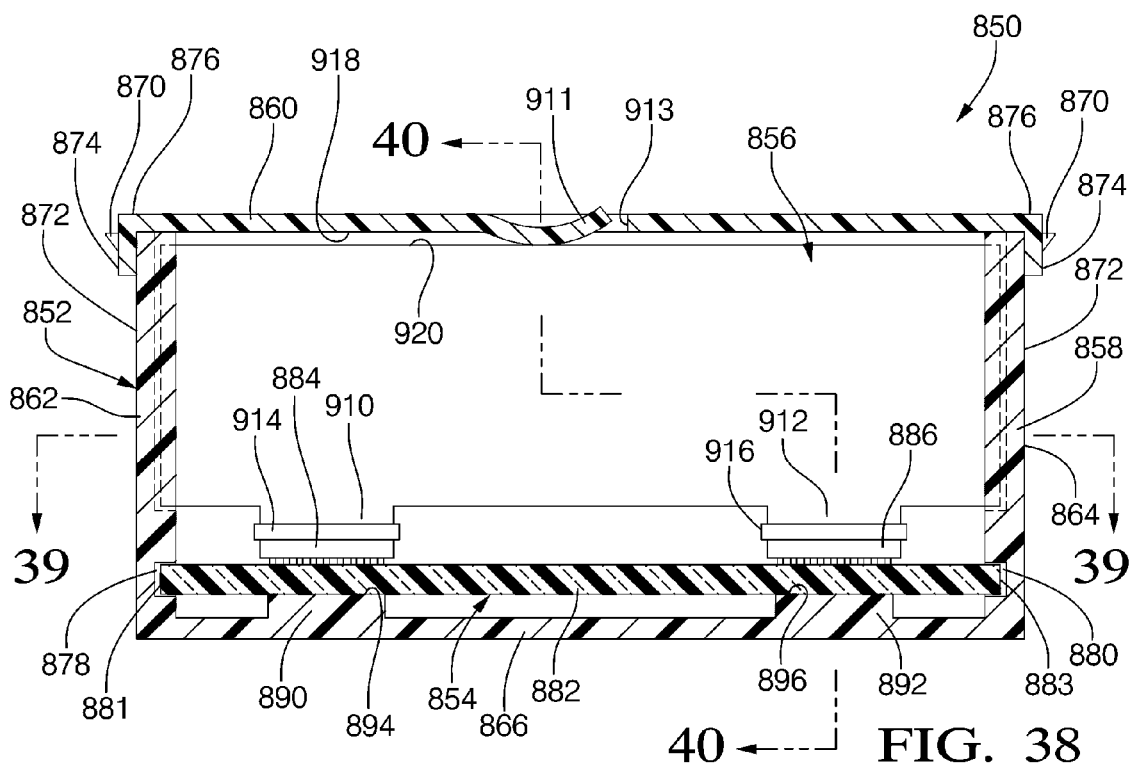
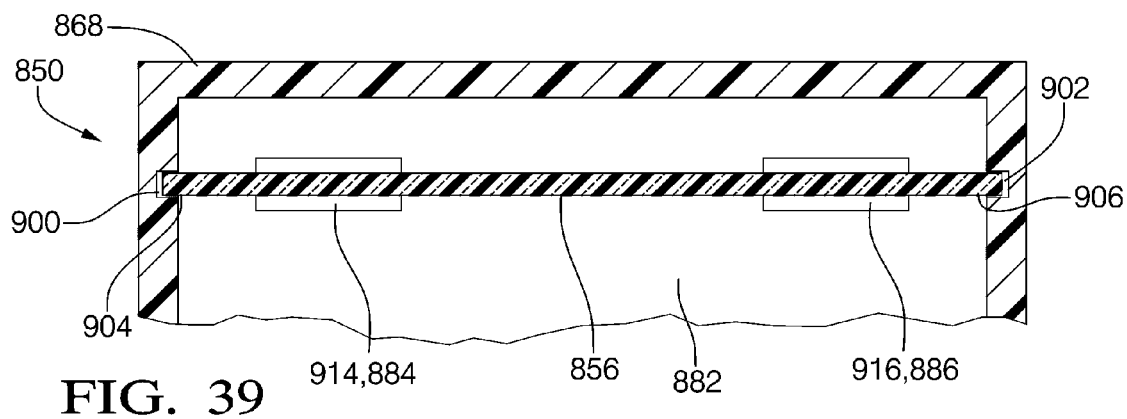
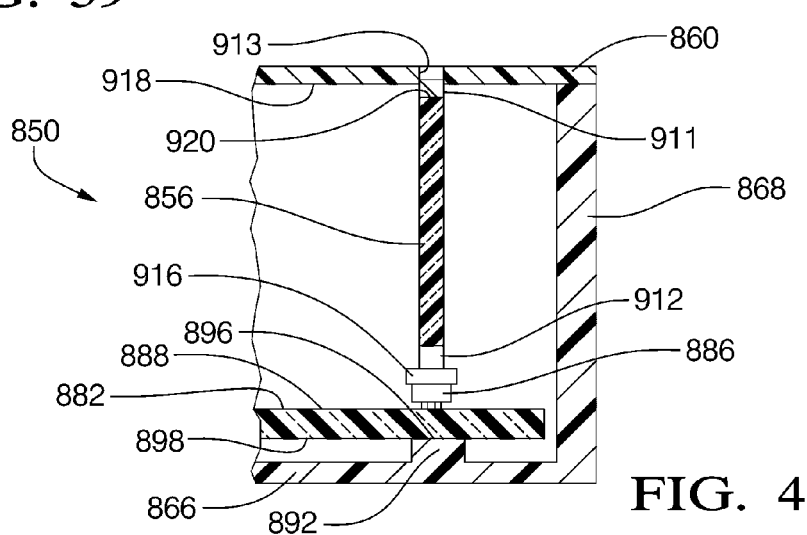

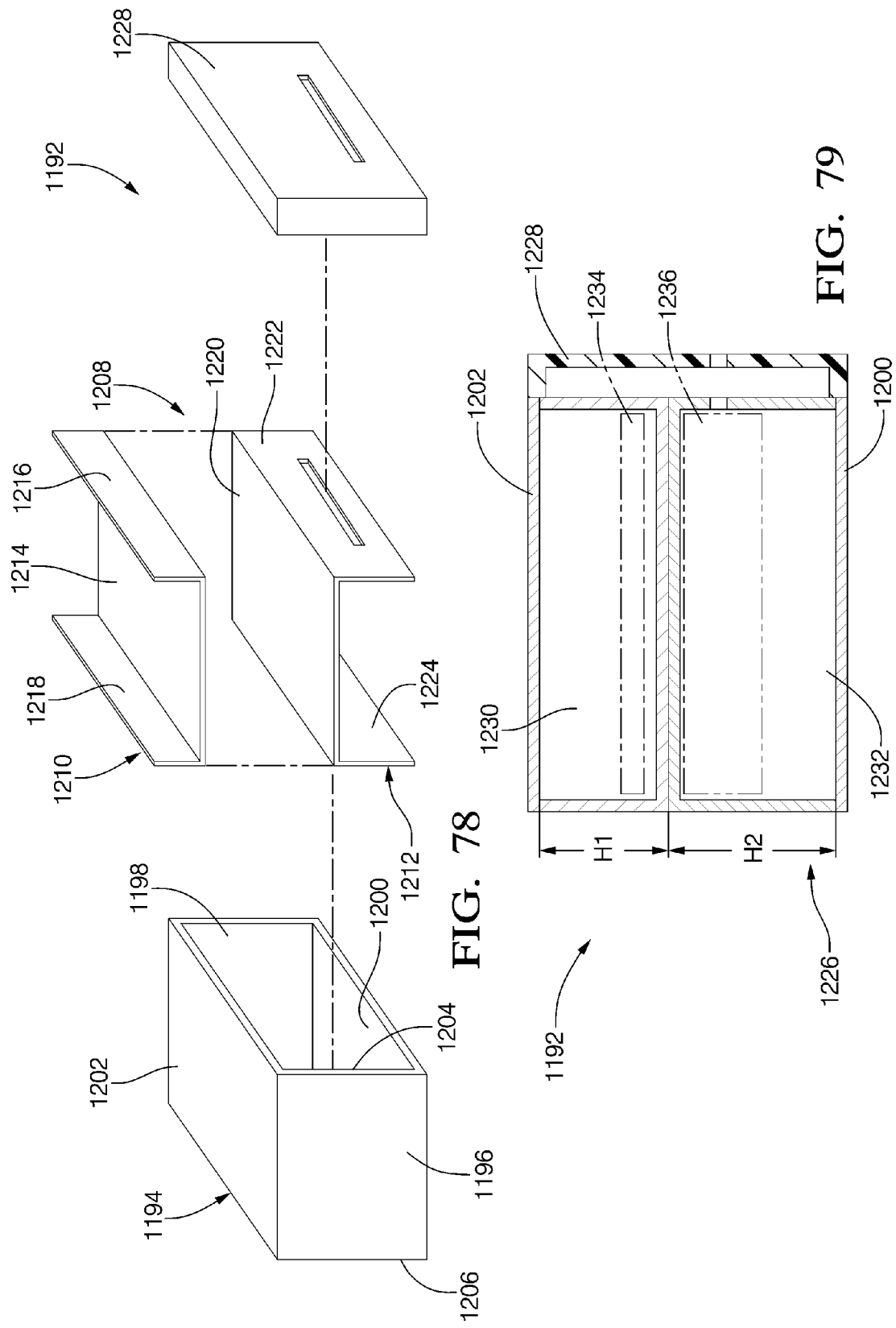

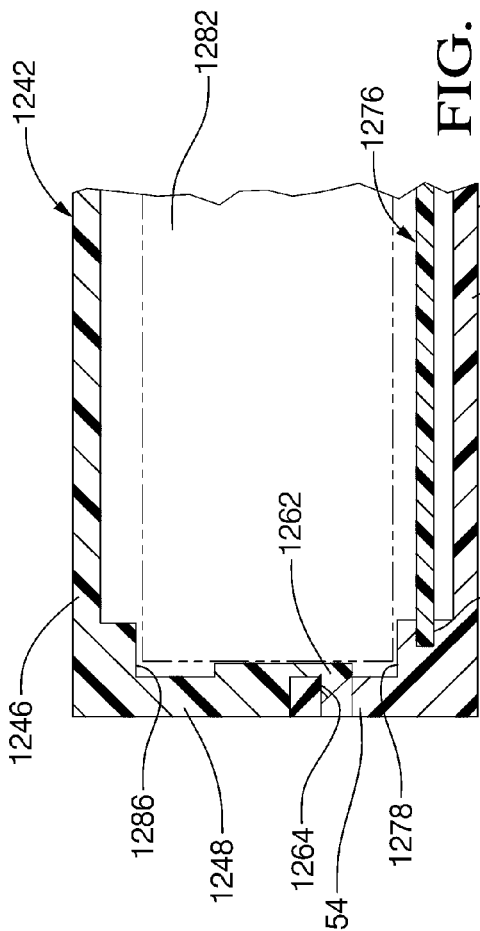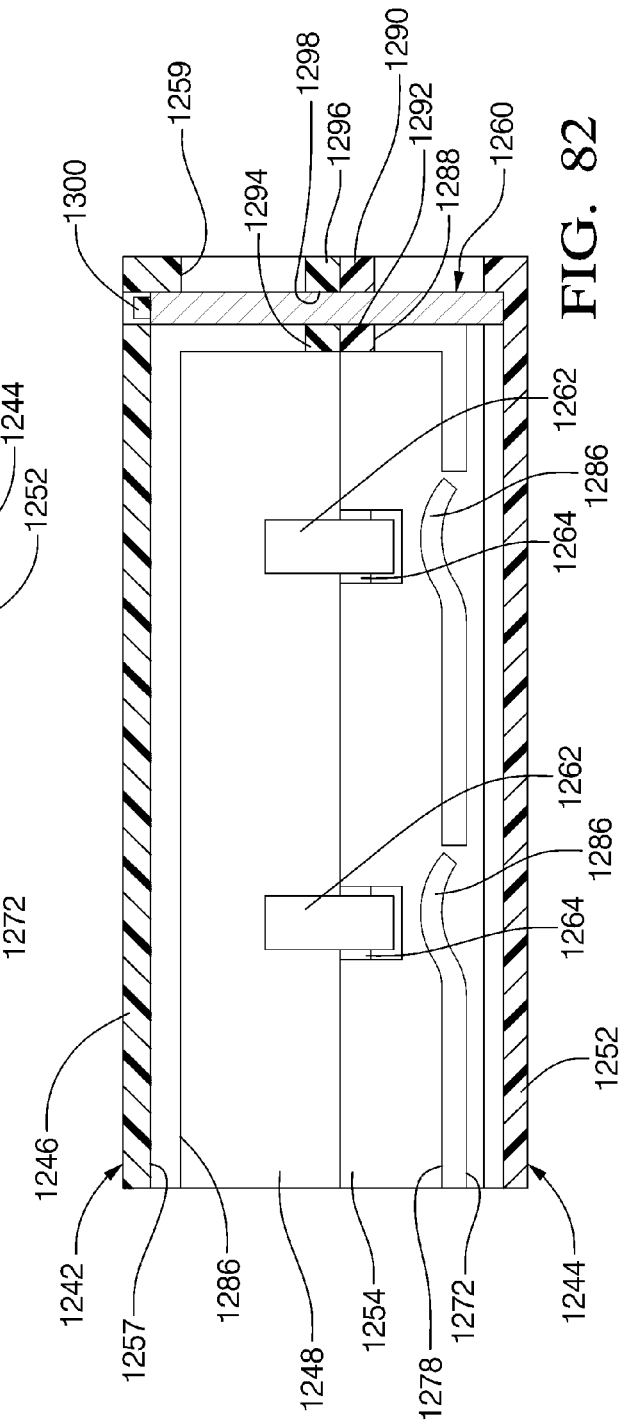

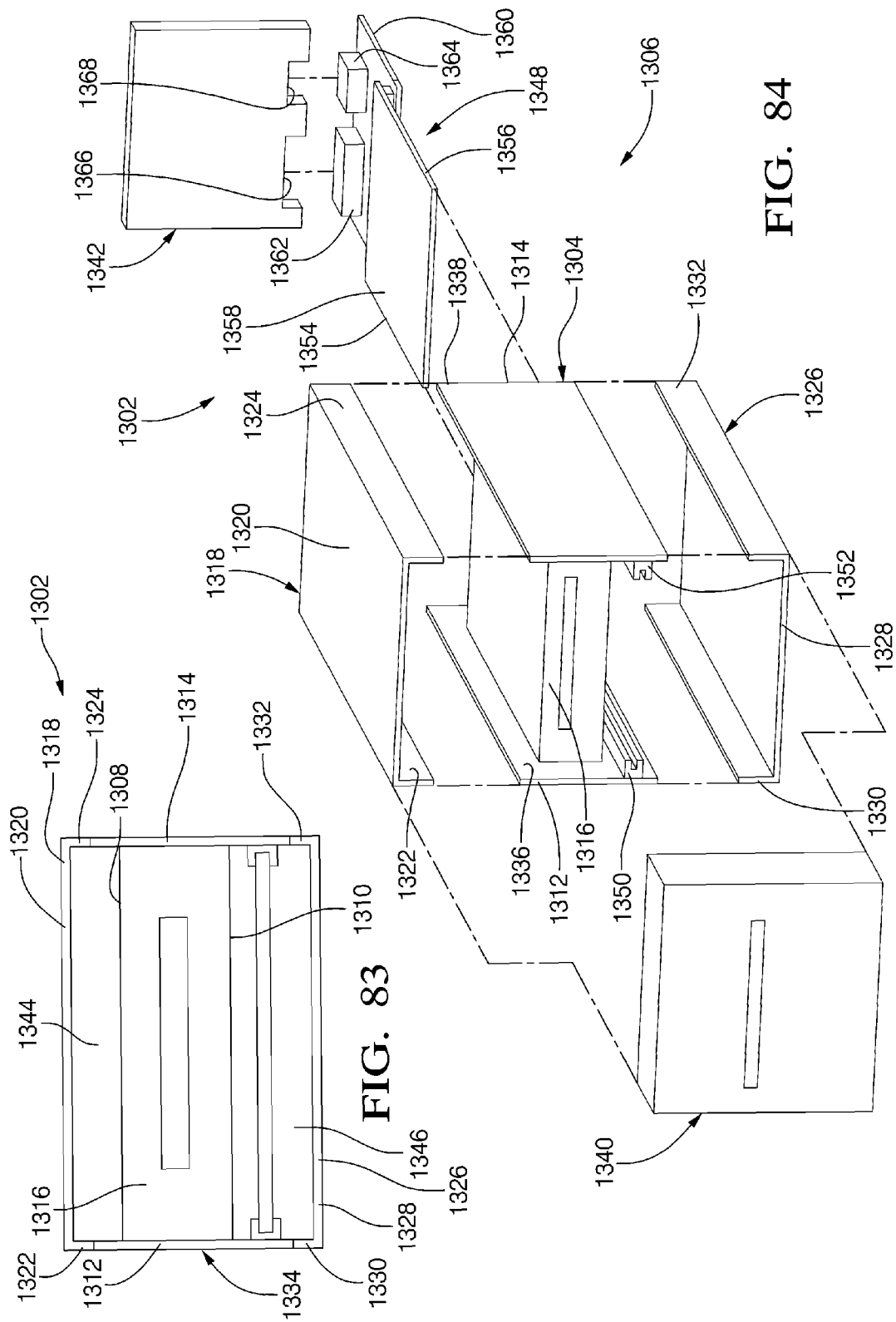

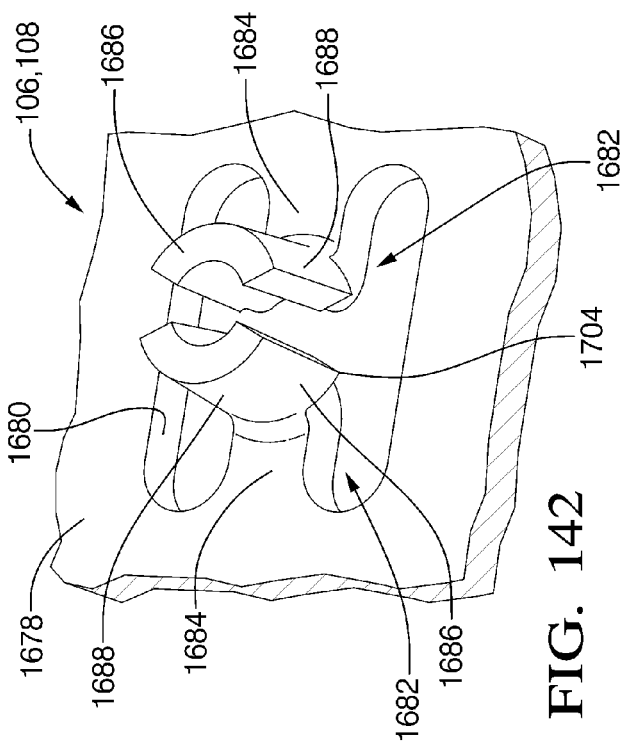
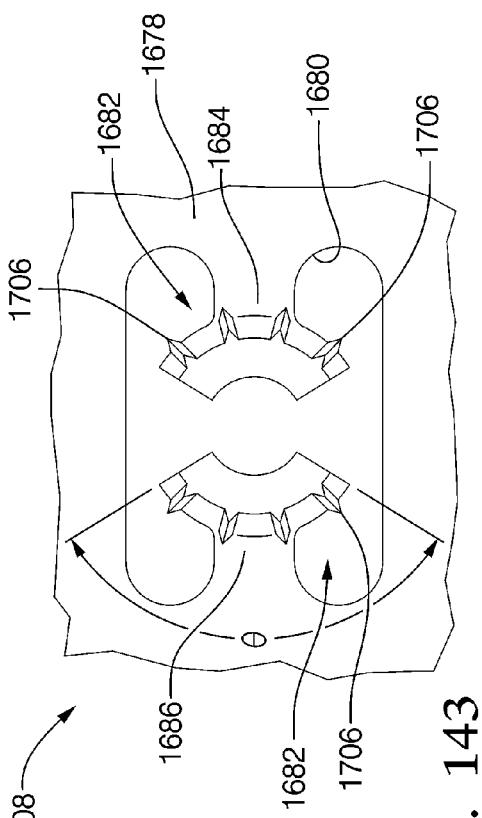
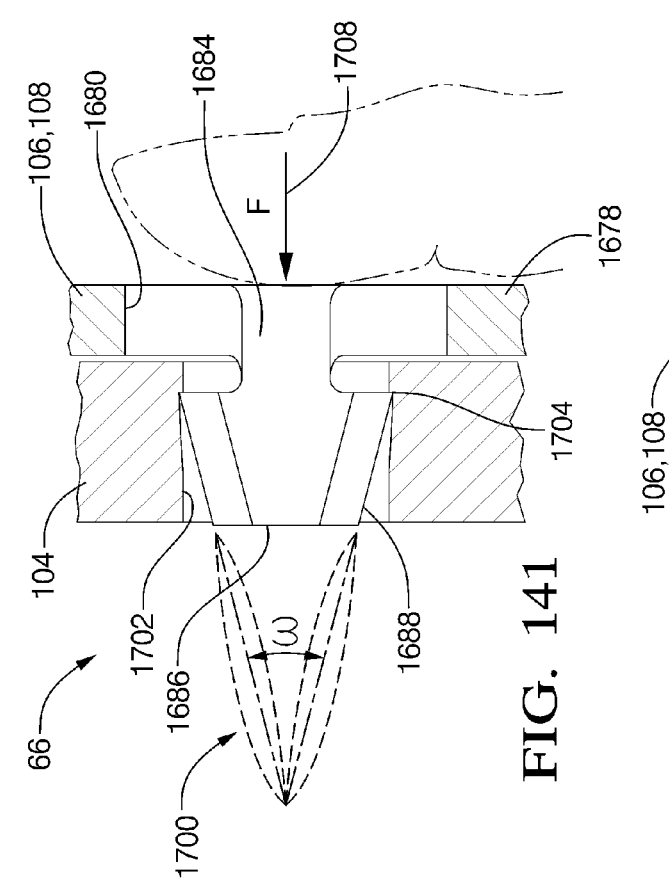
FIG. 142
FIG. 143
FIG. 141

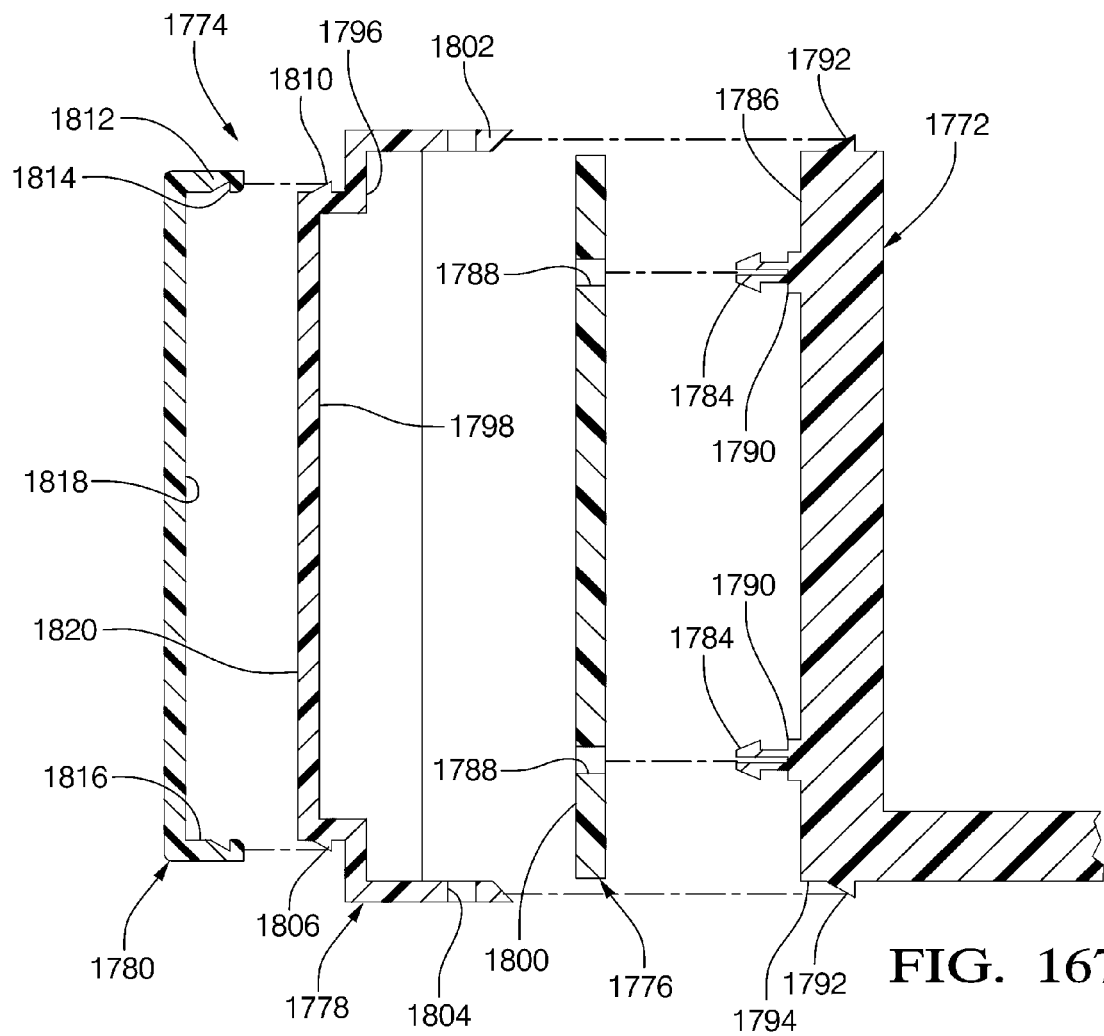
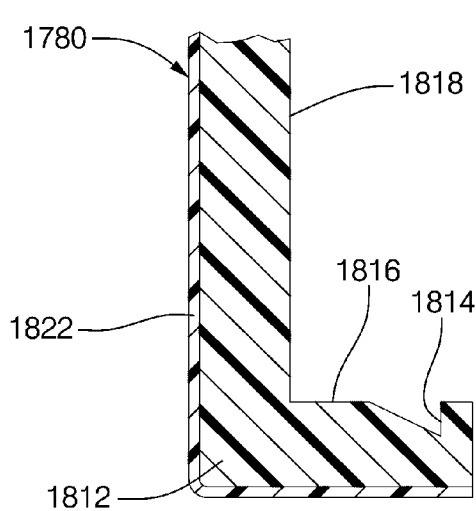 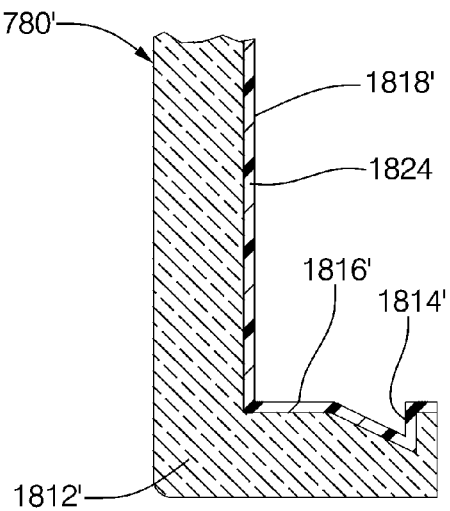
FIG. 168  FIG. 169

LIGHTWEIGHT AUDIO SYSTEM FOR AUTOMOTIVE APPLICATIONS AND METHOD

RELATED APPLICATIONS

This is a divisional application U.S. Ser. No. 14/048,082, filed 8 Oct. 2013, which is a divisional application of U.S. Ser. No. 13/208,687, filed 12 Aug. 2011, which is a divisional application of Ser. No. 12/764,195, filed 21 Apr. 2010, now U.S. Pat. No. 8,035,976 B2, which is a divisional application of U.S. Ser. No. 11/893,357, filed 15 Aug. 2007, now U.S. Pat. No. 7,733,659 B2, which claims the benefit of U.S. Ser. No. 60/838,698 filed 18 Aug. 2006 to Chris R. Snider et al., entitled Lightweight Automotive Radio/CD Player and U.S. Ser. No. 60/931,467 filed 23 May 2007 to Chris R. Snider et al., entitled Lightweight Automotive Telematic Device, all assigned to a common assignee.

TECHNICAL FIELD

The present invention relates generally to apparatus for enclosing electrical subassemblies, and more specifically relates to apparatus for efficiently securing subassemblies to a chassis of an electrical assembly such as an automobile radio, compact disc playing mechanism, cassette tape playing mechanism, navigational aid, personal computer, personal and telematic communication devices or disk drive mechanism.

BACKGROUND OF THE INVENTION

Devices such as automobile radios or personal computers contain subassemblies such as cassette playing mechanisms or disk drives that are attached to the chassis using threaded fasteners. The chassis provides structural support for the subassemblies and also provides electromagnetic shielding to limit electromagnetic interference (EMI) experienced by, and/or created by the device. The fasteners ensure that each subassembly within the chassis is properly located and securely retained within the chassis.

The use of such fasteners can have numerous drawbacks, particularly in a high volume production setting. The process for applying or installing fasteners can vary, but there is usually some degree of automation required, ranging from manually loading a screw into a bit on a pneumatic driver to using self-feeding automated machines. Typically, the torque applied by the device used to drive the fasteners must be monitored regularly and adjusted in order to assure proper seating of the fasteners. When fasteners are used, sheet metal tolerances, as well as tolerances of the fasteners themselves, have to be maintained at tight levels to allow for the minimization of stress in the assembly when aligning multiple fasteners with corresponding holes in the chassis and in the subassembly.

When threaded fasteners are used to assemble an electrical device, the assembly cycle time can be very long especially in high volume production. An operator assembling the device must typically first obtain the threaded fastener, orient and position it in alignment with the driver bit, then manipulate or actuate the machine to drive the threaded fastener. Furthermore, using threaded fasteners presents a risk of any one of the following upstream failures occurring: stripping of fastener threads; insufficient torque resulting in an unseated fastener; excessive torque resulting in distension/deformation of the fastener or adjacent electrical components; installation of the wrong fastener type or size; foreign object damage due to fasteners and/or metal shavings dropping onto the assembly and/or subassembly; and stripping of the head of the threaded fastener. Also, a fastener installation tool such as a driver and bit can slip off the fastener and impact an electrical component resulting in a damaged assembly.

If self-tapping fasteners are used, the process of driving the self-tapping fasteners into sheet metal often causes shavings of sheet metal to disperse into the assembly. Such shavings have been known to cause electrical failures, such as shorts or corruption of magnetic components that can permanently damage the product. If self-tapping fasteners are not used, an extra production step is required to pre-form threads in the sheet metal of the chassis and/or the subassembly to be installed within the chassis.

Fasteners further require an additional inventory burden on the production line in that the production line must be continuously stocked with part numbers (fasteners) other than the integral components that add value to the assembly. Also special tools specifically required for assembly, using fasteners, such as drivers and bits, must be continuously monitored and maintained for proper performance, wear and torque specifications. Typically, the top and/or bottom surface of the chassis must be secured in place after the subassembly is attached to the chassis.

Special fixtures are often required on the production line to secure a subassembly in a proper location and orientation while it is mounted within the chassis with fasteners. Such fixtures can be very complex, and the use of such fixtures usually requires extra handling of both the subassembly and of the resulting assembly thereby adding to the production cycle time and potentially compromising quality of the final product.

FIG. 1 illustrates the construction of a typical prior art automotive radio/compact disc (CD) player 10. Radio/CD player 10 comprises a radio subassembly whose principle circuit components are carried on a circuit board 12 and a CD player subassembly 14. The circuit board 12 and the CD player 14 are encased within a common chassis 16 made up of sheet metal components. Chassis 16 includes a wraparound housing 18 defining a back and sidewalls, a top cover 20, a bottom cover 22 and a front plate 24 which are interconnected by numerous threaded fasteners to collectively enclose the subassemblies. The top and bottom covers 20 and 22, respectively, are provided with large arrays holes or openings for airflow and ventilation of heat generated within the radio/CD player 10. A convector or heat sink 26 is carried on an outer surface of one of the chassis sidewalls and is interconnected through a port/window 28 to a power device assembly 30. A trim plate assembly 32, along with a support pad 34 and CD dust cover 36 are affixed to the front plate 24, providing an operator control interface with the radio/CD player 10. Circuit board 12 is electrically in-circuit with the CD player subassembly 14 through an intermediate flex wire cable 38 and with the power device assembly 30 through a jumper cable 40. Information bearing labels 42 and 44 are provided for future reference by the operator and service technicians. The radio/CD player 10 is electrically interconnected with an antenna, power supply, speakers and other related systems of a host vehicle by rear-facing connectors 46 carried on the circuit board 12 which are registered with openings 48 in the rear wall of wraparound housing 18. The radio/CD player 10 is mounted within a host vehicle by threaded fasteners passing through openings in mounting features 50 extending from front plate 24 and a rearwardly directed mounting bushing 52 which is threadably affixed to a stud 54 carried on the outer surface of the rear wall 56 of wraparound housing 18. As best seen in FIGS. 11 and 12, the shank of the stud 54 extends outwardly through a hole 58 disposed concentrically with a localized recess 60 and the stud 54 is seated within the recess 60. FIG. 9O illustrates another known stud design including a threaded shank secured to the rear wall 53 of a radio set 51 by a set nut 55 and receiving a molded rubber, plastic or vinyl stud 57 thereover. Note the large number of threaded fasteners 59.

The radio/CD player 10 of FIG. 1 is of ordinary complexity and may require fifty or more threaded fasteners to complete the manufacturing process. Installation of that many fasteners may require that the in-process chassis be re-positioned/re-fixtured ten to fifteen times as it passes along an assembly line of eight to ten skilled workers/work stations.

Vehicle entertainment systems usually include an audio component such as a radio to enable receiving signals from antennas, contain various forms of playback mechanisms, and have the capacity to accept data from user devices like MP3 players. Typically, the radio has a decorative assembly that provides man-machine interface as well as displaying pertinent data relative to the selected media and audio settings. Also, the back-end or chassis is constructed of metal to provide various functions to ensure the performance of the radio in the vehicular environment. The structure to contain the mass from playbacks, the heat conductive properties, and the electrical shielding and grounding are just a few of the advantages to using the metal construction. Unfortunately, with the density of the metal, the disadvantage of added weight is a side effect of the typical construction. In a vehicle, added weight impacts fuel economy, as well as other hidden costs during assembly that can effect the cost of the product, like sharp edges of metal can be a potential hazard for assemblers in the manufacturing plant as well as added weight can limit the packaging of multiple parts in containers for inter and outer plant distribution.

Thermal Management System

Devices such as automobile stereos, audio amplifiers, home stereo systems, two-way radios, computers, signal conditioners/amplifiers, compact disc playing mechanisms, and cassette tape playing mechanisms are examples of products that typically require electrical components to amplify signals and regulate power. Accordingly, such devices typically contain numerous electrical components such as single in-line package (SIP) amplifiers and regulators that are typically soldered into printed circuit boards. Such electrical components generate heat in use. The heat must be dissipated away from the electrical components to avoid damage that can be caused by excessive temperatures in the electrical components. For example, excessive temperatures can cause delicate electrical leads to fail or insulating materials to melt, thereby causing a short circuit resulting in damage to, or even failure of, the entire electrical device.

A convector is often mounted to an outer surface of such a device to dissipate heat generated by components by transferring the heat away from the components and the device to the convector and then to the air through radiation. In order to accomplish this, it is preferable that the convector be physically in contact with the component. The components and the convector can be pressed together to allow even better heat conduction from the components to the convector. Sometimes an intermediary material such as a thermal pad or silicon grease is used between the component and the convector to assist in creating an adequate heat transfer junction.

Many convectors are made from aluminum due to the high heat conductivity of that material. Convectors often include a plurality of fins to increase the effective surface area of the convector and thereby increase the rate at which the convector can dissipate heat. Typically, aluminum, convectors are formed by an extruding process, during which the fins can also be formed integrally therewith.

Convectors are usually assembled to the component or components during final assembly of the overall device in which they are used. At final assembly, components such as SIP amplifiers are already soldered into a printed circuit board. The order of assembly can vary as to which component is assembled into the chassis first. The printed circuit board can be installed into the chassis before the convector is mounted to the printed circuit board and the chassis. Alternatively, the convector can be mounted to the chassis before the printed circuit board is mounted to the convector. Sometimes, the convector is assembled to the printed circuit board to form a subassembly before being assembled to the chassis.

Typically, components are attached to the convector using a clip and one or more threaded fasteners that extend through a hole in the clip and into a hole in the convector. The clip, component and convector must all be simultaneously held in a fixture and then be fastened together with a threaded fastener. If the component includes a hole to accept a threaded fastener, it can be mounted directly to the convector using a threaded fastener that extends through that hole, without using a clip.

The use of such fasteners can have numerous drawbacks, particularly in a high volume production setting. Often, each hole in the convector that receives a fastener must be separately drilled or punched. This is especially true for an extruded convector if the axis of the hole is not aligned with the direction in which the convector is extruded. The fastening process can vary, but there is usually some degree of automation required, ranging from manually loading a screw into a bit on a pneumatically or electrically powered driver to using self-feeding screw machines. Typically, the torque applied by the device must be monitored regularly and adjusted in order to assure proper seating of the fasteners.

The clamping force between the convector and the component should be at a proper level to ensure sufficient heat transfer to the convector. When fasteners are used to attach the convector to the component, clamping force is a function of the type of fastener and its condition and degree of assembly (e.g. the level of torque applied during installation of the fastener). Thus, a threaded fastener that is not seated all the way will give less clamping force than one that is seated all the way. Or, a stripped or improper type of fastener may provide an insufficient clamping force.

Special fixturing is often required to hold a component in the proper location while it is mounted to the convector using one or more fasteners. Such fixturing can be very complex and use of such fixturing usually requires extra handling of both the component and of the resulting assembly, thereby adding to the production cycle time and potentially compromising quality of the final product.

When threaded fasteners are used, the assembly cycle time can be very long, especially in high volume production. The operator must specifically obtain the threaded fastener, bring it in contact with the driver bit, then drive the threaded fastened. If self-tapping fasteners are used, the process of driving the self-tapping fasteners into metal often causes metal shavings to disperse into the assembly. Such shavings have been known to cause electrical failures that can permanently damage the product. If self-tapping fasteners are not used, an extra production step is necessary to form threads in the metal of the convector.

Accordingly, there is a need for electrical assemblies that do not require fasteners or tooling for securing a component to a convector.

Electrostatic Discharge Device

Static electricity (electrostatics) is created when two objects having unbalanced charges touch one another, causing the unbalanced charge to transfer between the two objects. This phenomenon commonly occurs in homes, vehicles and other environments when the air is dry (i.e. has a characteristic relatively low level of humidity). For instance, when a person slides onto a car seat, electrons may transfer between the two, causing the surface of the person's body to store a charge. When the person, then, touches a vehicle component, the charge may travel (discharge) from the body to the component, thus creating static electricity. If the object touched is an electronic device, such as a home stereo, home theatre system, computer, vehicle entertainment system or other electronic media system, this electrostatic discharge can be harmful to the sensitive electronic components of the device. For instance, when a person slides onto a vehicle seat and inserts a disc into the car stereo, a charge may travel from the body through the disc to the sensitive electronic components in the vehicle stereo. Similar problems may occur when using DVD and other magnetic media and disc players.

Accordingly, problems with the drainage of a static electric charge impacting sensitive electronic components continue to persist.

Living Hinge Button Switch Linkage

A variety of automotive accessories, e.g., an automotive radio, within a motor vehicle employ button switches. Traditionally, buttons for the button switches have been fabricated and decorated (i.e., painted and laser trimmed) individually. The buttons are then set in a separate housing that includes a plurality of integrally formed guides for accepting the buttons. Unfortunately, each of the buttons has required individual fabrication and decoration, which significantly increases the total cost of an end product so designed. Further, as the individual buttons are actuated, they can produce a squeaking noise due to the fact that each of the individual buttons includes a number of posts that mate with integrally formed guides in the housing. Various automotive accessories, such as an automotive radio, also receive inputs from rocker switches, which, similar to button switches, have been painted and laser trimmed and also may create noise when a user actuates the rocker switch as the switch may engage a separate housing or trim plate. Additionally, both button and rocker switches have generally required additional components (e.g., springs) to provide a desired tactile feel.

Thus, what is needed is a parallel guide mechanism for a switch that provides noiseless actuation and guided movement and allows for material and/or component design that provides a desired actuation tactile feel without increased component cost.

Integrated Vehicle Display Lighting Assembly

Vehicle display assemblies often use a backlit liquid crystal display (LCD) so that the display can be viewed easily by the user. Fluorescent light is the most common backlight source for LCDs. To ensure that the display can be read in daytime ambient light, the display backlighting is relatively intense.

The display assemblies may also include buttons for operating, for example, a radio or a CD player. Current assemblies illuminate each button with its own incandescent light source, providing backlighting and color for any graphics on the button. Each light source may include a colored boot to produce a desired light color for the button graphics.

As vehicles incorporate more features that require more buttons, the number of light sources also increases. The heat generated from the incandescent lights, however, elevates the temperature of the buttons by as much as 20° C., enough to be noticeable by a user. Further, the increased temperature may place undesirable thermal stress on the display components. Thermal protection algorithms may be used to monitor the assembly temperature and reduce the light intensity if the temperature reaches a selected threshold until the temperature drops to an acceptable level. Unfortunately, these systems require additional, cumbersome circuitry for turning the button light sources on and off.

There is a need for a display assembly lighting system that can illuminate a main display and adjacent buttons while keeping the assembly temperature within a desirable range.

It is known in the art that illuminated display systems, such as those found in radio receivers, compact discs, and heating, ventilation, and air conditioning (HVAC) controllers, include a back-lit display panel. Typically, it has been common practice to locate light pipes between a printed circuit board and the display panel to direct light from a light source to a portion of the display panel for controlled illumination. However, because this location of the light pipe is typically shared by other electrical components and mechanical structures (i.e. button bodies, potentiometers, plastic ribs, LCD displays, etc.), the design of the light pipe may become complex, which may affect the efficiency of the lighting system.

Accordingly, a final design of the light pipe has often included complex structures that weave between the electrical components and mechanical structure. Once light is provided to an entrance port of the light pipe, gradual changes in direction of light propagation by means of total internal reflection on non-parallel light pipe walls tend to introduce losses as collimation decreases. Losses in collimation also increase the difficulty in directing light exiting the light pipe to the specific areas of the display panel.

The complexity of such light pipe designs makes computer simulation difficult and time consuming, which lends to prevention of design optimization by means of iterative prototyping and expensive design cycles drawn out with proof of concept often being delayed until injection molded light pipe prototypes can be produced. As such, a need exists for improving the collimation effects and efficiency of light pipes applied in an illuminated display system.

Self-Aligned Button Retainer

There are numerous types of switch mechanisms in use today for operating and regulating systems and components of vehicles and other devices. The switch mechanisms can be on-off type switches, switch mechanisms which regulate the volume, amplitude and/or intensity of various systems, switch mechanisms which are available only for emergency-type usage, and the like.

In automobiles and other vehicles, there are numerous types of switch mechanisms which are used for the various electronic components and systems that are available and in use in the vehicles. These electronic components include windshield wipers, emergency lights, turn signals, cruise control, power seats, power windows, heated seats, four-wheel drive systems, overdrive systems, navigation systems, timing systems, clocks, mileage, trip or travel systems, and the like. Many of these mechanisms have dual functions, such as being used not only to control, for example, the on-off status of the component or system, but also to adjust one of its functions, such as amplitude, balance, base, treble, etc. Many such switches utilize rocker-type buttons which pivot or rotate around a central point or section and have two ends which are adapted to operate or actuate certain switches or systems. Automotive entertainment systems such as radios and CD players frequently use push button type switches in space-saving compact arrays, with packaging space being a premium.

Switch mechanisms are typically designed to meet various criteria and considerations other than function. The considerations include appearance, aesthetics, ease of assembly, positioning, ease of use, versatility of function, and design. These considerations can affect the size, color, type, and method of activation of the switch mechanism. The switch mechanisms are also made from various types of materials, including plastic, acrylic, and metal materials. In this regard, cost and durability factors can be significant in the final selection of the switch mechanisms to be utilized.

Although there are numerous switch mechanisms in use today which operate satisfactorily, there is a constant need to improve the operation, versatility and appearance of various switches, as well as to correct problems with existing switches. For example some of the switch mechanisms provide excess freedom of movement, have undesirable noise problems, are too expensive, have alignment problems in the socket or housing in which they are positioned, do not operate with the requisite tactile "feel", or are simply too difficult to operate for the desired function. Thus, a need exists for improved switch mechanisms, particularly those which minimize noise problems, have improved alignment, have the desired "feel" or can be adjusted to achieve the desired feel, and which can be easily and simply actuated.

Interface with Personal Entertainment Devices

Vehicle entertainment systems usually include an audio component such as a radio to enable receiving signals from antennas, contain various forms of playback mechanisms, and have the capability to accept data from user devices such as MP3 players. Typically, the radio has a decorative assembly that provides man-machine interface as well as displaying pertinent data relative to the selected media and audio settings.

Many consumer electronic devices like the popular iPod from MacIntosh have become mainstream must-haves for certain demographic groups of consumers. Automobile manufacturers are developing methods to allow the consumer to connect to the automobile's entertainment system with their personal music device, whether it be an iPod, a memory stick via a USB port, or a similar device. Several automobile manufacturers such as BMW and VW/Audi have provided a pig-tail or wired connection for an iPod in their glove box.

Referring to FIG. 127, alternative prior art approaches are illustrated wherein a personal device is directly interconnected with the vehicle entertainment system through a cable and phone jack plugged into an auxiliary (aux) input in the front face of the entertainment system, or, alternatively, plugged into a pig-tail connector located in the vehicle glove compartment.

This arrangement enables the consumer to connect the vehicle audio system with their personal device. Some automobile radios have an auxiliary jack on the front of the radio. The auxiliary jack allows playing the music, but does not necessarily allow for player control through the radio. This requires the device be accessible for control of the music.

The problems with the glove box approach are the potential for damage to the device from other contents in the glove box, and the cable connection offers no flexibility for connecting to another device. Damage may occur to the cable as well through normal use.

The auxiliary jack method allows more flexibility for devices, but limits the control and may incur damage through impact while a plug is connected.

Some aftermarket radios offer a USB (Universal Serial Buss) port on the front panel thereof, but may also incur damage due to the potential leverage on the face of the unit when a flash memory is connected, not to mention vehicle occupant impact issues resulting from braking and collisions. Furthermore, connection interfaces open to the vehicle passenger compartment environment risk system damage from foreign objects and air-borne contamination, not to mention being aesthetically unattractive.

With most automotive suppliers, the present generation of radios are typically designed to fit a standard frontal area size. Typically, the DIN standard (issued by the Deutsches Institut für Normung, or German Institute for Standardization) is used for either a "2DIN" or a single "DIN" size in most radios. 2DIN radios typically have larger displays and contain multiple disc changers integrated into the package.

With the advent of music storage devices, like flash memory and devices like the iPod™, there is less dependency on multiple disc changers and more desirability for the radio to communicate with the personal music storage or music device carried by the consumer. The rapidly changing customer market has initiated a drive to feature content on OEM (original equipment manufacturer) supplied radios for automobiles to provide those wants and that has an impact on interchangability and potential safety issues.

SUMMARY OF THE INVENTION

The present invention provides numerous product and process advantages which collectively result in substantial cost and labor savings. By way of example, the preferred design optimizes the assembly process. It minimizes the required handling of major components and subassemblies during the assembly cycle. Final assembly is optimized, wherein only seven major components and subassemblies are involved. This minimizes the number of work stations and fixtures, in-process transfers between work stations and total assembly cycle time. The inventive design permits selection of the optimal mechanical product configuration for a given receiver family. Furthermore, it permits idealized electrical and mechanical building block partitioning for common and unique elements.

The preferred embodiment of the invention contemplates screwless final assembly without the use of tools, fixtures and assembly machines. This greatly enhances in-process product flow in the factory, improves scheduling of final assembly, and allows labor intensive processes such as stick lead assembly to be largely moved off-line. This greatly reduces both direct and indirect labor requirements. Furthermore, inventory control is simplified inasmuch as position part proliferation is deferred to or near the end of process.

These and other features and advantages of this invention will become apparent upon reading the following specification, which, along with the drawings, describes preferred and alternative embodiments of the invention in detail.

BRIEF DESCRIPTION OF THE DRAWINGS

The present invention will now be described, by way of example, with reference to the accompanying drawings, in which:

FIG. 15, is a perspective view of the circuit board assembly with ground clips installed thereon;

FIG. 16, is a fragmentary, cross-sectional view of a ground clip and an associated portion of the printed circuit board on an enlarged scale in assembly with an adjacent portion of the case to effect a grounding point with the integral wire mesh;

FIG. 19, is a cross-sectional view taken on lines 19-19 of FIG. 17;

FIG. 20, is a cross-sectional view taken on lines 20-20 of FIG. 17;

FIG. 21, is a front perspective view of a prior art faceplate illustrating rivet/staked spring clips for ESD protection to associated contact pads on a trim plate assembly;

FIG. 33, is a fragmentary detail, on an enlarged scale, of the rear end portion retention tab of the CD mechanism bracket depicted in FIGS. 30-32;

FIG. 34, is a cross-sectional view of a first portion of the retention tab of the CD mechanism bracket taken on lines 34-34 of FIG. 33 illustrating an integral dimply/crush rib formed therein;

FIG. 35, is a cross-sectional view of another portion of the retention tab of the CD mechanism bracket taken on lines 35-35 of FIG. 33;

FIG. 36, is an end plan view of the retention tab of the CD mechanism bracket in its assembled position within the rear wall portion of the case of the radio/CD player as depicted in FIG. 32;

FIG. 38, is a cross-sectional view of an alternative, guillotine or drop in place type aluminum plate heat sink in representative assembly with PC board mounted power ICs within a radio housing assembly;

FIG. 39, is a cross-sectional top view taken along lines 39-39 of FIG. 38;

FIG. 40, is a broken, cross-sectional side view taken along lines 40-40 of FIG. 38;

FIG. 78, is an exploded, perspective view of a third alternative embodiment of a radio/CD player featuring an I-beam structure allowing both the control electronics PCB and the CD player to be assembled in a bottom-up sequence;

FIG. 79, is a cross-sectional view of the third embodiment of a radio/CD player of FIG. 78, on an enlarged scale, with the control electronics PCB and CD player illustrated in phantom;

FIG. 81, is a broken, cross-sectional view, on an enlarged scale, of internal features of the case assemble of the radio/CD player of FIG. 80, illustrating the self-engagement feature of the case halves and the mounting/positioning of the PCB and CD player (illustrated in phantom);

FIG. 82, is a cross-sectional view, on an enlarged scale, of additional internal features of the case assembly of the radio/CD player of FIG. 80, taken along lines 82-82 of FIG. 81, illustrating application of a guillotine heat sink and integral leaf springs for securing the CD player (not illustrated);

FIG. 83, is an exploded, perspective view of a fifth alternative embodiment of a radio/CD player featuring an "H" shaped case wherein CD player mounting brackets comprise sidewalls of the case which self-engage with top and bottom panels to effect closure of the case;

FIG. 84, is a simplified cross-sectional view of the radio/CD player assembly of FIG. 83 illustrating the mounting of the PCB and the CD player within the case;

FIG. 119, is an inverted, front-right perspective view of the radio/CD player of FIGS. 97-114, as fully assembled;

FIG. 120, is a perspective view of the back side of the trim plate assembly of the prior art radio/CD player illustrated in FIG. 1, illustrating the surface details thereof;

FIG. 121, is a perspective view from the outside of a front plate of a radio/CD player similar to that described hereinabove, illustrating three light pipes integrally molded within the front plate, including a plurality of outwardly directed integral extensions which, in application, register with devices of an associated trim plate assembly (not illustrated);

FIG. 122, is a perspective view of the inside surface details of the front plate of FIG. 121;

FIG. 123, is a front plan view of the outside of the front plate of FIG. 121;

FIG. 124, is a perspective view of the outside surface of the front plate of FIG. 121, with the three light pipes removed;

FIG. 125, is a perspective view of the outside surface details of the three light pipes as removed from the front plate, but retaining their original juxtaposition;

FIG. 126, is a perspective view of the inside surface details of the three light pipes as removed from the front plate, but retaining their original juxtaposition;

FIG. 127, is a broken, perspective view of the cockpit area of an automobile, illustrating an instrument panel mounted prior art entertainment system interconnected with a personal music device (in solid line) through a front panel auxiliary input, and an alternative personal music device (in phantom) through a glove box configured pig tail;

FIG. 128, is a front-right perspective view of an alternative embodiment of a radio/CD player embodying another aspect of the present invention, including an (open) media drawer configured in the front trim plate assembly with a personal music device stored within the drawer and operatively interconnected with the host radio/CD player system via a coupling cable;

FIG. 129, is a side cross-sectional view of the radio/CD player of FIG. 128, with the drawer open and the personal music device being installed/removed;

FIG. 130, is a side cross-sectional view of the radio/CD player of FIG. 128, with the drawer fully closed and the personal music device installed inside;

Figure 30:
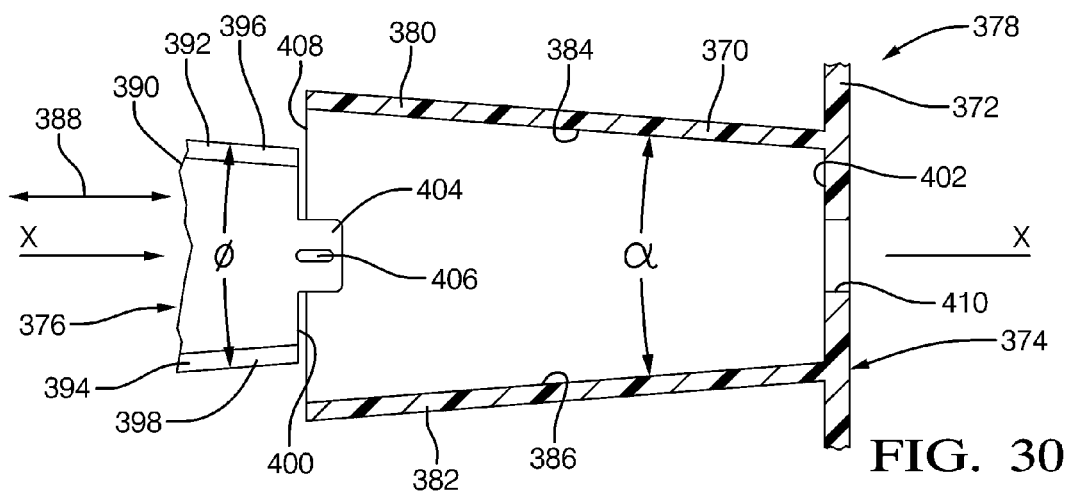
FIG. 30, is a fragmentary, cross-sectional view of the initial positioning of a CD mechanism bracket with respect to a support shelf integrally formed within the case.
Figure 31:
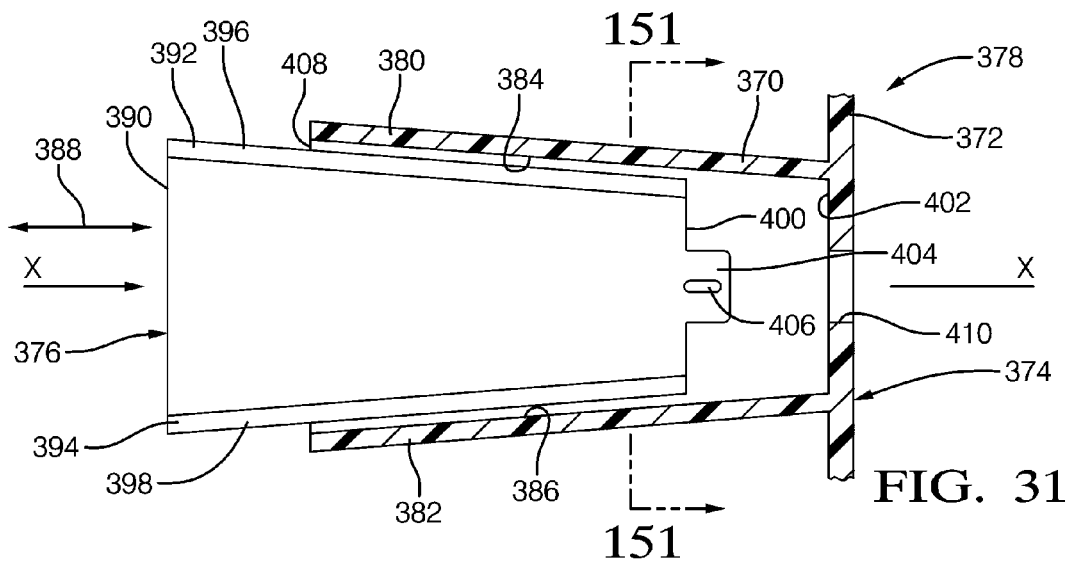
FIG. 31, is a fragmentary, cross-sectional view of the CD mechanism in an intermediate position with respect to the support shelf during its installation.
Figure 32:
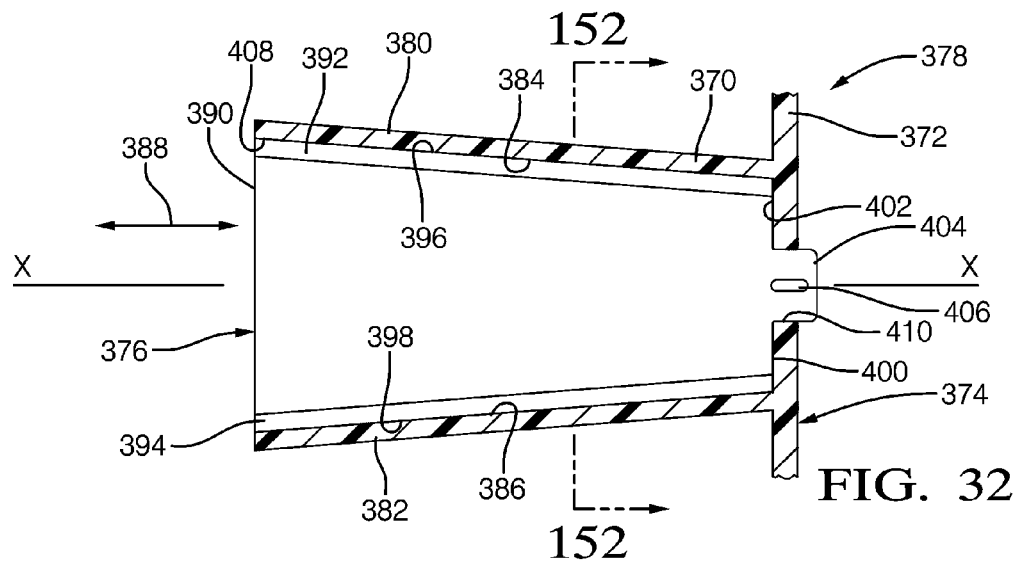
FIG. 32, is a fragmentary, cross-sectional view of the CD mechanism in its final installed position with respect to its associated support shelf.
Figure 128:
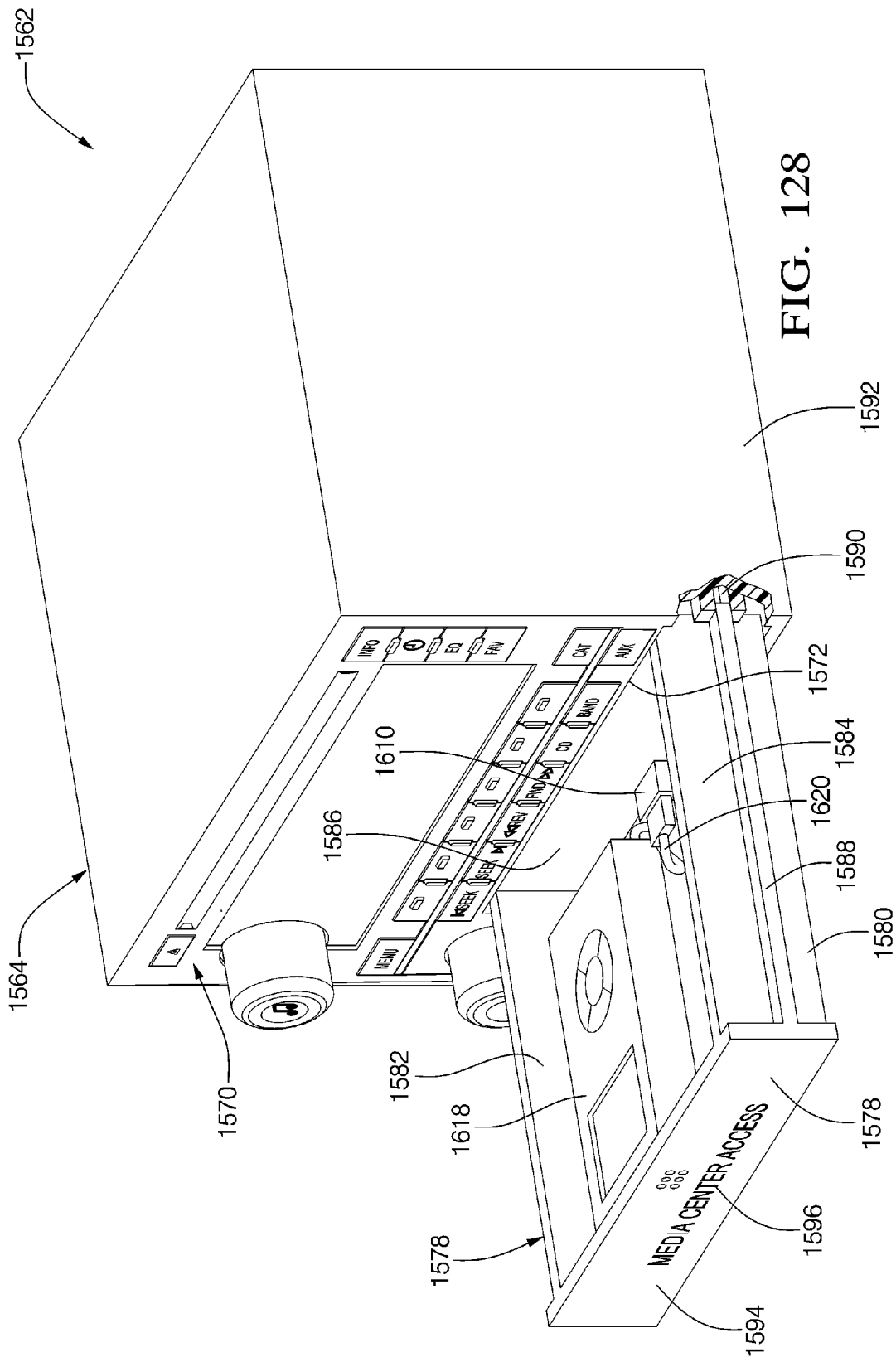
Figure 129:
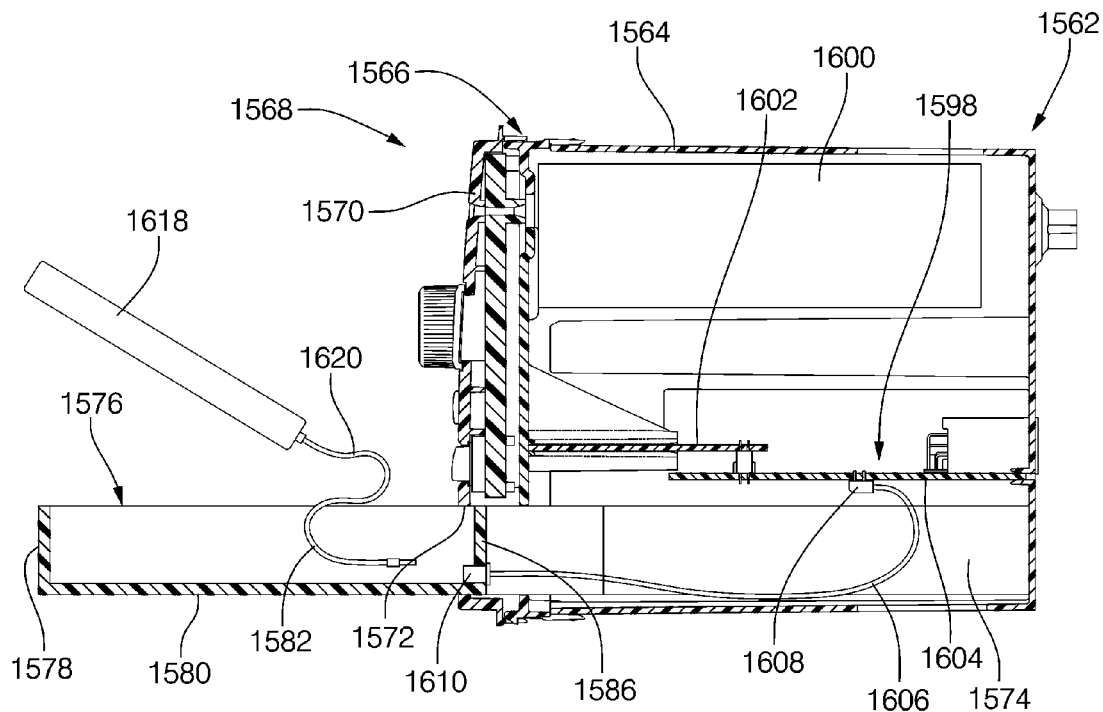
Figure 130:
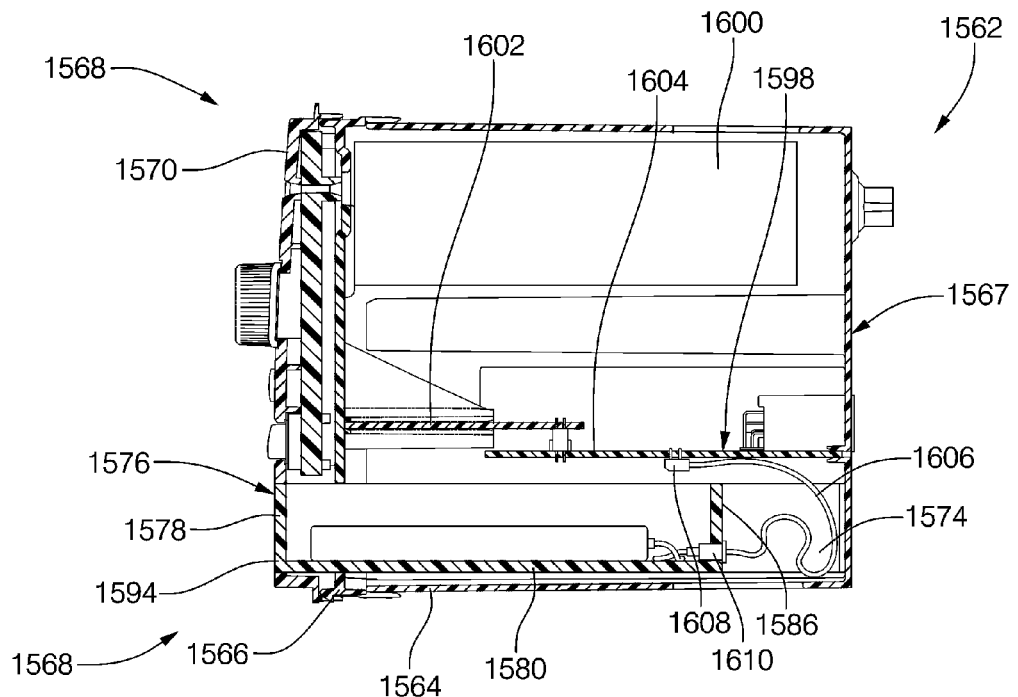
Figure 131:
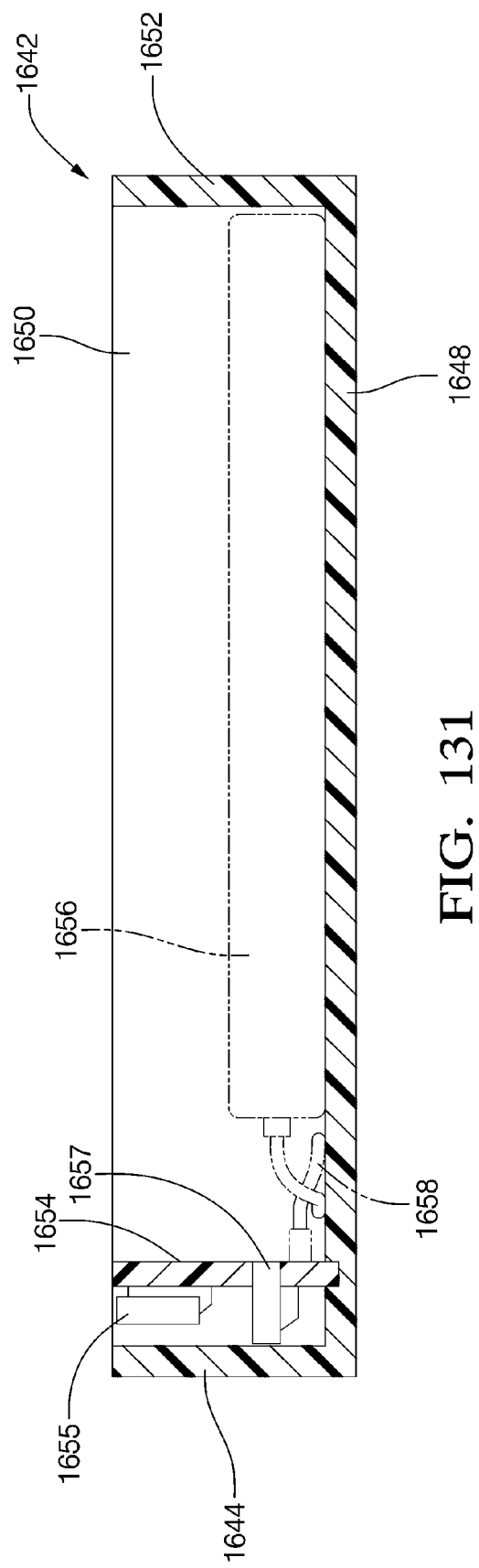
Figure 132:
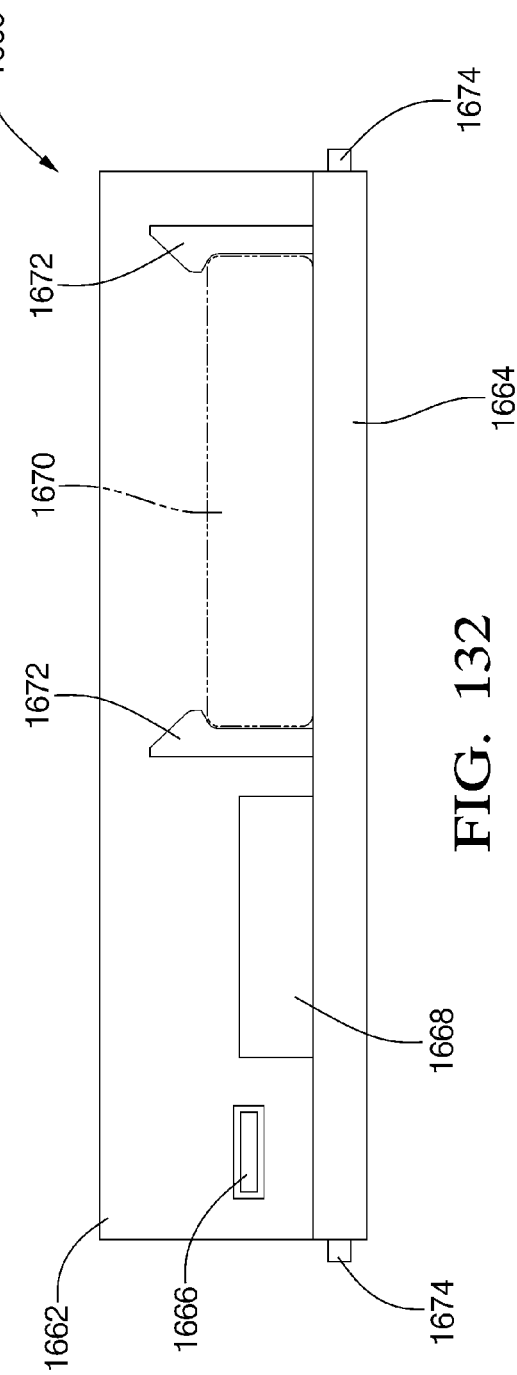
Figure 133:
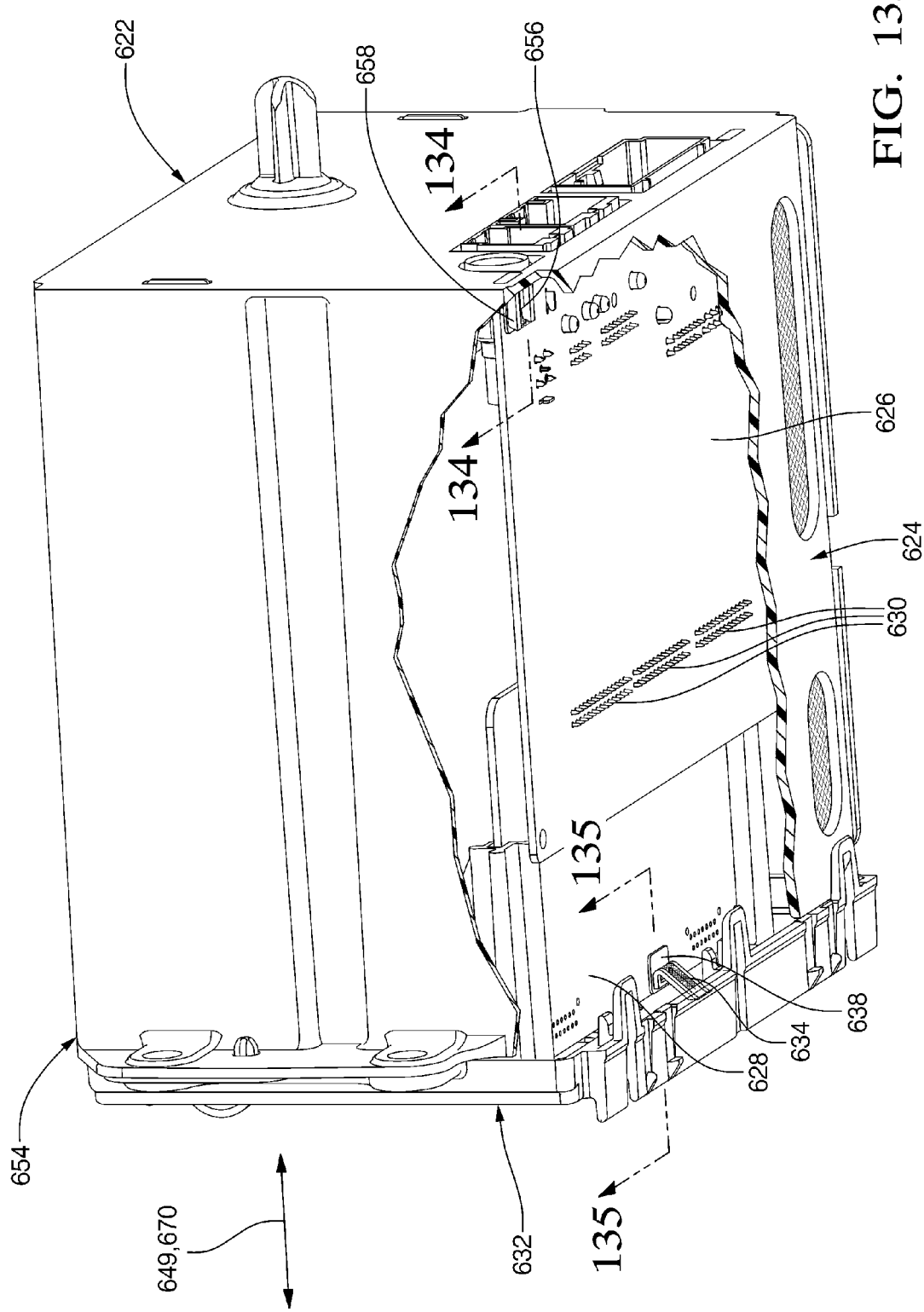
Figure 134:
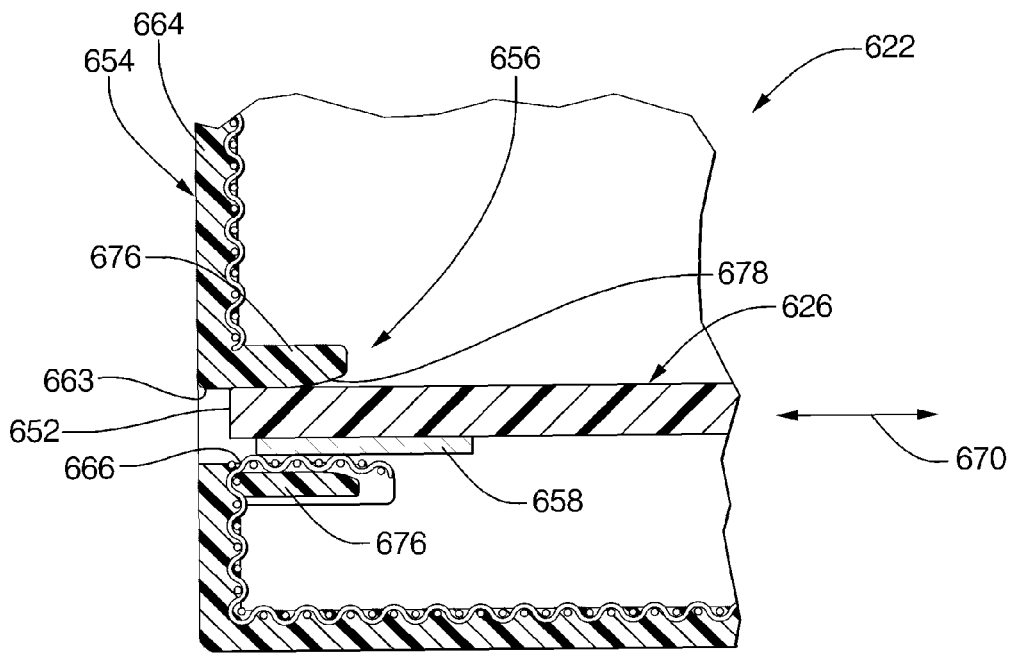
Figure 135:
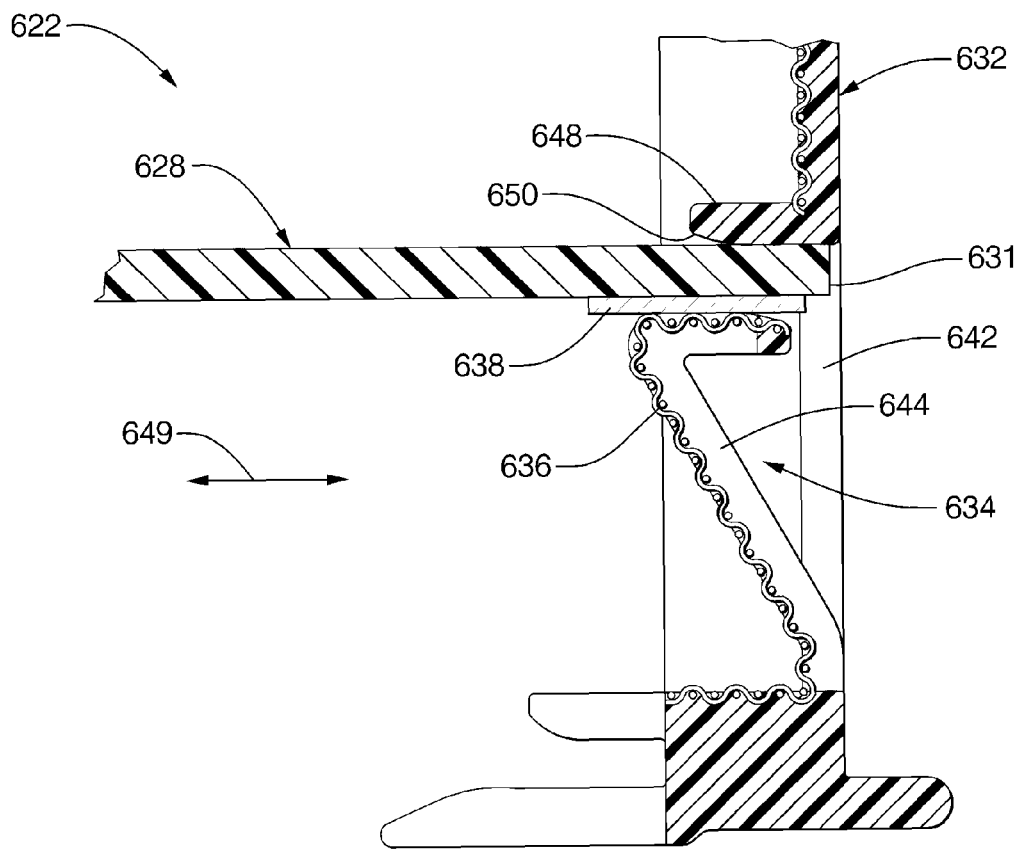
Figure 136:
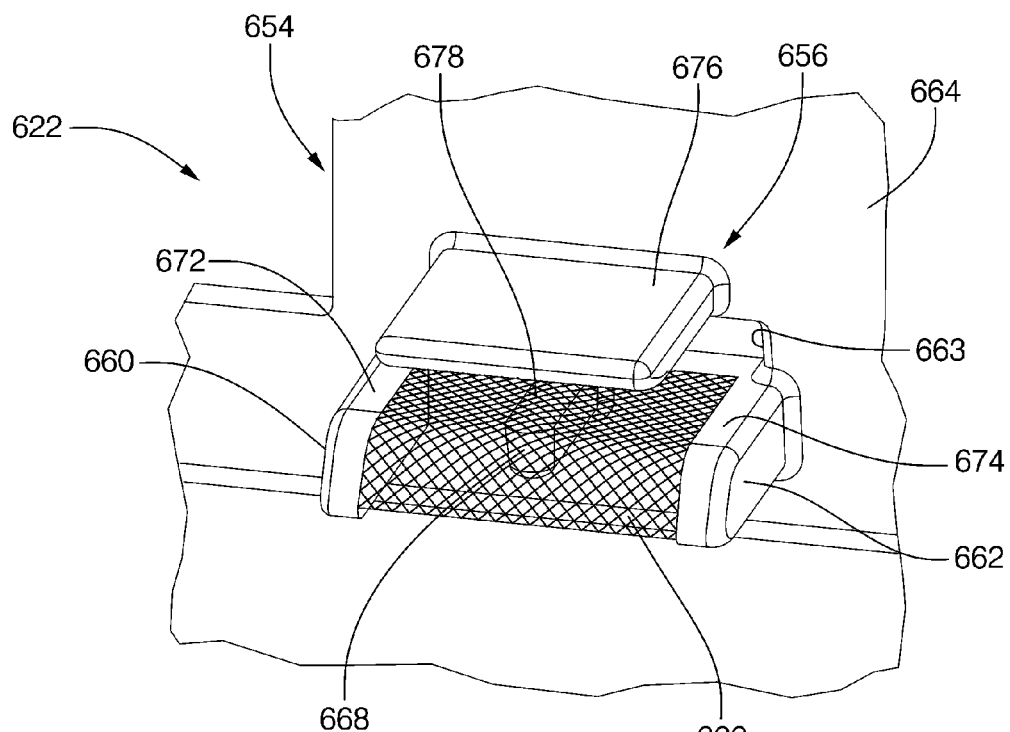
Figure 137:
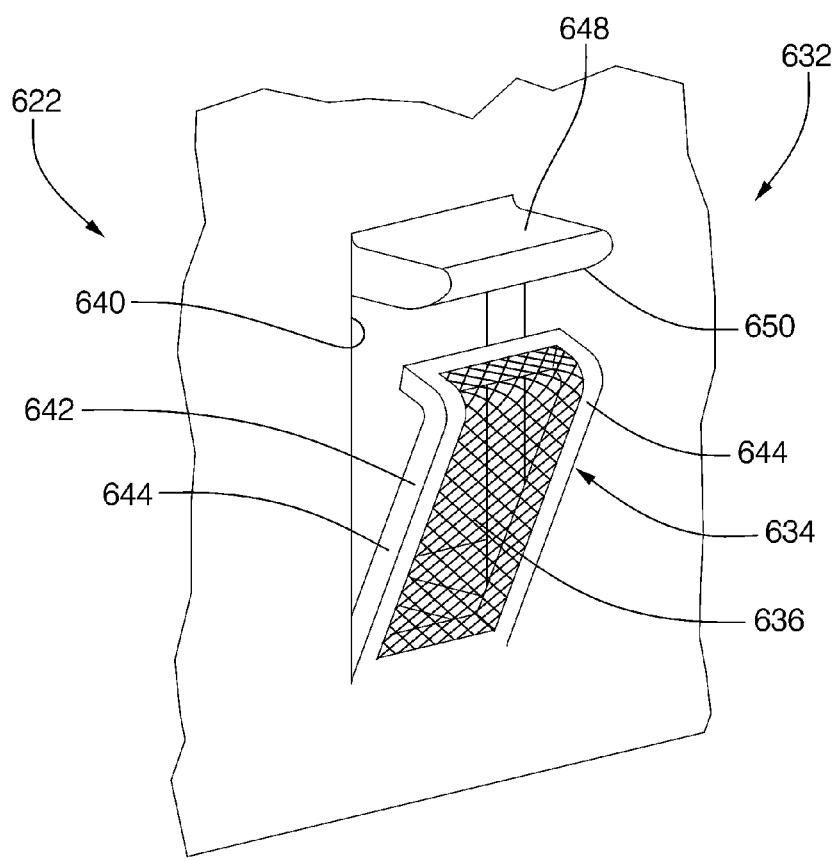
Figure 138:
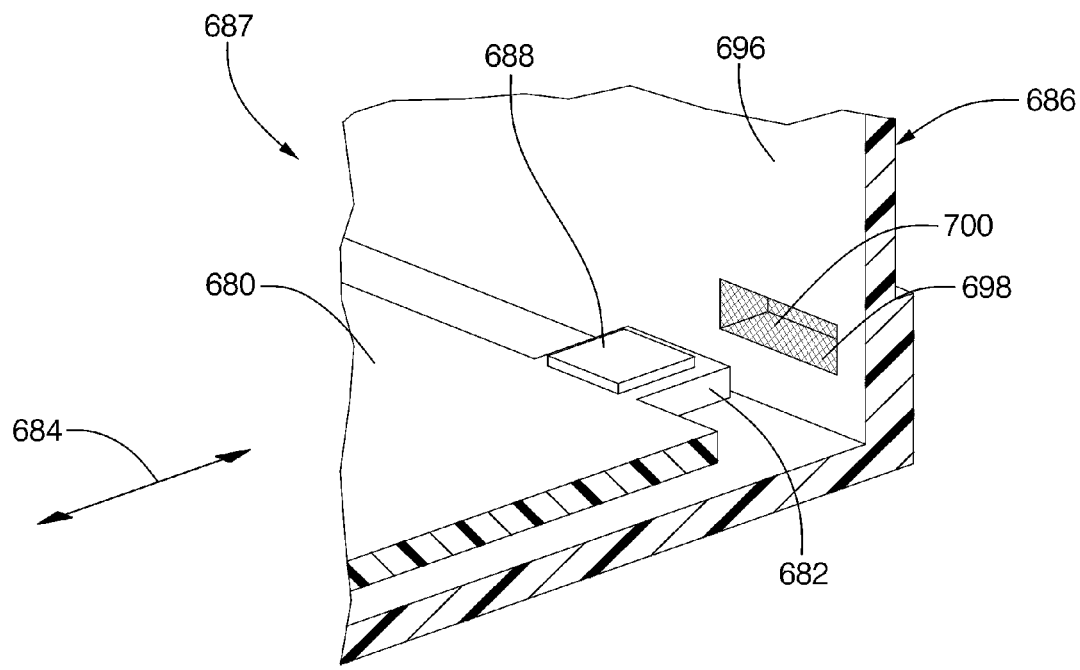
Figure 139:
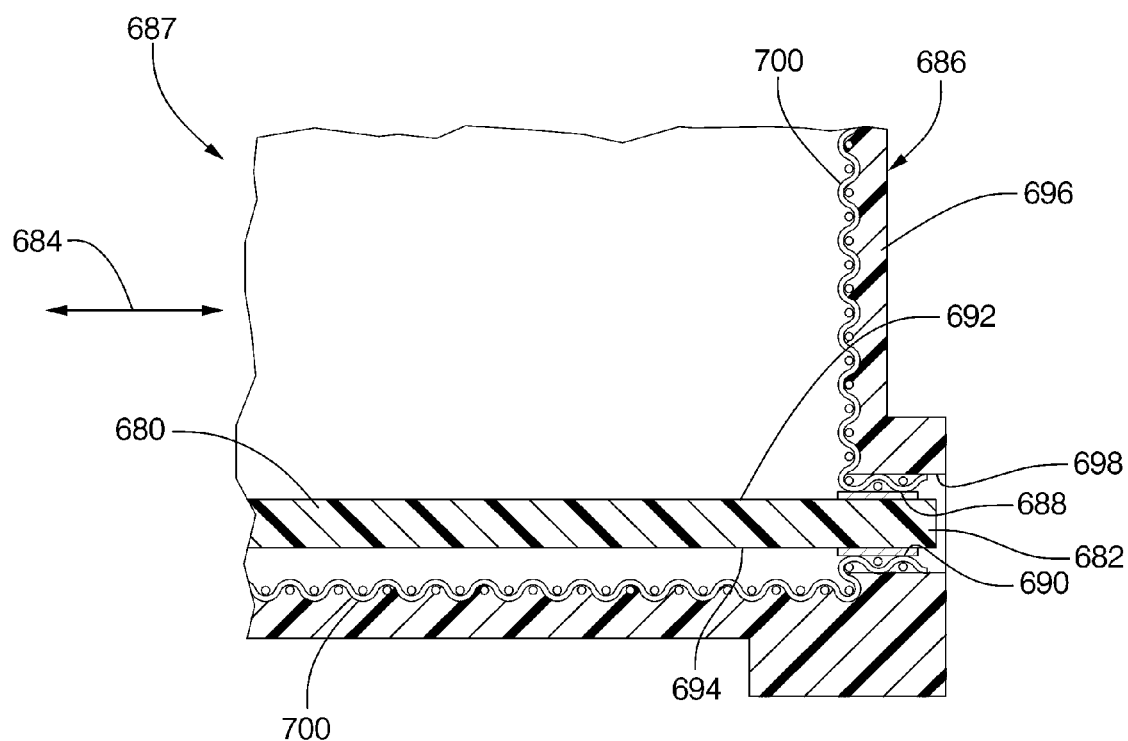
Figure 140:
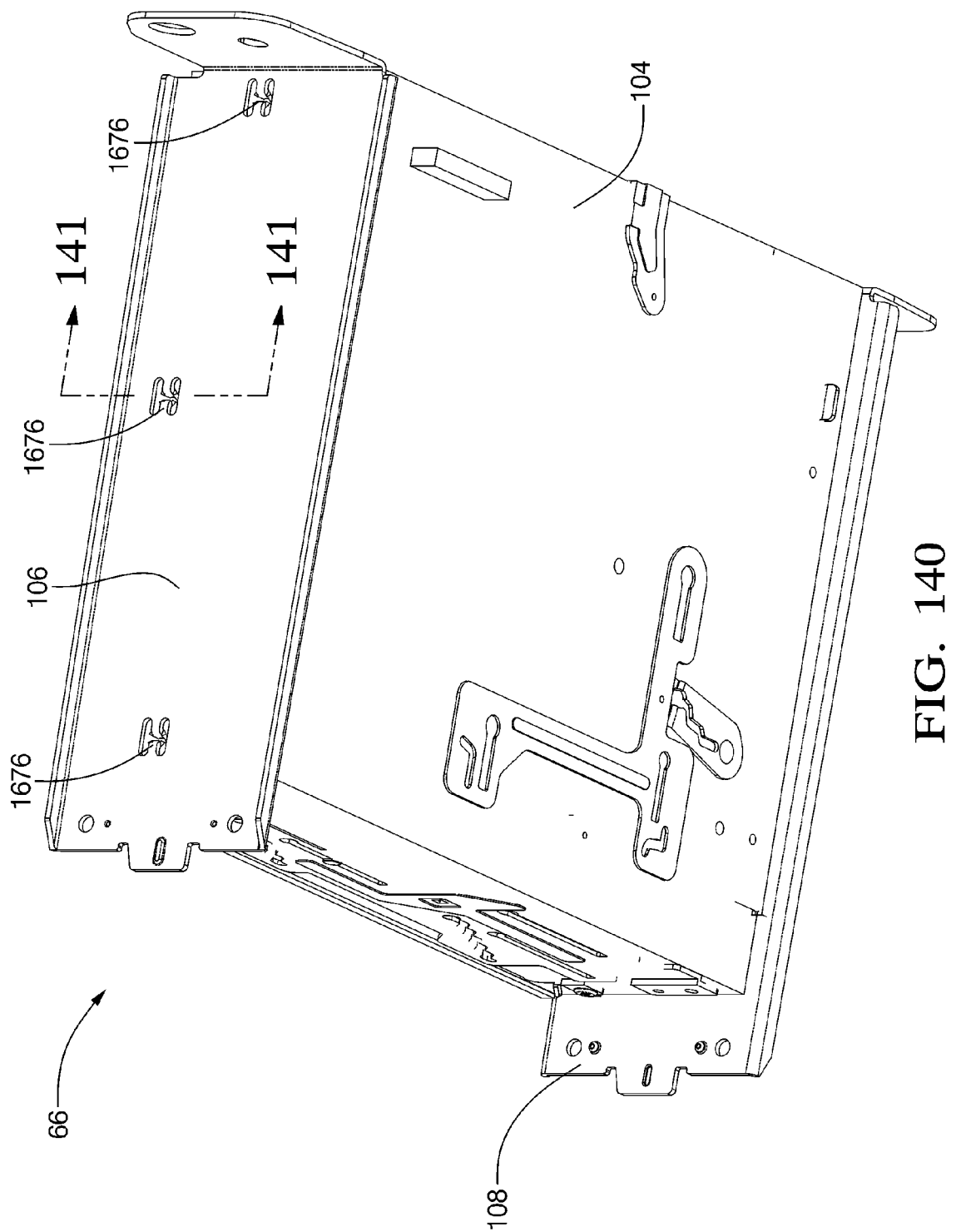
Figure 144:
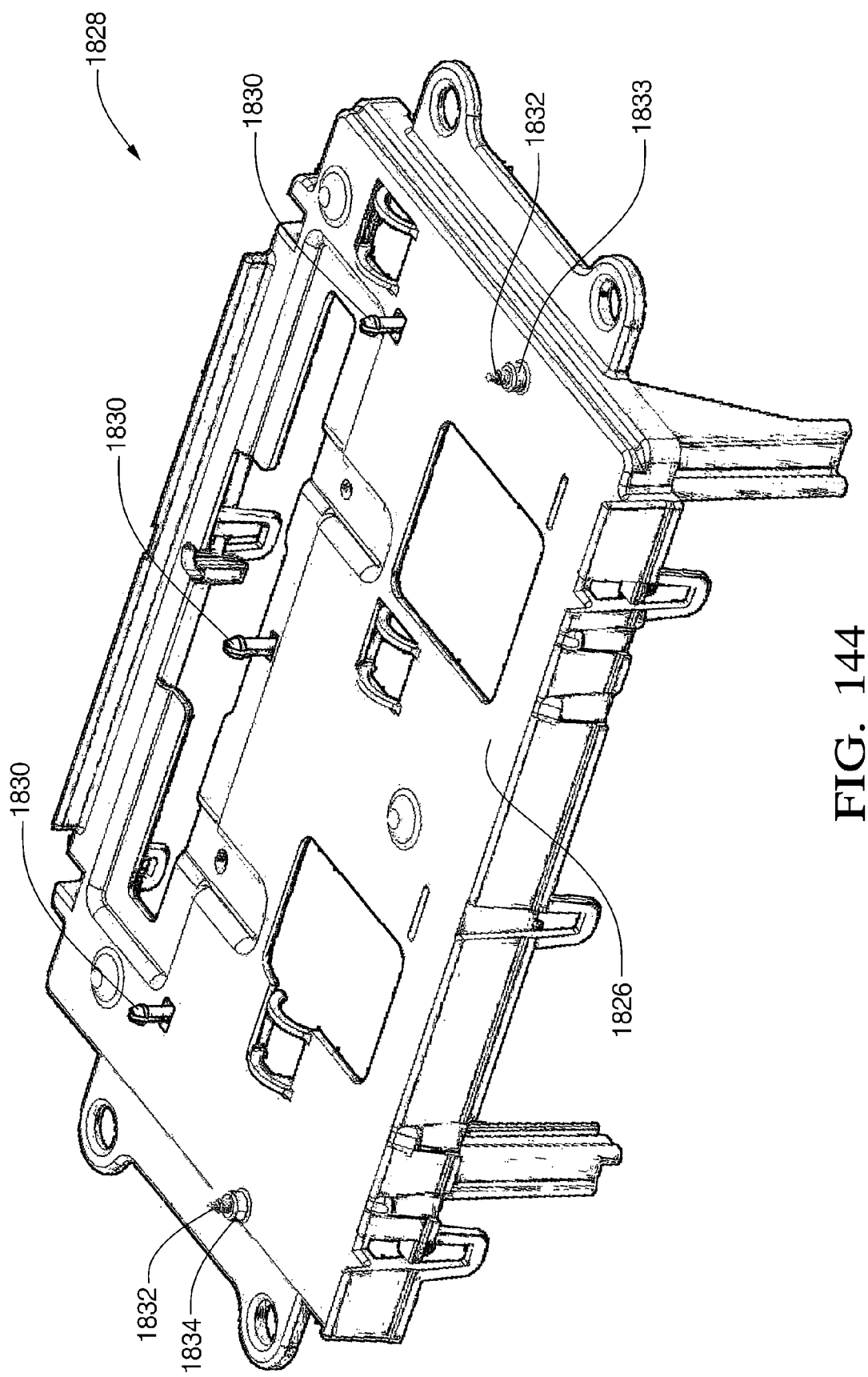
Figure 145:
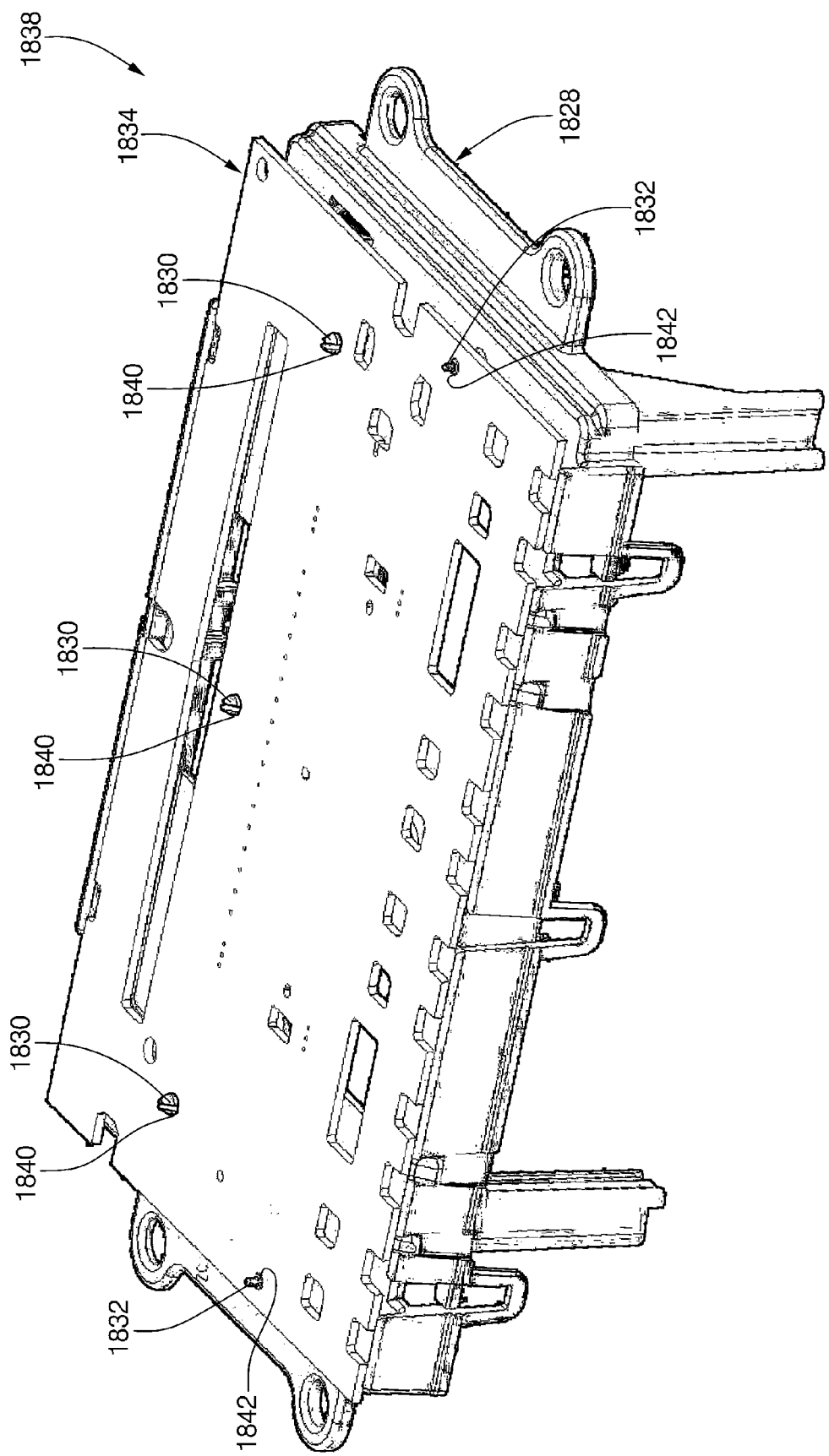
Figure 146:
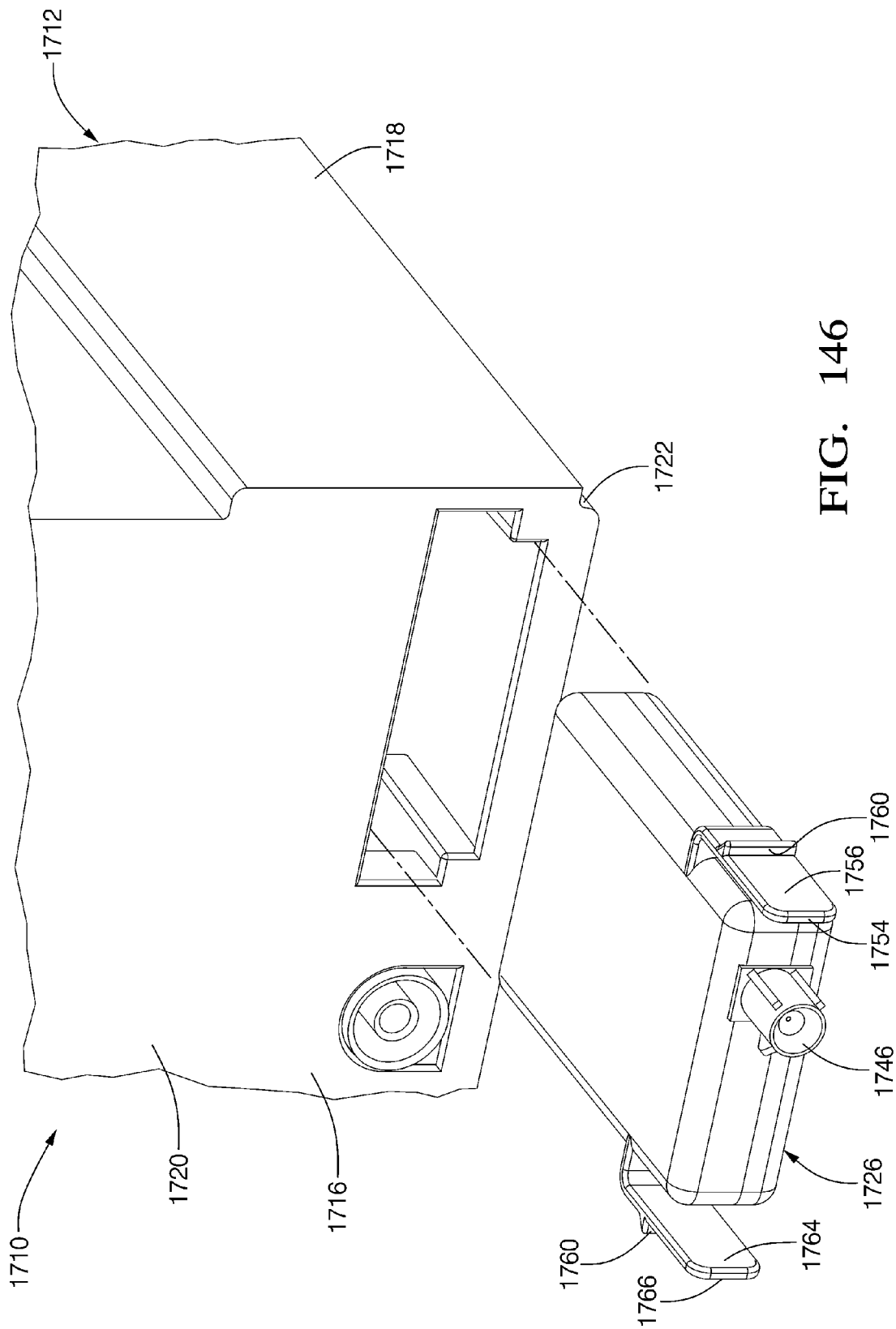
Figure 147:
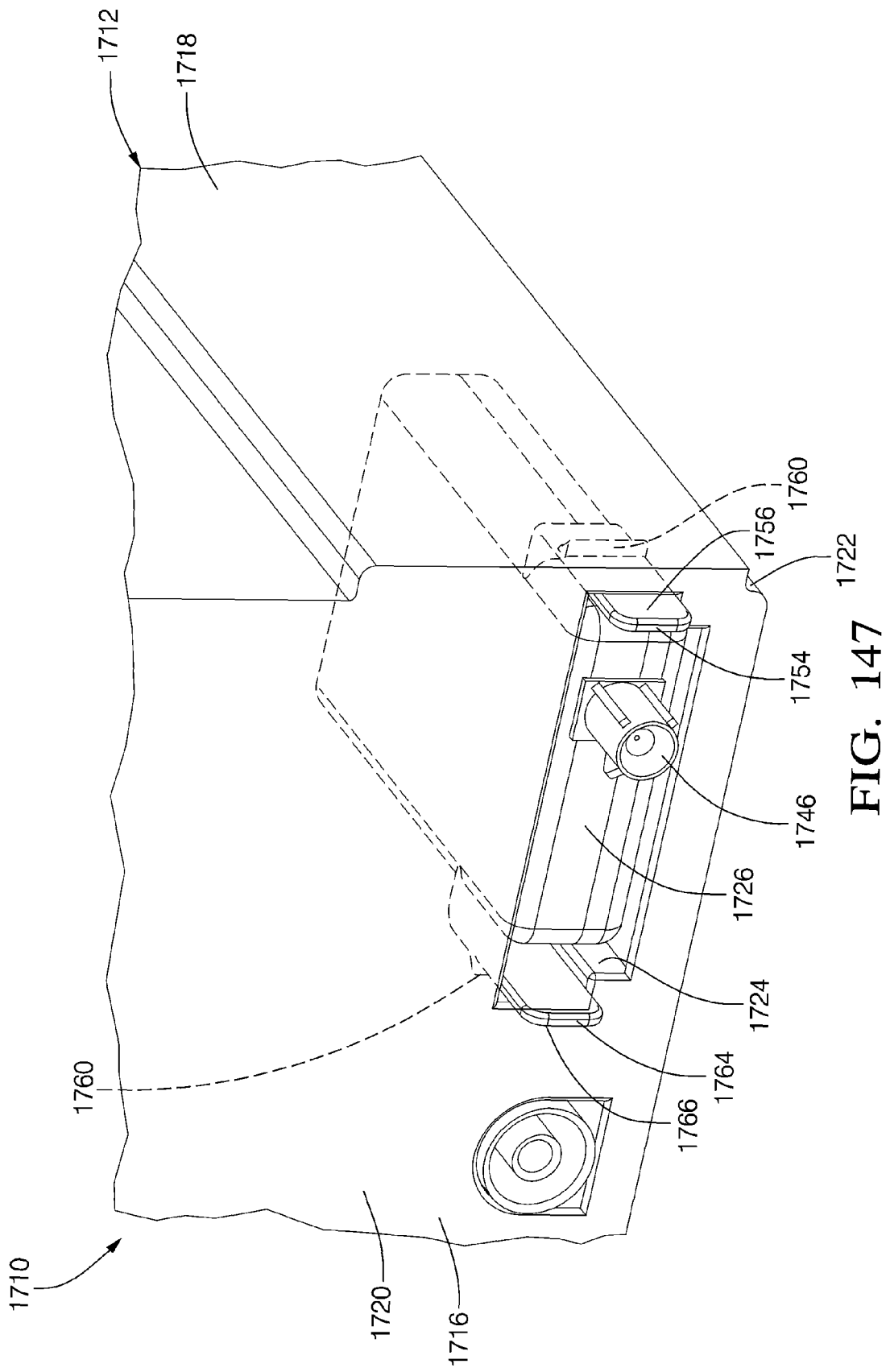
Figure 148:
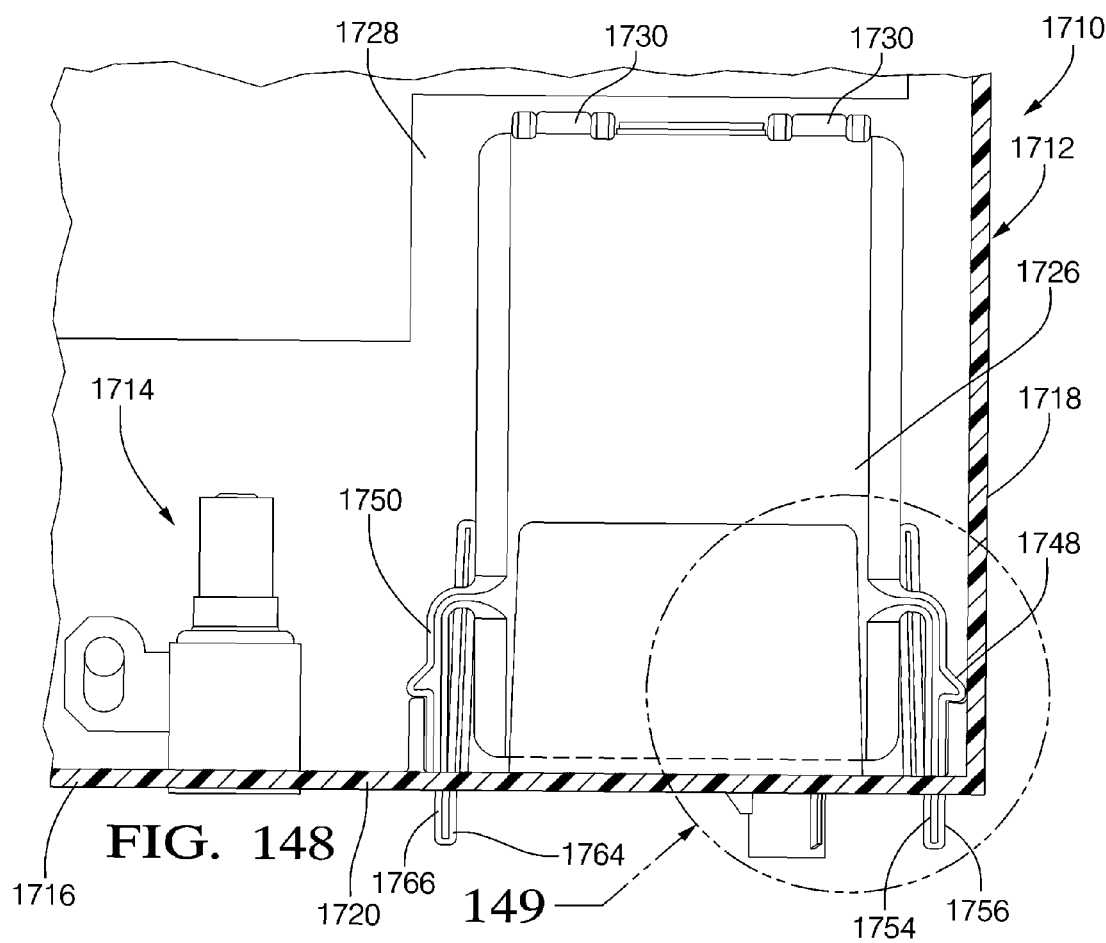
Figure 149:
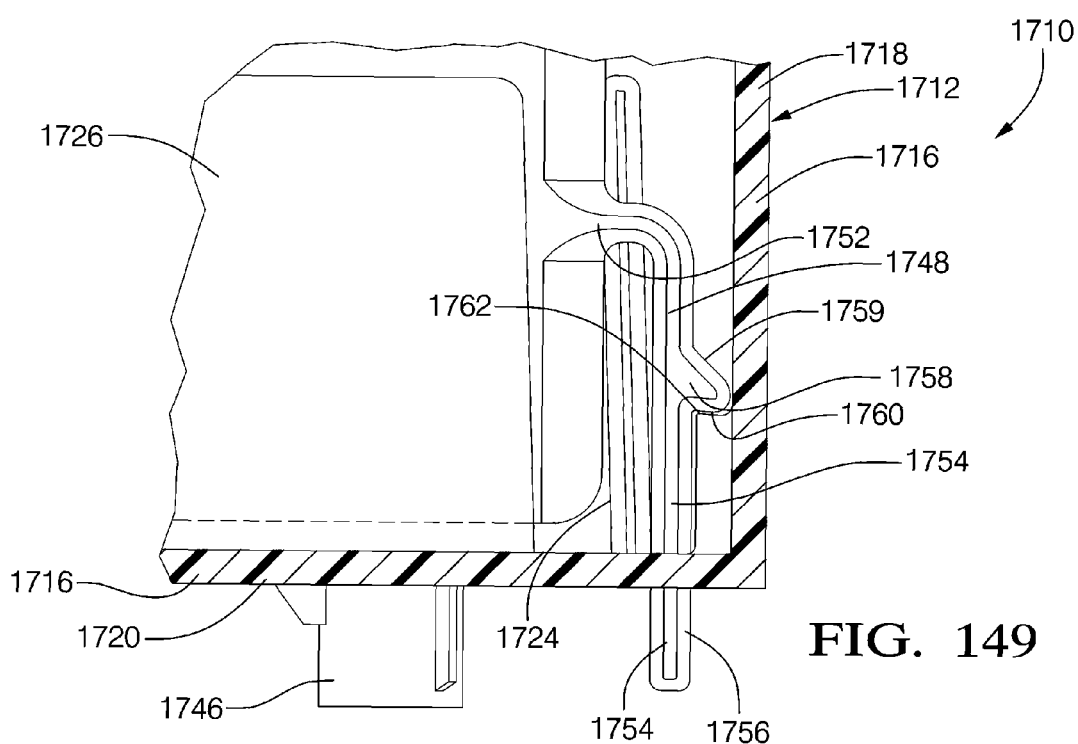
Figure 150:
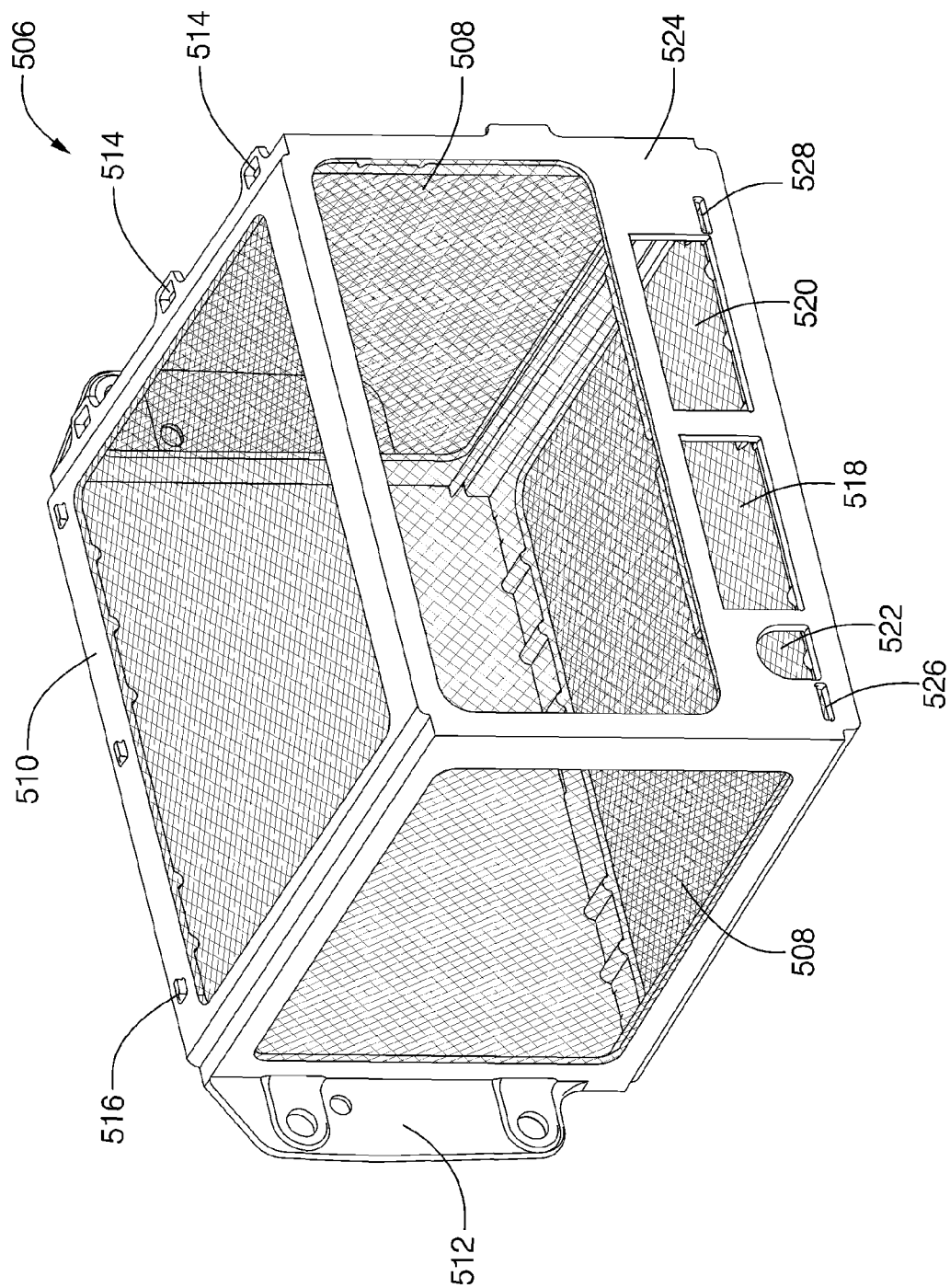
Figure 151:
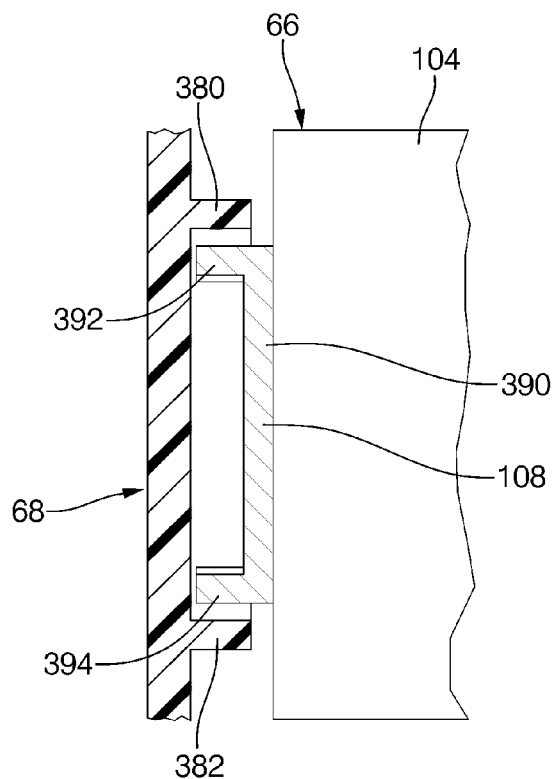
Figure 153:
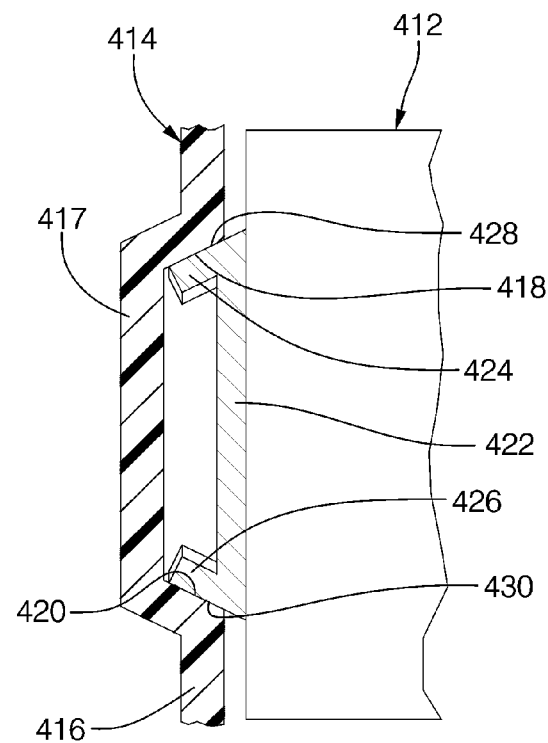
Figure 152:
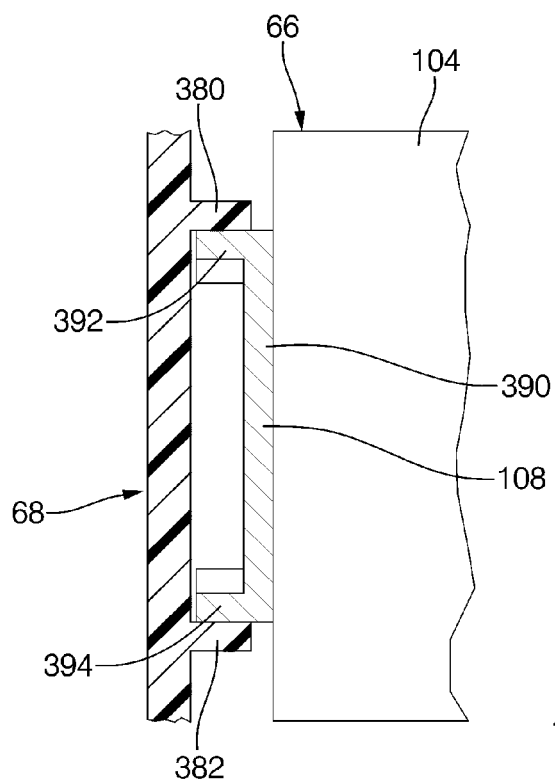
Figure 154:
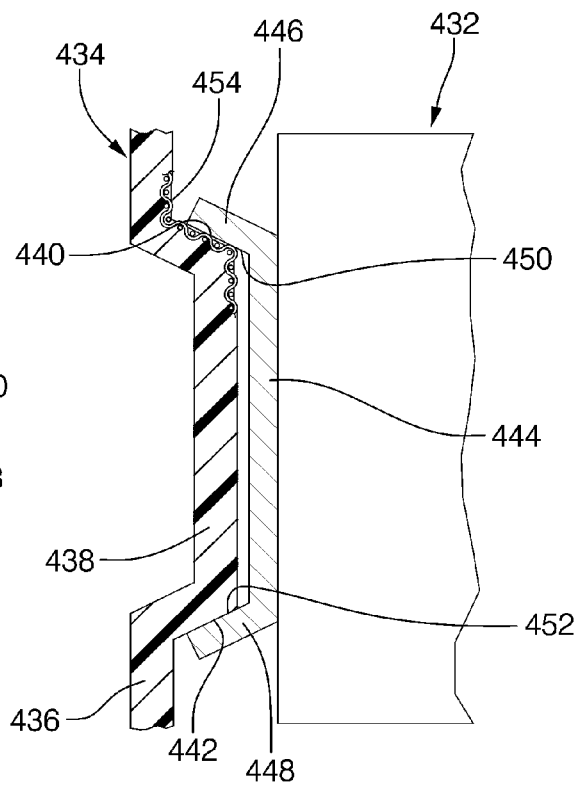
Figure 155:
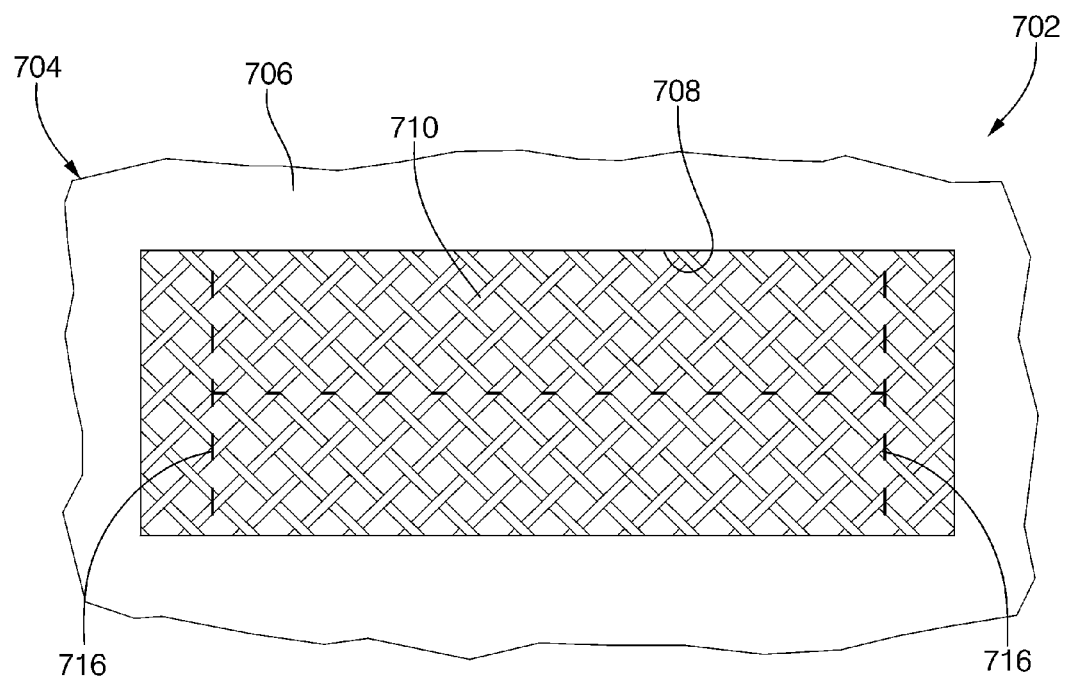
Figure 156:
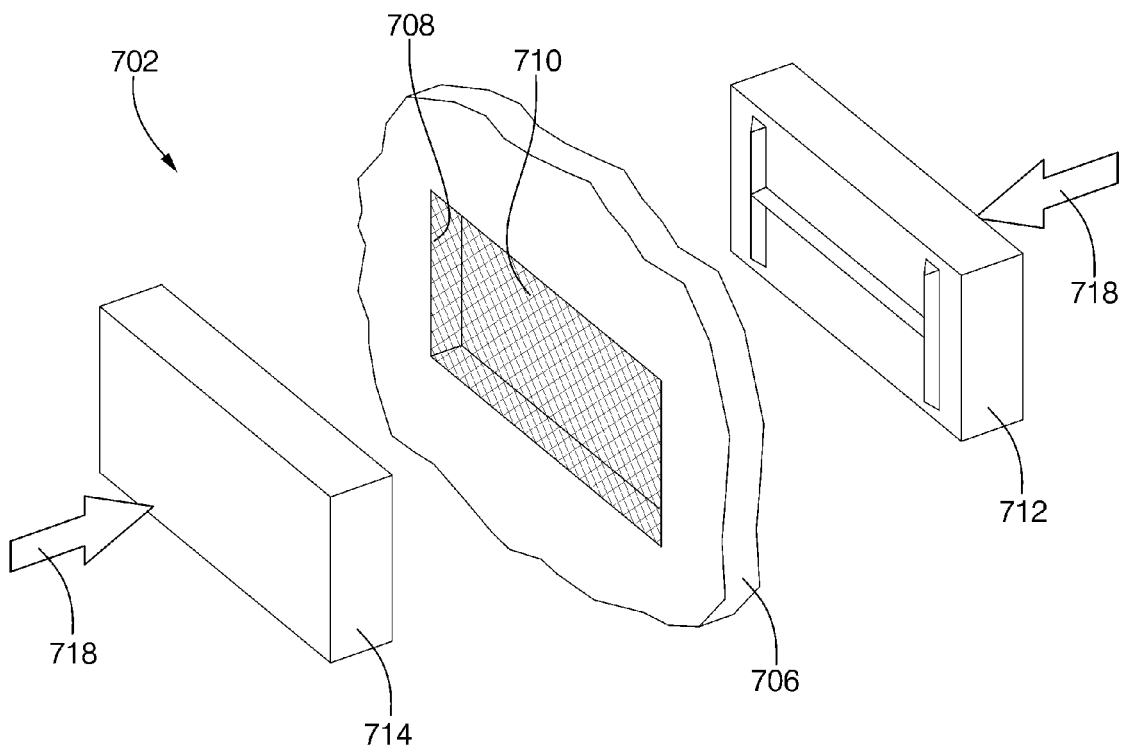
Figure 157:
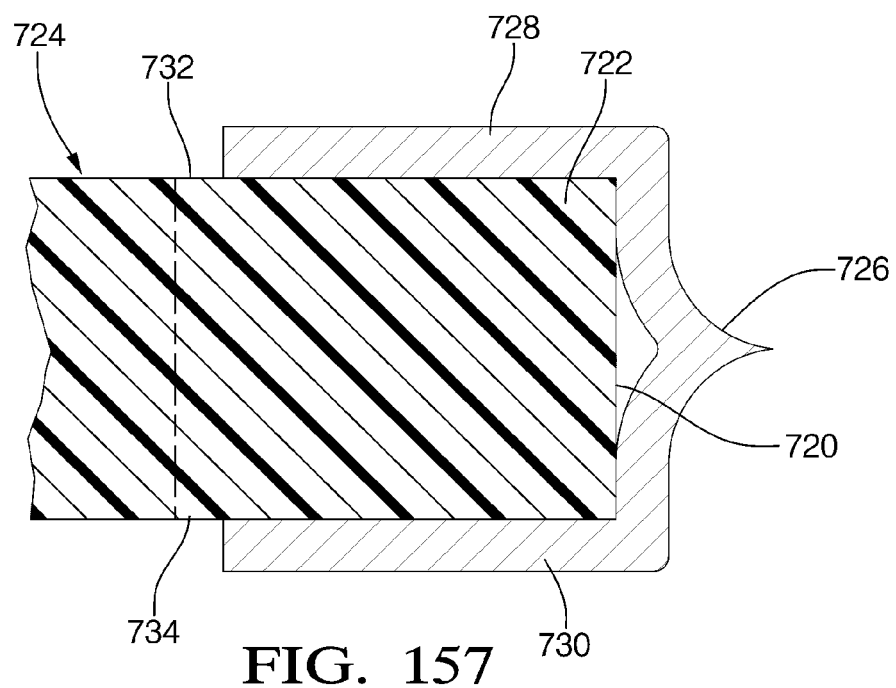
Figure 158:
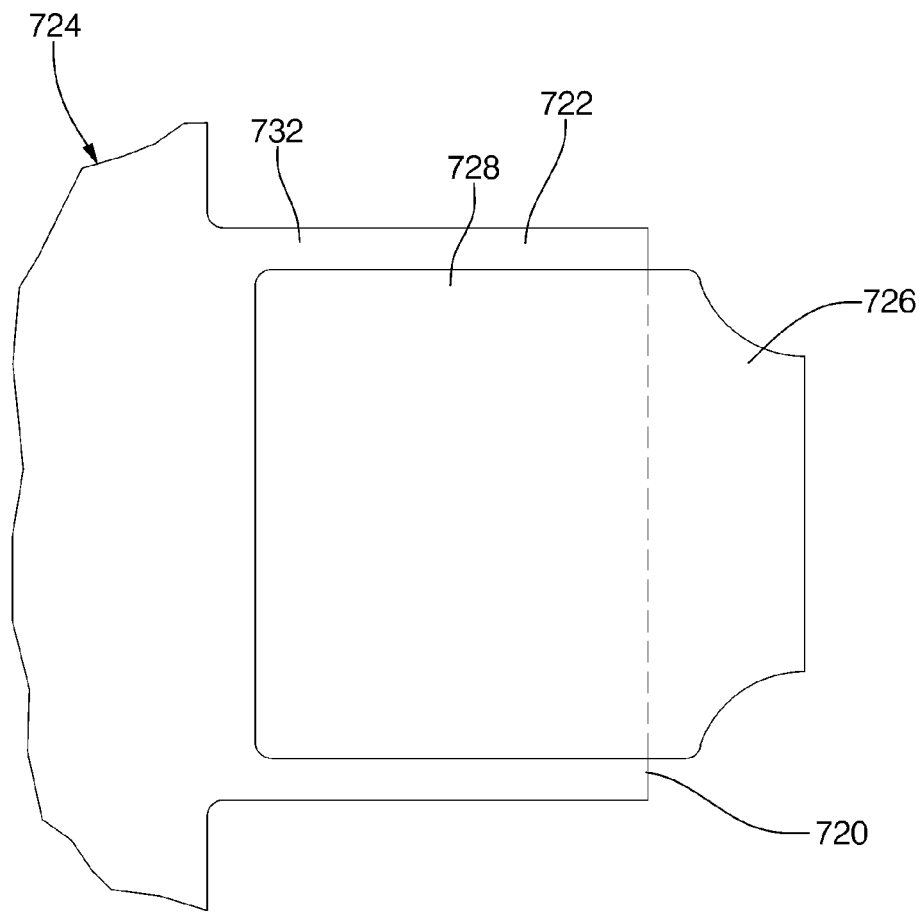
Figure 159:
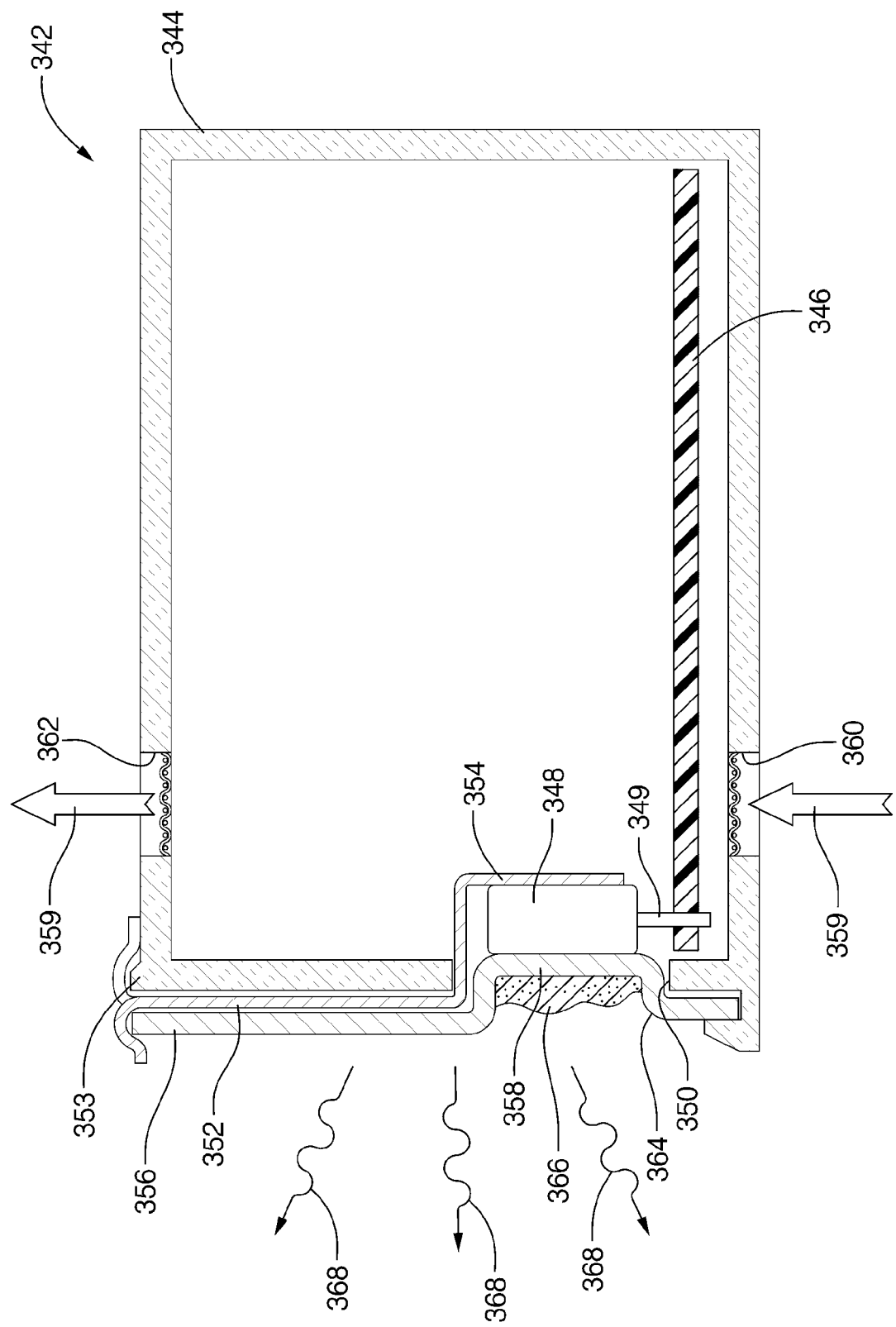
Figure 160:
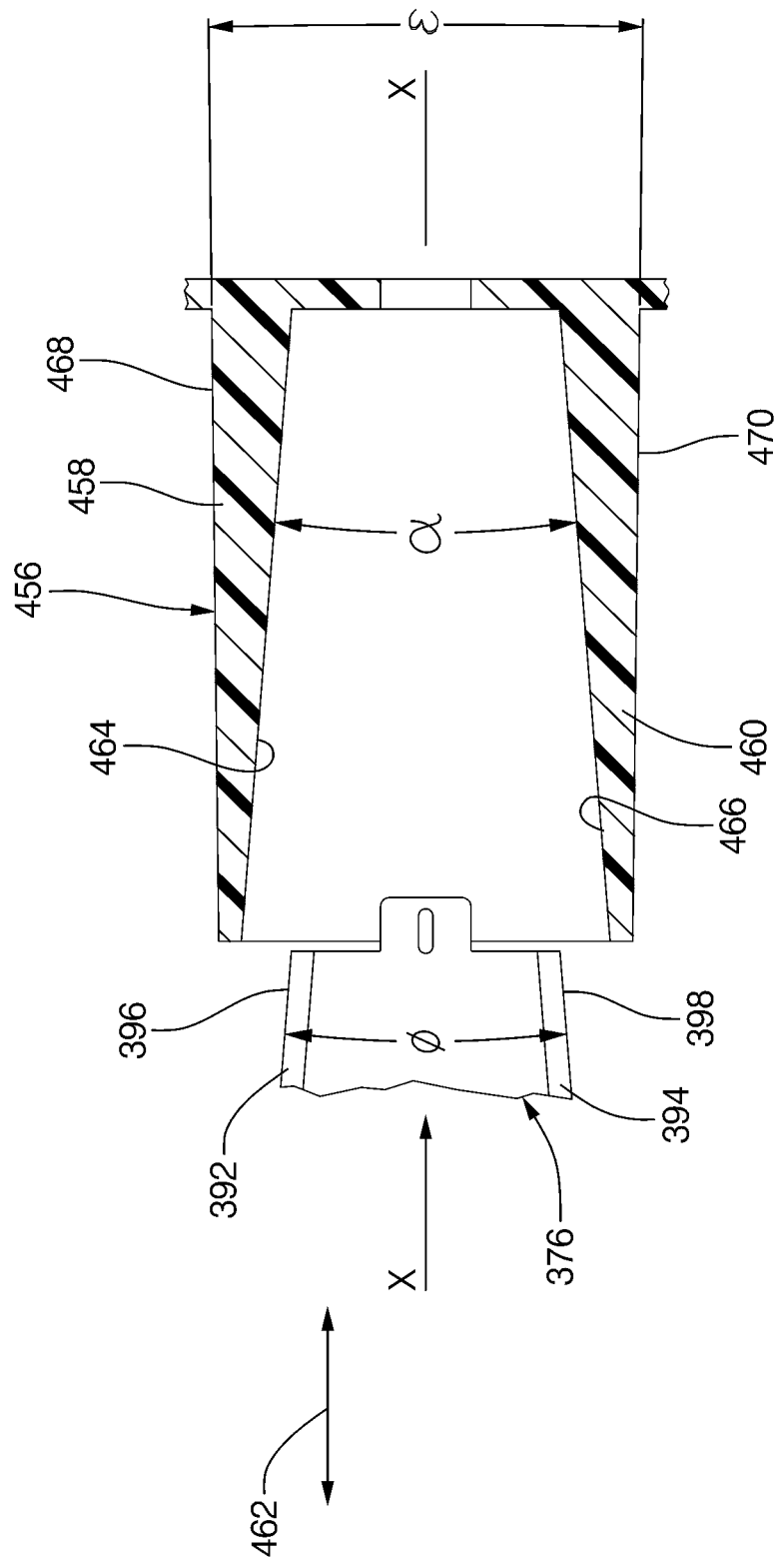
Figure 161:
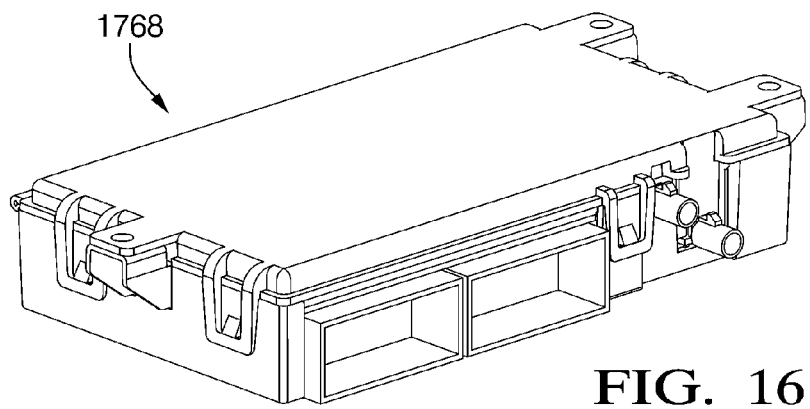
Figure 162:
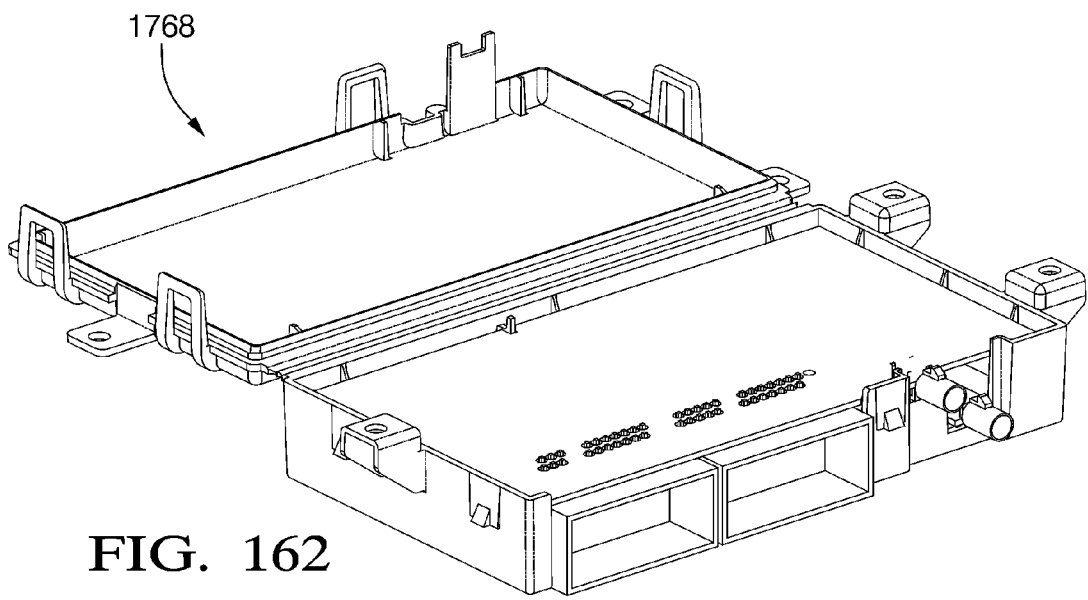
Figure 163:
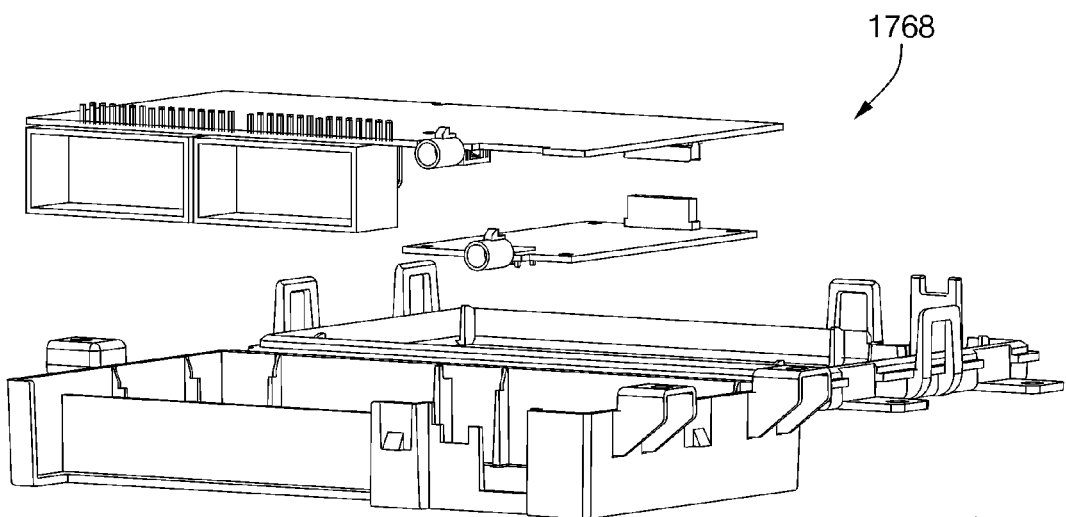
Figure 164:
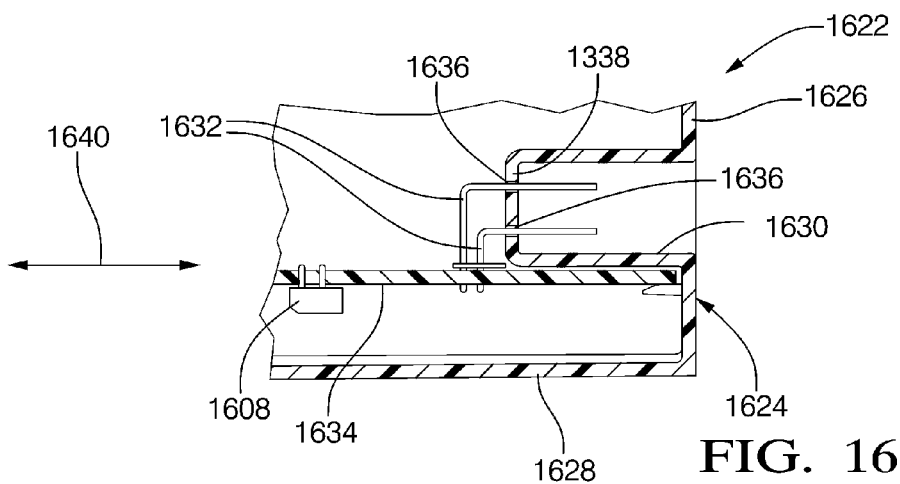
Figure 165:
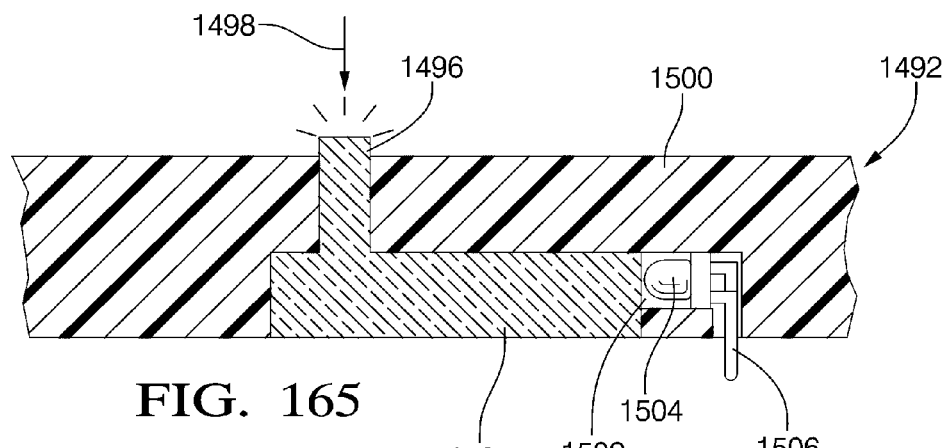
Figure 166:
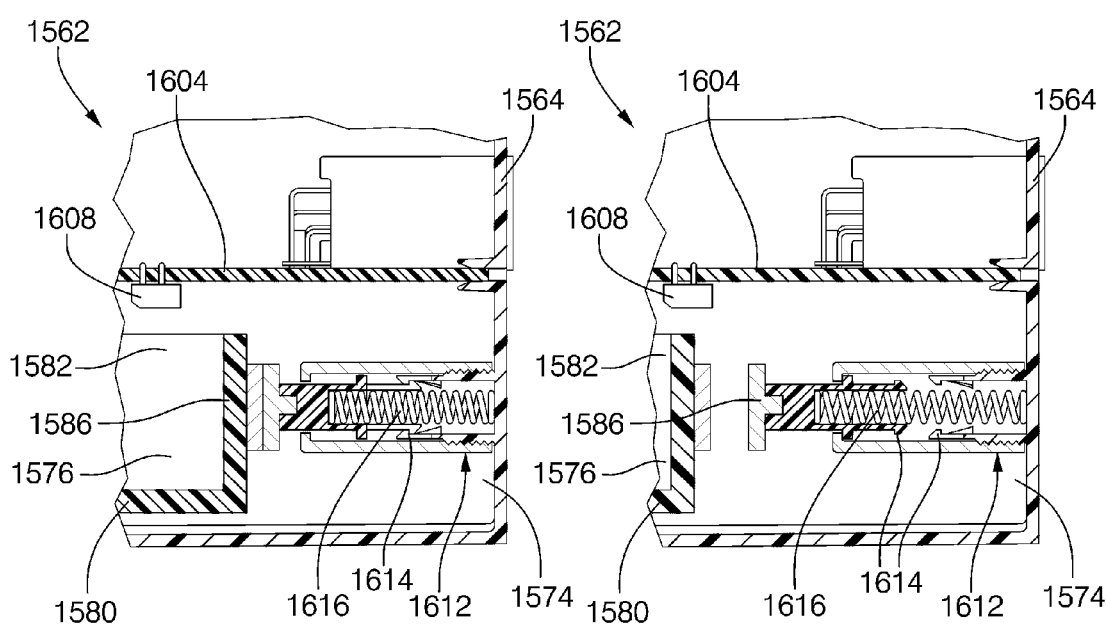
Figure 170:
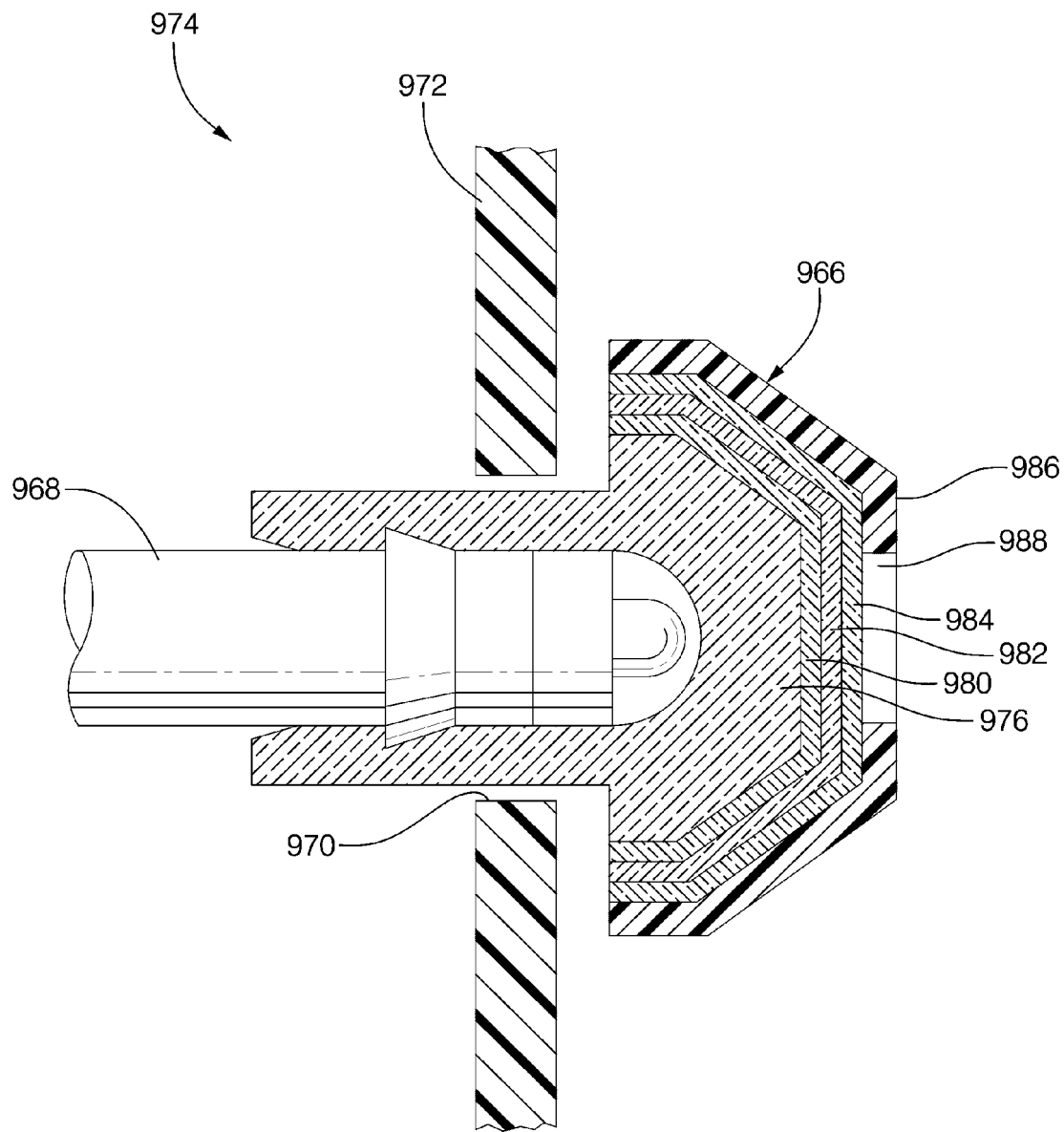

FIG. 131, is a side, cross-sectional view of a drawer assembly similar to that of FIGS. 128-130, but with the addition of an interface electronics package in the front portion of the media drawer to facilitate electrical interconnection with the radio/CD player assembly;

FIG. 132, is a rear plan view of a media platform for replacing the drawer of the radio/CD player of FIG. 128, the media platform including an opening/closing guide system and media hold-down features;

FIG. 133, is a broken, bottom-rear perspective view of an audio system assembly embodying an alternative embodiment of the present invention illustrating internal PCB front and rear edge self-grounding with integral features of the audio system housing assembly;

FIG. 134, is a broken, cross-sectional view, on an enlarged scale, of the rear edge of the PCB of FIG. 133 self-engaging and self-grounding with exposed electrically conductive shield and guide tangs integrally formed with the audio system housing assembly;

FIG. 135, is a broken, cross-sectional view, on an enlarged scale, of the front edge of the PCB of FIG. 133 self-engaging and self grounding with exposed electrically conductive shield and guide tangs integrally formed with the audio system housing assembly;

FIG. 136, is a broken, rear facing perspective view of the exposed electrically conductive shield and guide tangs of FIG. 134, with the PCB removed;

FIG. 137, is a broken, forward facing perspective view of the exposed electrically conductive shield and guide tangs of FIG. 135, with the PCB removed;

FIG. 138, is a broken, perspective, cross-sectional view of an alternative approach to self-grounding a PCB, wherein a rearwardly directed extension of the PCB containing grounding pads on the top or bottom (or both) surfaces thereof registers with an opening formed in the rear wall of the case exposing electrically conductive screen;

FIG. 139, is a broken, cross-sectional view of the alternative embodiment of FIG. 138, with the PCB is in its installed design position wherein the extension has pierced the exposed screen and established electrical connection between the grounding pads and the screen;

FIG. 140, is a bottom-rear perspective view of a CD player subassembly affixed to opposed left and right mounting brackets via integral squirts;

FIG. 141, is a broken, cross-sectional view, on an enlarged scale, of one of the squirts taken on line 139-139 of FIG. 140, as it is manually applied (as illustrated in phantom) within an adjacent opening in the CD player subassembly;

FIG. 142, is a broken, perspective view, on an enlarged scale, of one of the squirts of FIG. 140;

FIG. 143, is a top plan view of an alternative embodiment of one of the squirts of FIG. 140;

FIG. 144, is a perspective view of the front surface of the audio system housing assembly closure member illustrating integral locating and retention features for a trim plate assembly PCB;

FIG. 145, is a perspective view of the front surface of the audio system housing assembly closure member of FIG. 144, with the trim plate assembly PCB installed;

FIG. 146, is a rear-left, broken perspective view of an alternative embodiment of a lightweight audio system featuring a screwless, plug-in module for enabling the radio portion of the system to be (re)configured to accommodate any known satellite radio provider or hardware upgrade;

FIG. 147, is a perspective view of the audio system of FIG. 146 with the plug-in module (illustrated partially in phantom) in the fully installed position;

FIG. 148, is a broken, cross-sectional view of the audio system of FIG. 147, illustrating the electrical and mechanical interface of the module with the host audio system case;

FIG. 149, is a broken, cross-sectional view of a portion of FIG. 148, on an enlarged scale, illustrating the structural details of the screwless module retention features;

FIG. 150, is a rear-right perspective view of a composite case of an alternative design automotive audio system which has wall panels formed nearly exclusively of electrically conductive screen supported along the respective edges thereof by a framework of a molded polymer based material;

FIG. 151, is a cross-sectional view taken on lines 151-151 of FIG. 31, illustrating the juxtaposition of an associated pair of guideways formed by a housing case and guide members formed by a CD changer mounting bracket with the bracket partially installed within the case;

FIG. 152, is a cross-sectional view taken on lines 152-152 of FIG. 32, illustrating the juxtaposition of the associated pair of guideways and guide members with the bracket fully installed within the case;

FIG. 153, is a cross-sectional view of an alternative configuration of the guideways/guide members of FIGS. 151 and 152, with the respective contacting surfaces angularly converging;

FIG. 154, is a cross-sectional view of a second alternative configuration of the guideways/guide members of FIGS. 151 and 152, with the respective contacting surfaces diverging and an electrical grounding connection established therebetween;

FIG. 155, is a broken, plan view of the rear case wall screened opening of FIG. 138, on an enlarged scale, with the exposed screen having a pattern of perforations formed therein;

FIG. 156, is a broken perspective view of the exposed screen of FIG. 155, prior to formation of the perforations, and its juxtaposition with an aligned pair of punch-type forming dies;

FIG. 157, is a cross-sectional view, on an enlarged scale, similar to FIG. 138, wherein the PCB extension carries a screen piercing tool which is integrally formed with the upper and lower grounding pads;

FIG. 158, is a broken, top view of the integrated grounding pad/piercing tool as carried on a PCB extension;

FIG. 159, is a cross-sectional schematic view of a simplified inventive thermal control apparatus similar in many respects to the embodiment of the invention depicted in FIGS. 22-29;

FIG. 160, is a fragmentary, cross-sectional view of the initial positioning of a CD mechanism bracket with respect to an alternative support shelf integrally formed within the case, similar to FIG. 30, with the wall surfaces defining the guideways each tapered on their upper and lower surfaces to provide a drafted condition to enhance injection molding formation of the case;

FIG. 161, is a perspective view of an assembled telematics device for automotive two-way communication/receiver systems;

FIG. 162, is a perspective view of the telematics device of FIG. 161, with the case open to illustrate its one-piece, living-hinge construction;

FIG. 163, is an exploded, perspective view of the telematics device of FIGS. 161 and 162, illustrating the details of internal subassemblies;

FIG. 164, is a broken, cross-sectional view of a portion of the audio system housing case wherein the electrical interface plug includes a connector body which is integrally formed with the housing case;

FIG. 165, is a broken, cross-sectional view of the audio system case closure member/trim panel formed of two-shot molded polymeric materials having different opacities;

FIG. 166A, is a broken, cross-sectional view of a portion of the audio system case and media drawer illustrating a "push-push" latch and opening spring with the media drawer in the closed and latched position;

FIG. 166B, is a broken, cross-sectional view of a portion of the audio system case and media drawer similar to FIG. 166A, with the media drawer in a partially opened and released position;

FIG. 167, is an exploded side plan view of a closure member (front plate), switch/display printed circuit board (PCB), trim plate assembly and decorative facia for an automotive radio/CD player;

FIG. 168, is a broken, cross-sectional view of the facia of FIG. 167, on an enlarged scale, with first surface finishing;

FIG. 169, is a broken, cross-sectional view of an alternative facia, similar to that of FIG. 168, with second surface finishing; and FIG. 170, is a broken, cross-sectional view of a front loaded, color shifting actuator button in assembly with a rear loaded actuator device (ex. switch) and extending through a registering opening in an associated trim plate/panel.

Although the drawings represent varied embodiments and features of the present invention, the drawings are not necessarily to scale and certain features may be exaggerated in order to illustrate and explain the present invention. The exemplification set forth herein illustrates several aspects of the invention, in one form, and such exemplification is not to be construed as limiting the scope of the invention in any manner.

DESCRIPTION OF THE ILLUSTRATIVE EMBODIMENTS

The present invention can be applied in its broadest sense to electronic devices and systems where shielding from radio frequency interference (RFI), electromagnetic interference (EMI), bulk current injection (BCI) and/or electrostatic discharge (ESD) is required. In addition to vehicle based radios and audio entertainment systems, the invention can be advantageously applied in "infotainment" and telematic systems. Furthermore, the present invention employs virtually "fastenerless" design architecture to facilitate low-cost, high volume production techniques.

A telematics product is a two-way communication/receiver system that enables access by a vehicle occupant to vehicle related information like geographic position/location through the use of a GPS module with antenna, vehicle diagnostics, crash sensors and air bag deployment. It also contains a phone module that is linked through a microphone in the vehicle and the radio speaker system for hands free calling via voice recognition and links to a call center for a variety of services, including but not limited to emergency help, concierge, vehicle theft recovery, turn-by-turn route guidance, vehicle diagnostics and vehicle unlock.

For convenience of understanding, the following description will be focused primarily upon an automotive radio/CD player system.

Lightweight Radio/CD Player for Vehicular Application (1)

The present invention reflects an improved design to reduce the overall weight of an automotive radio/CD player without compromising the strength of the unit. The present invention employs a polymer based material that can be molded to provide the necessary features for the chassis as well as the frontal interface to the decorative front-end assembly described for the man-machine interface. By molding a case with the necessary details to accept the playback mechanisms (if desired) as well as the circuit board(s) needed for the electrical control, the required functionality of the unit is maintained as compared to the typical metal box. The necessary shielding and grounding is accomplished by insert-molding a mesh screen wire that has been pre-formed to contour with the molding operation. The grounding of the circuit boards may be accomplished by using ground clips attached directly to the ground pads of the circuit board that would interface directly with exposed screen wire mesh of the molded part. While metal is also a good conductor for the thermal load inside the unit, openings must be incorporated to allow airflow for additional cooling. The same openings can compromise the shielding. With in-molded mesh screen wire, the mesh acts as a Faraday cage to shield the electronics, but the open weave allows airflow to promote the dissipation of the thermal load from inside the unit, to the exterior. Besides the reduction of mass offered by the molded polymer material for the unit chassis and front plate, the hidden benefits include ease of handling in the assembly process as well as less container and shipping weight.

To facilitate assembly, the molded polymer chassis and front plate can use integral or molded in guideways and snaps, thereby eliminating the typical screw fastener assembly method previously used for these components. To enhance the rigidity, the component parts that comprise the assembly are sandwiched at the common vehicle instrument panel attachment points such that when the mounting screws are driven, they firmly clamp the component pieces to the host vehicle. In the event a playback mechanism of substantial mass and volume is required, the sub-assembly structure for the mechanism would utilize formed attachment tabs that would be an intermediate layer in the aforementioned component part sandwich. Another benefit for the mounting at the back of the radio is often vehicles have a receptive hole or slot in the inner cavity of the instrument panel carrier that accepts a mounting bushing or "bullet" shaped extension that is screwed to a mounting stud that is typically swaged to the back of the metal enclosure of the radio. The mounting "bullet" can be molded directly in the polymer-based case eliminating the additional part and the assembly of that additional part.

To replace the metal structure of the vehicle radio, a galvanized (or appropriately coated) steel mesh wire screen will be cut, formed, and molded with a polymer resin to provide necessary details for assembly of components required for the functionality of the radio including, but not limited to, a circuit board assembly, a heat sink for audio power and switching components, a playback mechanism, and a man-machine interface or trim plate assembly, as well as vehicle mounting features. While the polymer or plastic provides the majority of the mechanical structure for the radio, the in-molded mesh screen wire provides the needed protection from various electrical anomalies including electromagnetic contamination, radio frequency interference, bulk current injection, and electrostatic discharge, to name a few. The screen mesh also allows openings necessary for air passage or venting of heat from the radio by molding the radio back end or case and front plate. The many details and features needed in a typical assembly can be incorporated directly into the parts, eliminating the need for fasteners and separate additional parts often required with parts fabricated in metal.

The specific materials selected for fabricating the radio case and front plate will vary depending upon the application, including the contained mass of the mechanisms employed as well as the severity of the contemplated environment (esp. temperature and vibration). Examples of materials that could be employed for typical automotive applications are:

Case: Glass-filled polyester, Glass-filled polypropylene, Polycarbonate, ABS.

Front Plate: Polycarbonate, ABS, PC/ABS and Noryl.

Major components which contact one another or are mechanically interconnected preferably are formed from material having substantially differing surface finish and hardness characteristics to minimize the possibility of resulting squeaks, rattles and the like.

Although presently viewed as cost prohibitive for automotive applications, it is contemplated that nano carbon tube filler can be employed within the plastic material forming the case and front plate to provide effective shielding and enhance the structural strength of the case assembly.

In addition to weight savings, which may amount to well over one pound (0.4536 Kg), the part handling is improved to reduce the amount of fasteners as well as separate component parts. Often a radio may be constructed from a wrap-around, a cover and the fasteners along with a mounting bushing or "bullet" screwed to a "swaged" threaded stud in the metal case. Also, the metal pieces require assembly personnel to wear gloves during handling to avoid any cuts or damage to their hands as well as protection from any metal fabrication fluid residue. Molded plastic does not require any special gloves, or the concerns of cuts to the skin. Aside to the benefit to the vehicle by reducing the radio weight by over one pound (0.4536 Kg), the savings for a manufacturer include reduced shipping cost through the weight reduction and potential container efficiency improvements. Product labeling can be improved through laser engraving the plastic with the desired number, customer logos, etc. Metal typically requires a stamping detail (not easily changed) and/or a printed label that is adhesively applied. This offers greater flexibility and eliminates additional parts (like labels) to use the plastic, as well as better durability than a label.

Referring to FIGS. 2-10, a consolidated radio/CD player apparatus 62 embodying many aspects of the present invention is illustrated. The radio/CD player 62 is an assemblage of six major components or subassemblies, a circuit board subassembly 64, a CD player subassembly 66, a box-like housing case 68, a front closure member or front plate 70, a convector or heat sink 72 and a trim plate subassembly 74.

It is envisioned that each of the major components/subassemblies would be produced "off-line" and the final assembly process would comprise the efficient, high volume joining of the major components/subassemblies and end-of-line testing of the completed units.

FIGS. 2 and 8-10 depict plan and perspective views of the fully assembled radio/CD player apparatus 62. FIG. 3 is an exploded view illustrating the juxtaposition of the respective major components during the assembly process. FIGS. 4-7 depict specific assembly steps of the major components as will be described hereinbelow.

The case 68 and front plate 70 are each preferably injection molded of polymer based material and collectively comprise a substantially closed housing assembly 76. The case 68 has a box-like structure, including upper and lower wall portions 78 and 80, respectively, left and right side wall portions 82 and 84, respectively, and a rear wall portion 86. The case 68 also has mounting features extending externally of the case walls, including left and right front mounting flanges 88 and 90, respectively, extending from the forward edges of the left and right side walls 82 and 84, respectively, and a mounting stud 92 extending rearwardly from the rear wall 86. All of the case wall portions and mounting features of the case 68 are integrally formed in a single injection molding process. The case defines a front opening 94 which, upon assembly, is closed by front plate 70. An assembly axis 96 extends symmetrically from front to rear of the case 68, exiting opening 94 along the nominal centerline of the case 96.

The circuit board subassembly 64 consists of a common or main printed circuit board (PCB) 98 and a unique, application specific PCB 100 which are electrically and mechanically interconnected by several pin connectors 102. It is envisioned that edge connectors, ribbon connectors or the like could be substituted for the pin connectors 102. The common PCB 98 contains all surface mount components. The circuit board subassembly 64 comprises an audio component.

The CD player subassembly 66 consists of a conventional multi-disc player unit 104 and substantially mirror-image left and right side mounting brackets 106 and 108, respectively, affixed thereto by integral fastener devices such as "squirts" (refer FIGS. 141-143). Note that there are slight differences between the left and right mounting brackets 106 and 108, but they are deemed to be inconsequential for purposes of the present invention. The left and right mounting brackets 106 and 108 have outwardly directed mounting flanges 110 and 112, respectively, which, upon assembly, register with case mounting flanges 88 and 90, respectively. The CD player subassembly 66 comprises an audio component.

The heat sink 72 comprises a substantially flat, stamped aluminum plate adapted for mounting to the outer surface of the left case sidewall 82 and includes a recessed portion 114 which, upon installation, extends inwardly through a port 116 in left case sidewall 82 for thermal interconnection to heat generating and power circuit components 118, 120 and 122 carried on the main PCB 98.

The trim plate subassembly 74 is configured to organize audio system input/output and display devices, informational indicia and decorative display devices for an associated host vehicle operator.

Referring particularly to FIGS. 4-7, a method of assembly of the lightweight audio system 62 of the present invention is illustrated. Audio system 62 can be assembled manually by an ordered process wherein a single (preferably, but not limited to) operator, who sequentially assembles the six major components or subassemblies on a designated work surface 124. No specialized tools or separate/dedicated fixtures are required. No threaded fasteners/screws are required. Each of the major components and subassemblies form integral features which cooperate to interact with features of the other components and subassemblies to register, align and guide the components and subassemblies during adjoining thereof as well as to removably affix the components and subassemblies to one another when in their final design position. This process is referred to herein as the Slide-lock Snap-lock™ Screwless Assembly Technology and Method or "SLAT". In effect, the components "self-fixture" one another in combination during the manipulation of the components in the assembly process.

Figure 4:
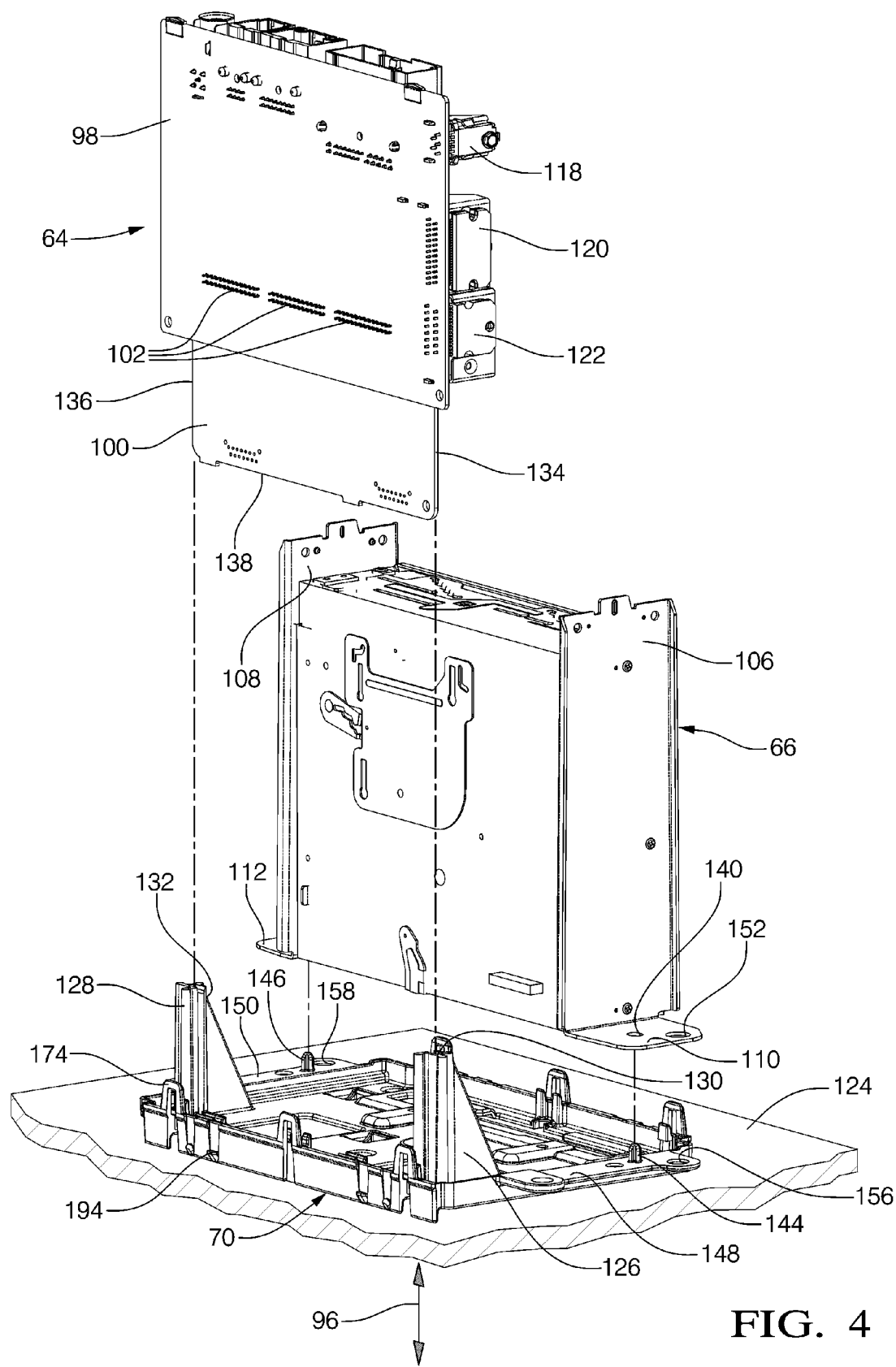
FIG. 4, is an exploded, perspective view of the radio/CD player of FIG. 2, illustrating final assembly step I in the production thereof wherein the playback mechanism and circuit board assembly are slid and snapped to the faceplate.

Assembly of the radio/CD player 62 is affected by the assembly technician or operator taking the following steps:

As illustrated in FIG. 4, place the front plate 70 on the work surface 124 in an inverted position with the outer surface of the front plate disposed upon the work surface 124. The centerline of the front plate 70 defines an assembly axis, as designated by arrow 96 extending normally to the work surface 124.

The front plate has two laterally spaced, rearwardly directed extensions 126 and 128 integrally formed therewith. Extensions 126 and 128 form guideways or opposed slots 130 and 132, respectively, which open towards one another and are directed parallel to the assembly axis 96. Lateral edge guide surfaces 134 and 136 of the application specific PCB 100 register within slots 130 and 132 and are guided thereby during the insertion process until the leading edge surface 138 of the PCB 100 contacts the inside (upward facing in FIGS. 4 and 5) surface of front plate 70. At this point, common PCB 98 is cantilever suspended from PCB 100 via pin connectors 102 and other supports (not illustrated). Referring FIG. 5, the circuit board subassembly 64 is retained in position by the interfit of the edge surfaces 134 and 136 within slots 130 and 132.

The CD player subassembly 66 is next installed by manipulating it along the assembly axis 96 until through holes 140 and 142, formed in bracket mounting flanges 110 and 112, register with locating pins or nibs 144 and 146 integrally formed in laterally extending mounting flanges 148 and 150, respectively, integrally formed in front plate 70. Thereafter, the CD player subassembly is displaced downwardly along the assembly axis 96 until the lower surfaces of bracket mounting flanges 110 and 112 abut the upper surfaces of front plate mounting flanges 148 and 150. The CD player subassembly 66 is retained in the position illustrated in FIG. 5 by an interference fit between the front plate nibs 144 and 146, and the mounting bracket flange through holes 140 and 142.

Mounting bracket flanges 110 and 112 have secondary, larger diameter through holes 152 and 154 formed therein which register with similarly dimensioned through holes 156 and 158, respectively, formed in front plate mounting flanges 148 and 150 for receiving attachment means such as bolts, for affixing the completely assembled radio/CD player 62 to a host vehicle.

The steps of installing the circuit board subassembly 64 and the CD player subassembly can be reversed from that describer hereinabove.

The housing case 68 is next installed by manipulating it along the assembly axis 96 whereby the case wall portions 78, 80, 82, 84 and 86 fully envelop the circuit board subassembly 64 and CD player subassembly 66 in combination with the front plate 70.

Figure 5:
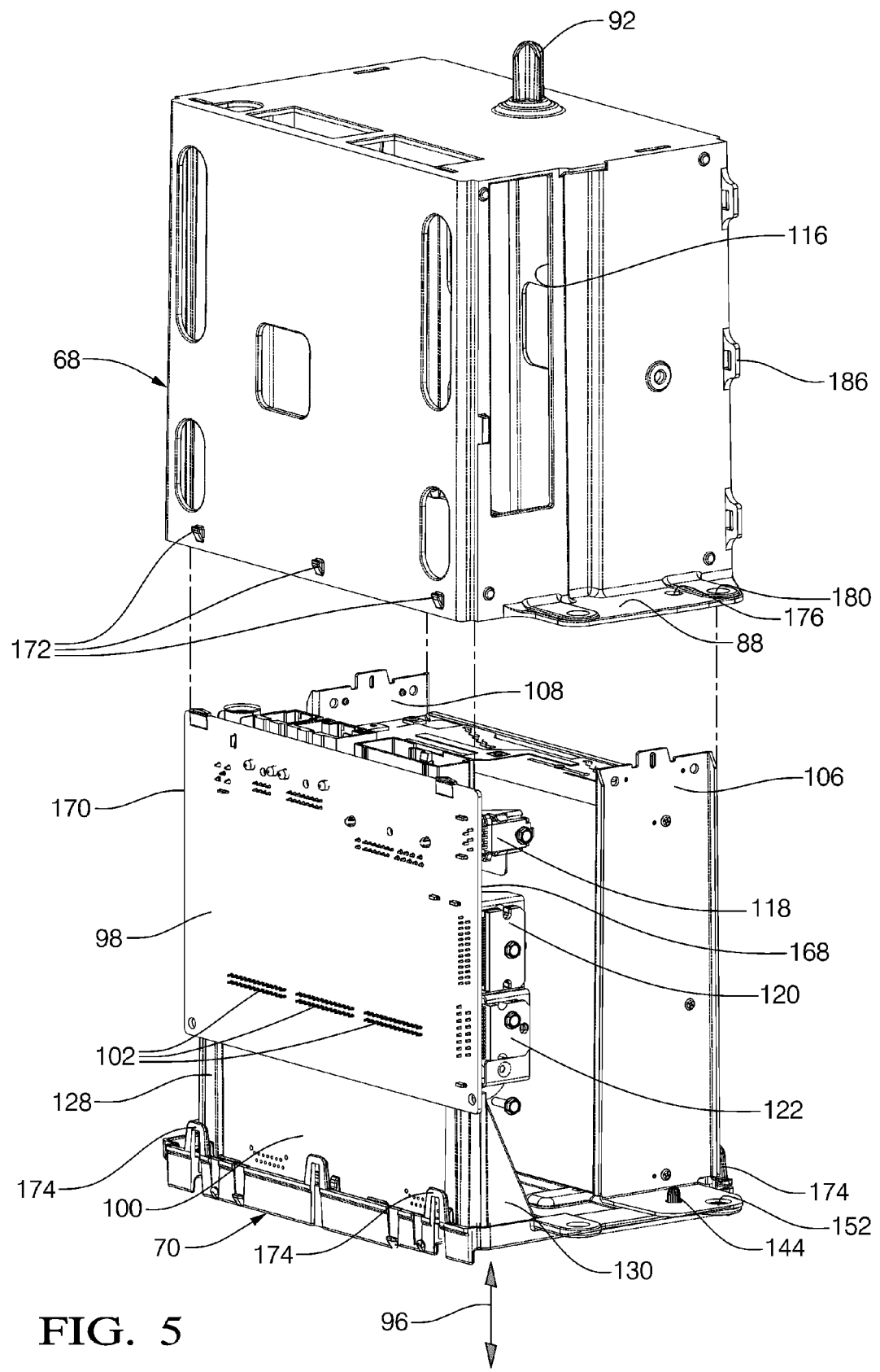
FIG. 5, is an exploded, perspective view of the radio/CD player of FIG. 2, illustrating final assembly step II in the production thereof wherein the case is slid and snapped to the faceplate.
Figure 93:
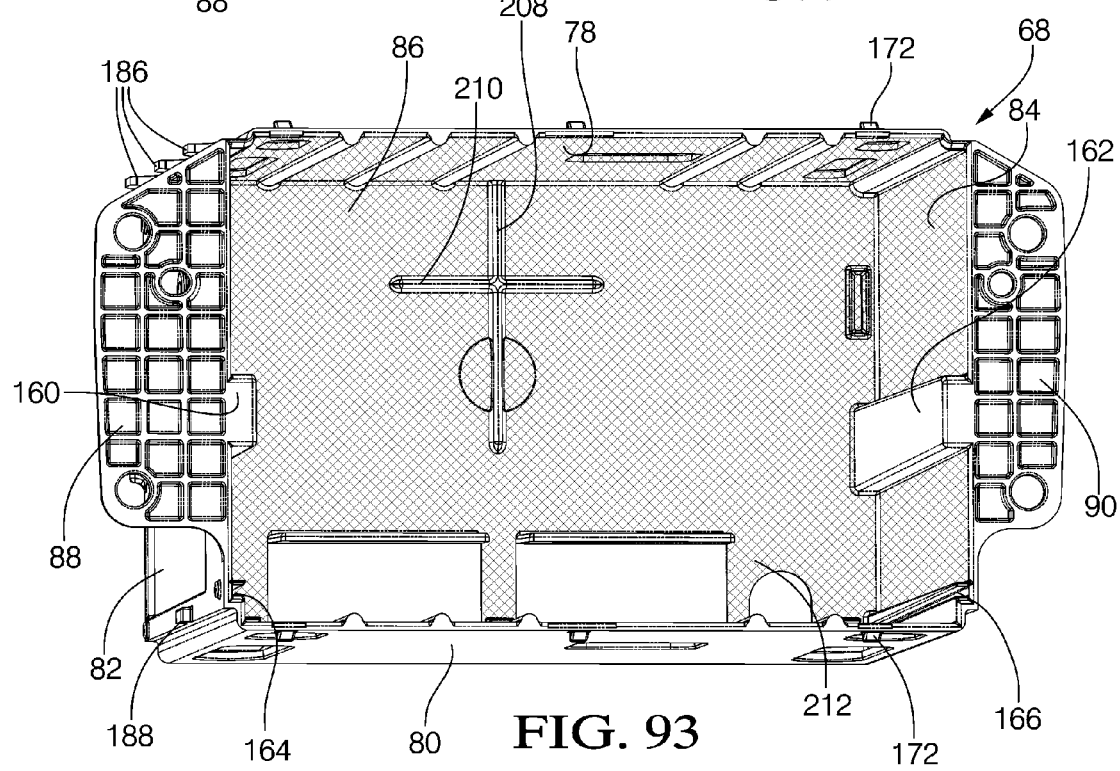
FIG. 93, is a front perspective view of the interior surface details of the case/back-end of FIG. 91 illustrating the wire mesh screen which has been insert molded within the case adjacent the inner surface portions thereof.

As best viewed in FIGS. 3, 5 and 93, the centerline of the case 68 is first manually aligned with the assembly axis 96 and rotationally positioned with the subassembly consisting of the circuit board subassembly 64, CD player subassembly 66 and the front plate 70, whereby a first cooperating pair of guideways 160 and 162 integrally formed in case sidewall portions 82 and 84 register with the CD player mounting brackets 106 and 108 and, simultaneously, a second cooperating pair of guideways 164 and 166 integrally formed in case sidewall portions 82 and 84 register with lateral edge guide surfaces 168 and 170 of common PCB 98. The case 68 is then manually displaced along the assembly axis 96 until the leading edge thereof defining front opening 94 contacts the rear surface of the front plate 70. Thereafter, cooperating ramped snap-engagement features 172 and 174 integrally formed with upper and lower wall portions 78 and 80 of the case 68 and the front plate 70, respectively, momentarily self-displace one another and snap back to self-engage to establish a positive interlock therebetween.

The case mounting flanges 88 and 90 form through holes 176 and 178 which register and self-engage with nibs 144 and 146, respectively, to provide a redundant engagement feature. Furthermore, the case mounting flanges 88 and 90 form a second set of through holes 180 and 182, respectively, which register with through holes 152 and 154 of mounting brackets 106 and 108, and through holes 152 and 154 of front plate mounting flanges 148 and 150, respectively.

Figure 1:
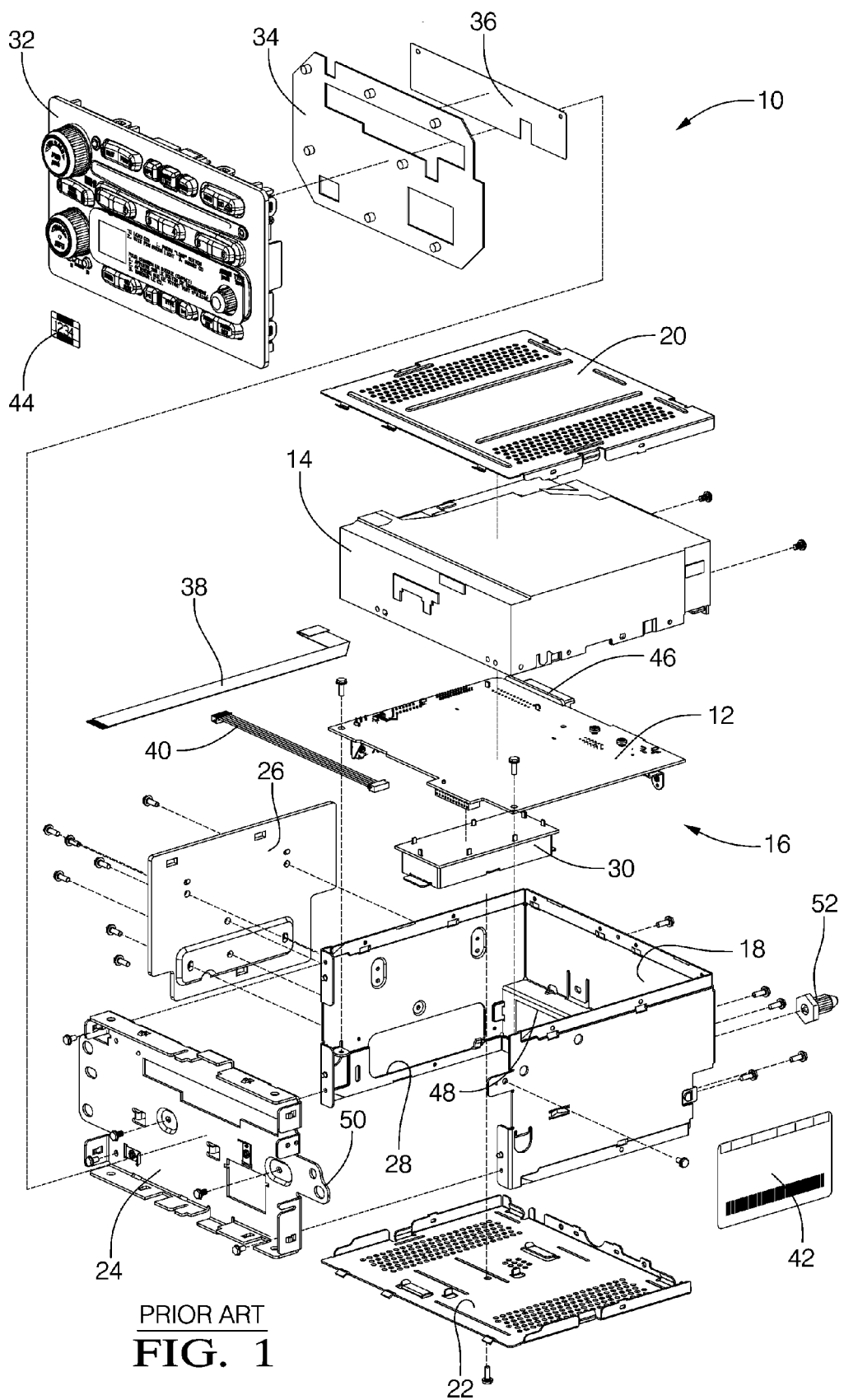
FIG. 1, is an exploded, perspective view of a prior art automotive radio/CD player combination in a common chassis constructed of sheet metal and a large number of threaded fasteners.
Figure 2:
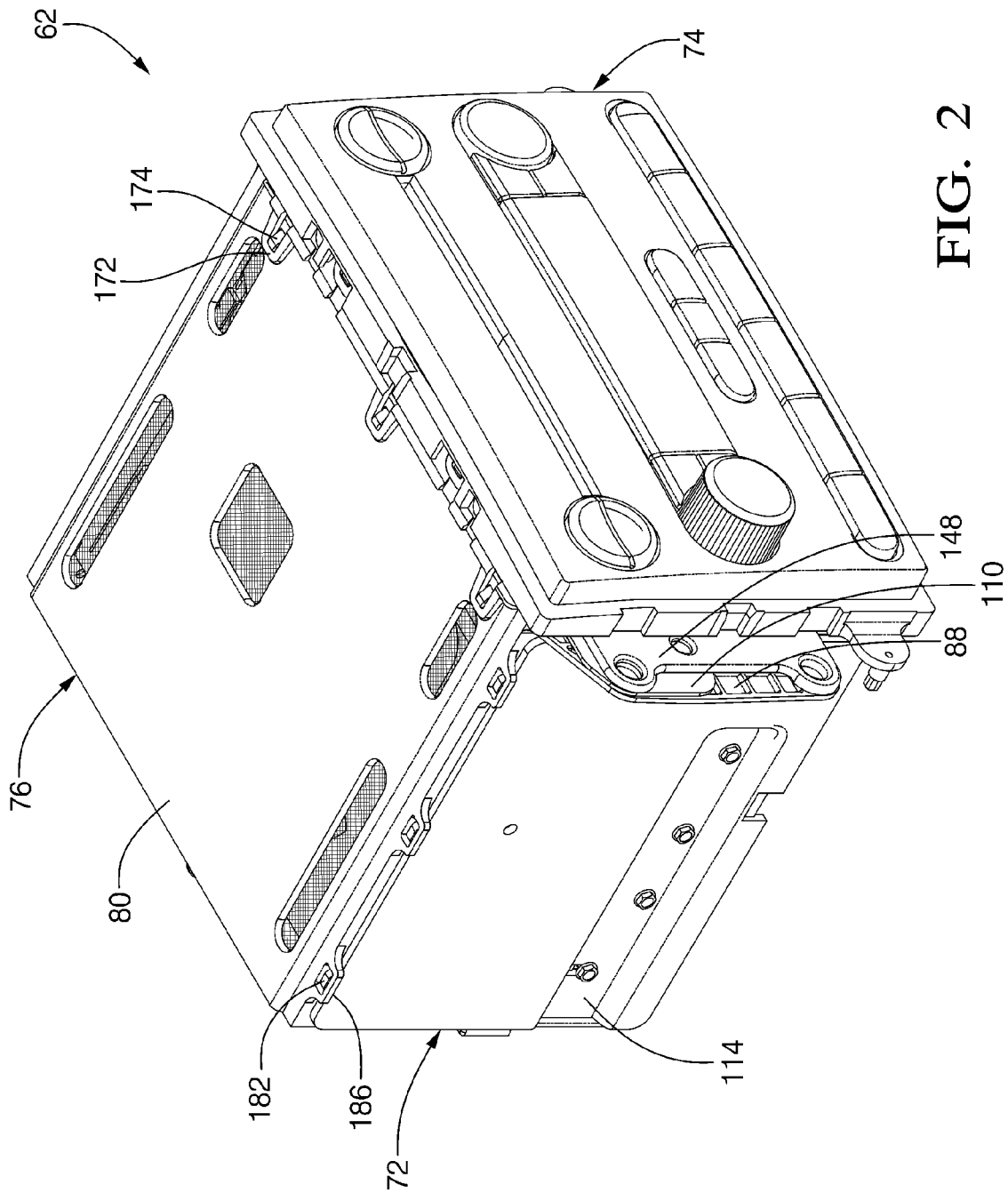
FIG. 2, is a front-left perspective view of the preferred embodiment of the present invention embodied in an automotive radio/CD player.
Figure 3:
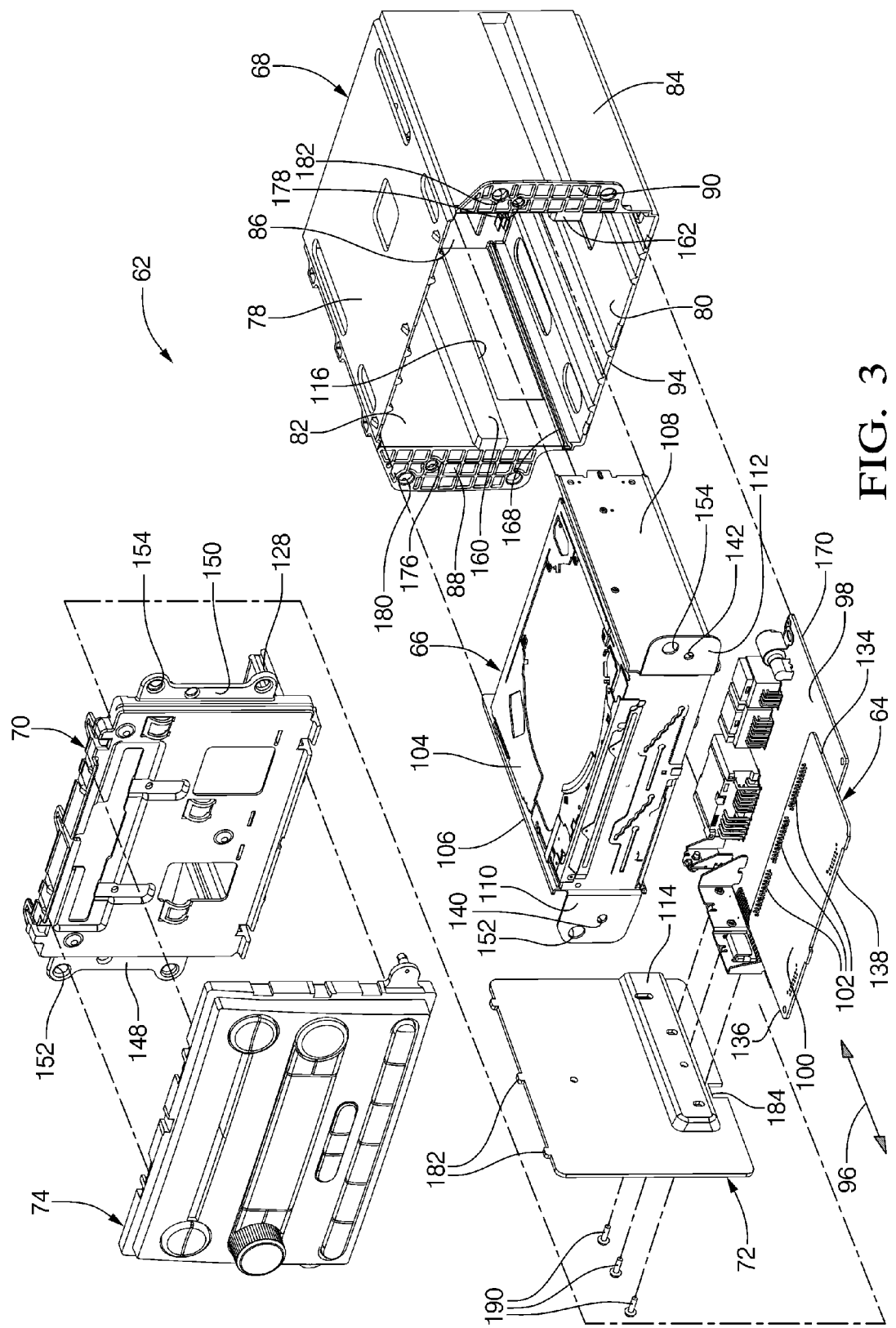
FIG. 3, is an exploded, perspective view of the radio/CD player of FIG. 2, illustrating the major subcomponents and subassemblies thereof.
Figure 6:
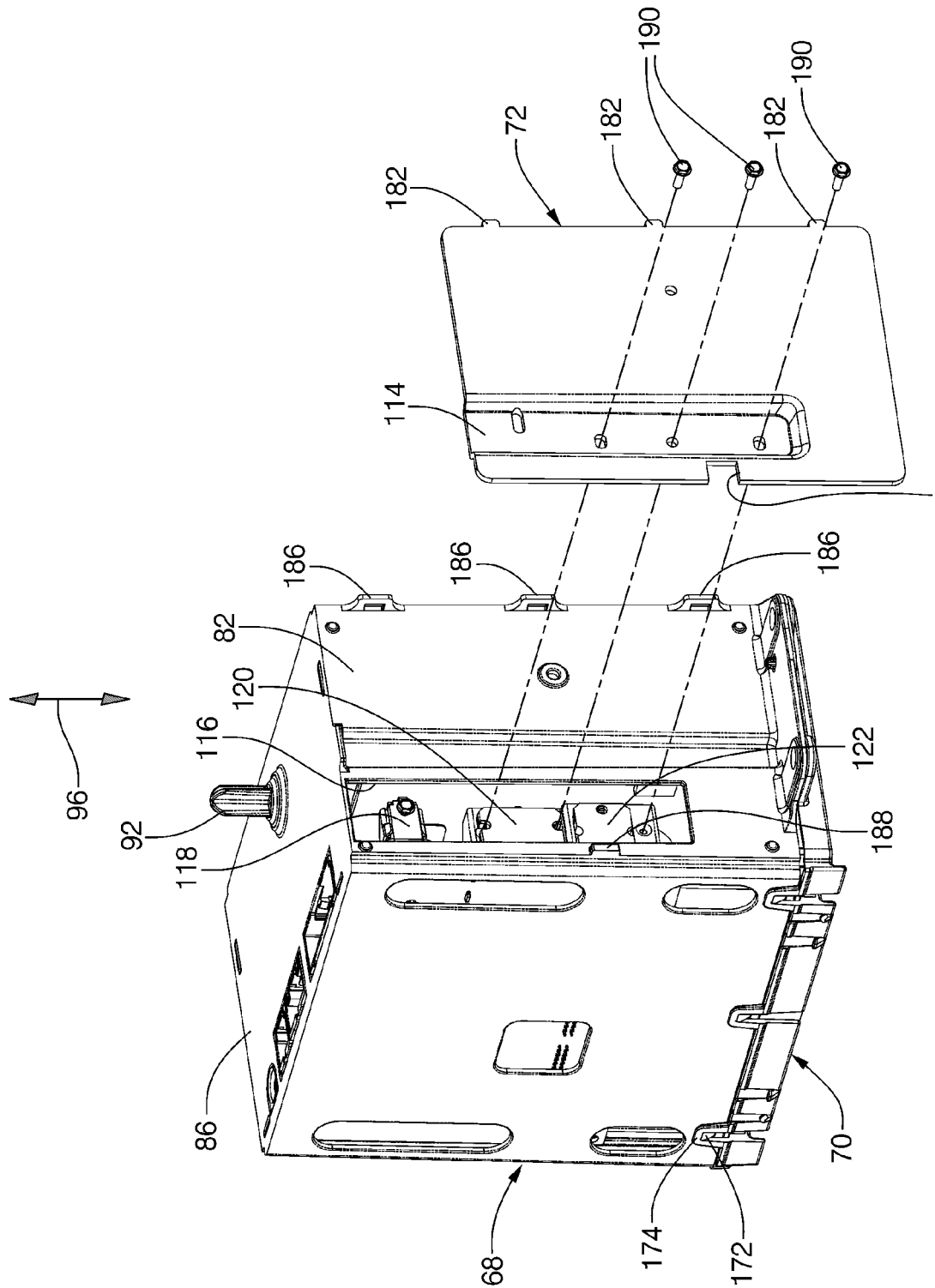
FIG. 6, is an exploded, perspective view of the radio/CD player of FIG. 2, illustrating final assembly step III in the production thereof wherein the power device retainer clip and heat sink are consecutively anchored, pivoted and snapped to the side of the case.
Figure 7:
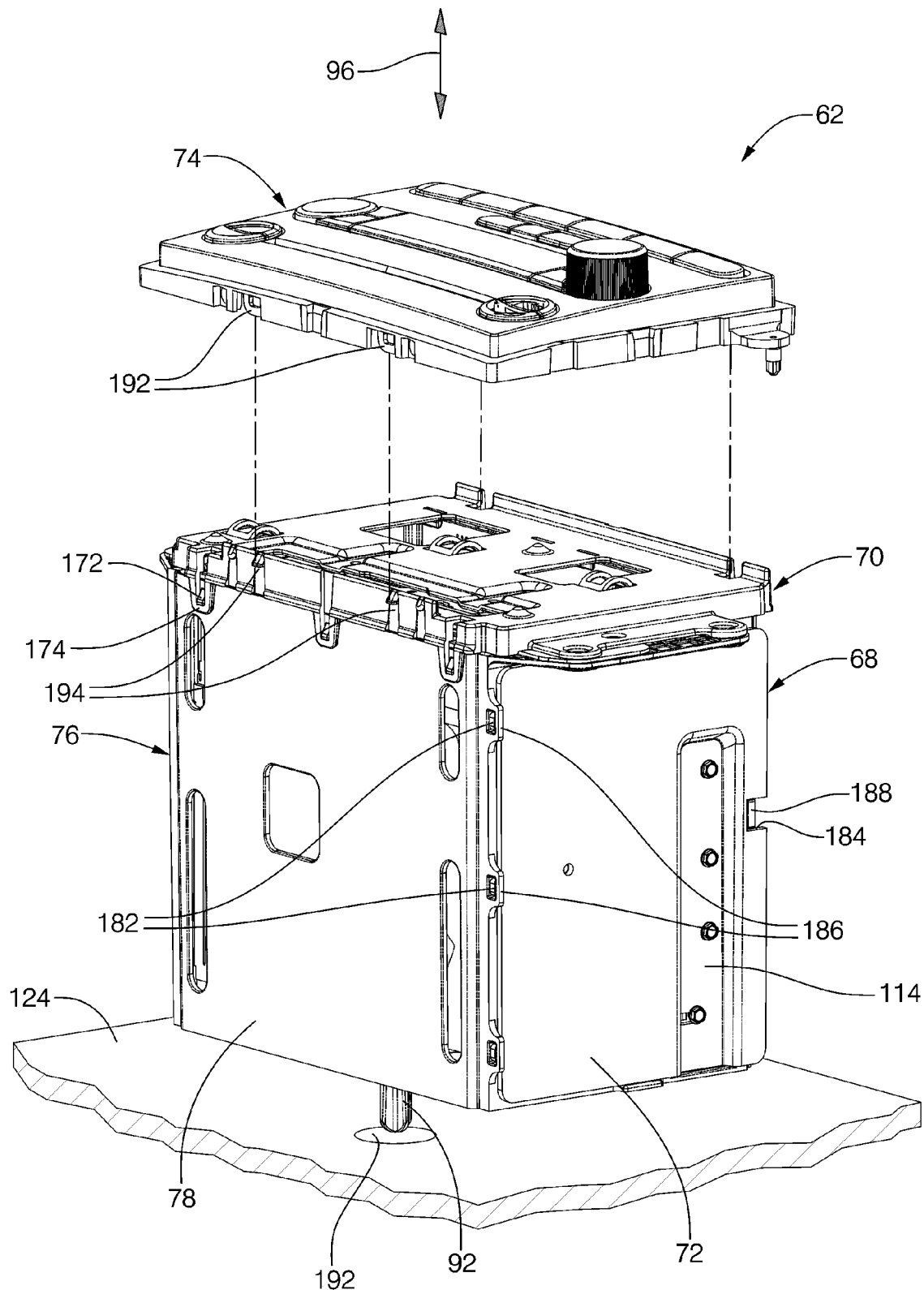
FIG. 7, is an exploded, perspective view of the radio/CD player of FIG. 2, illustrating final assembly step IV in the production thereof wherein the trim plate assembly is snapped to the faceplate/back-end assembly.
Figure 8:
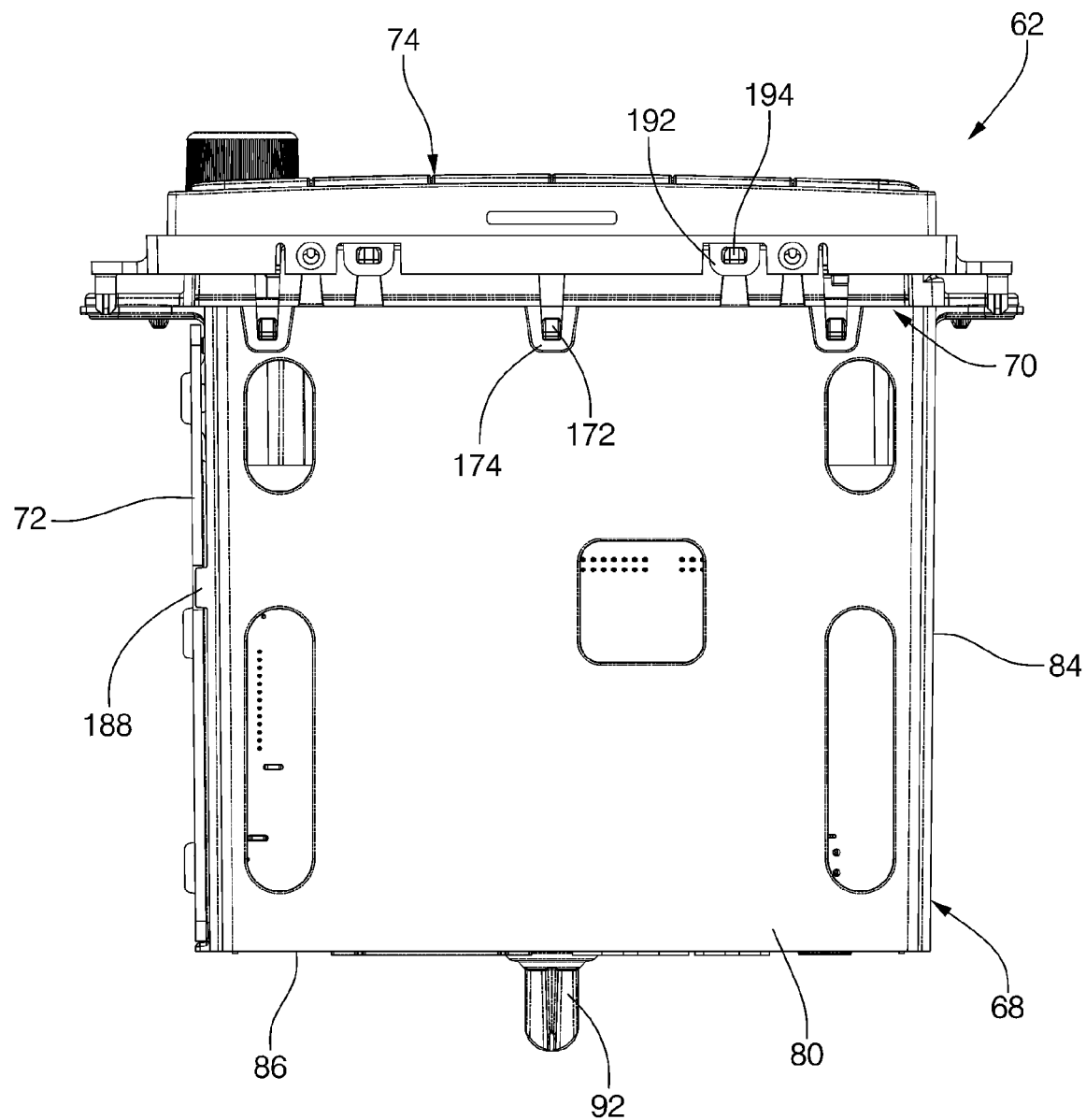
FIG. 8, is a bottom plan view of the radio/CD player of FIG. 2.
Figure 9:
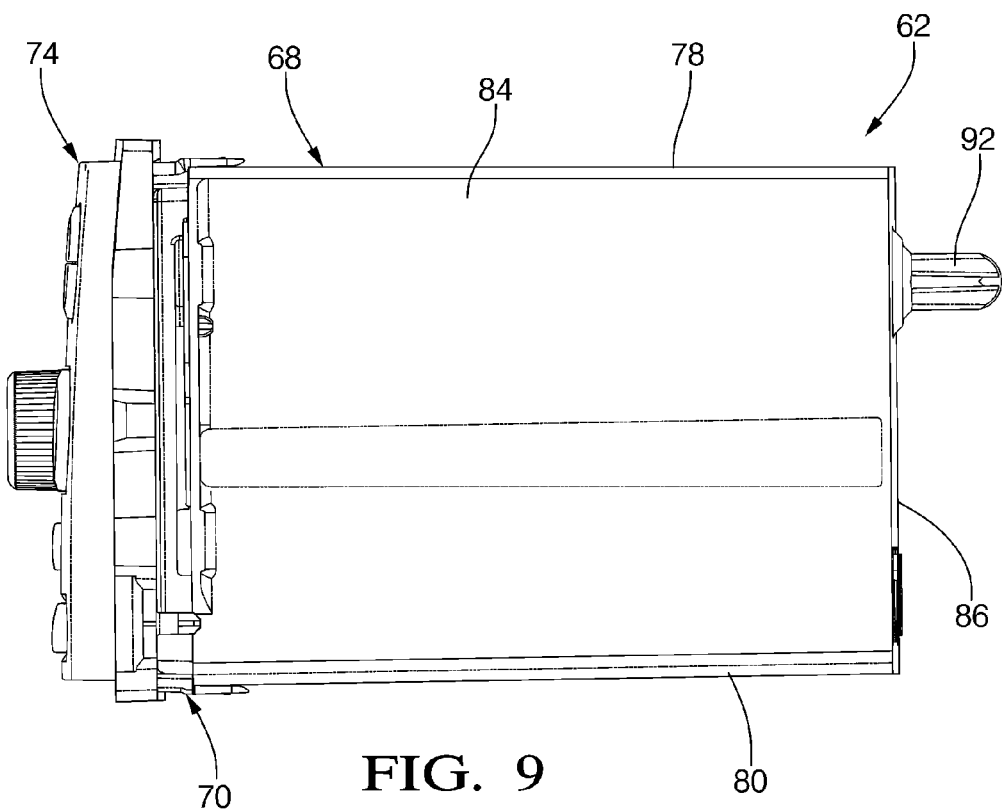
FIG. 9, is a top plan view of the radio/CD player of FIG. 2.
Figure 10:
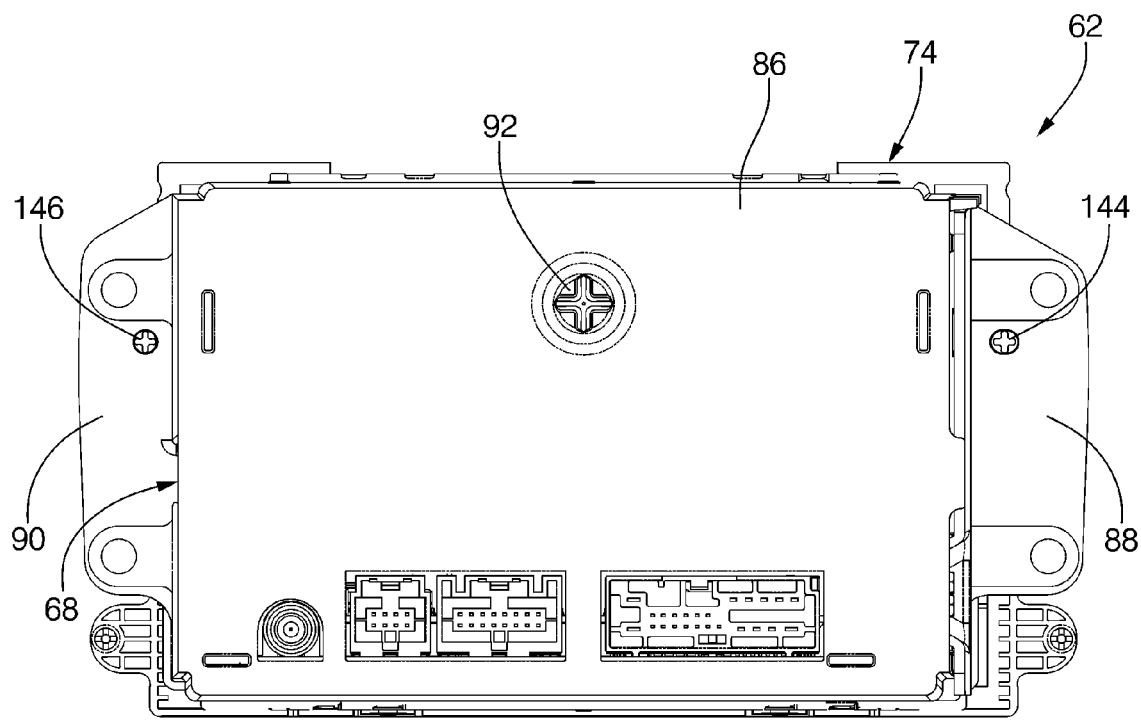
FIG. 10, is a rear plan view of the radio/CD player of FIG. 2.

As best viewed in FIGS. 2, 6 and 7, the heat sink 72 is next installed. The heat sink 72 includes several locating tabs 182 integrally formed along one edge thereof and a locator recess 184 formed in an opposed edge. The heat sink 72 is manually affixed to the outer surface of the case left side wall portion 82 which defines integral tab receiving extensions 186 along the upper edge thereof. Once the heat sink locating tabs 182 are inserted within their respective case wall portion extensions 186, the heat sink 72 is rotated into its design position illustrated in FIG. 7 wherein a resilient ramped catch member 188 integrally formed along the bottom edge of the left side wall portion 82 snap engages the recess 184 to fixedly interlock the heat sink 72 to the case 68.

When the heat sink 72 is in its installed position, the recessed portion 114 extends inwardly into the case 68 through the port 116. The inner surface of the recessed portion 114 establishing an abutting relationship against the power circuit components 118, 120 and 122 to provide a cooling thermal convector to the exterior of the case 68. Means are provided to ensure that components 118, 120 and 122 remain in intimate contact with the heat sink 72 such as screws 190, or, preferably (as illustrated in FIGS. 22-29 and 41-43) to continuously resiliently urge the components into engagement with the recessed portion 114 of the heat sink 72.

It is contemplated that the heat sink 72 could be alternatively mounted to the case rear wall portion 86, whereby it would be installed along the assembly axis 96.

Referring to FIG. 7, the final step of assembling the major components and subassemblies is illustrated. First, the subassembly of the components illustrated in FIG. 6 is manually inverted, with the case rear wall portion 86 disposed on the designated work surface 124. Due to the localized outward projection of the stud 92, a stability enhancing spacer (not illustrated) or, alternatively, a recess 192 in the work surface 124 ensures a stable platform to complete assembly.

The trim plate subassembly 74 is then manipulated to become in register with the case 68 and manually displaced along the assembly axis 96 until the lower surface of the trim plate assembly 74 contacts the upper surface of the front plate 70 (as depicted in FIG. 7). Thereafter, cooperating ramped snap-action engagement features 192 and 194 integrally formed with upper and lower edge skirt surfaces of the case trim plate assembly 74 and the front plate 70, respectively, momentarily self-displace one another and snap back to self-engage to establish a positive interlock therebetween.

The completed assembly of the major components and subassemblies is depicted in FIGS. 2, 8-10 and 92. Following the assembly process, the completed radio/CD player 62 is placed in a queue for testing and quality checks.

Molded-in Integrated Mounting Bushing (2)

The rear mounting bushing for current radios is typically attached by welding a threaded stud to the back wall of the wrap around and then the bushing is screwed on. With the plastic box receiver, the mounting bushing can be molded as an integral part of the receiver box, eliminating two part numbers and the labor to install them.

Figure 12:
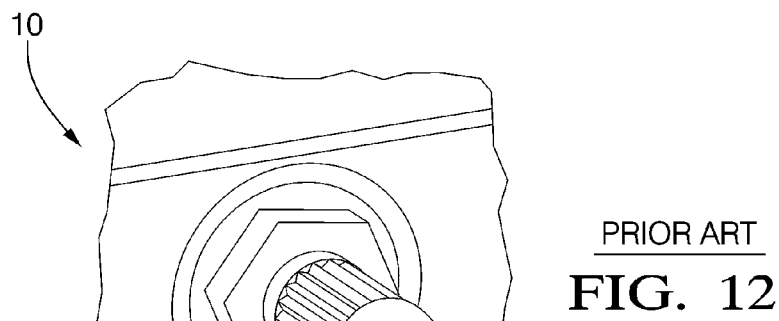
FIG. 12, is an exploded, cross-sectional view of the prior art mounting bushing assembly of FIG. 11.
Figure 11:
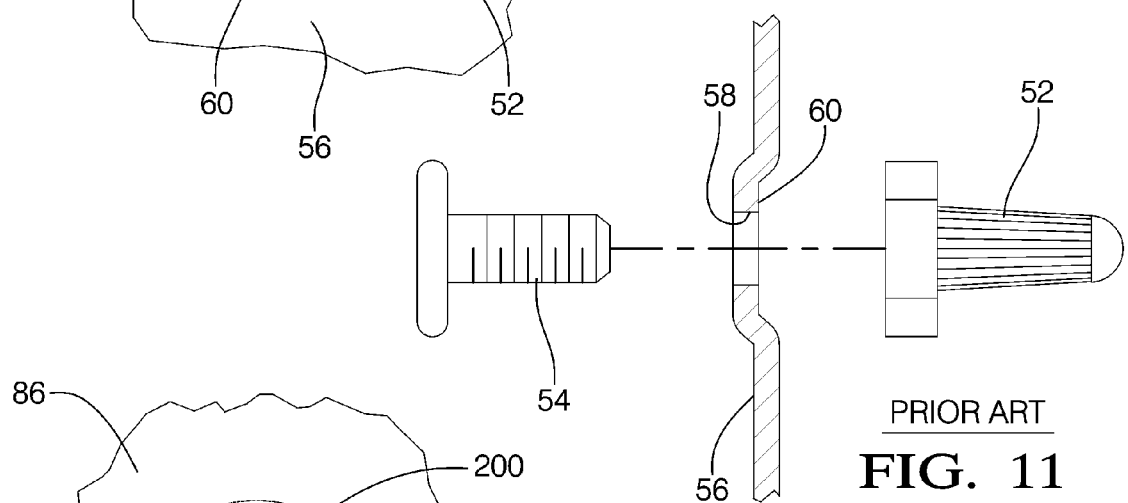
FIG. 11, is a fragmentary, perspective view of a portion of the rear surface of the prior art radio/CD player of FIG. 1, illustrating the mounting bushing assembly.
Figure 13:
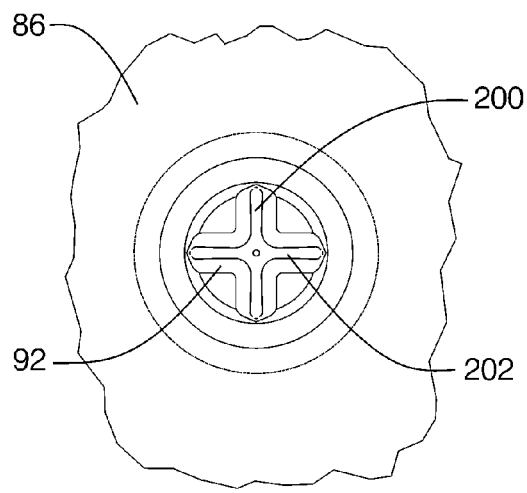
FIG. 13, is a fragmentary, rear plan view of a rear integral mounting stud on an enlarged scale with a mating opening of a host vehicle rear mounting bracket superimposed thereon in phantom.
Figure 14:
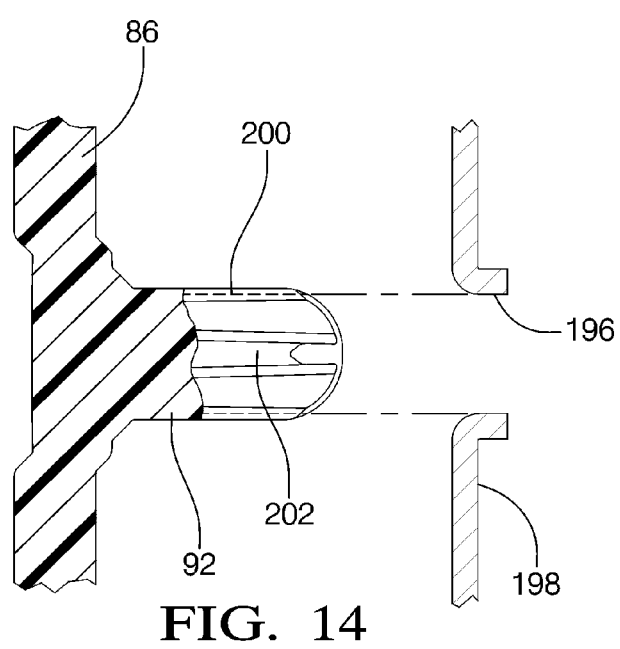
FIG. 14, is a fragmentary, cross-sectional view taken on lines 14-14 of FIG. 13 with the mounting stud juxtaposed with pre mounting relationship with the host vehicle mounting bracket.
Figure 17:
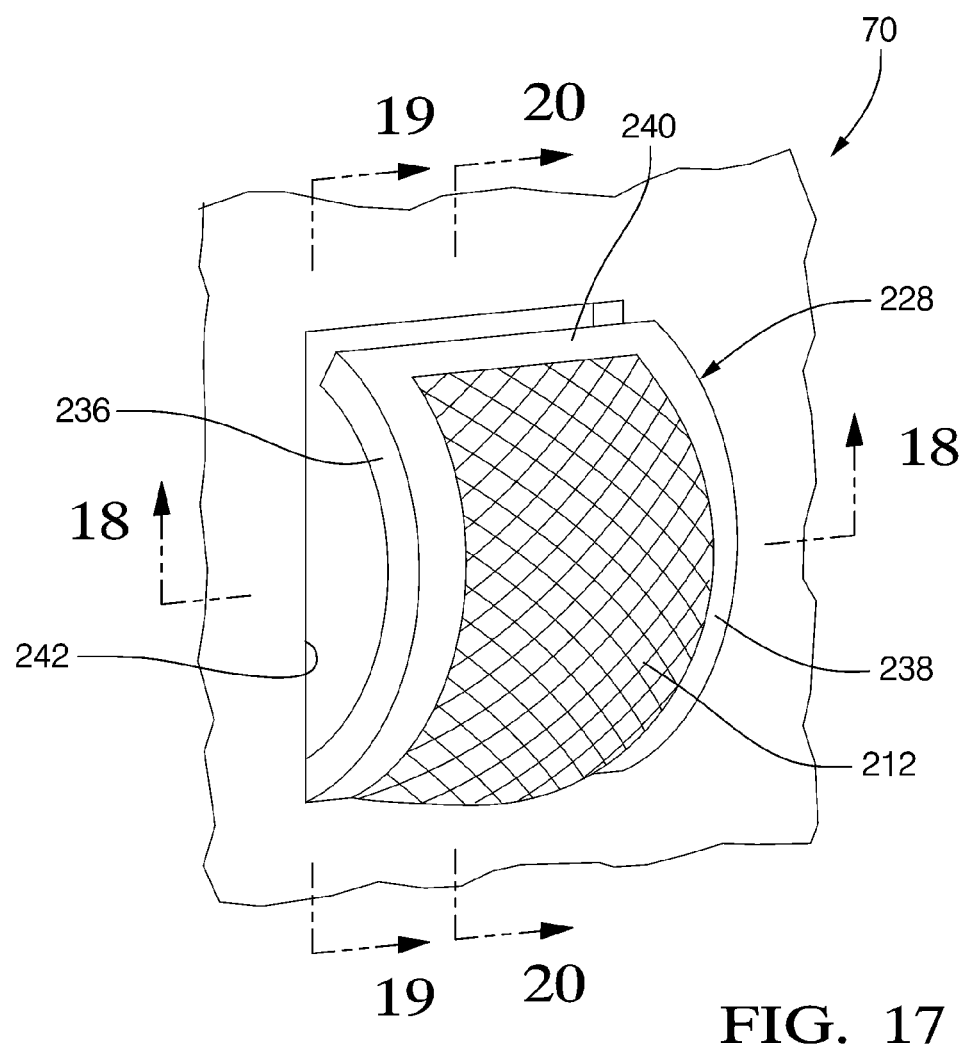
FIG. 17, is a fragmentary, perspective view of a keypad grounding clip integrally formed on the front side of the faceplate.
Figure 18:
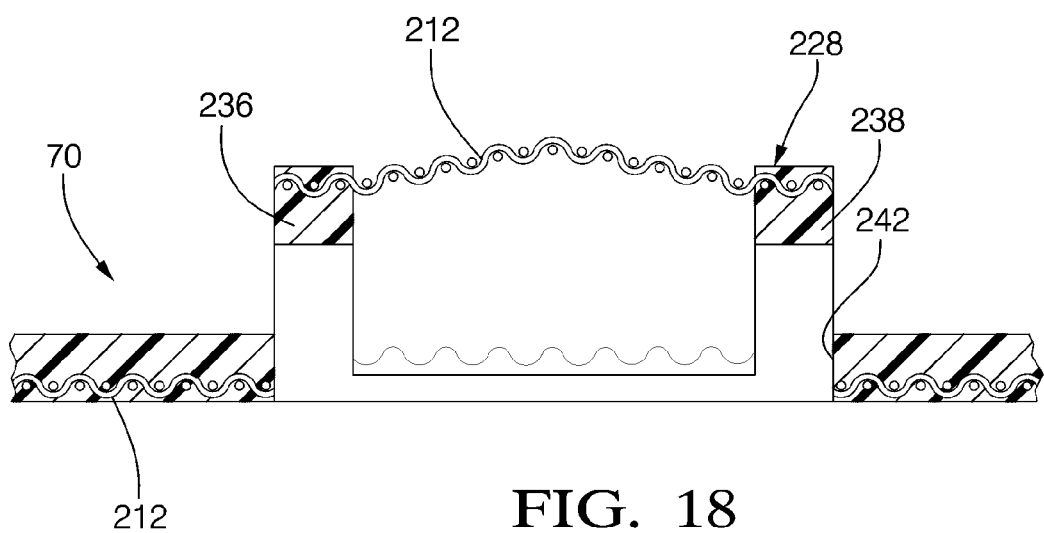
FIG. 18, is a cross-sectional view taken on lines 18-18 of FIG. 17.
Figure 22:
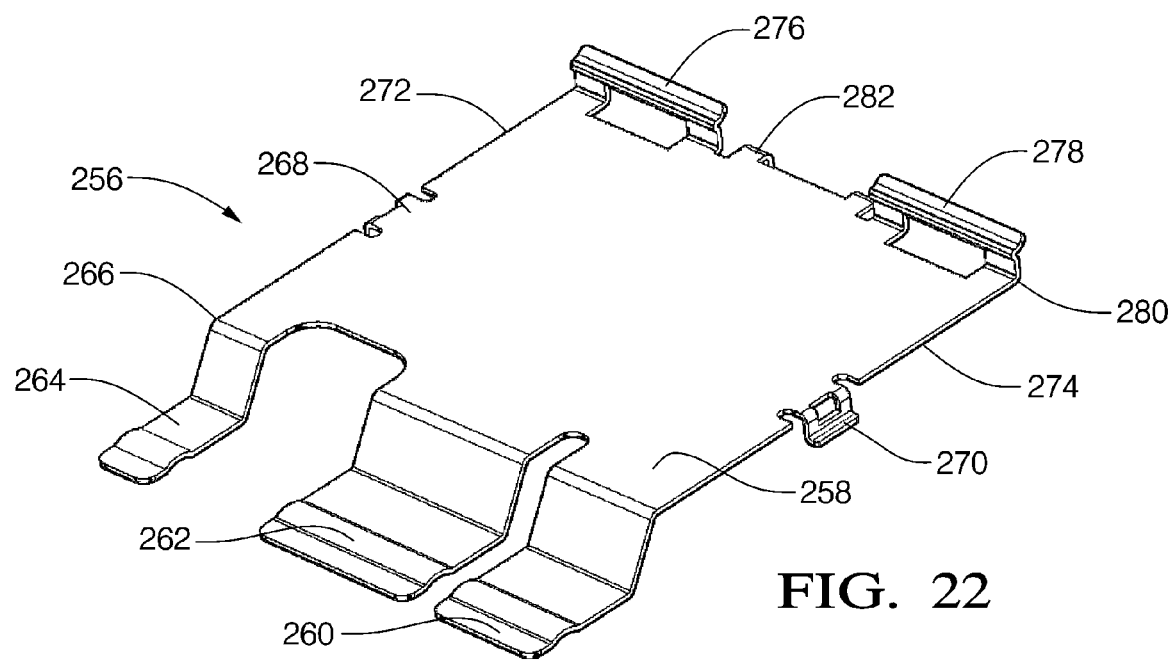
FIG. 22, is a perspective view of the outer side (as assembled) of an electrical power device retainer/backing clip.
Figure 23:
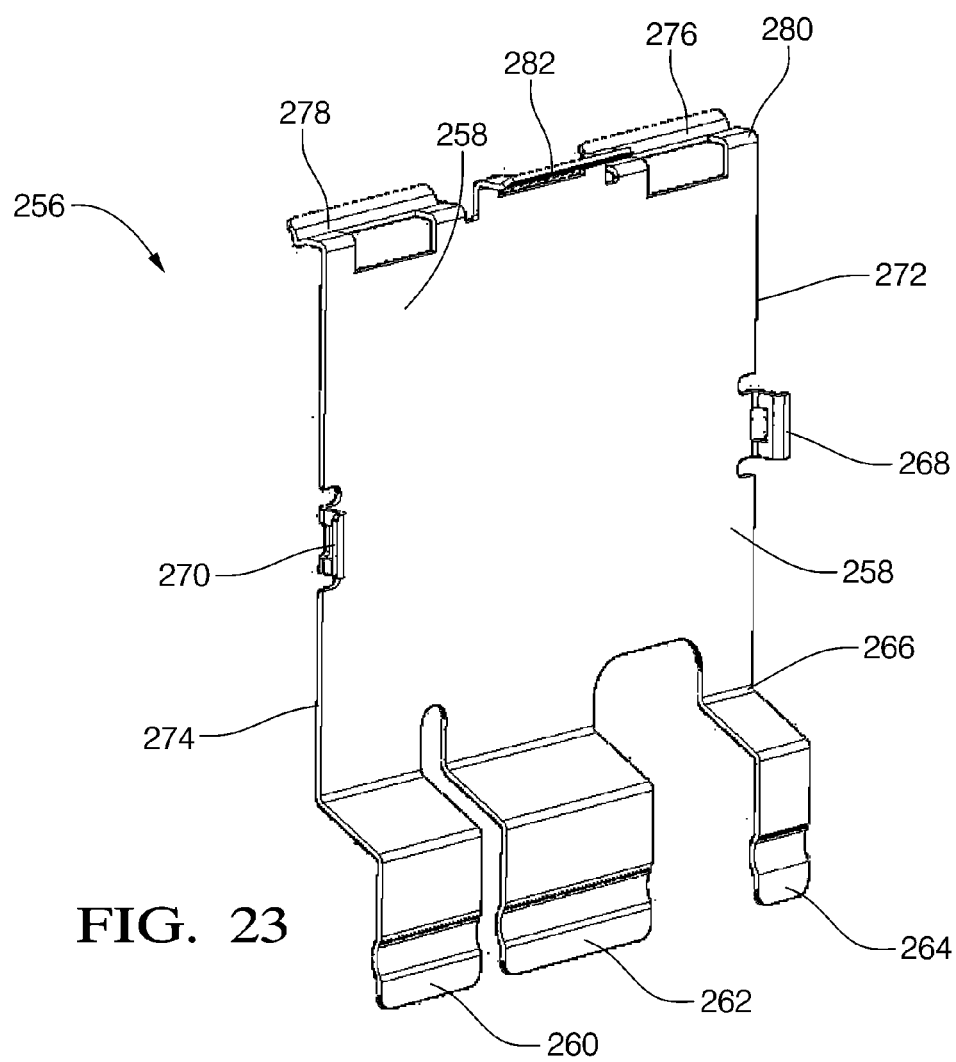
FIG. 23, is a perspective view of the inner side (as assembled) of the electrical power device retainer/backing clip of FIG. 22.

Referring to FIGS. 11 and 12, a typical prior art stud 54 is illustrated as part of a conventional radio/CD player 10.

Referring to FIGS. 5-10, 13 and 14, a feature of the present invention is illustrated wherein the stud 92 is integrally formed with the housing case 68, such as through injection molding. The stud 92 functions to support the rear portion of the radio/CD player assembly 62 when installed in the host vehicle. Upon installation of the radio/CD player assembly, the rearwardly directed stud 92 registers with an opening 196 in a vehicle structural support member 198.

The stud 92 is elongated and has a characteristic cross or "+" shaped cross-section along its axial length. The cross-section configuration of the stud 92 has intersecting vertical and horizontal portions 200 and 202, respectively. The outwardmost surfaces of the vertical and horizontal portions 200 and 202 are dimensioned to establish an interference fit within the opening 196 of the support member 198. Because the stud 92 is constructed of softer material (plastic) than the support member 198 (steel), the outer surfaces of the vertical and horizontal portions will tend to deform locally upon insertion into opening 196 and thereby assure a tight, rattle free connection. Rearwardly directed edges 206 are configured with a sharp transition which will scarf the plastic material of the stud 92 upon any withdrawal from the opening.

As is best illustrated in FIG. 93, vertical and horizontal bosses 208 and 210, respectively, are located directly interiorly of the stud 92 to reinforce the rear wall portion 86 of the case 68 to prevent "oil-canning" and allows use of relatively thin wall section for enhanced weight saving.

Figure 94:
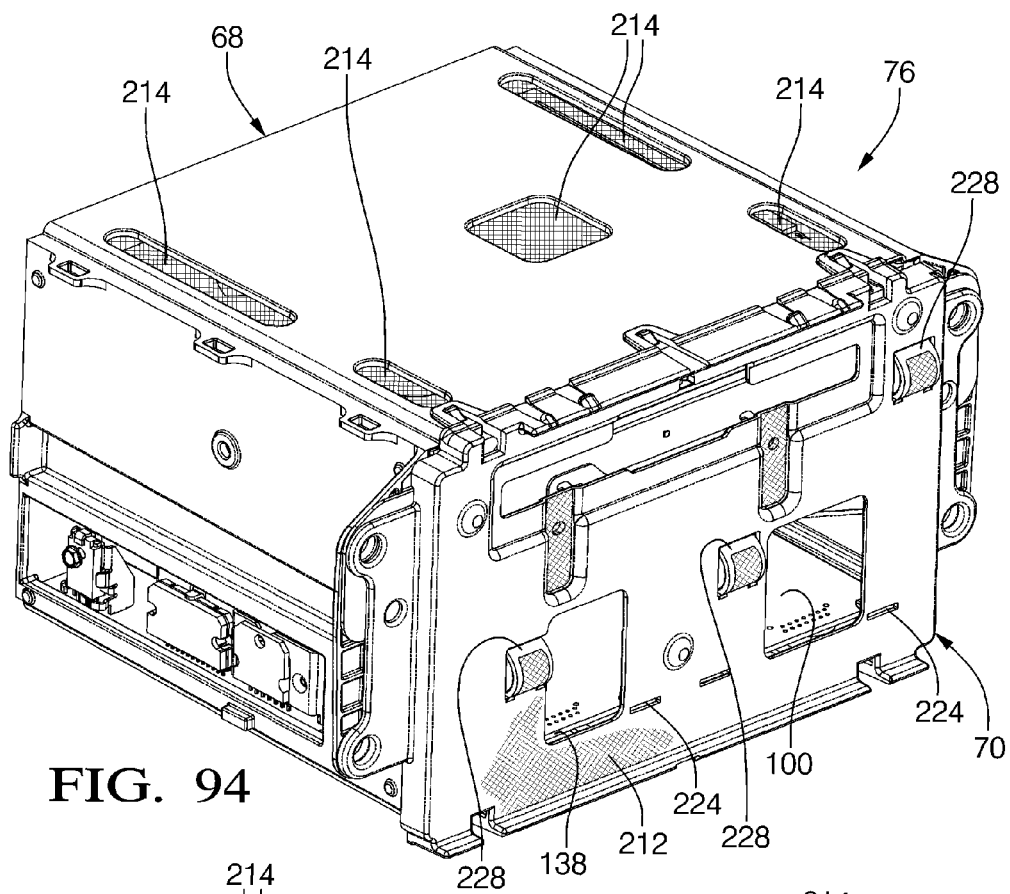
FIG. 94, is a front-above perspective view of a partially assembled radio/CD player, substantially similar to that illustrated in FIG. 7 (prior to installation of the trim plate assembly), illustrating, inter alia, (1) three outwardly directed spring contacts carried by resilient members integrally formed with the faceplate and (2) the juxtaposition of the wire mesh within the faceplate adjacent the outer surface thereof.
Figure 95:
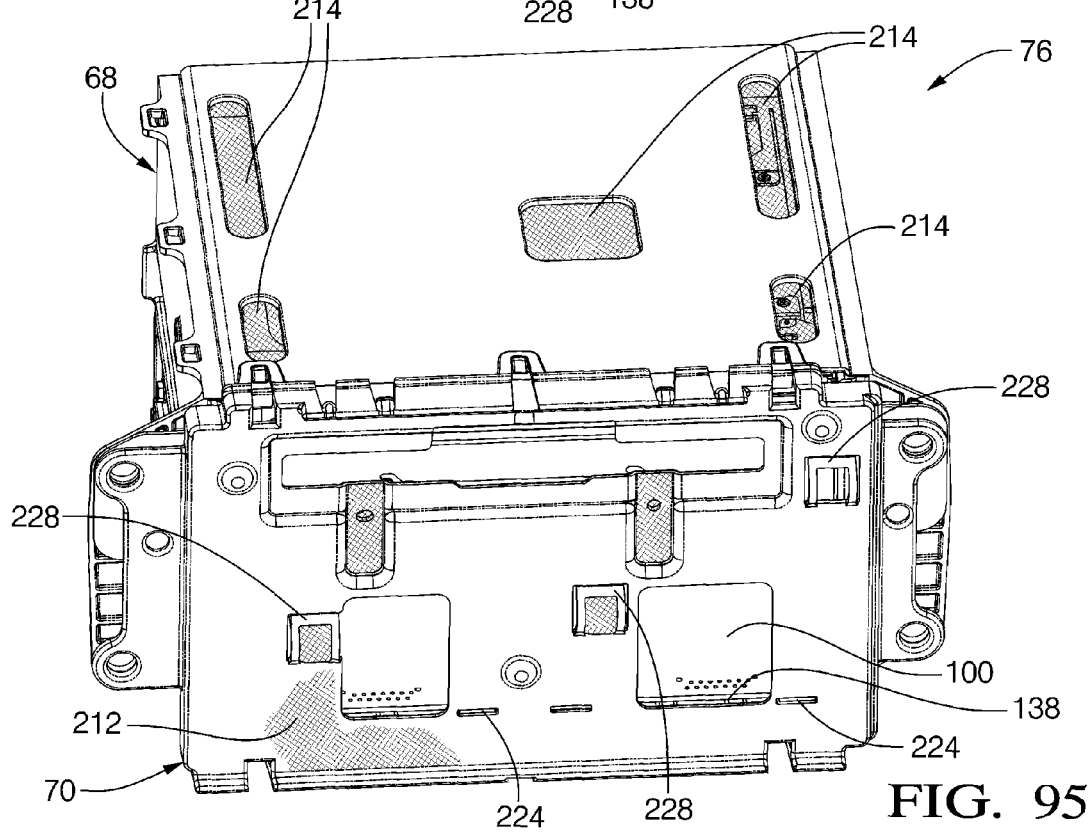
FIG. 95, is a front-left perspective view of the partially assembled radio/CD player of FIG. 94, illustrating the same features from a different perspective.
Figure 96:
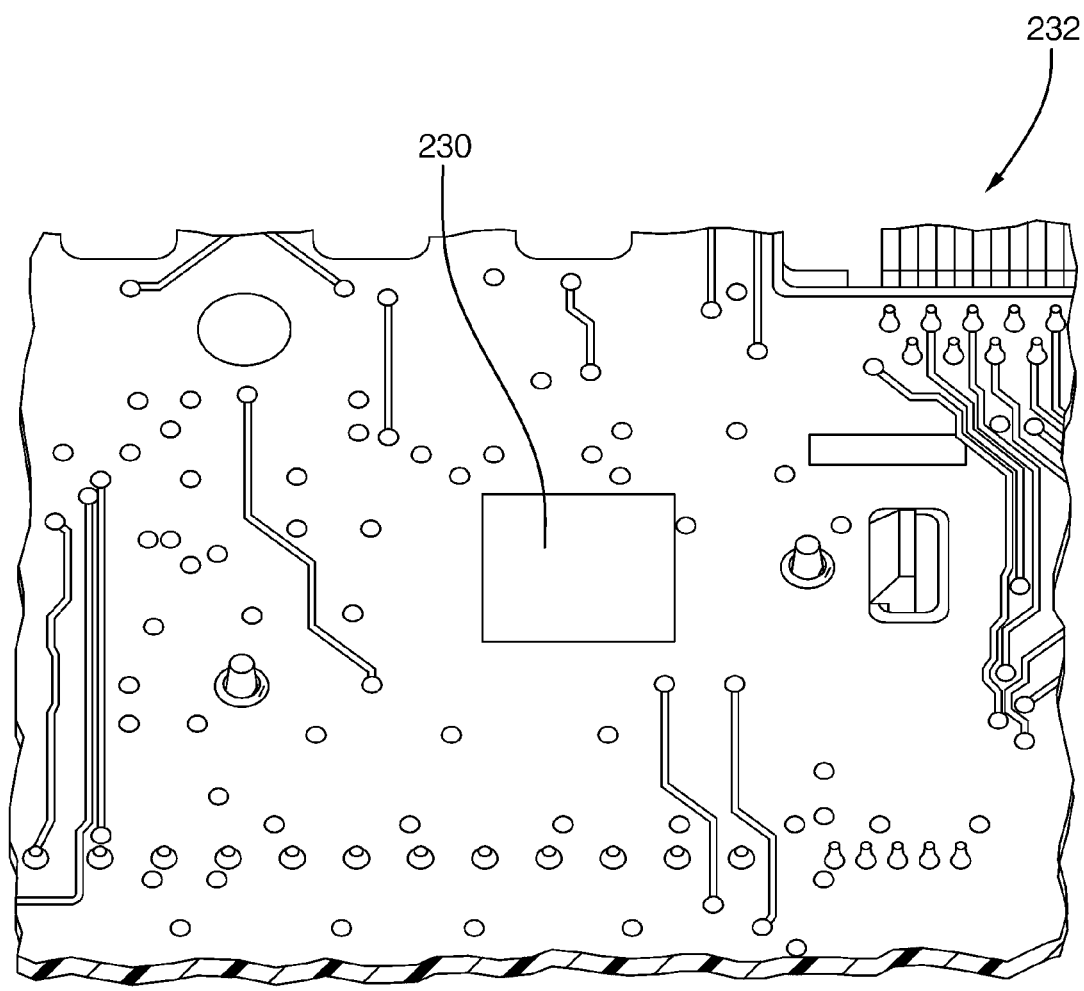
FIG. 96, is a fragmentary, perspective view of a keyboard assembly printed circuit board carried on the inside surface of the trim plate assembly illustrating one of three contact pads which, after assembly, register with and establish electrical interconnection with spring contacts illustrated in FIGS. 94 and 95.
Figure 97:
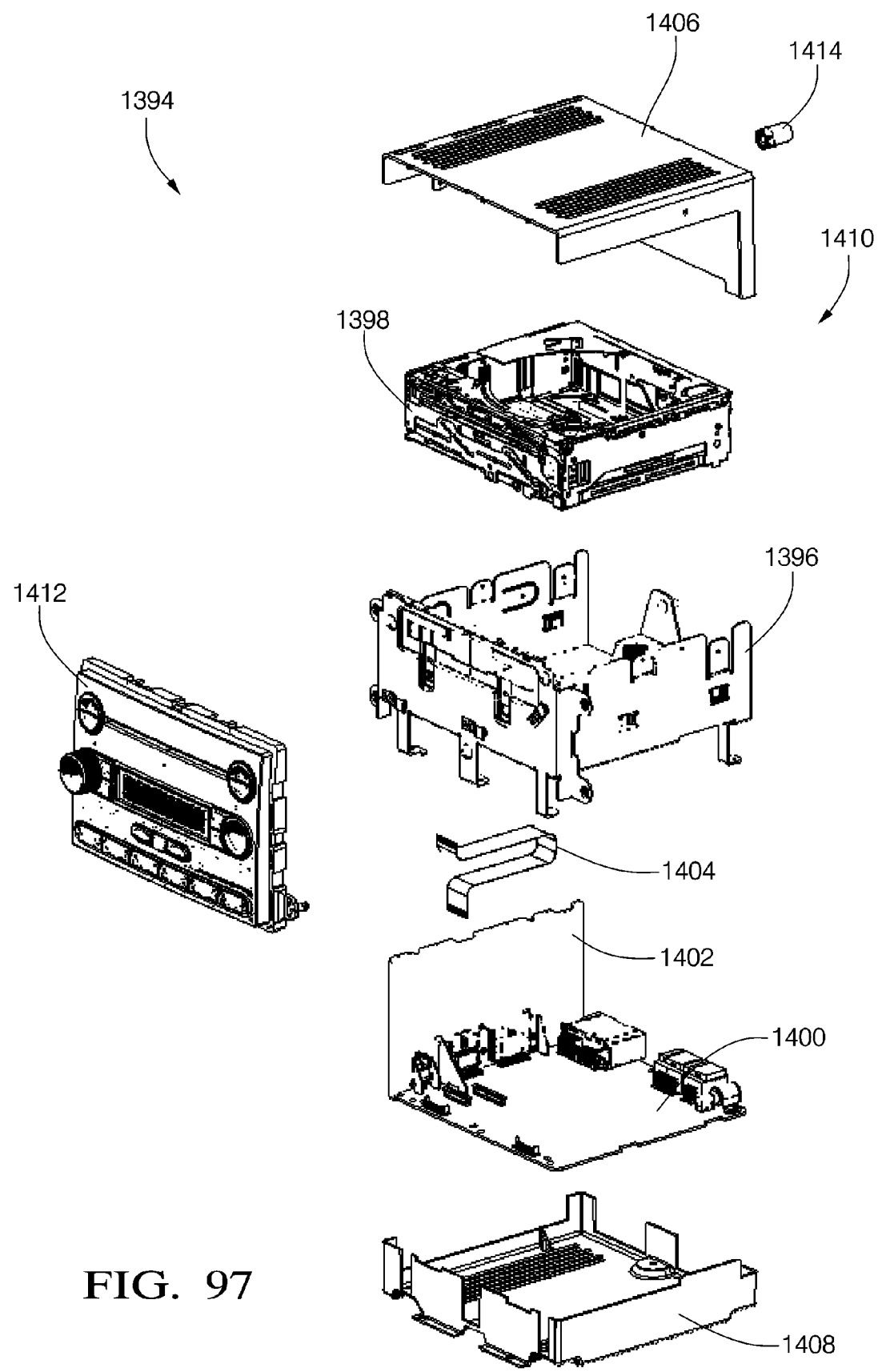
FIG. 97, is an exploded, perspective view of a sixth alternative embodiment of a radio/CD player featuring a modified I-beam case construction wherein the case comprises an assembly of plastic/screen composite and metal panels.
Figure 98:
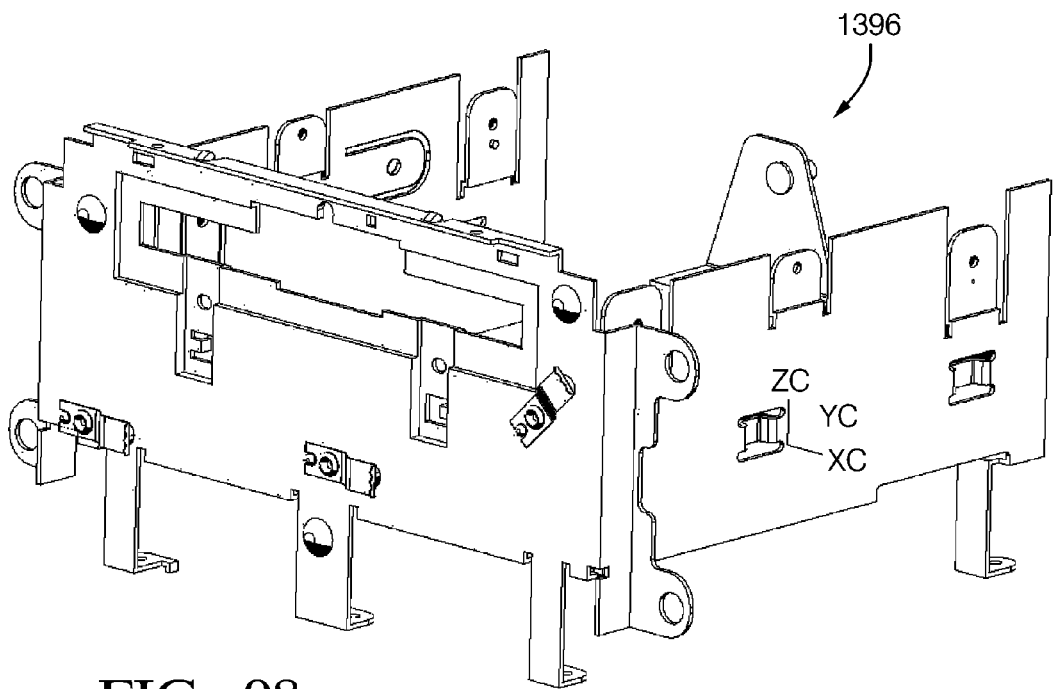
FIG. 98, is a front-side perspective view of a stamped metallic sub-assembly of the radio/CD player of FIG. 97 defining a front panel, partial sidewalls and CD player shelf.
Figure 99:
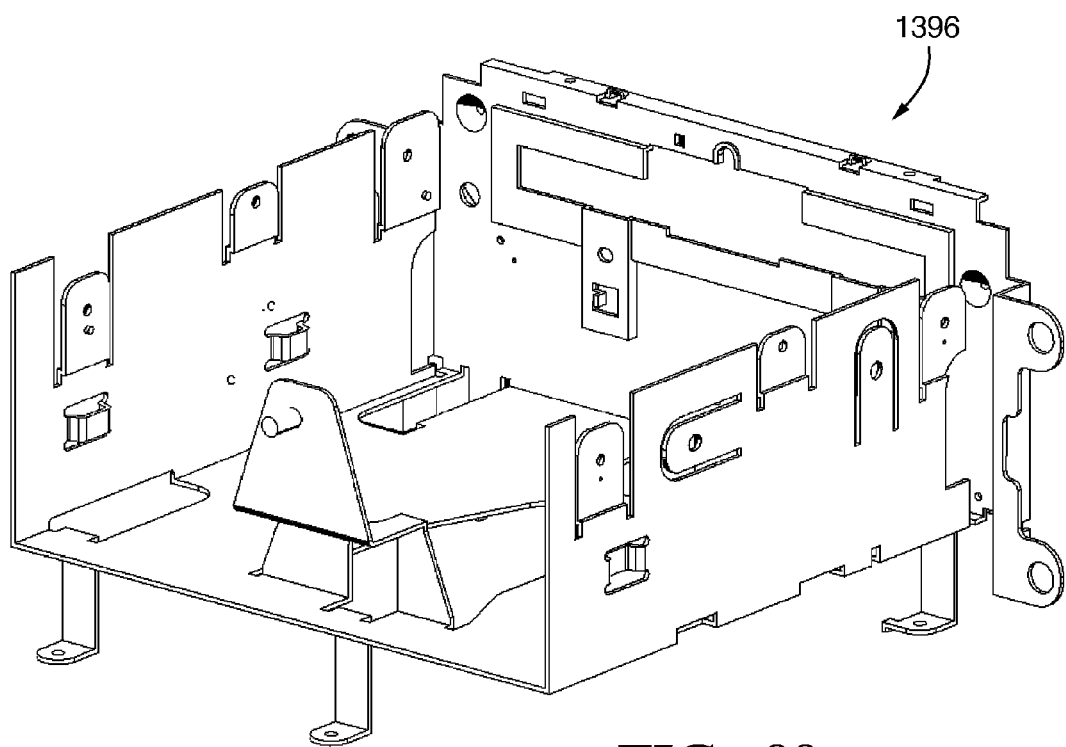
FIG. 99, is a rear-side perspective view of the stamped metallic sub-assembly of FIG. 98.
Figure 100:
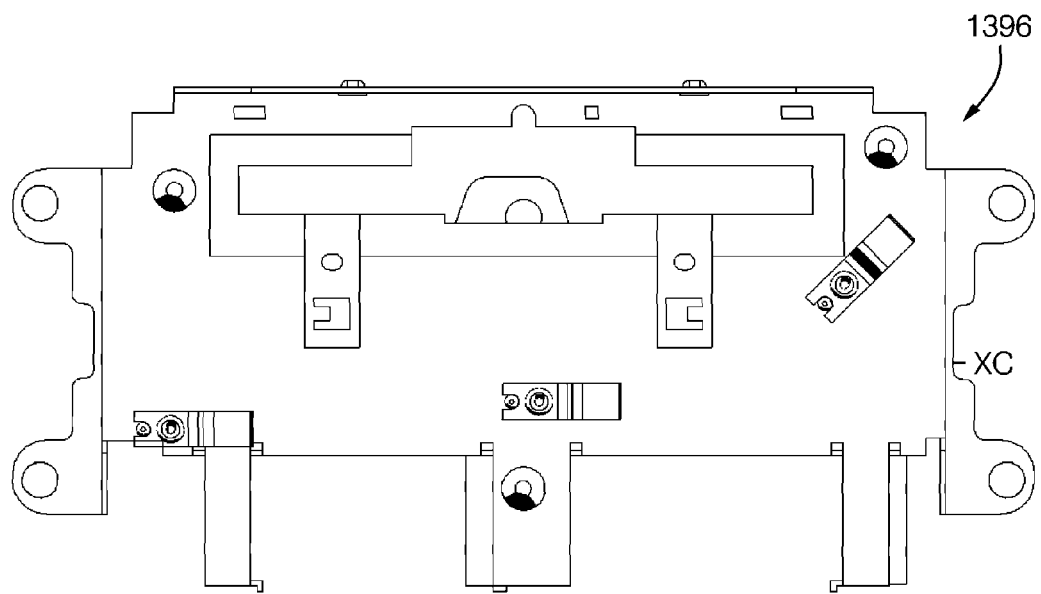
FIG. 100, is a front plan view of the stamped metallic sub-assembly of FIG. 98.
Figure 101:
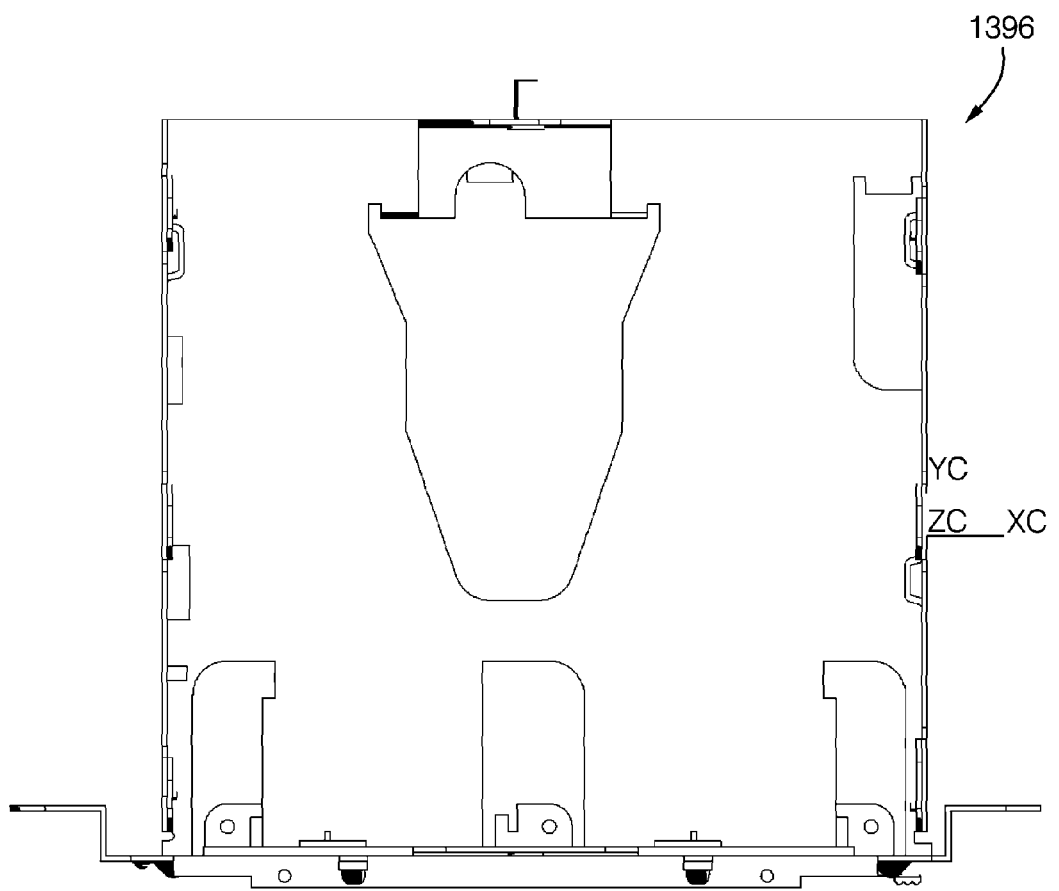
FIG. 101, is a top plan view of the stamped, metallic sub-assembly of FIG. 98.
Figure 102:
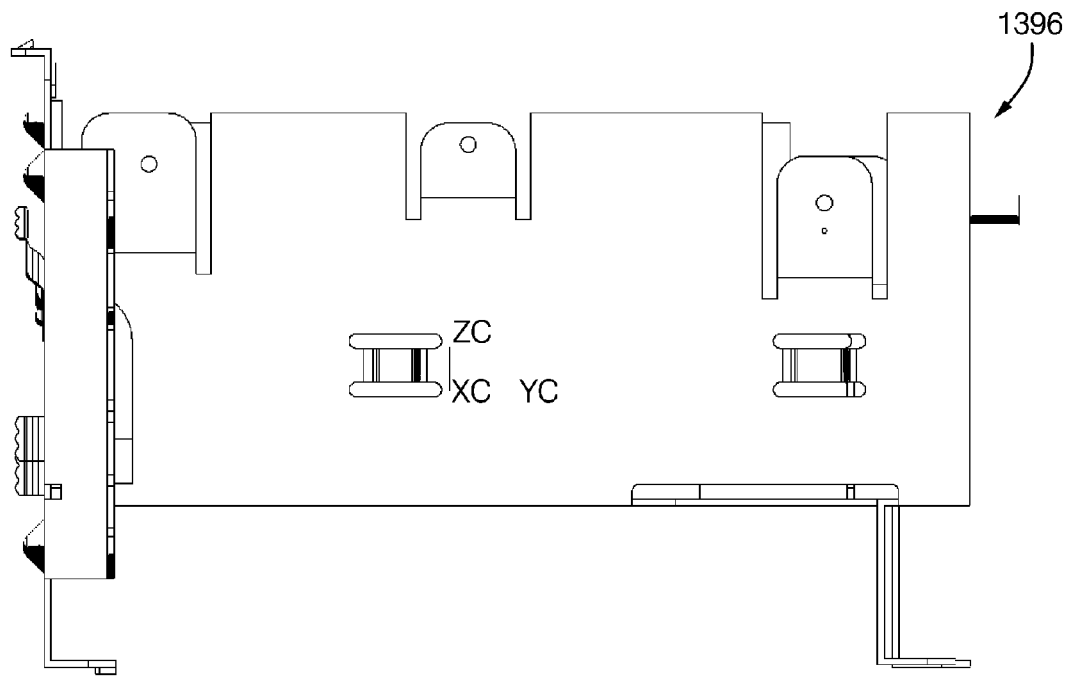
FIG. 102, is a right side plan view of the stamped, metallic sub-assembly of FIG. 98.
Figure 103:
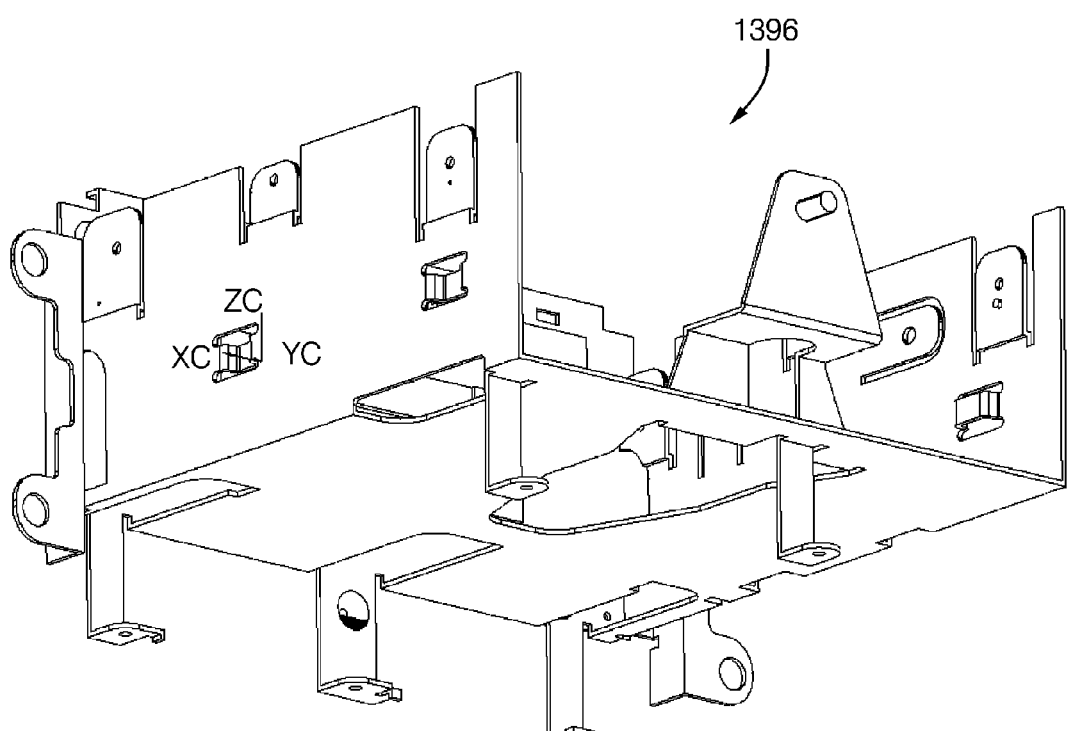
FIG. 103, is an inverted, rear side perspective view of the stamped, metallic sub-assembly of FIG. 98.
Figure 104:
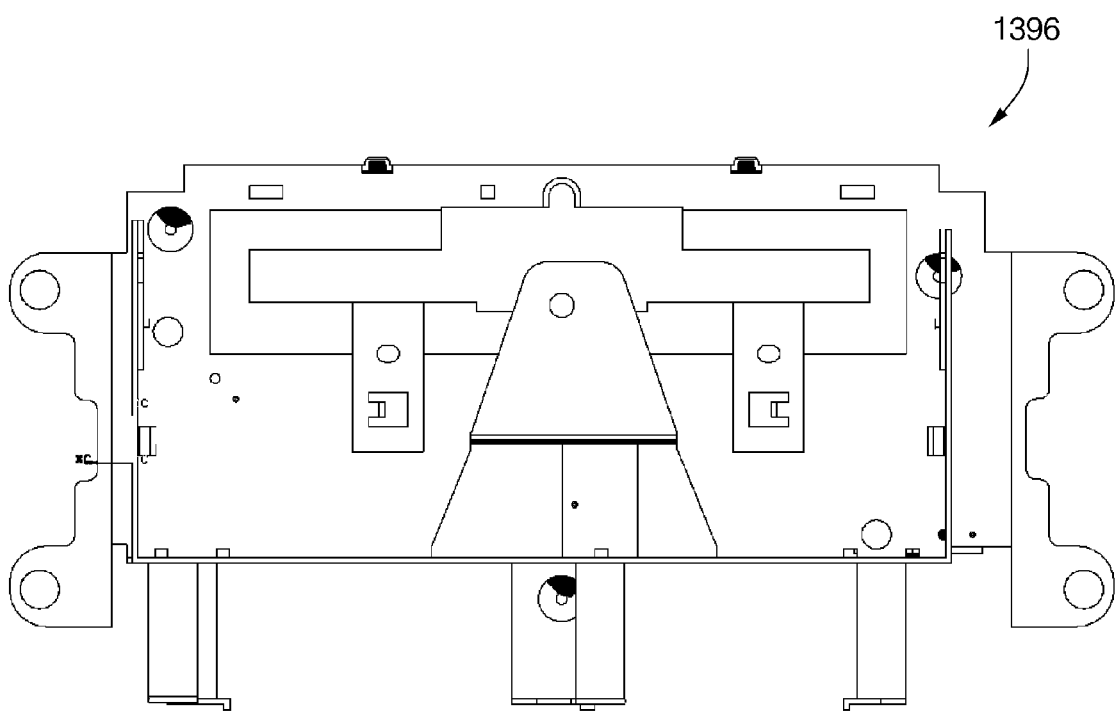
FIG. 104, is a rear plan view of the stamped, metallic sub-assembly of FIG. 98.
Figure 105:
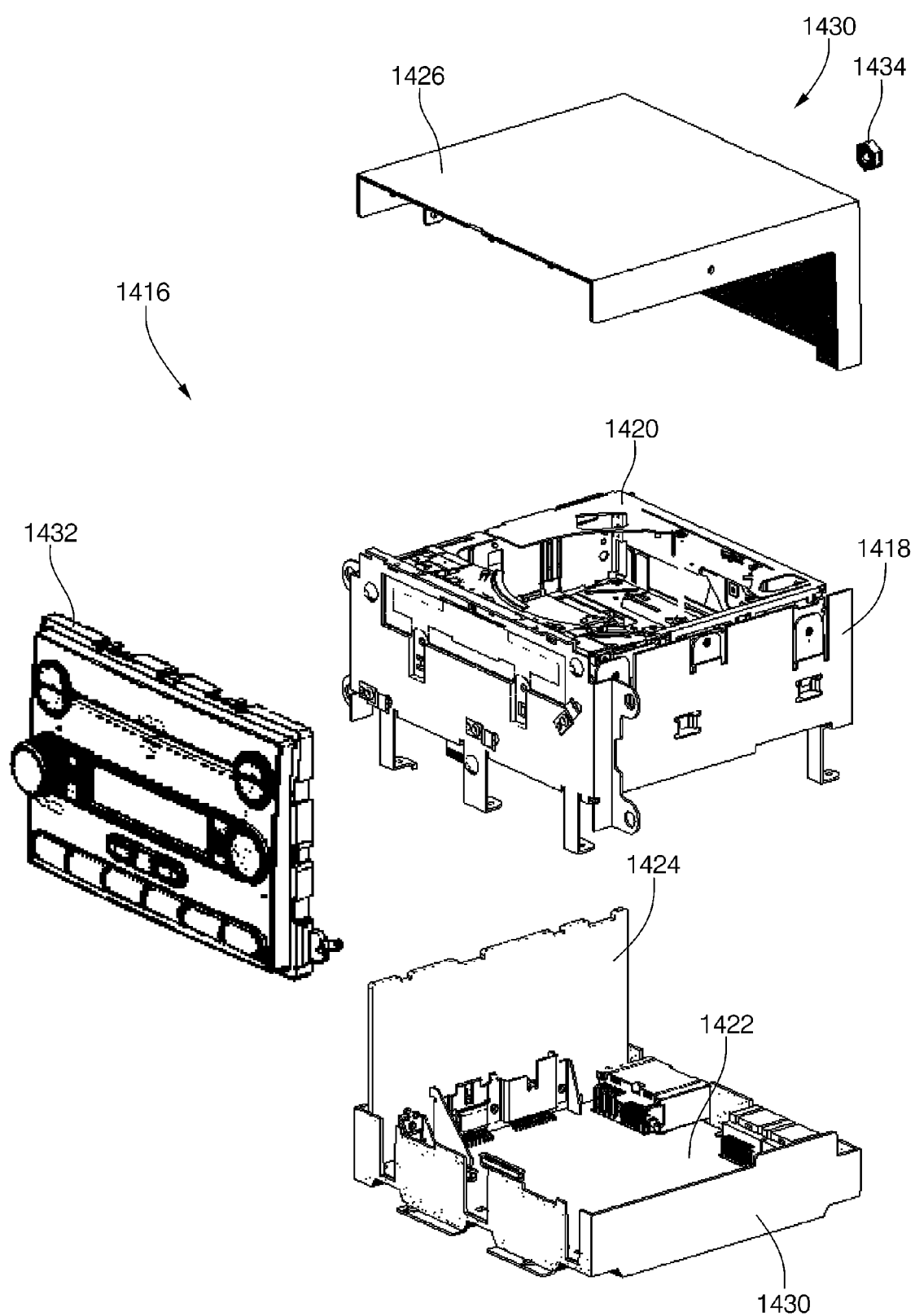
FIG. 105, is a partially exploded, front-side perspective view of a variant of the sixth alternative embodiment of the radio/CD player of FIGS. 97-104, wherein a (single) PCB and heat sink subassembly have been pre-assembled in a bottom/partial sidewall molded plastic case component and upper and lower case ventilation hole arrays have been deleted.
Figure 106:
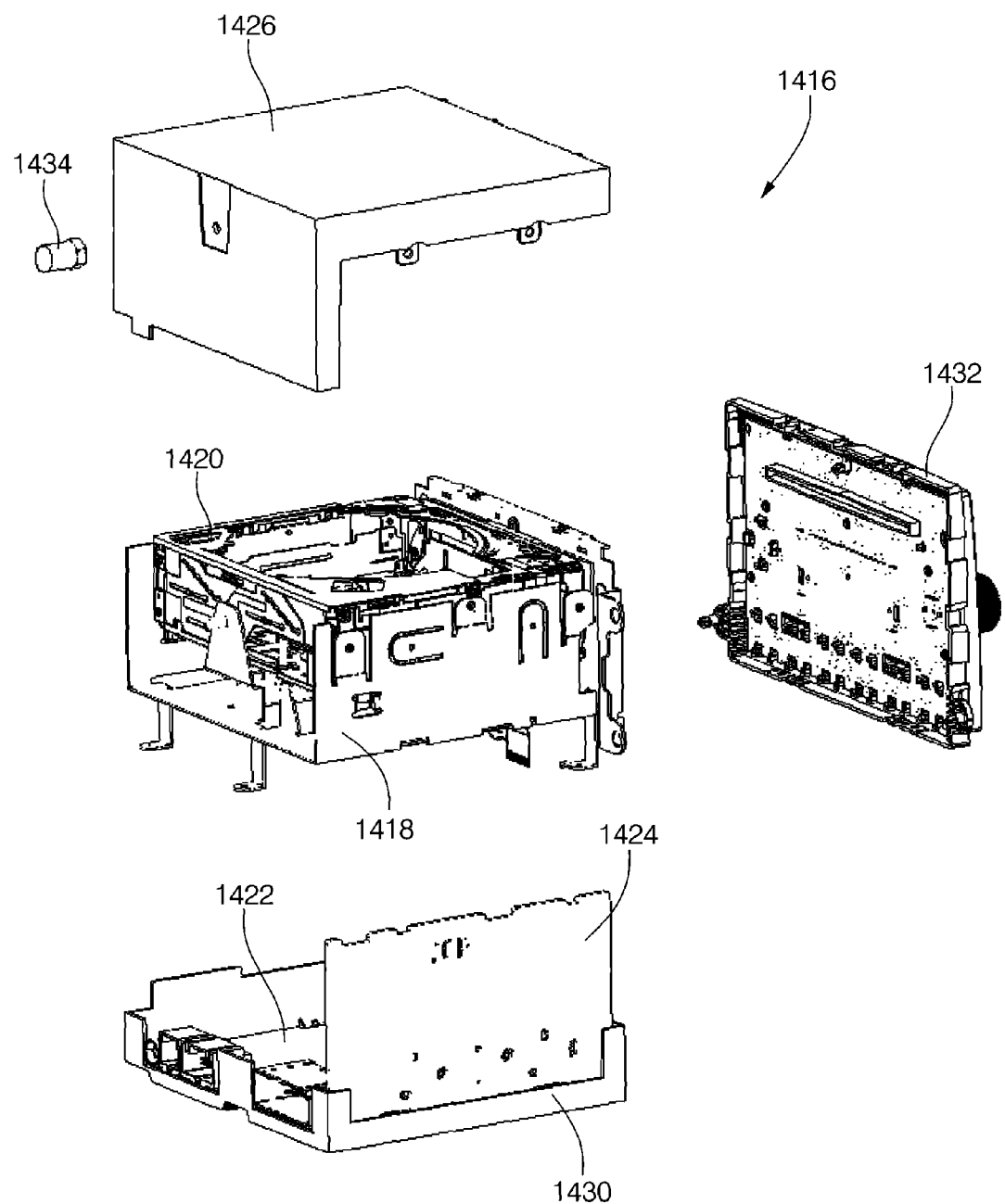
FIG. 106, is an exploded, rear-side perspective view of the radio/CD player of FIG. 105.
Figure 107:
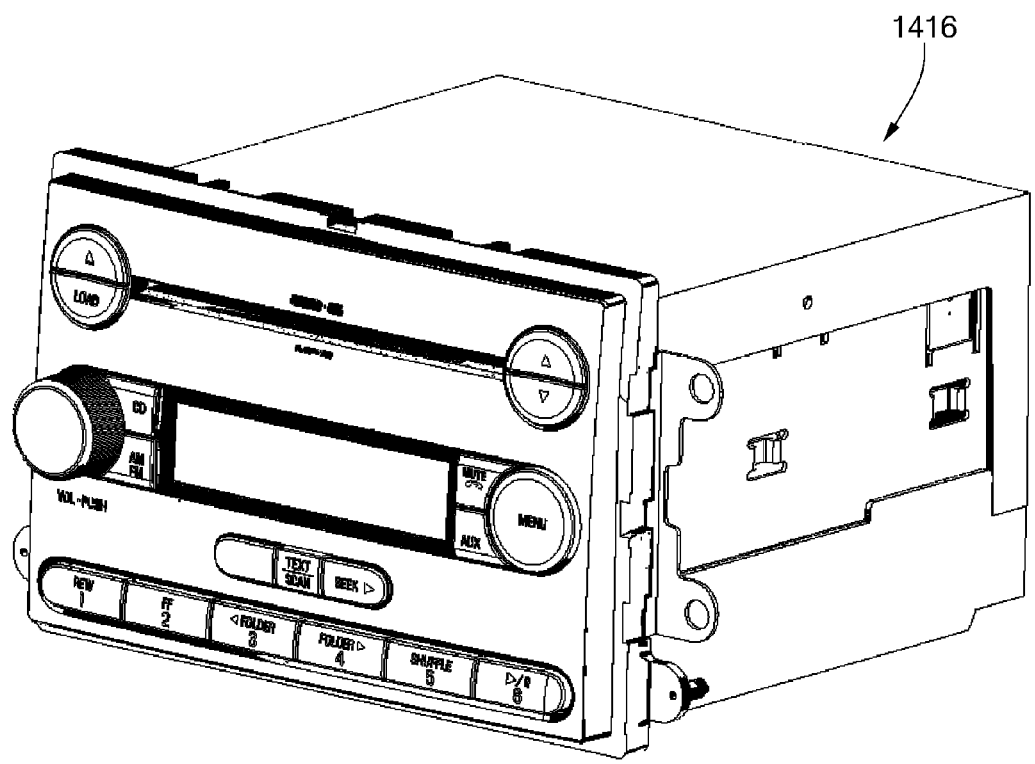
FIG. 107, is a front-right perspective view of the radio/CD player of FIG. 105, as fully assembled.
Figure 108:
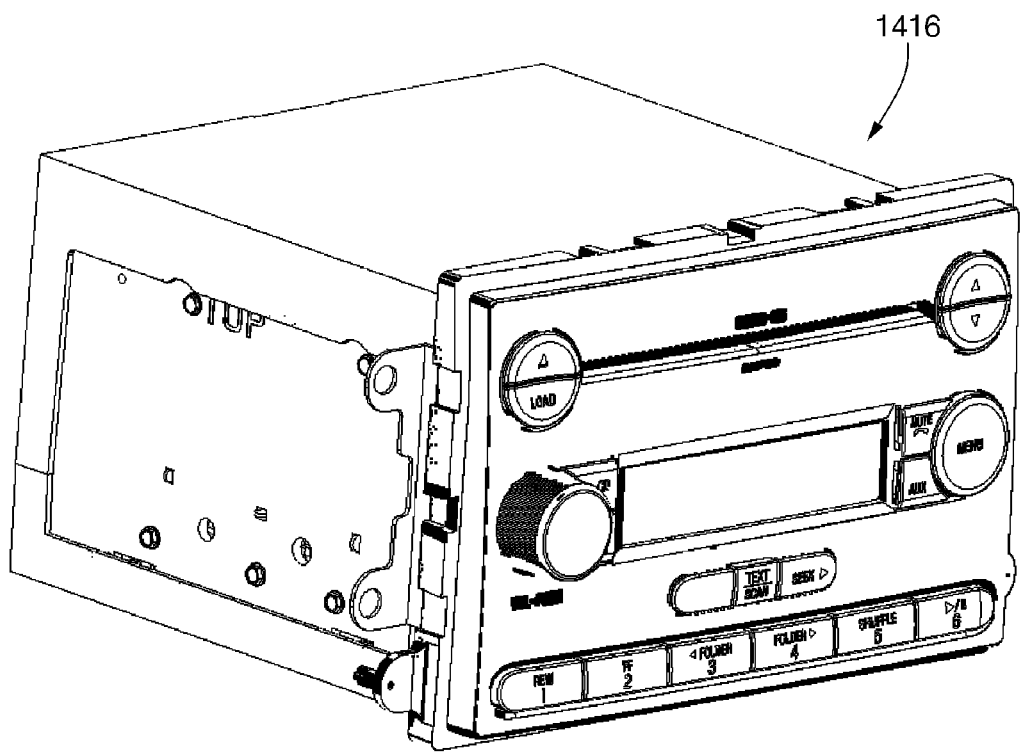
FIG. 108, is a front-left perspective view of the radio/CD player of FIG. 105, as fully assembled.
Figure 109:
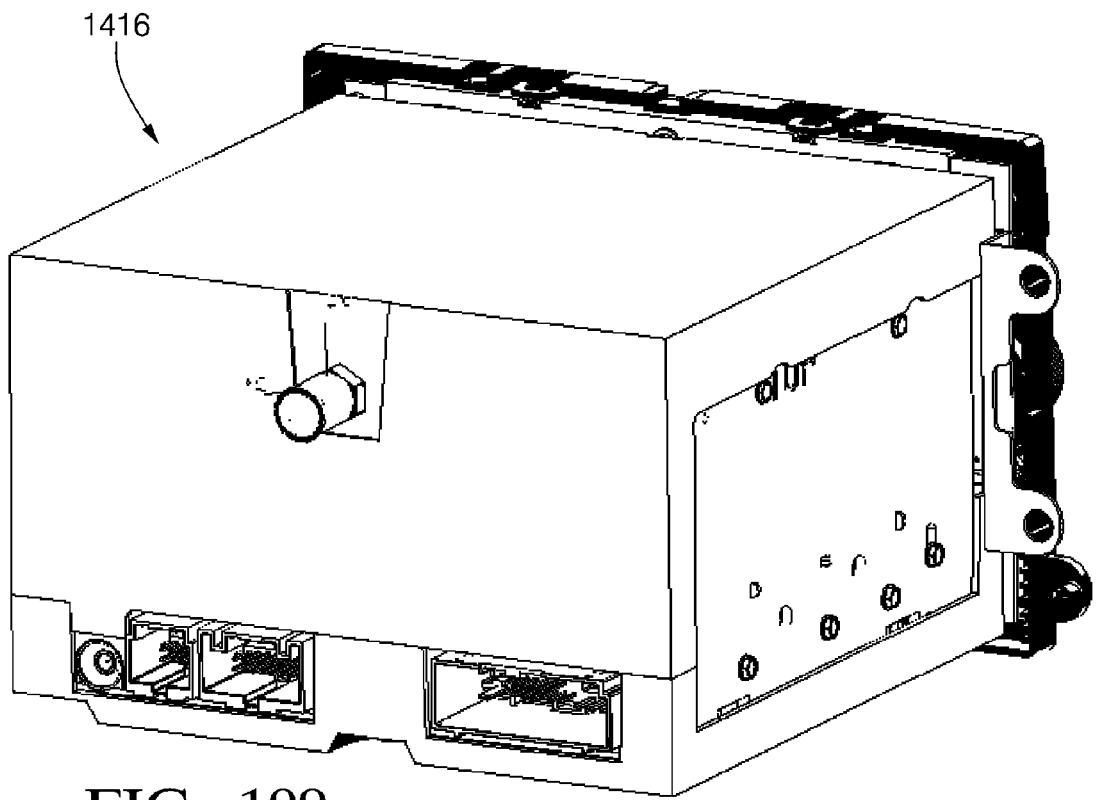
FIG. 109, is a rear-left perspective view of the radio/CD player of FIG. 105, as fully assembled.
Figure 110:
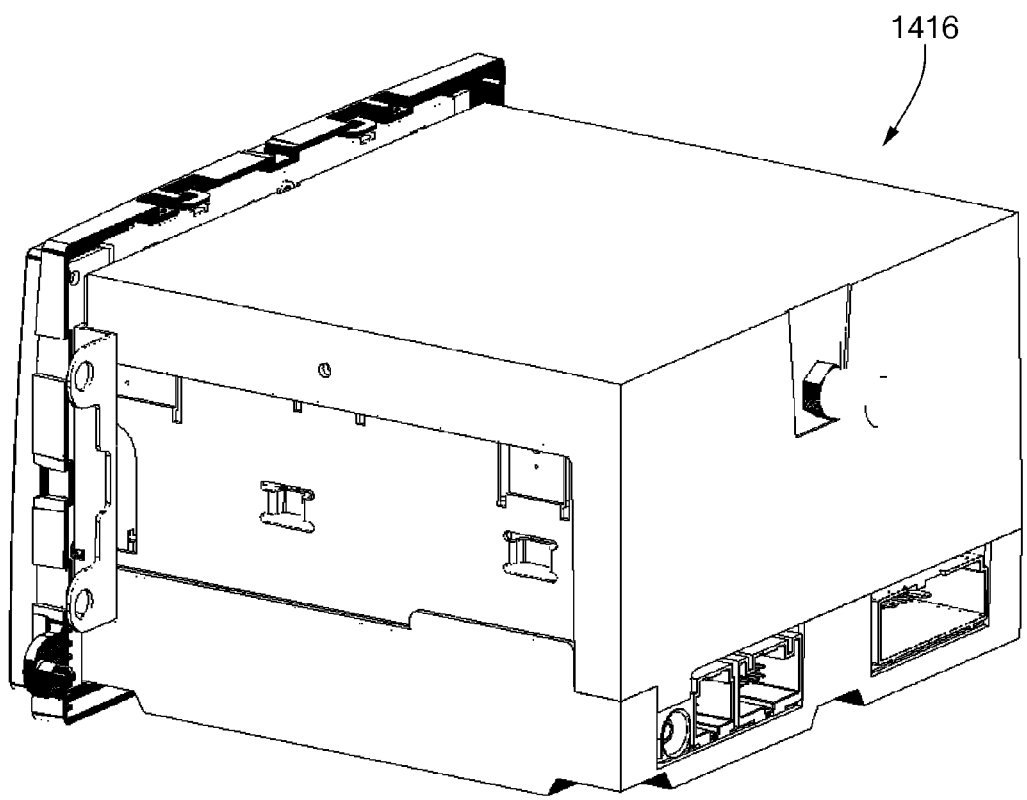
FIG. 110, is a rear-right perspective view of the radio/CD player of FIG. 105, as fully assembled.
Figure 111:
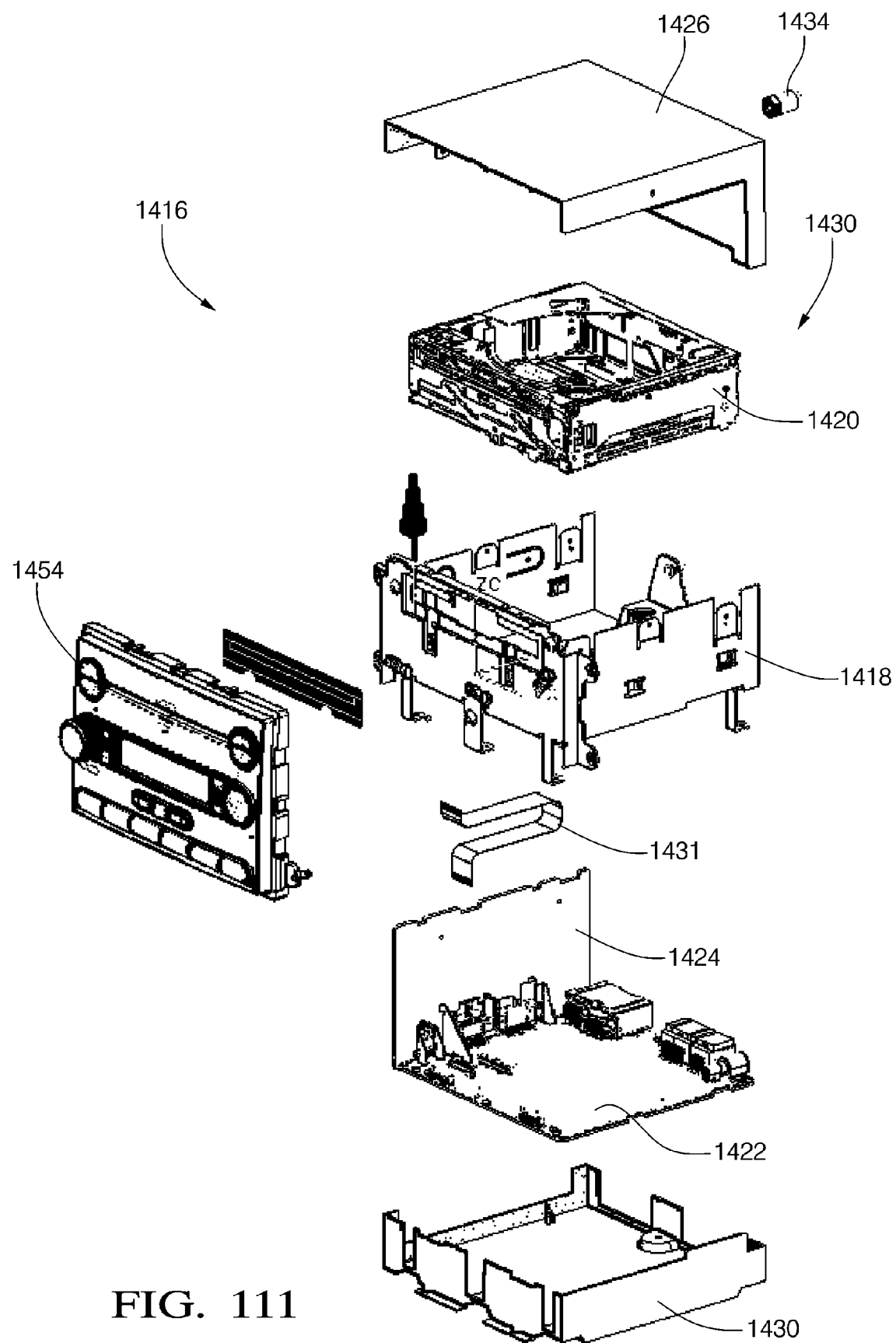
FIG. 111, is a fully exploded view of the radio/CD player of FIG. 105.
Figure 112:
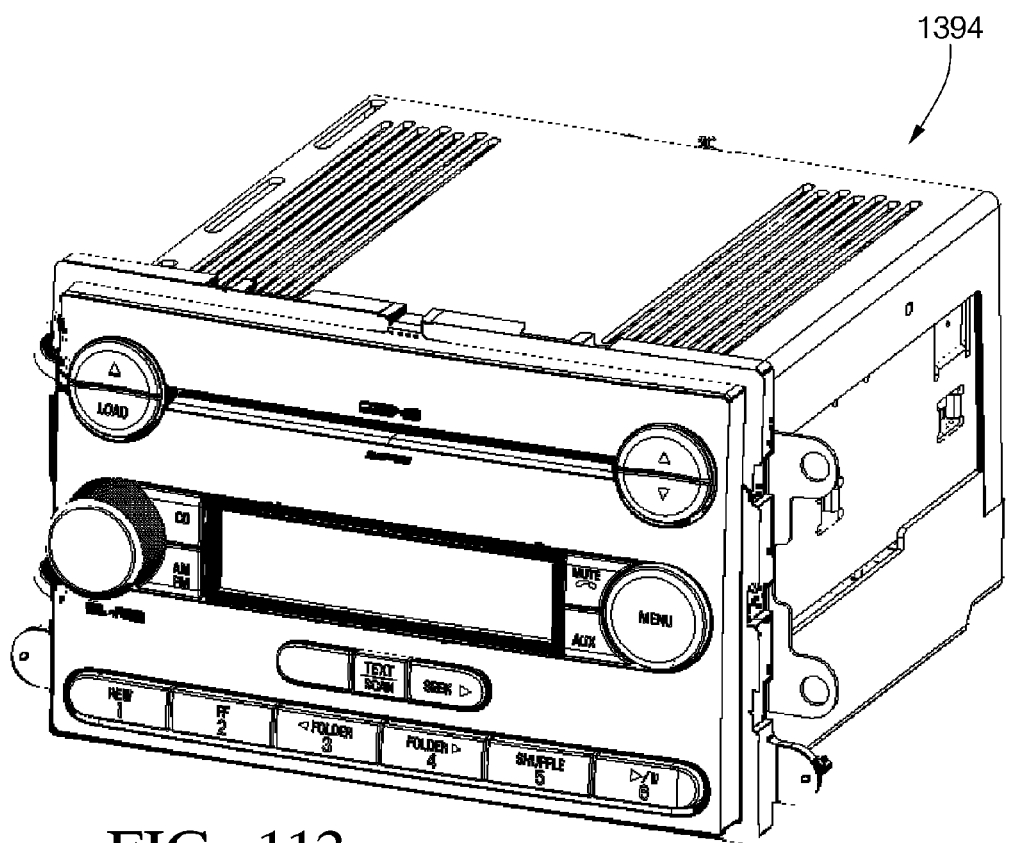
FIG. 112, is a front-right perspective view of the radio/CD player of FIG. 97.
Figure 113:
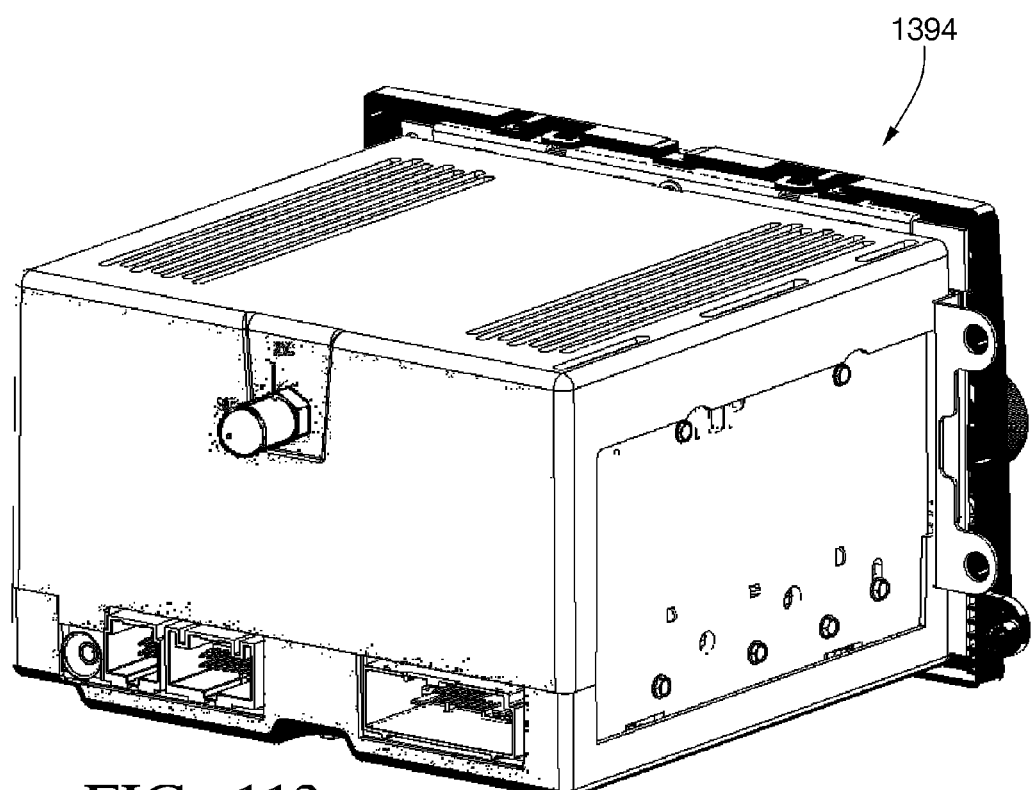
FIG. 113, is a rear-left perspective view of the radio/CD player of FIG. 97.
Figure 114:
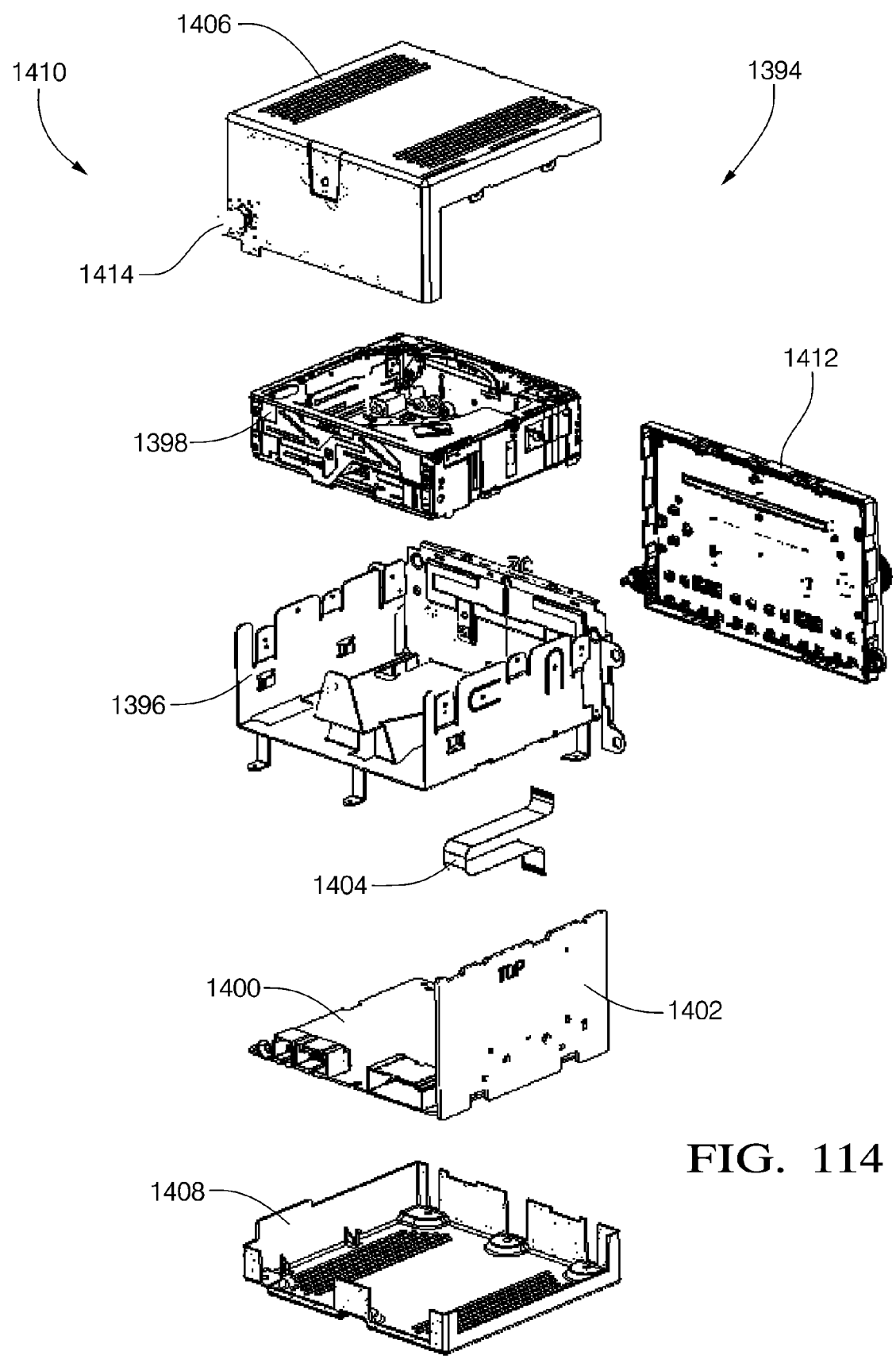
FIG. 114, is an exploded, perspective view of the radio/CD player of FIG. 97, from a rear-left perspective.
Figure 115:
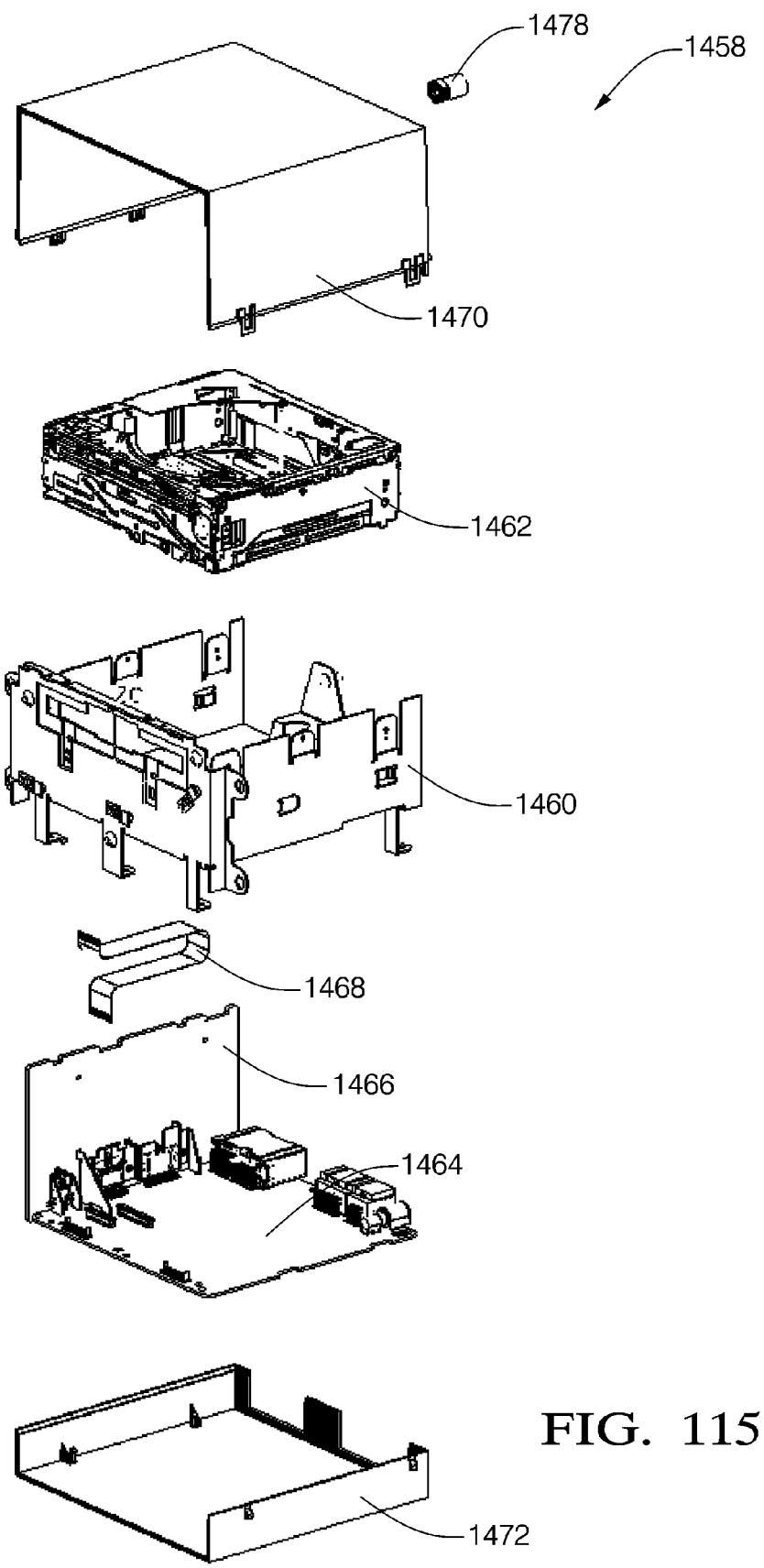
FIG. 115, is an exploded, front-right perspective view of a seventh alternative embodiment of the radio/CD player, featuring a modified "clamshell" or "interlocking block" type composite plastic case construction.
Figure 116:
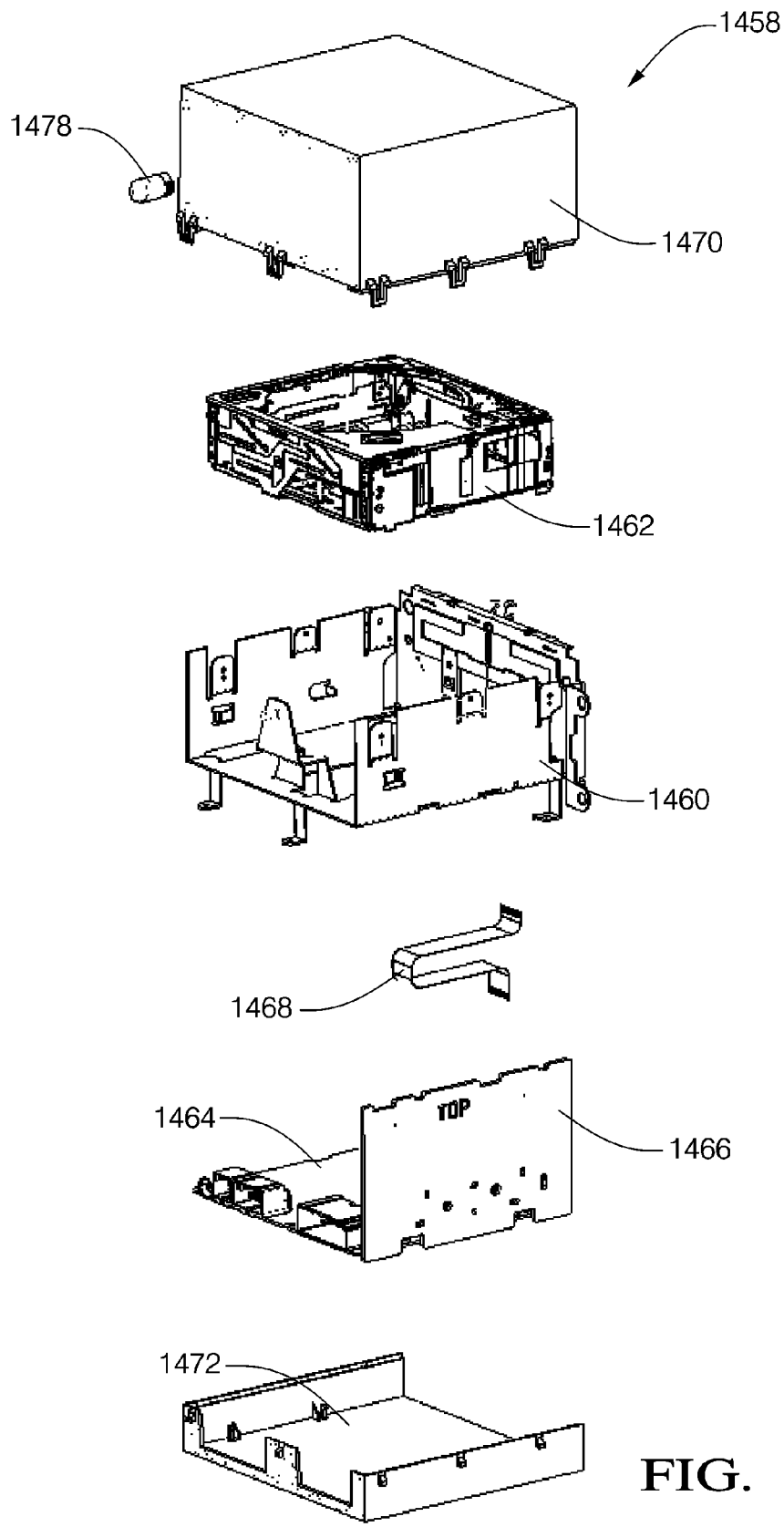
FIG. 116, is an exploded, rear-left perspective view of the radio/CD player of FIG. 115.
Figure 117:
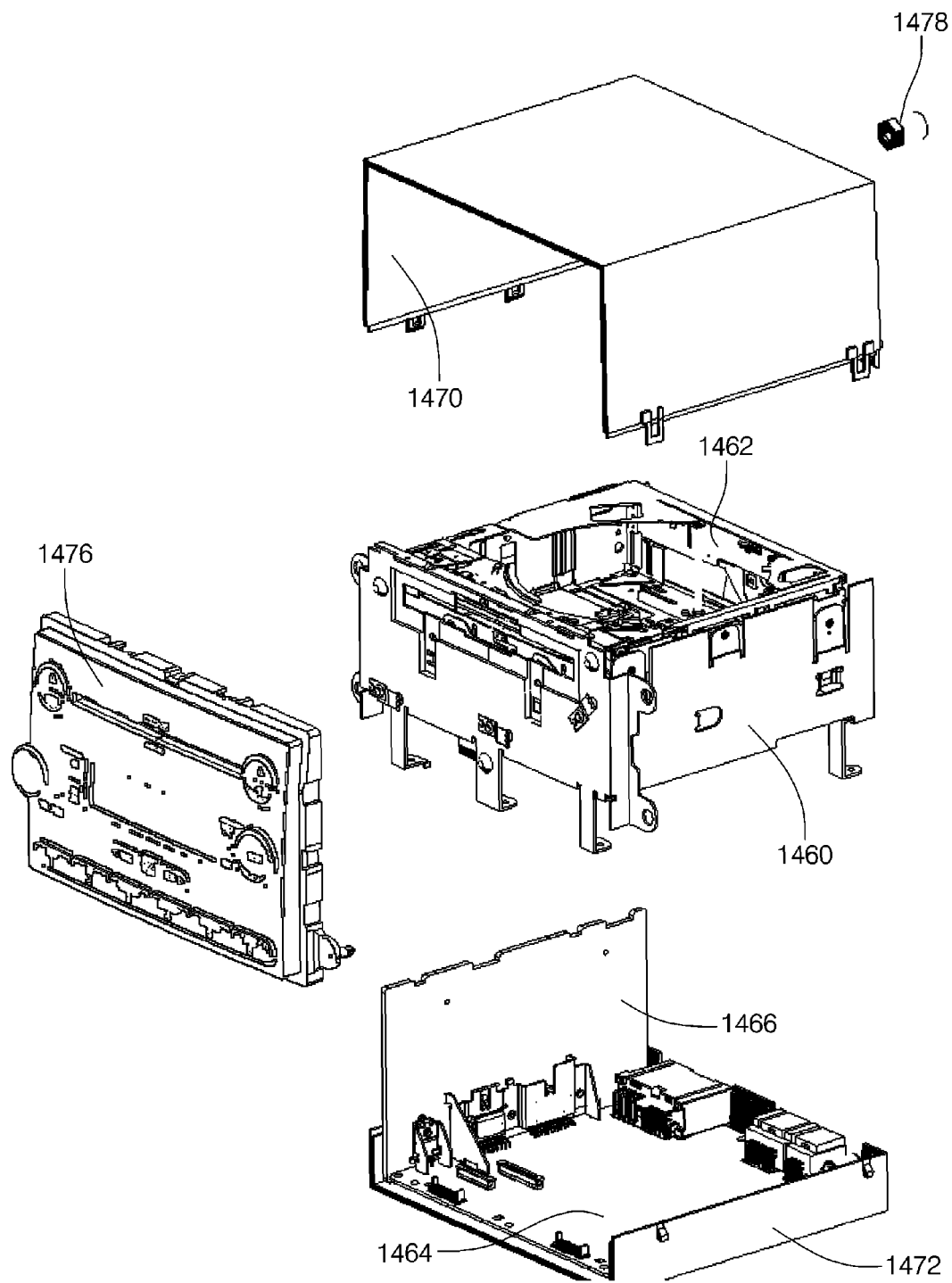
FIG. 117, is an exploded, front-right perspective view of the radio/CD player of FIG. 115, wherein the PCB and heat sink have been pre-assembled with a molded plastic case bottom panel and the CD player has been pre-assembled with a stamped, metallic sub-assembly similar to that described in FIGS. 98-104 and the trim plate has been added.
Figure 118:
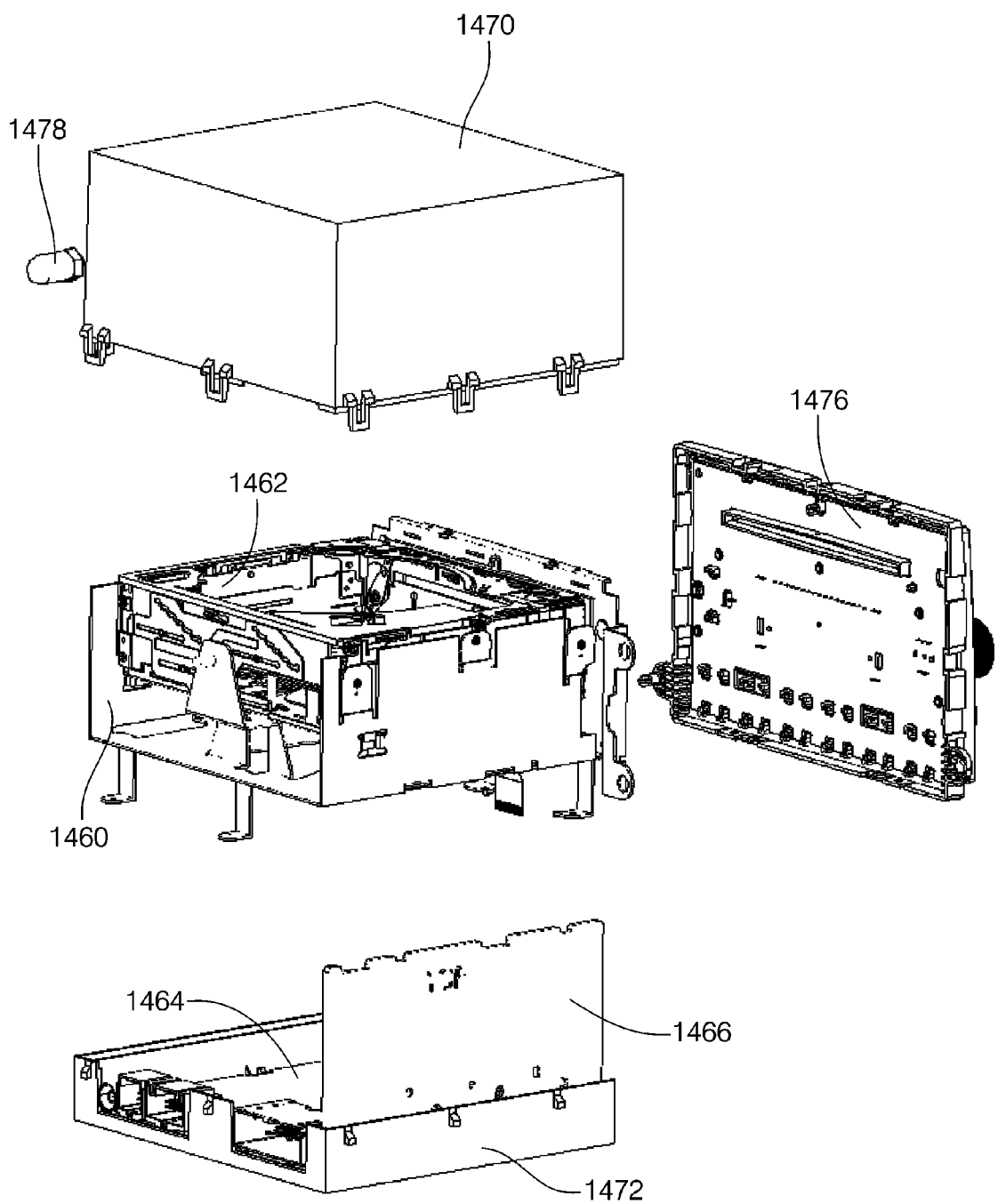
FIG. 118, is an exploded, rear-left perspective view of the radio/CD player of FIG. 117.
Figure 119:
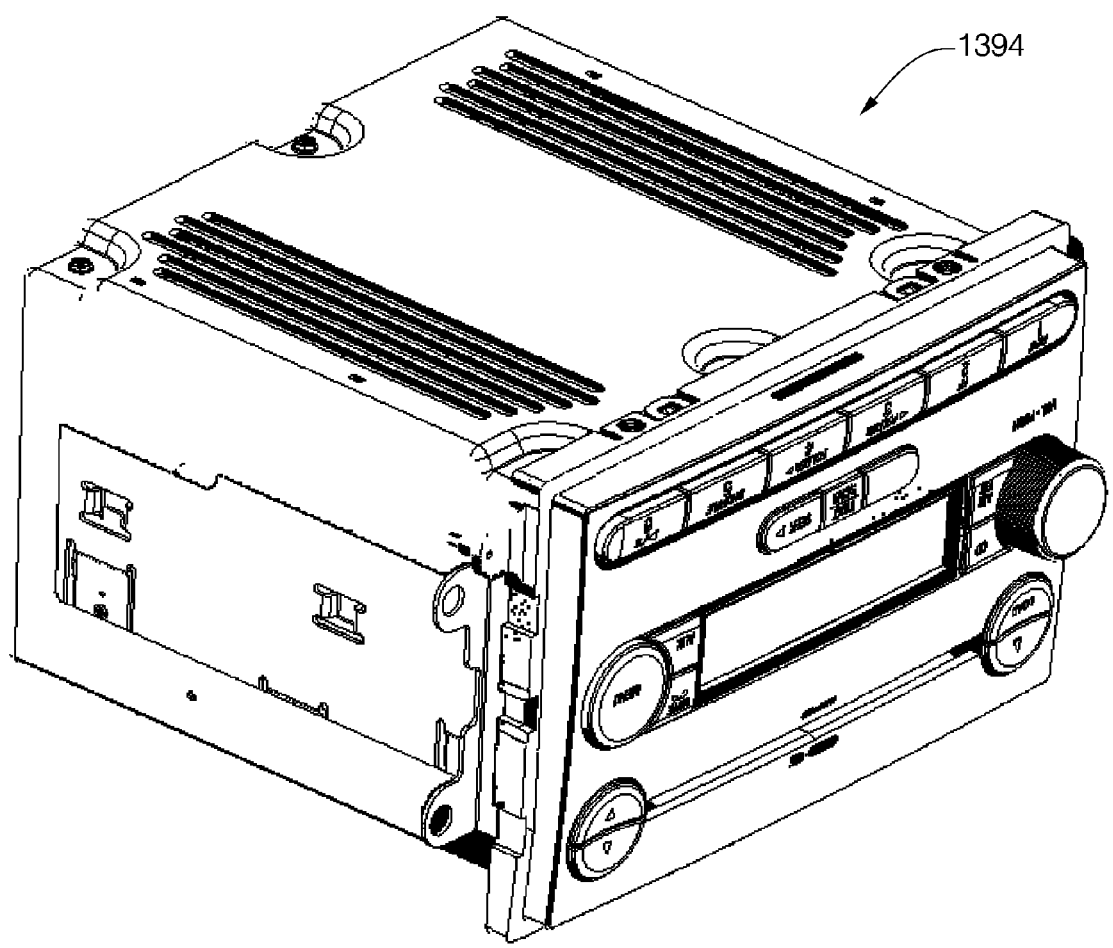

FIGS. 93-95 illustrate an alternative construction of the case 68 and front plate 70 of the housing assembly 76 wherein both elements of the case assembly 76 are formed of a composite of relatively rigid polymer material and electrically conductive material operable to shield the audio components (such as the circuit board subassembly 64 and the CD player subassembly 66) from electrical anomalies including radio frequency interference (RFI), electromagnetic interference (EMI), bulk current injection (BCI) and electrostatic discharge (ESD). The electrically conductive material comprises substantially continuous planer sheet portions applied to surfaces of or within polymer housing assembly wall portions as discrete elements, electrically conductive paint, foil or electrostatic or vacuum deposition applied material. Alternatively, the electrically conductive material comprises a wire mesh screen 212 which has been cut and folded to net shape and inserted within a mold cavity whereby it is effectively insert molded within the polymer based material. Preferably, the wire screen 212 is centered within the wall portions of the case and front plate whereby electrically insulating polymer material effectively covers the wire screen 212, both inside and out, to prevent inadvertent grounding of the housing assembly to interior or exterior structures.

Through empirical testing and development, the inventors have found that it is preferable to locate the wire screen 212 near the inside surface of the case 68 and the outside surface of the front plate 70. Openings 214 are provided in the case 68 by locally eliminating the polymer material but leaving the wire screen intact, whereby judiciously positioned openings 214 provide natural convection cooling to the ambient without having a break or gap in the electrical anomaly protection provided by the wire screen 212.

Circuit Board Grounding to Wire Mesh System (3)

The common circuit board and the unique circuit board are grounded to the molded in wire mesh by using a grounding clip that contacts the ground plane on the circuit board to the metal mesh by pressing the circuit board with the clip installed into a hole or recess in the plastic box that exposes the mesh. A point/ridge/protuberance is used on the clip to press into the mesh and increase the pressure for intimate contact. An alternative of this clip is one that gets surface mounted and soldered to the board and does not require manual assembly.

Referring to FIGS. 15 and 16, one form of grounding the ground plane 216 of the circuit board subassembly 64 to the wire screen 212 is illustrated. The leading edge surface 138 of the unique PCB 100 carries two beryllium copper grounding clips 218, which are electrically and mechanically connected to the PCB ground plane 216. Similarly, a trailing edge surface 222 of the common PCB 98 carries two grounding clips 218. Each grounding clip 218 includes a resilient contact arm 220 extending outwardly along the assembly axis 96. Upon assembly, the grounding clips 218 carried on the leading edge surface 138 of PCB 100 register with exposed wire screen 212 within windows 224 in front plate 70 (refer FIGS. 94 and 95), and the grounding clips 218 carried on the trailing edge surface 222 of PCB 98 register with exposed wire screen 212 within windows 226 in the rear wall portion 86 of the case 68. The contact are 220 of each grounding clip 218 is configured to continuously bear against the adjacent exposed wire screen 212 to maintain electrical contact therewith.

Referring to FIGS. 133-139 and 155-158, alternative forms of grounding the ground plane 216 of the circuit board subassembly 64 to the wire screen are illustrated. FIG. 133 illustrates a radio/CD player 622 similar in all material respects to the radio/CD player 62 described hereinabove in connection with FIGS. 2-10 and 15-20 inter alia, with the exceptions described immediately hereinbelow. In essence, in this embodiment, the four ground clips 218 contained on the circuit board subassembly 64 are deleted and replaced by connectors integrally formed with the housing assembly 76.

Referring to FIGS. 133, 135 and 137, a circuit board subassembly 624 includes a common PCB 626 interconnected with a unique PCB 628 by pin connectors 630. A leading edge 631 of the unique PCB 628, when installed within a front plate 632, engages two Z-clips 634 integrally formed within the front plate 632, whereby wire screen 636 exposed in the Z-clip 634 engages a contact pad/plane 638 carried on the unique PCB 628 adjacent its leading edge 631. A trailing edge 652 of the common PCB 626, when installed in a housing case 654, engages two grounding clips 658 integrally formed within the case 654, whereby wire screen 636 exposed in the grounding clip 656 engages a contact pad/plane 658 carried on the common PCB 626 adjacent its trailing edge 652.

As best viewed in FIGS. 135 and 137, the Z-clip 634 includes a frame 640 integrally formed adjacent one side of an associated opening 642 and extending inwardly (within an associated housing case 643) therefrom as a resilient cantilever. The frame 640 includes two parallel "L' or "J" shaped leg portions 644 interconnected by a cross support portion 646. A flap of wire screen 636 is die-cut prior to being injection molded within the front plate 632. During the injection molding process, the edges of the wire screen flap are insert molded within the leg portions 644, the cross-support portion 646 and the adjacent front panel of the front plate 632, thereby exposing the wire screen flap 636 for electrical connection with the unique PCB contact pad 638. An inwardly directed boss 648 is integrally formed on the front plate 632 adjacent an edge of the opening 642 opposite from the leg portions 644, and extends substantially parallel to an assembly axis 649. The boss 648 forms a guide/abutment surface 650 which is spaced from the exposed wire screen flap 636 by a dimension slightly less than the thickness of the unique PCB 628 to ensure a tight compressive fit when the leading edge 631 of the unique PCB 628 is inserted therebetween. The natural resiliency of the polymer material forming the Z-clip frame 640 ensures continued continuity of the electrical connection between the exposed wire screen 636 of the Z-clip and the unique PCB contact pad 638.

As best viewed in FIGS. 134 and 136, the grounding clip 656 includes a cooperating pair of laterally spaced support members 660 and 662 integrally formed in a rear wall portion 664 of the case 654 adjacent the bottom edge of an associated opening 663 and extending inwardly therefrom. A flap of wire screen 666 is die-cut prior to being injection molded within the case 654. During the injection molding process, the lateral edges of the wire screen flap 666 are insert molded within the support members 660 and 662 and the adjacent portion of the case rear wall portion 664, thereby exposing the wire screen flap 666 for electrical connection to the common PCB 626 contact pad 658. A wire screen positioning finger 668 is integrally formed in the rear wall portion 664 of the case 654 laterally intermediate the support members 660 and 662, and extends inwardly from the rear wall portion 664 substantially parallel to an insertion axis 670 as a resilient cantilever. The positioning finger 668 is vertically positioned with respect to the support members 660 and 662 to continuously contact the lower surface of the wire screen flap 666 to ensure that the lateral center portion of the wire screen flap 666 is bowed slightly upwardly and resiliently maintained at least slightly above the upper surface portions 672 and 674 of the support members 660 and 662, respectively. An inwardly directed boss 676 is integrally formed on the rear wall portion 664 of the case 654 adjacent the top edge of the opening 663 opposite from and laterally centered with the support members 660 and 662. The boss 676 forms a guide/abutment surface 678 which is spaced from the exposed wire screen flap 666 by a dimension slightly less than the thickness of the common PCB 636 to ensure a tight compressive fit then the trailing edge 652 of the common PCB 636 is inserted therebetween. The natural resiliency of the polymer material forming the ground clip 656 structural elements ensures continued continuity of the electrical connection between the exposed wire screen 666 of the ground clip 656 and the common PCB contact pad 658.

Referring to FIGS. 138 and 139, another example of self-grounding is illustrated wherein a PCB 680 includes an extension 682 projecting forwardly therefrom in line with an assembly axis 684 of a housing case 686 for an audio system 687. Contact pads 688 and 690 are carried on upper and lower surfaces 692 and 694 of the PCB extension 682. A rear wall portion 696 of the case 686 forms a window 698 exposing a portion of wire screen 700 which is aligned with the PCB extension 682. When the wire screen 700 is insert molded within the polymeric material forming the case 686, the portion thereof coinciding with the window 698 is left intact. During the assembly process of the audio system 687, wherein the PCB is installed by insertion along guideways (not illustrated) within the case 686, the PCB is inserted with sufficient force to locally rupture and penetrate the exposed wire screen 700 within the window 688. Following the rupture of the wire screen 700, the residual separation edges thereof are drawn into the window 698 by friction caused by motion of the upper and lower PCB surfaces 692 and 694, respectively. When the PCB 680 assumes its installed position, as illustrated in FIG. 139, the rended portions of the wire screen 700 are compressively fit between the contact pads 688 and 690 and the adjacent edges of the window 698, ensuring continued continuity of the electrical connection between the exposed wire screen 700 and the PCB contact pads 688 and 690. It is contemplated that a single (one side of the PCB) contact pad can also be employed. However, the redundancy afforded by the dual contact pads 688 and 690 is preferable.

Referring to FIGS. 155 and 156, a modification of the self-grounding system described in connection with FIGS. 138 and 139 can enhance assembly of an audio system 702 for simplified and improved unit-to-unit repeatability. A housing case 704 includes a wall portion 706 forming a window 708 exposing a wire screen 710 to establish a point of electrical connection to an audio component within the case 704. After the wire screen 710 is insert molded within the polymer material forming the case 704, but before the assembly if the audio system 702, a tool, such as a cooperating punch 712 and die 714 is pressed simultaneously against the inner and outer surfaces of the exposed screen 710 within the window 708 to form perforations or weakenings, indicated by dotted lines 716. This process step is indicated by arrows 718. The perforations 716 make the exposed wire screen 710 more predictably frangible for improved unit-to-unit quality. Thereafter, during final assembly of the audio system 702, the wire screen 710 separates along the perforations 716 when contacted by the leading edge of a PCB extension 682 (refer FIGS. 138 and 139).

Referring to FIGS. 157 and 158, an alternative self grounding approach involves modifying a leading surface 720 of an extension 722 of a PCB 724 to form a sharpened, laterally extending leading edge 726. The leading edge 726 can be formed by the PCB material itself or, preferably, by hardened material, such as a metal appliqué or band formed in a "U" or a "V" configuration engaging the PCB 724 by upper and lower members 728 and 730 affixed to the upper and lower surfaces 732 and 734 of the PCB extension 722 such as by soldering. The upper and lower members 730 and 732 can serve as electrical ground pads. Upon installation of the PCB 724, the sharp leading edge 726 first contacts and cleaves the exposed wire screen 710 into the form illustrated in FIG. 139.

In addition to the forgoing, punch dies 712/714 such as those depicted in FIG. 156 can be employed in modified form to actually sever and/or remove a portion (or all) of the wire screen 710 after the molding of the housing case 704, but before the final assembly of the audio system 702. Furthermore, one or more service access windows can be provided elsewhere in the walls of the housing case 704. The service windows are closed at the time of manufacture by exposed screen including perforations, as depicted in FIG. 155. The exposed screen could be severed by a tool or process later in the service life of the audio system 702 to service or modify the system.

Front Plate ESD Grounding to Keyboard Through Wire Mesh (4)

The method of grounding the plastic front plate (with molded in metal mesh) to the keyboard is by using plastic spring clip that contains an open window to expose the mesh where the spring clip comes into contact with a tinned pad on the keyboard. This provides an ESD path to ground when inserting a static charged CD into the CD changer.

Referring to FIGS. 17-21 and 94-96, several spring clip structures 228 are integrally formed in the front plate 70 which, in assembly, continuously resiliently bear locally exposed segments of the wire screen 212 against a tinned grounding pad 230 (only one is illustrated) on a keypad PCB 232 to establish a ground path therebetween.

Each spring clip structure 228 has a frame 234 including two parallel arc shaped portions 236 and 238 and a cross-support portion 240 integrally formed with front plate 70 and extending therefrom as a resilient cantilever. An opening 242 in the front plate registers with each spring clip 228 to permit flexure thereof.

Prior to molding of the wire screen 212 within the front plate 70 the screen preform is die-cut to form an integral flap which is captured within the mold and the edges thereof encased within arc-shaped portions 236 and 238 and cross-support portion 240. The central portion of the exposed wire screen is expanded or stretched to form an outward bow shape (refer FIGS. 18 and 20) to ensure that the resulting exposed screen protuberance firmly contacts the PCB grounding pad 230.

Referring to FIG. 21, a prior approach is illustrated wherein separate spring grounding clips 244 are each mechanically affixed to the front plate 246 of a radio/CD player assembly 248 by a rivet 250 or other suitable fastener. The rivets are required to establish an electrical ground path as well as to mechanically secure the spring clips 244 to the front plate 246, adding labor, cost and complexity to the manufacturing process.

Front Plate with Integral Assembly Fixturing (5)

Using a plastic front plate enables assembly fixturing for the CD mechanism and circuit boards for slide lock and snap lock assembly instead of the screws used in a traditional receiver.

Referring to FIGS. 4 and 5, guideways in the form of slotted extensions 126 and 128, as well as locator/retention features 144 and 146 integrally formed on the reverse (inside) surface of the front plate 70 provides a number of significant advantages in the manufacture and final assembly of the radio/CD player 62 by reducing product part count, assembly time, and substantially eliminates dedicated hard fixturing and tools to affect assembly.

Thermal Management System for Vehicular Radio Application (7)

The thermal devices are placed in a window in the plastic box and are attached to the heat sink, which is attached to the inside of the box. This puts a plastic wall (a good insulator) between the heat sink and the CD mechanism to minimize the temperature that a CD reaches inside the box metal case. The thermal efficiency of this system eliminates the need for a cooling/ventilation fan.

Referring to FIGS. 22-29, 41-43 and 159, an alternative embodiment for affecting a screwless affixation of a convector or heat sink 252 within a radio/CD player 254 is illustrated. The heat sink 252 and radio/CD player are substantially identical to the above-described heat sink 72 and radio/CD player 62 in all material respects with the exception of the features described immediately hereinbelow.

Referring to FIGS. 22-29, an electrical power device retainer/backing clip 258 is formed of stamped, mild or spring sheet steel and defines a generally rectangular body portion 258 and three offset support members 260, 262 and 264 integrally inwardly and downwardly depending from a lower edge 266 of body portion 258. Left and right side retainer clips 268 and 270 integrally depend inwardly from left and right side edges 272 and 274, respectively, of body portion 258. Left and right heat sink retainer clips 176 and 278 integrally outwardly extend from an upper edge 280 of body portion. A housing case retaining clip 282 integrally extends inwardly from the central portion of the upper edge 280.

Radio/CD player 254 has a polymer case 284 in which a port 286 is formed in a left side wall portion 288. Three power circuit components 290, 292 and 294 are carried on a common PCB 296 within the case 284 in register with the port 286. The power circuit components 290, 292 and 294 are mounted to the common PCB 296 by their respective lead frames which are aligned with a plane defined by the left side wall portion 288. Thus, unlike the power circuit components 118, 120 and 122 described in connection with FIGS. 2-10 and 15 hereinabove, which are depicted as being substantially rigidly affixed to their associated common PCB 98, power circuit components 290, 292 and 294 are laterally displacable due to bending of their leadframes.

Figure 24:
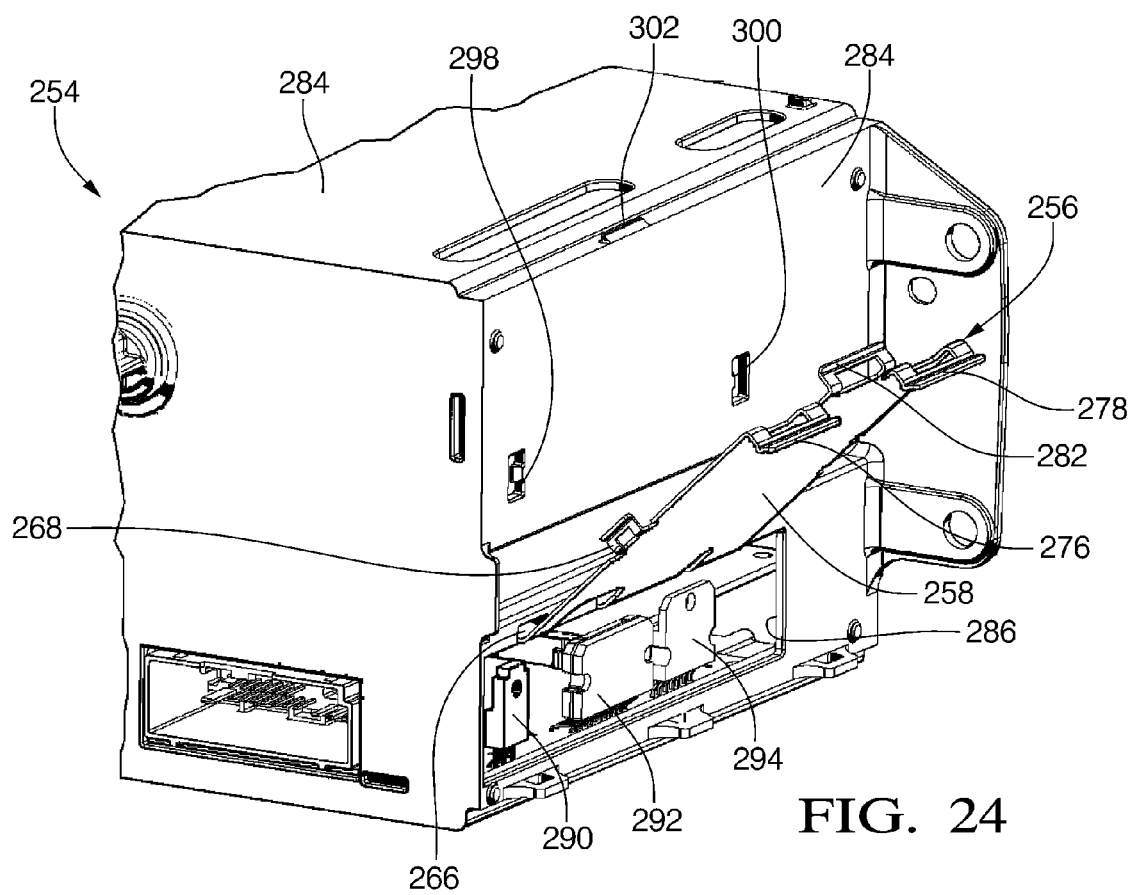
FIG. 24, is rear-left perspective view of the initial placement of the retainer/backing clip of FIGS. 22 and 23 through a thermal port in the left side wall of the case of the radio/CD player of FIG. 2.
Figure 25:
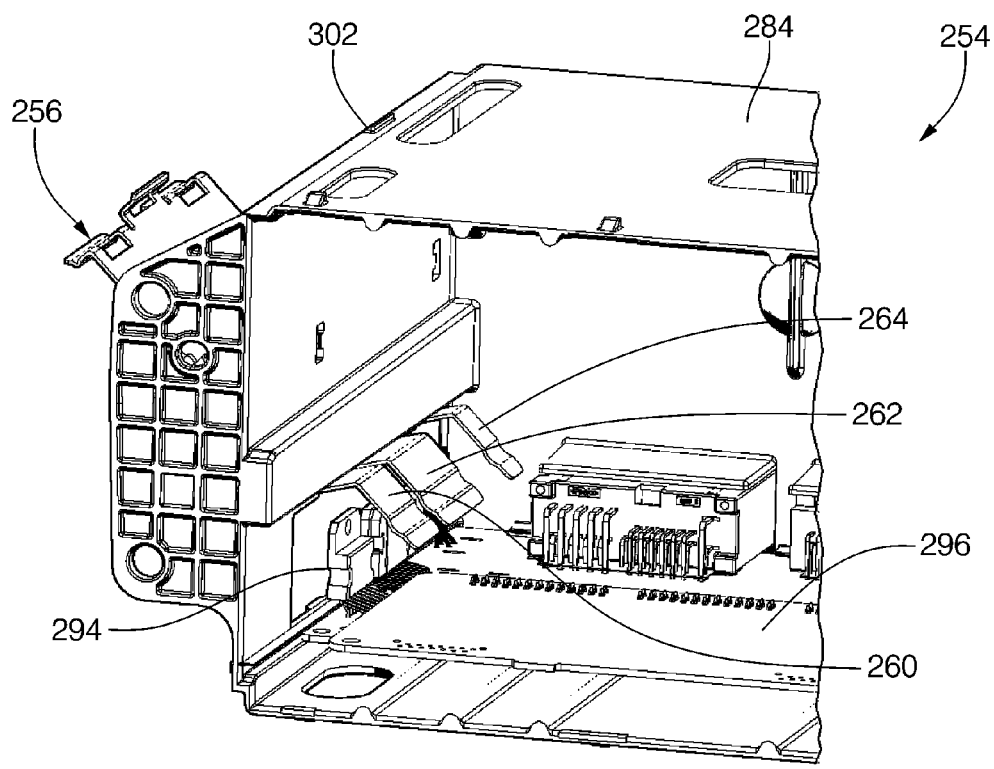
FIG. 25, is a front-right perspective view of the initial placement of the retainer/backing clip through the thermal port corresponding to the depiction of FIG. 24.

As best viewed in FIGS. 24 and 25, the backing clip 256 is installed by manipulating it to insert the free ends of the support members 260, 262 and 264 into the case 284 through the port 286 above and inwardly of the power circuit components 290, 292 and 294, respectively. Insertion of the backing clip 256 is complete when its lower edge 266 is substantially aligned with and adjacent the horizontal upper edge of the port 286.

Figure 26:
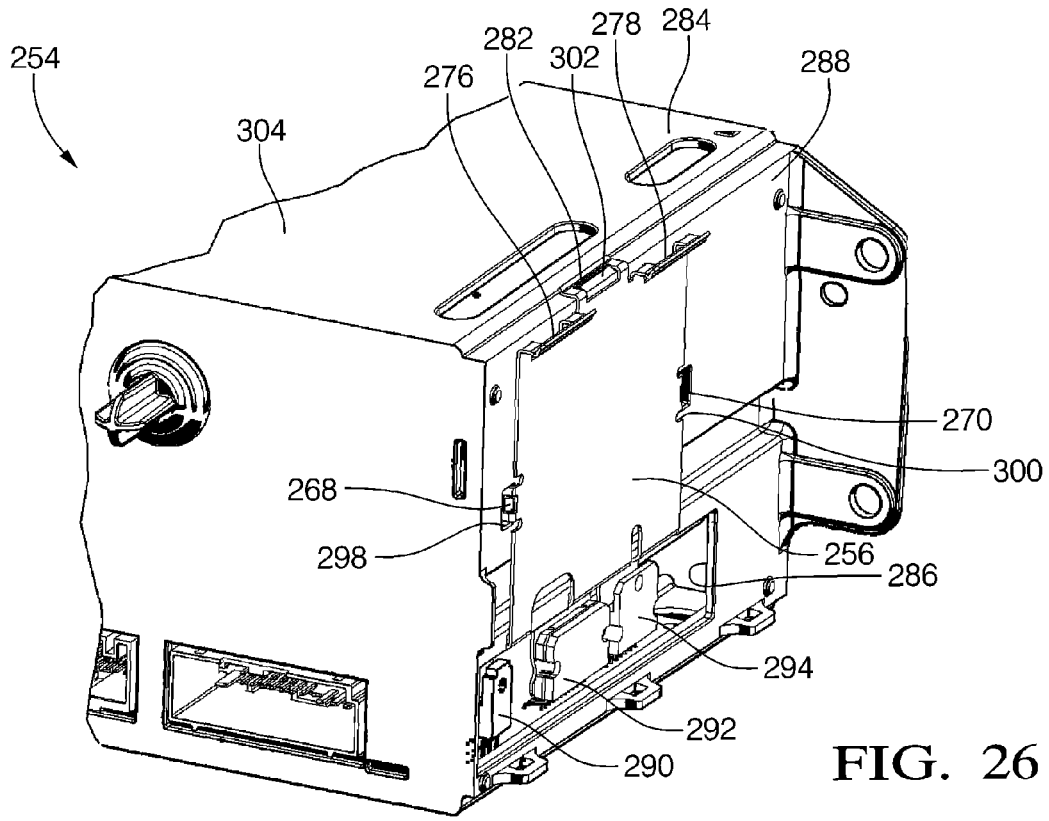
FIG. 26, is a rear-left perspective view of the final positioning of the retainer/backing clip in assembly with the left side wall of the case of the radio/CD player to effect rear surface support of the three associated electrical power devices.
Figure 27:
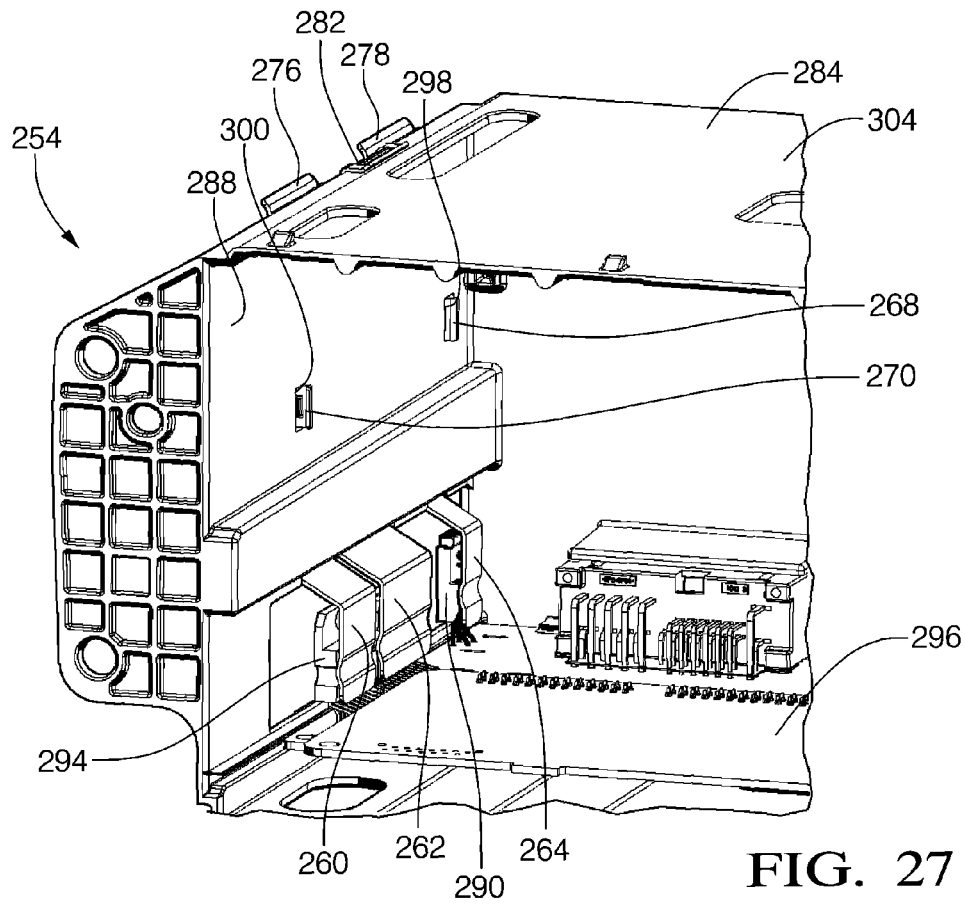
FIG. 27, is a front-right perspective view of the final positioning of the retainer/backing clip in assembly with the case of the radio/CD player corresponding to the depiction of FIG. 26.

As best viewed in FIGS. 26 and 27, the backing clip 256 is then rotated clock-wise from the perspective of FIG. 25 to the perspective of FIG. 27. Insodoing, the support members 260, 262 and 264 reach behind (internally within case 284) and abut the inside surfaces of the power circuit components 290, 202 and 294, respectively. Support members 260, 262 and 264 act as individual cantilevered leaf springs which continuously urge their respective power circuit components laterally outwardly. As the backing clip 256 approaches its installed position illustrated in FIGS. 26 and 27, its side retainer clips 268 and 270 extend within and snap-engage ramped catch openings 298 and 300, respectively, securing the backing clip into intimate contact with the outer surface of the left side wall portion 288 of the case 284. Furthermore, case retaining clip 282 snap-engages a ramped, upwardly extending retention tab 302 formed on an upper wall portion 304, providing redundant retention with the case 284.

Figure 28:
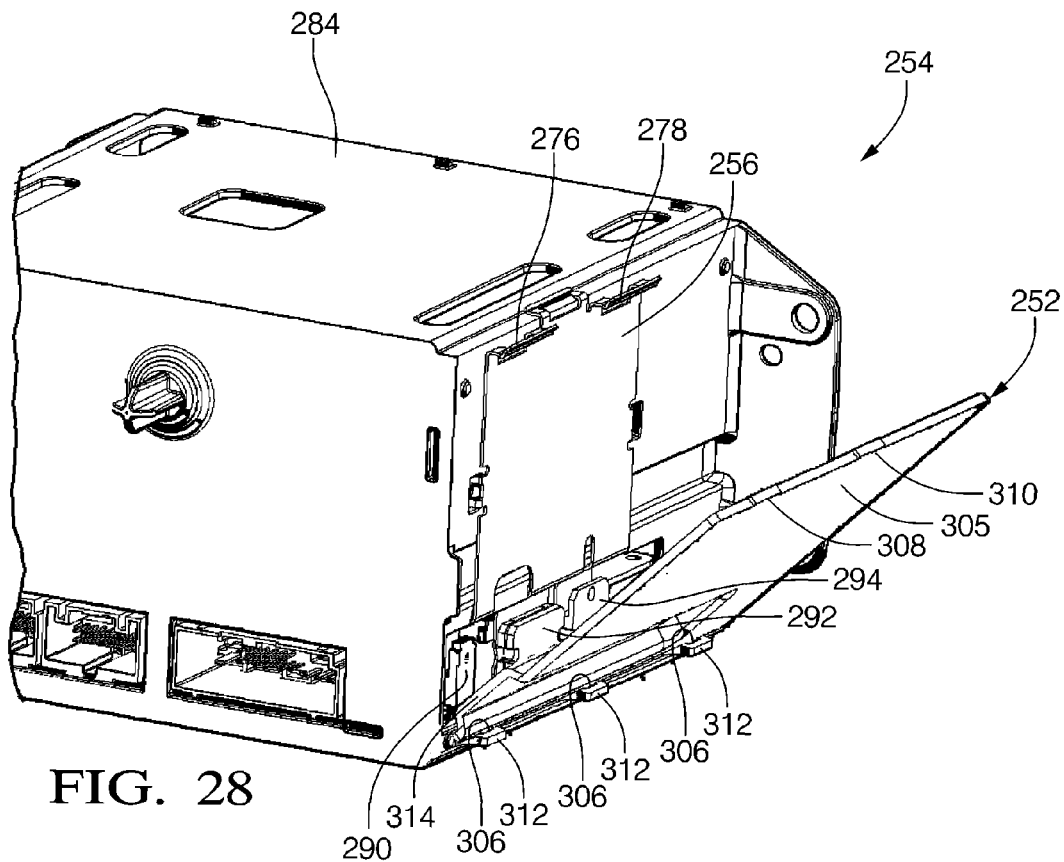
FIG. 28, is a rear-left perspective view of the initial placement of a heat sink adjacent the left side wall of the case of the radio/CD player of FIG. 2.
Figure 29:
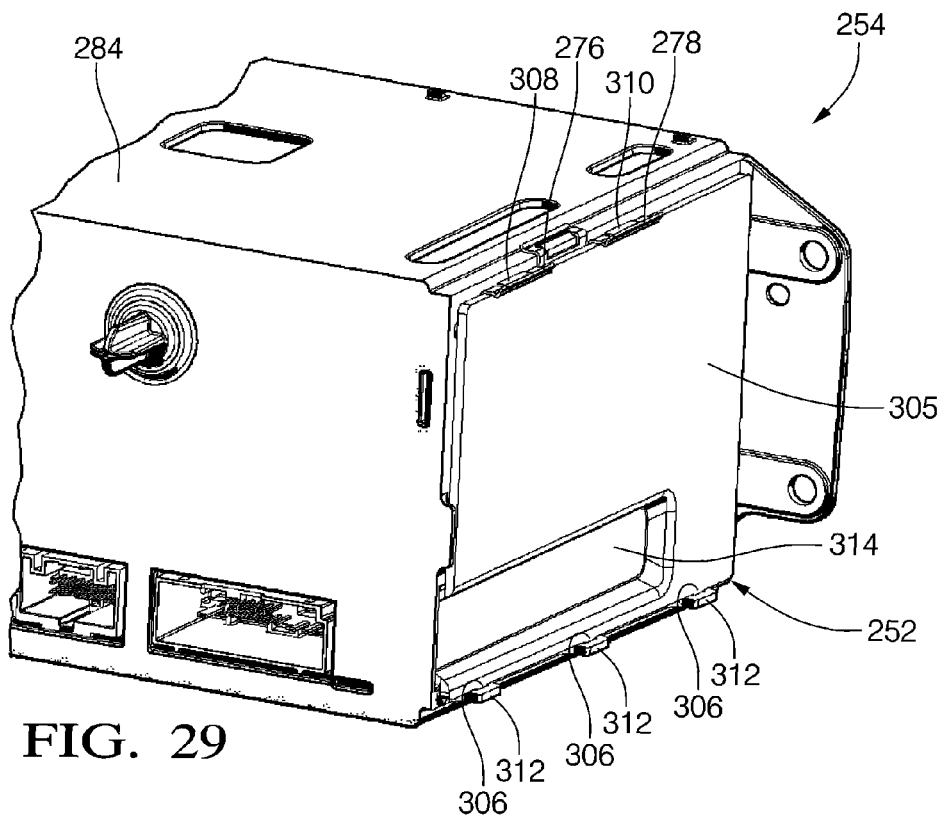
FIG. 29, is a rear-left perspective view of the final positioning of the heat sink in assembly with the retainer/backing clip and the left side wall of the case of the radio/CD player.

As best viewed in FIGS. 28 and 29, the heat sink 252 comprises a stamped planer aluminum body 305 with three integral spaced locating tabs 306 extending downwardly from the bottom edge thereof and spaced left and right integral locating tabs 308 and 310 extending upwardly from the upper edge thereof. The heat sink body 305 forms a recessed portion 314 which, upon installation, extends laterally within the case 284 through the port 286.

The heat sink 252 is installed by manipulating it in the position suggested in FIG. 28 wherein each locating tab 306 engages its respective tab receiving socket 312. The heat sink 252 is then rotated counter-clockwise from the perspective and position of FIG. 28 to the installed position of FIG. 29. Insodoing, upper tabs 308 and 310 snap engage retainer clips 276 and 278, respectively, positively locking the heat sink in its installed position.

When installed, the inner surface of the recessed portion 314 of the heat sink 252 intimately abuts the outwardly directed (thermal output) surfaces of power circuit components 290, 292 and 294 to provide a heat dissipation path thereto. The resilient support members 260, 262 and 264 maintain the intimate contact between the power circuit components 290, 292 and 294 and the heat sink 252. If required, thermal grease can be applied to the inside surface of the recessed portion 314 to improve thermal conductivity.

Figure 41:
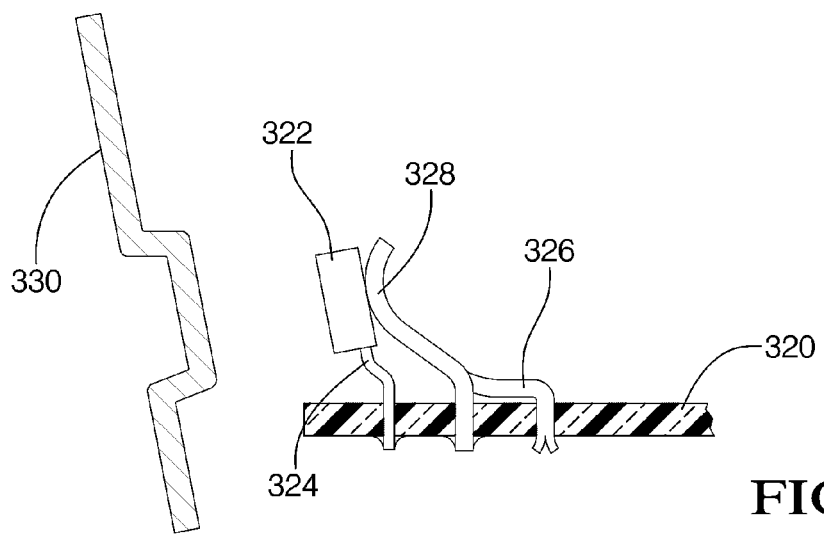
FIG. 41, is a broken, side plan view of an alternative design screwless resilient power clip carried on a PC board adjacent a power device for biasing the power device towards an opposed heat sink.
Figure 42:
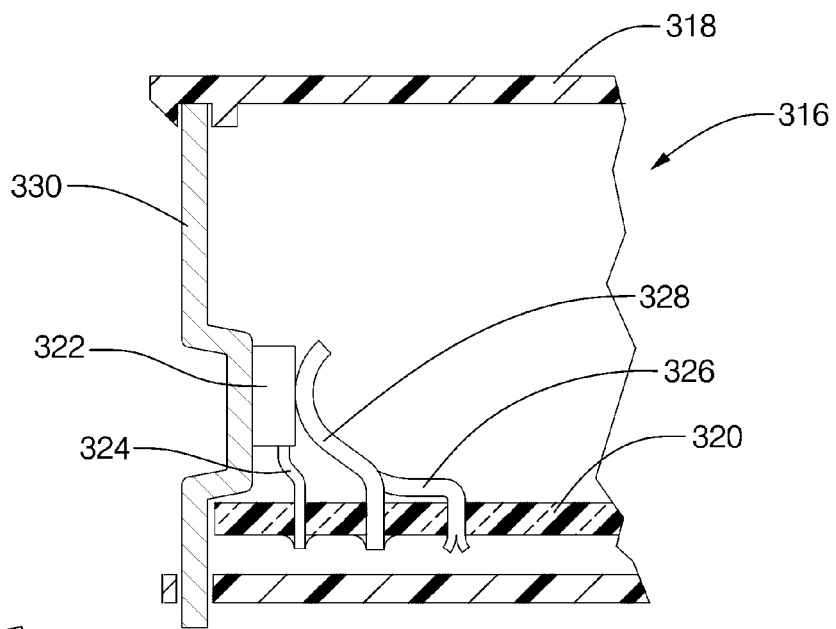
FIG. 42, is a broken, side plan view of the screwless power clip of FIG. 41 with the heat sink in its installed position within a housing, and with the clip continuously biasing the power device against an embossed inner surface of the heat sink.

Referring to FIGS. 41-42, a simplified, alternative embodiment of a fastenerless thermal control system for an audio device 316 is illustrated. The audio device 316 includes a case 318 enclosing a PCB 320. One (or more) power circuit components 322 have their lead frames 324 solder connected to the PCB 320 and is cantilevered therefrom. A resilient power clip 326 is affixed to the PCB 320 and includes a cantilevered resilient leaf spring 328 which continuously bears against the inside surface of the power circuit component 322. A heat sink 330 has cooperating self-engaging/retaining features with the audio system case 318. When in the installed position (FIG. 42) the inside surface of the heat sink 330 is in intimate contact with the power circuit component 322, and is retained in contact by the constant urging of the leaf spring 328.

Figure 43:
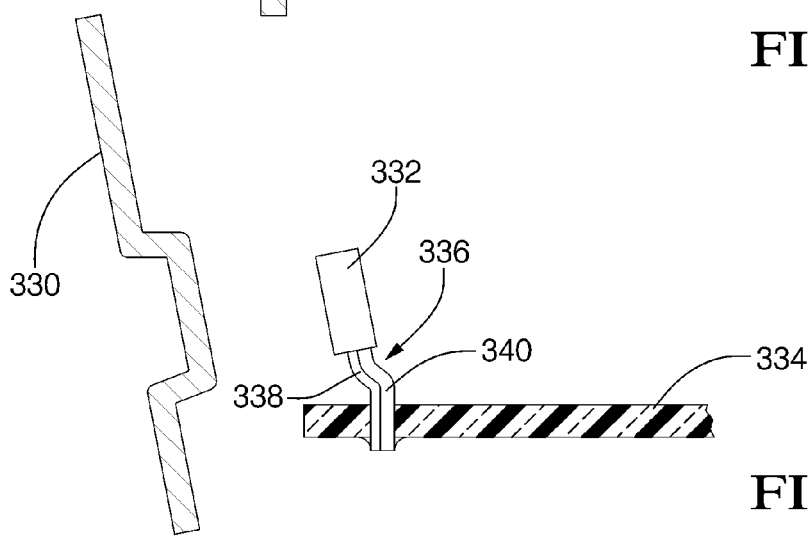
FIG. 43, is a broken, side plan view of an alternative design functionally similar to that of FIGS. 41 and 42, but where the power device lead frame is partially or completely formed of resilient spring material to replace the power clip.
Figure 44:
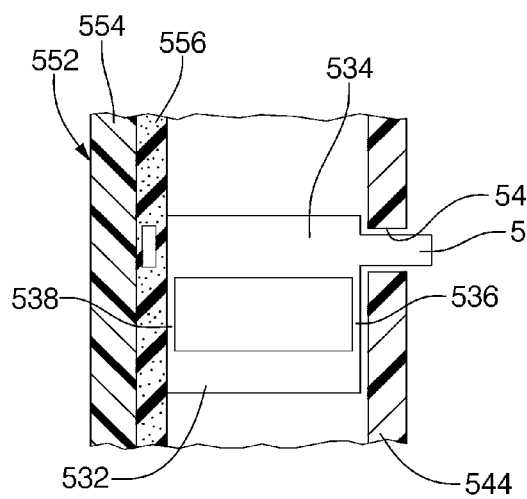
FIG. 44, is a broken, cross-sectional view of a prior art rear loaded pushbutton employing flexible molded linkage in assembly with a switch/contact pad, a printed circuit backer board and a front trim plate.
Figure 45:
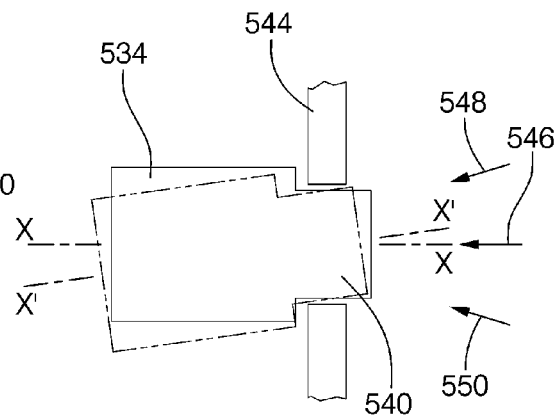
FIG. 45, is a broken, top cross-sectional view of the prior art pushbutton of FIG. 44 with the pushbutton in both a relaxed (solid line) position and an axially offset (in phantom) position.
Figure 46:
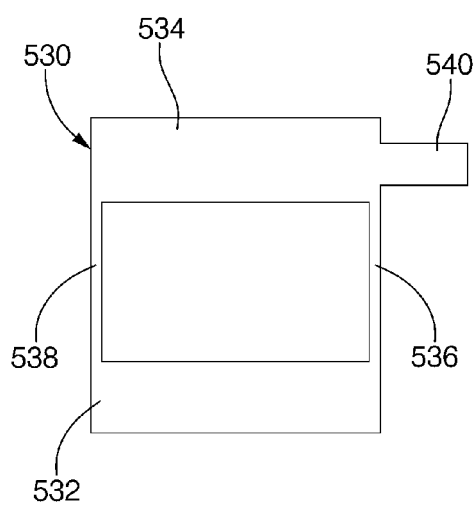
FIG. 46, is a cross-sectional view of the prior art rear loaded pushbutton of FIG. 44 with the molded linkage in the relaxed position.

Referring to FIG. 43, the above described power clip 326 of FIGS. 41 and 42 is eliminated and a power circuit component 332 is solder connected to a PCB by a lead frame 336 comprising both electrically conductive lead elements 338 and a spring-like lead element 340. Spring element 340 of the lead frame 336 serves to continuously urge the power circuit component 332 to its illustrated position. When the heat sink 330 is installed, the spring lead element 340 will maintain the power circuit component 332 in intimate contact with the heat sink 330.

Referring to FIG. 159, another simplified alternative embodiment of a fastenerless thermal control system for an audio device 342 is illustrated. The audio device 342 comprises a case 344 formed of thermally insulating material. A PCB 346 is disposed within the case 344 which has a power circuit component 348 cantilever affixed thereto via its lead frame 349 positioned adjacent a thermal port 350. A retainer/backing clip 352 is snap-engaged with a feature 353 on the exterior of the case 344 and includes a resilient integral support member 354 extending through the port 350 and continuously resiliently urging the power circuit component 350 toward the port 350. A heat sink 356 snap-engages with features on the case 344 and backing clip 352 to retain it in its illustrated position wherein the power circuit component 348 is maintained in intimate contact with the inner surface of a recessed portion 358 of the heat sink 356 extending through the port 350.

Convection air flow (arrows 359) can be provided by providing inlet and outlet windows 360 and 262 in the case 344. A pocket 364 formed on the outer surface of the heat sink 356 as part of the recessed portion 358 can be filled with a thermally conductive material 366 to increase the effective thermal mass of the heat sink 356 and to improve radiant thermal rejection as indicated by arrows 368.

Low Cost Structural Support for CD Changer for Vehicular Radio Application (8)

Using a plastic box for the receiver enables low cost location and support for the CD mechanism and enables for slide lock assembly instead of the screws used in a traditional receiver. The brackets on the CD mechanism have a 1° taper that matches a 1° taper on the support shelf in the plastic box. This makes it easy for an operator to start the slide, but all of the clearances go to zero as the box snaps into place providing a strong rattle free assembly without the use of the traditional screws.

Referring to FIGS. 30-36, 151, 152 and 160, the details of the mounting of the CD player subassembly 66 within the housing case 68 (refer FIG. 3) are illustrated in a simplified form. FIGS. 30-32 represent a longitudinal cross-section of a case guideway 370, including a rear wall portion 372 taken just laterally inside of the right side wall portion (not illustrated) of a housing case 374 to illustrate the spacial cooperation between the case guideway 370 and a right side CD player mounting bracket 376 during the insertion thereof in the assembly of a radio/CD player 378. A mirror-image case guideway is integrally formed on the opposite, left wall portion of the case 374.

The guideway 370 is integrally formed with the right sidewall portion (not illustrated) and the rear wall portion 372 of the housing case 374, projecting laterally therefrom. The guideway 370 is generally "C" shaped, having laterally disposed upper and lower leg portions 380 and 382 extending longitudinally the entire depth of the case 374. The leg portions 380 and 382 form continuously converging or tapered surfaces 384 and 386, respectively, which are offset by an angle α (nominally 1°) vertically centered above and below a longitudinal assembly axis 388. The mounting bracket 376 is preferably stamped from sheet aluminum or similar material and is also generally "C" shaped, having a vertical portion 390 and laterally disposed upper and lower leg portions 392 and 394 extending longitudinally substantially the entire depth of the case 374. The leg portions 392 and 294 form continuously converging or tapered surfaces, respectively, which are offset by an angle φ (nominally 1°). The mounting bracket 376 has a leading edge surface 400 which, upon assembly, approaches the inside surface 402 of the case rear wall portion 372. The vertical portion 390 of the mounting bracket 376 has a rearwardly directed integral tab 404 extending from edge surface 400. The tab 404 has a localized upset bead or rib 406.

The CD player subassembly is installed by manually aligning the leading edge surface 400 of the mounting brackets 376 with the opening 408 of the guideway 370 (refer to FIG. 30) and rearwardly displacing it along the assembly axis 388. FIGS. 31 and 151 illustrate a mid-point in the insertion process wherein the guideway surfaces 384 and 386 remain substantially parallel to the cooperating mounting bracket surfaces 396 and 398. The guideway serves to register, align and guide the insertion of the mounting brackets 376. As the CD player subassembly 66 approaches the installed position depicted in FIGS. 32 and 152, the guideway surfaces 384 and 386 contact the mounting bracket surfaces to effectively provide a zero-tolerance interfit therebetween. This ensures precise positioning and effectively eliminates squeaks and rattles in application. As best viewed in FIGS. 32-36, in the installed position, the tabs 404 slip-fit penetrate into an opening or recess 410 in rear wall portion 372. The upset rib 408 forms an interference-fit within the window 410 to lockingly engage the CSD player subassembly 66 within the case 374.

Referring to FIG. 153, an alternative mounting configuration of an installed CD player subassembly 412 within a housing case 414 is illustrated. A sidewall 416 of the case 414 integrally defines a guideway 417 which extends laterally outwardly to form facing acutely offset cooperating upper and lower guide surfaces 418 and 420, respectively. Likewise, the CD player subassembly 412 carries left and right mounting brackets 422 (only one is illustrated) having acutely inwardly angled upper and lower legs 424 and 426, respectively, defining upper and lower surfaces 428 and 430, respectively.

Referring to FIG. 154, an additional alternative mounting configuration of an installed CD player subassembly 432 within a housing case 434 is illustrated. A sidewall 436 of the case 434 integrally defines a guideway 438 which extends laterally inwardly to form opposed acutely offset cooperating upper and lower guide surfaces 440 and 442, respectively. Likewise, the CD player subassembly 432 carries left and right mounting brackets 444 (only one is illustrated) having acutely outwardly angled upper and lower legs 446 and 448, respectively, defining upper and lower surfaces 450 and 452, respectively.

A localized area of wire screen 454 can be formed in the guideway 438 to affect a ground path between the CD player subassembly 432 and the case 434.

Referring to FIG. 160, an alternative guideway 456 for the CD player mounting bracket 376 (refer FIGS. 30-32) has upper and lower leg portions 458 and 460, each having a tapered, increasing thickness in the vertical dimension along their longitudinal extent (along the assembly axis 462. Upper and lower guide surfaces 464 and 466, respectively, are offset by angle α. Outer guideway edge surfaces 468 and 470 have a slight reverse taper at an offset angle ε (approximately 1°-3°) to provide release draft for the injection molding process.

Wire Mesh for Structural Component (9)

Molding in metal mesh into the plastic receiver case and front plate increases the strength of the material (much like putting re-bar into concrete) while still weighing less than a steel case. The gauge of the wire forming the mesh can be increased and the amount of plastic material can be substantially reduced, resulting in a very thin wall, robust structure.

Figure 37:
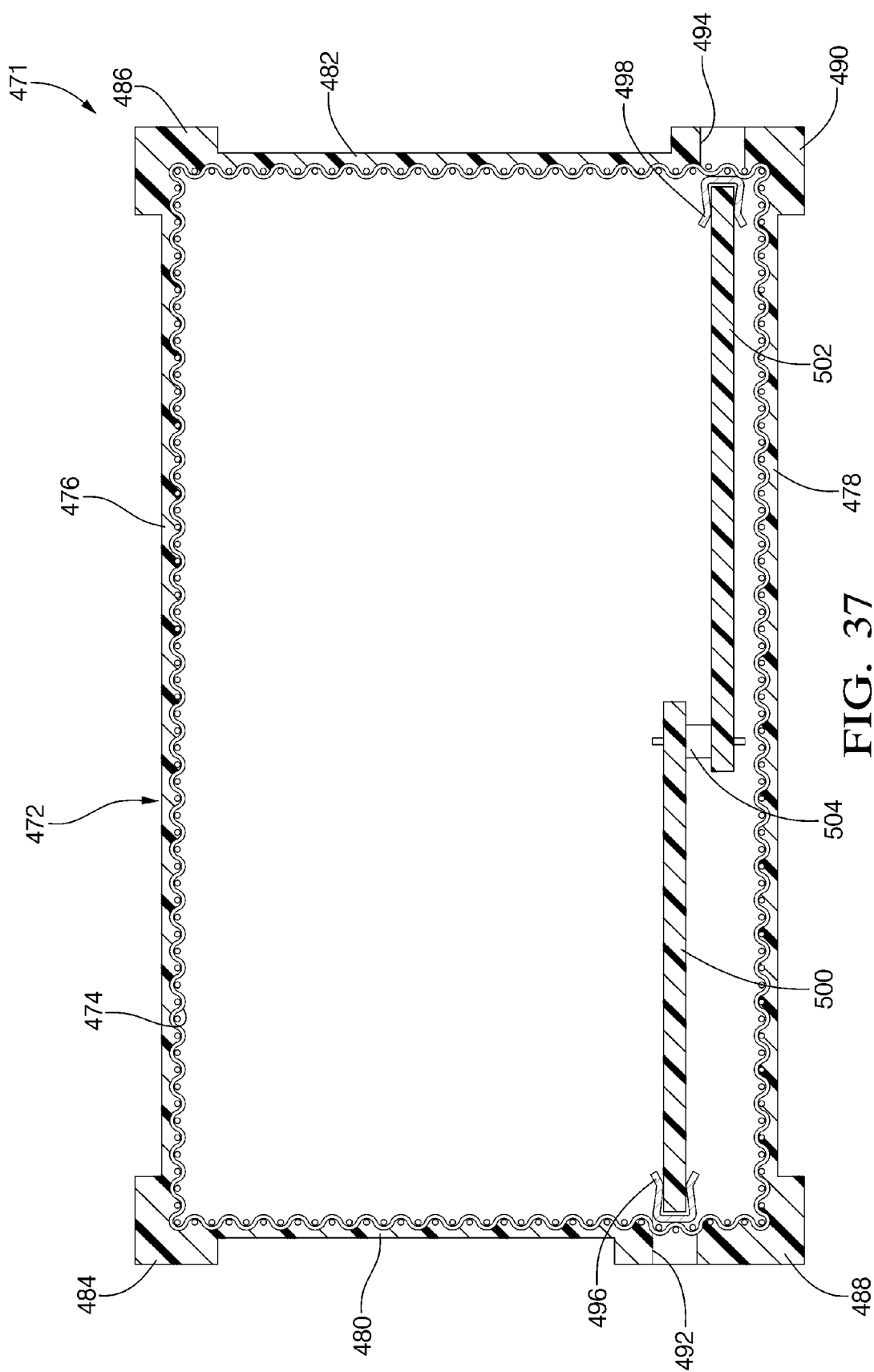
FIG. 37, is a cross-sectional view of an alternative, lighter weight outer case configuration in representative assembly with a bifurcated PC board wherein wire screen mesh provides both electromagnetic shielding as well as a significant portion of the overall structural strength of the case.

As an alternative to the structure illustrated in FIG. 37, the plastic can be eliminated from the center portions of some or all of the individual side, front, back, top and/or bottom panel portions of the case and front plate. This configuration would have the appearance of a screen box, with a molded plastic peripheral frame circumscribing each panel portion.

Referring to FIG. 37, a lightweight automotive audio system 471 can include a housing case 472 constructed of a composite of polymer based material with a wire screen 474 insert molded therein to isolate audio components therein from various electrical anomalies. To further reduce overall weight, the gauge of the wire screen can be increased whereby the screen contributes a significant component of the resulting overall structural strength of the case, while the nominal section or thickness of the polymer material can be substantially reduced. By way of example, the case 472 top and bottom wall portions 476 and 478, respectively, and left and right side wall portions 480 and 482, respectively, injection molded into a single unified structure, with the enlarged gauge wire screen 474 insert molded adjacent the inner surfaces thereof. Edges and corners of the case 472 formed at the intersection of two or three adjacent wall portions can be locally thickened to increase structural rigidity of the case 472 as well as to provide internal and external mounting and interface ports. The intersecting edges of the top wall portion 476 and the left and right side wall portions 480 and 482, respectively, form thickened left and right upper edge frames 484 and 486, respectively. Likewise, the intersecting edges of the bottom wall portion 478 and the left and right side wall portions 480 and 482, respectively, form thickened left and right lower edge frames. Lower edge frames 488 and 490 are locally vertically extended openings 492 and 494 for exposing the wire screen 474 to establish electrical contact with contact clips 496 and 498 carried by PCBs 500 and 502, respectively, interconnected by pin connectors 504 within the case 472.

Referring to FIG. 150, the example embodiment of FIG. 37 is further modified to form an extremely lightweight case 506 constructed of polymer based material and wire screen 508. Case 506 is configured so that some or all of the wall portions comprise a polymer frame 510 about the perimeter thereof and the wire screen 508 closing the center portion of such wall portions. Portions of the wire screen 508 adjacent edges of the case 506 are affixed to the frame 510 such as by insert molding. Attachment features such as mounting flanges 512, tab receiving extensions 514, ramped snap-engagement features 516 can be molded as an integral portion of the frame 510. Ports, such as wiring harness interconnections 518 and 520, and coaxial cable antenna interconnections 522 can be easily molded within an extended frame portion 524. Windows 526 and 528 can also be formed in extended frame portion 524 for electrically interconnecting the wire screen 508 with internal components.

Flexible Molded Linkage for Rear Loaded Pushbuttons (10)

This concept is disclosed in U.S. Pat. No. 6,384,355 B1 to M. Murphy et al. entitled "Parallel Guide Mechanism for a Switch" which is commonly assigned to the assignee of interest of this application. The specification of U.S. Pat. No. 6,384,355 is hereby incorporated herein by reference.

Living Hinge Button Linkage (11)

The basis of 4-bar button linkage is described in U.S. Pat. No. 6,384,355, the specification of which is incorporated herein by reference. It utilizes thin walls on each end of a base and top plate to control the motion of a button. However, this approach allows the button to slightly rotate if someone presses on the extreme left or right edge of the button. The living hinge is an improvement/modification of the idea where the thin walls are replaced with relatively thick walls, which are necked down at the intersection with the button and the top plate to form a living hinge and complete the 4-bar linkage. This concept can be applied in a treed button system.

In essence, the thin wall approach results in flexing or deformation of the wall, which will produce variations in the spacing between the associated hinges of each link. This can cause wobble or relative motion between the portion of the button extending through an opening in the user access panel. If the spacing tolerance between the button and the adjacent access panel opening is excessively small, the button can jam and cease to function. If the spacing tolerance is too great, it can result in undesirable squeaks and rattles.

In the present invention, the links are relatively inflexible (except in the integral hinge area), resulting in the spacing between the adjacent hinges to remain substantially constant. This will provide a smooth, substantially linear motion of the button, mitigating the under and over tolerance problems of certain prior art approaches described herein above.

Figure 47:
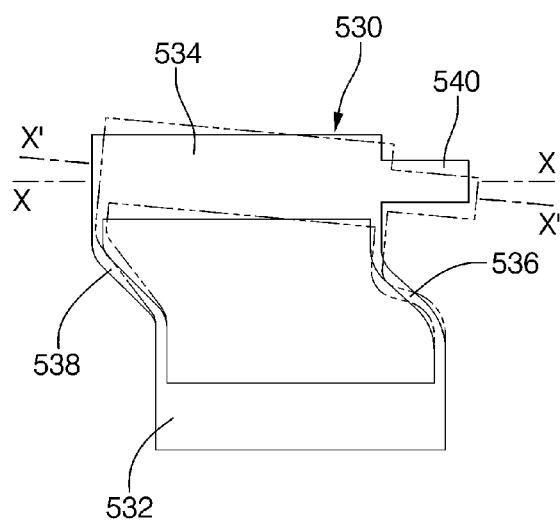
FIG. 47, is a cross-sectional view of the prior art rear loaded pushbutton of FIG. 44 with the molded linkage in the flexed position.

Referring to FIGS. 44-47, an example of prior flexible molded linkage for rear loaded pushbuttons is illustrated. A pushbutton linkage system 530 includes a base member 532 and a top plate 534 spaced above the base member 532 and integrally interconnected thereto by front and rear vertical members 536 and 538, respectively. The front and rear vertical members 536 and 538 have a thin wall section along their vertical extent and are relatively flexible. The top plate 534 has an extension 540 formed therein which, in application, extends through an opening 542 within a panel 544 such as a radio trim panel to provide operator access by manual actuation as indicated by arrows 546, 548 and 550. The push button linkage system 530 is typically nested within a switch housing assembly 552 consisting of a rigid housing portion 554 and resilient, non-conductive material 556 which maintains spacing between a fixed electrical contact and a movable electrical contact (not illustrated). When the extension 540 is depressed by an operator, the top plate 534 moves to the left, momentarily closing the two electrical contacts. When released, the top plate 534 returns to its illustrated position, opening the electrical contacts. When actuated along the centerline of the top plate 534 designated by axis X-X as indicated by arrow 546, it will translate left and right, without pitch or yaw. However, if actuated from an off center direction as depicted by arrows 548 and 550, it will pitch and/or yaw, as illustrated by axis X'-X' due to the flexure of the distributed displacement of members 536 and 638 as best seen in FIG. 47. As a result, the associated switch mechanism can malfunction due to binding between the extension 540 and the panel 544.

Figure 48:
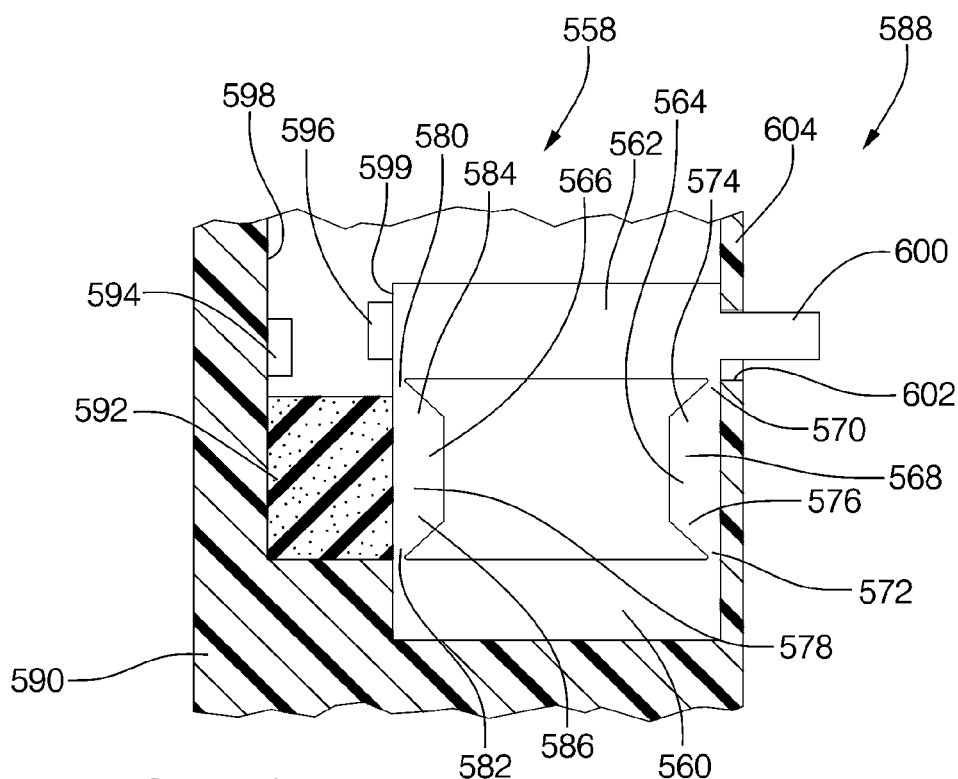
FIG. 48, is a cross-sectional view of an inventive 4-bar molded linkage for a rear loaded pushbutton assembly with the linkage in a relaxed position.
Figure 49:
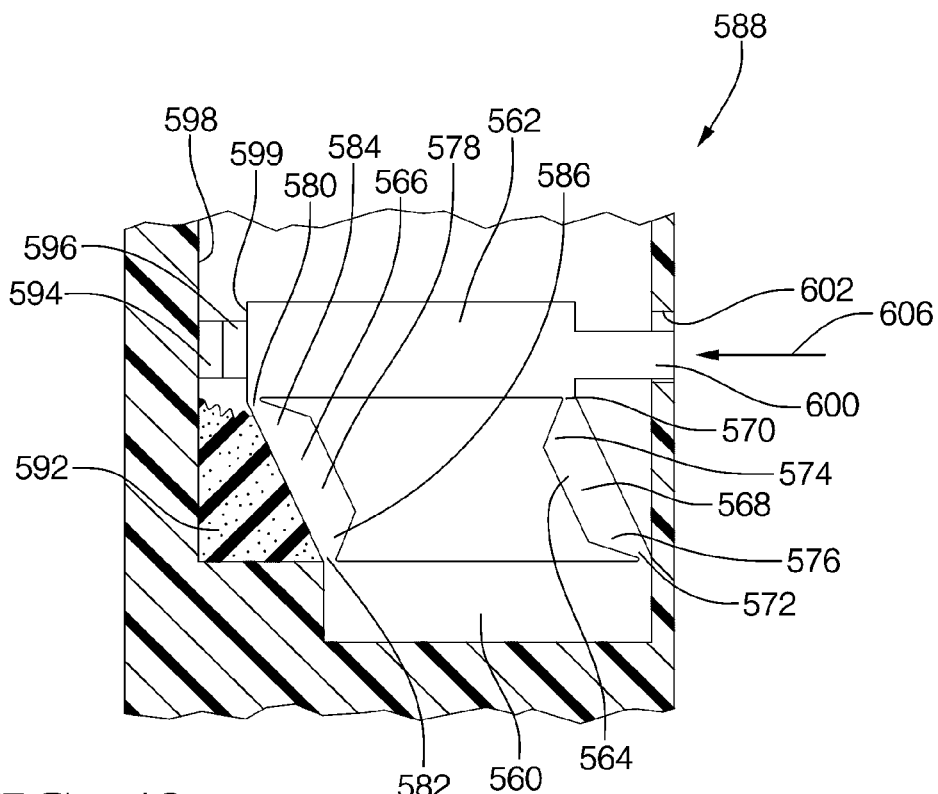
FIG. 49, is a cross-sectional view of the 4-bar molded linkage for a rear loaded pushbutton assembly of FIG. 48 with the linkage in a flexed position.
Figure 50:
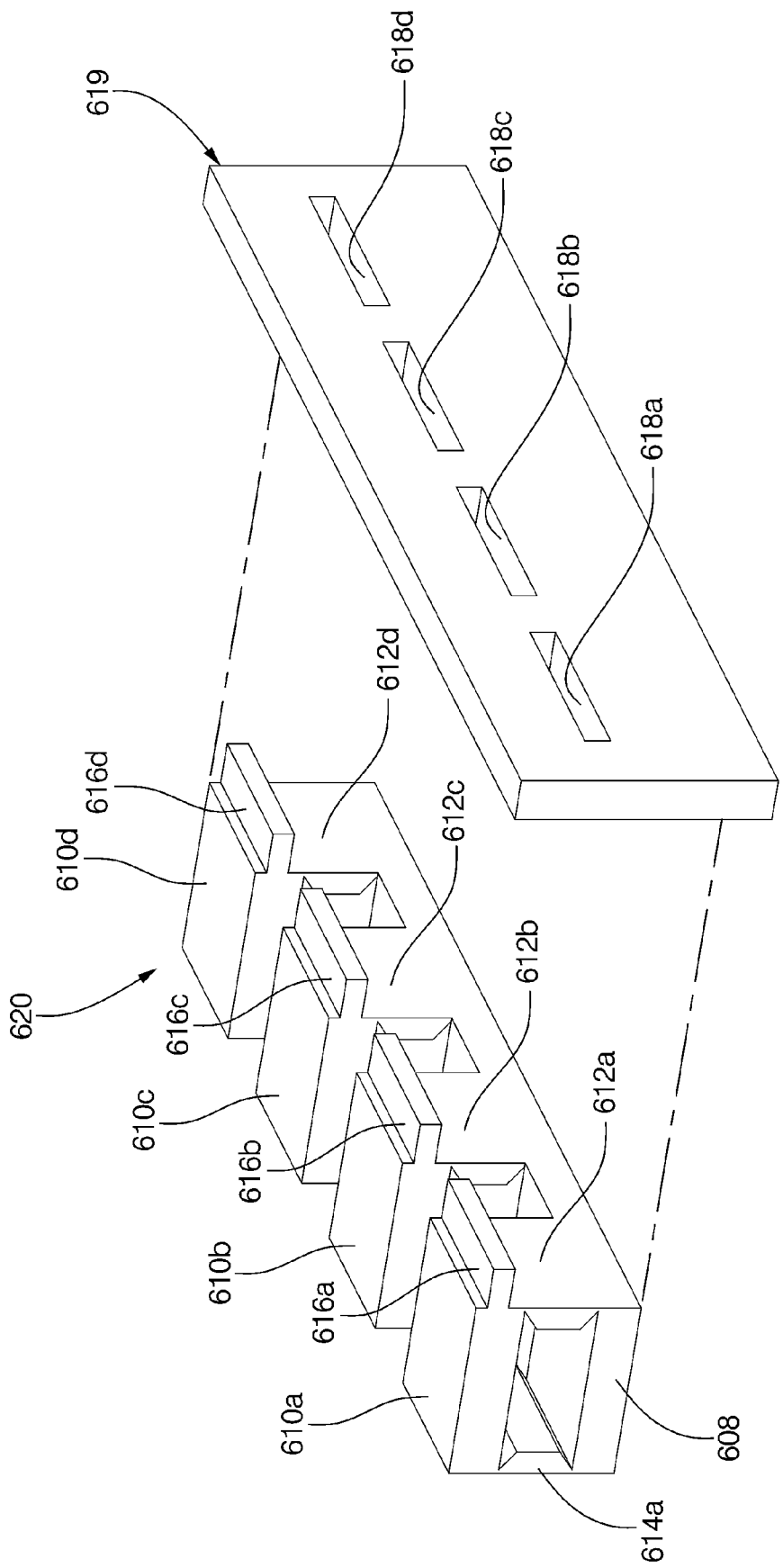
FIG. 50, is an exploded, perspective view of an array of integrally formed 4-bar linkage for rear loaded push button assemblies of FIGS. 48 and 49 juxtaposed with a decorative trim plate.

Referring to FIGS. 48-50, a simplified embodiment of the present invention is illustrated. A push button linkage system 558 comprises an elongated, horizontally disposed base member 560 and an elongated, horizontally disposed top plate 562 positioned above and parallel to the base member 560. Front and rear vertical links 564 and 566 interconnect the front and rear ends of the base member 560 and the top plate 562, respectively. The base member 560, top plate 562 and interconnecting links 564 and 566 are integrally molded or extruded as a single component from homogeneous, relatively rigid material such as nylon. The front link 564 defines a relatively thick sectioned middle portion 568, upper and lower end portions 570 and 572, respectively, and intermediate transition portions 574 and 576. Likewise, the rear link 566 defines a relatively thick sectioned middle portion 578, upper and lower end portions 580 and 582, respectively, and intermediate transition portions 584 and 586.

The upper end portion 570 of the front vertical link 564 integrally transitions into the bottom front corner of the top plate 562 as a web or first flexible living hinge. The upper end portion 580 of the rear vertical link 566 integrally transitions into the bottom rear corner of the top plate 562 as a web or second flexible living hinge. The lower end portion 572 of the front vertical link 564 integrally transitions into the top front corner of the base member 560 as a web or third flexible living hinge. The lower end portion 582 of the rear vertical link integrally transitions into the top rear corner of the base member 560 as a web or forth flexible living hinge. Thus constituted, the push button linkage system 558 comprises four rigid links arranged as a parallelogram with their respective adjacent ends attached at hinge points.

In application, the linkage system is nestingly received within a switch assembly 588 including a housing 590 which fixedly restrains the linkage base member 560 and means for continuously urging the linkage top plate rightwardly toward its position depicted in FIG. 48 such as a resilient, elastomeric foam block 592. A pair of switch contacts 594 and 596 are aligned within the switch housing 590, with one contact 594 fixed to an inner surface 598 of the housing 590, and the other contact 596 carried on a rear edge surface 599 and movable with the linkage top plate 562 between an open position, spaced from contact 594 (FIG. 48) and a second position engaging the other contact 594 (FIG. 49) to establish an electrical interconnection therebetween.

The front end of the linkage top plate 562 forms an integral rightwardly directed extension 600, which passes through an opening 602 formed in a panel 604 such as the trim plate subassembly 74 described in connection with FIG. 3 hereinabove. Manual displacement of the extension 600 indicated by arrow 606 causes the living hinges to affect pure rotation about their mutually parallel axes, transitioning the top plate 562 (and movable contact 596) to the position indicated in FIG. 49.

Empirical development and analysis has demonstrated that a switch assembly 588 with the linkage system 558 described herein is substantially impervious to off-angle actuation.

Referring to FIG. 50, a plurality of switch assemblies 588 can be ganged to form a compact, multi-function control panel such as the trim panel 74 in FIG. 3. The linkage system 558 can be expanded for multi-switch applications by lateral extension of a common base member 560 to support multiple sets (4 are depicted) of spaced top plates 610a-d separately interconnected to common base member 560 via respective front vertical links 612a-d and rear vertical links 614a-d. Each top plate 610a-d has an extension 616a-d, which registers with similarly spaced openings 618a-d in a common panel 619. Each of the four linkage systems depicted in the ganged linkage systems 620 in FIG. 50 function independently of one another, although various electrical interconnections of the respective contact pairs (not illustrated) can be configured to interact. Although fully functional as described, the extensions 600 and 616a-d are preferably configured to receive, support and illuminate decorative, indicia bearing front loaded actuator buttons as described in connection with the device of FIG. 170.

Slide-Lock Snap-Lock Screwless Assembly Method (13)

Using plastic for a receiver case enables low cost assembly of the components. The circuit boards and the CD mechanism can slide into place and then be locked or they can be snapped into place without screws. This reduces the number of parts required in the assembly and reduces the amount of direct and indirect labor to put a receiver together. The plastic case can be easily molded into a net shape forming the slides and snaps needed for assembly.

Referring to FIGS. 2-10 and 22-29, the apparatus and assembly method described substantially reduces the labor and component cost of the radio/CD player 62, as well as the required capital costs. Furthermore, it substantially enhances product quality by substantially eliminating the possibility of extraneous or missing (small) parts and/or improper assembly.

EMC, RFI, BCI, ESD Wire Mesh Protection System (14)

Using the molded in metal mesh in the receiver plastic box that is grounded to the circuit boards creates a Faraday cage that provides shielding protection for RFI (Radio Frequency Interference), EMI (Electro Magnetic Interference), BCI (Bulk Current Injection), and ESD (Electrostatic Discharge).

Refer to FIGS. 16 and 37 and their associated descriptions.

Partitioned Main Board into Common and Unique (15)

Using the principle of communization and modularity, the receiver main board has been divided into a common board and a unique board. This is counterintuitive because a single board is less expensive than two boards performing the same function. However, the common board contains all surface mount components (no stick lead or wave solder) and very large volumes can be produced without reconfiguring the assembly/production line. This will substantially reduce the manufacturing cost of this portion of the main board.

Referring to FIG. 15, automotive audio systems are unique in that they are typically designed in modular form and, in response to the requirements of individual customers, are produced by assembling individual units from varied combinations and permutations of modularized subcomponents. This, however, can be contrary to the manufacturing doctrine of large enterprises wherein large volume production of common designs is preferred for its inherent efficiencies. In the practice of the present invention, the individual electrical components to be assembled on the circuit board subassembly 64 are segregated into those which will be employed in each specie and sub-specie in a given product family. The commonly employed circuit elements (typically surface mount devices) are assembled on the "common" PCB 98. The application specific circuit elements (typically "stick" mount devices) are assembled on the "unique" PCB 100. The common PCB 98 is assembled employing highly automated manufacturing techniques for maximum efficiency, while the unique PCB 100 are assembled employing a different mix of labor and automation to maximize overall efficiency. Standard connector assemblies 736, 738 and 740 are provided on the common PCB 98 for interfacing the radio/CD player 62 with speakers, ground, power and associated control/readout systems via wire harnesses. A standard coaxial cable connector 742 is also provided on the common PCB 98 for interfacing with a vehicle antenna system.

An audio product manual entitled "2004 Model Year Ford Freestar Radios" (Document Number 04-RDPD-12-MA-F), dated 7 Oct. 2005, describes in detail the circuit architecture of a family of modern automotive audio systems developed and produced by the assignee of this application. In addition, the manual enumerates the individual electrical components employed and their arrangement in various audio subsystems. In the practice of the present invention, the listed individual electrical components would be segregated into the common PCB 98 and unique PCB 100 in keeping with the teachings herein. Accordingly, the above referenced audio product manual is incorporated herein by reference for the sake of completeness and to serve as a resource in understanding and practicing the present invention.

Referring to FIG. 164, an alternative embodiment of an audio system 1622 has a one-piece plastic housing 1624 defining a rear wall portion 1626 and a bottom wall portion 1628. Rather than providing discrete connector assemblies, such as assemblies 736, 738 and 740 in FIG. 15, with each including an insulating shell portion and a number of connector pins affixed to the PCB 98, an insulating shell is eliminated for each connector and replaced by an outwardly opening niche or pocket 1630 integrally formed on one of the case wall portions (for example, the rear wall portion 1626). Associated connector pins 1632 are affixed to a PCB 1634 and extend through registering openings 1636 in a case wall 1638 segment forming the niche 1630 in a direction parallel to an assembly axis 1640. The case wall segments 1638 defining the niche 1630 also include integral attachment features for the mating wiring harness plug (not illustrated). This feature reduces part count and cost while conserving space within the audio system housing assembly.

Fault Codes to Replace in-Circuit Test (16)

In the present invention, a form of "self test" is employed and the normal in-circuit test with its expensive fixtures, long test cycle time on expensive equipment is replaced by a simple fixture that powers up the microprocessor and activates embedded test codes that asks the micro to communicate with each of the other ICs on the board and return any fault codes. This is a much lower cost approach, which will accomplish most of the benefit of an in-circuit test.

Figure 55:
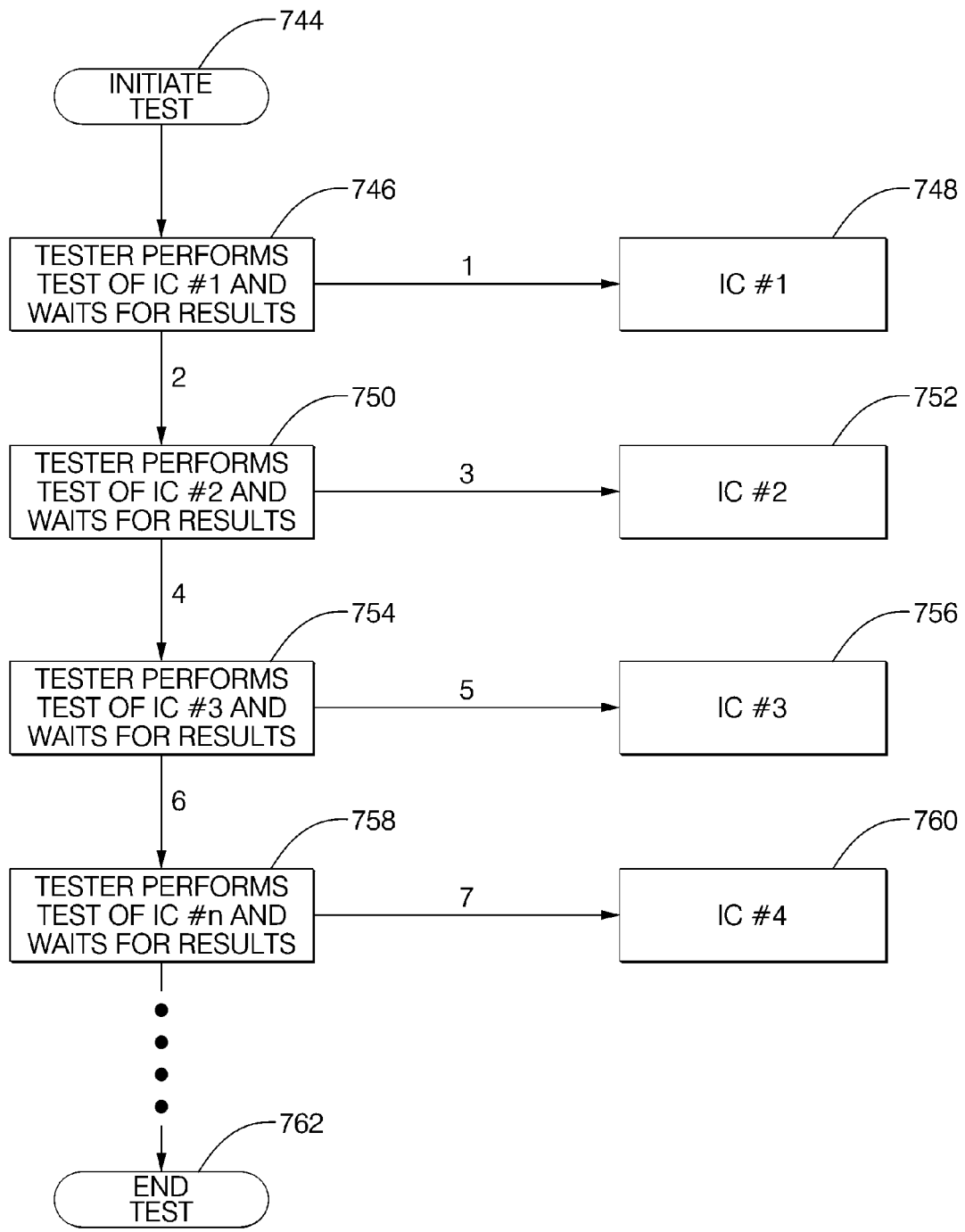
FIG. 55, is a process flow chart for prior art end of line detection of IC faults performed by dedicated production line test equipment.

Referring to FIG. 55, prior manufacturing of automotive audio devices typically employed dedicated test equipment located at the end of an assembly line which serially initiated, ran, completed and recorded performance tests for each unit before initiating testing of the next-in-line unit. Such prior art testing sequences typically followed the following process steps. The test is initiated at step 744, the tester performs a fault test at step 746 for a first integrated circuit (IC) 748. After waiting for and recording the IC#1 test results, the tester advances to step 750 and performs a fault test for a second IC 752. After waiting for and recording the IC#2 test results, the tester advances to step 754 and performs a fault test for a third IC 756. After waiting for and recording the IC#3 test results, the tester advances to step 758 and performs a fault test for a forth IC 760. After waiting and recording the IC#4 test results, the tester proceeds serially to test every additional IC in the unit under test. Once all of the ICs have been tested and the results recorded, the test is terminated at step 762.

Figure 56:
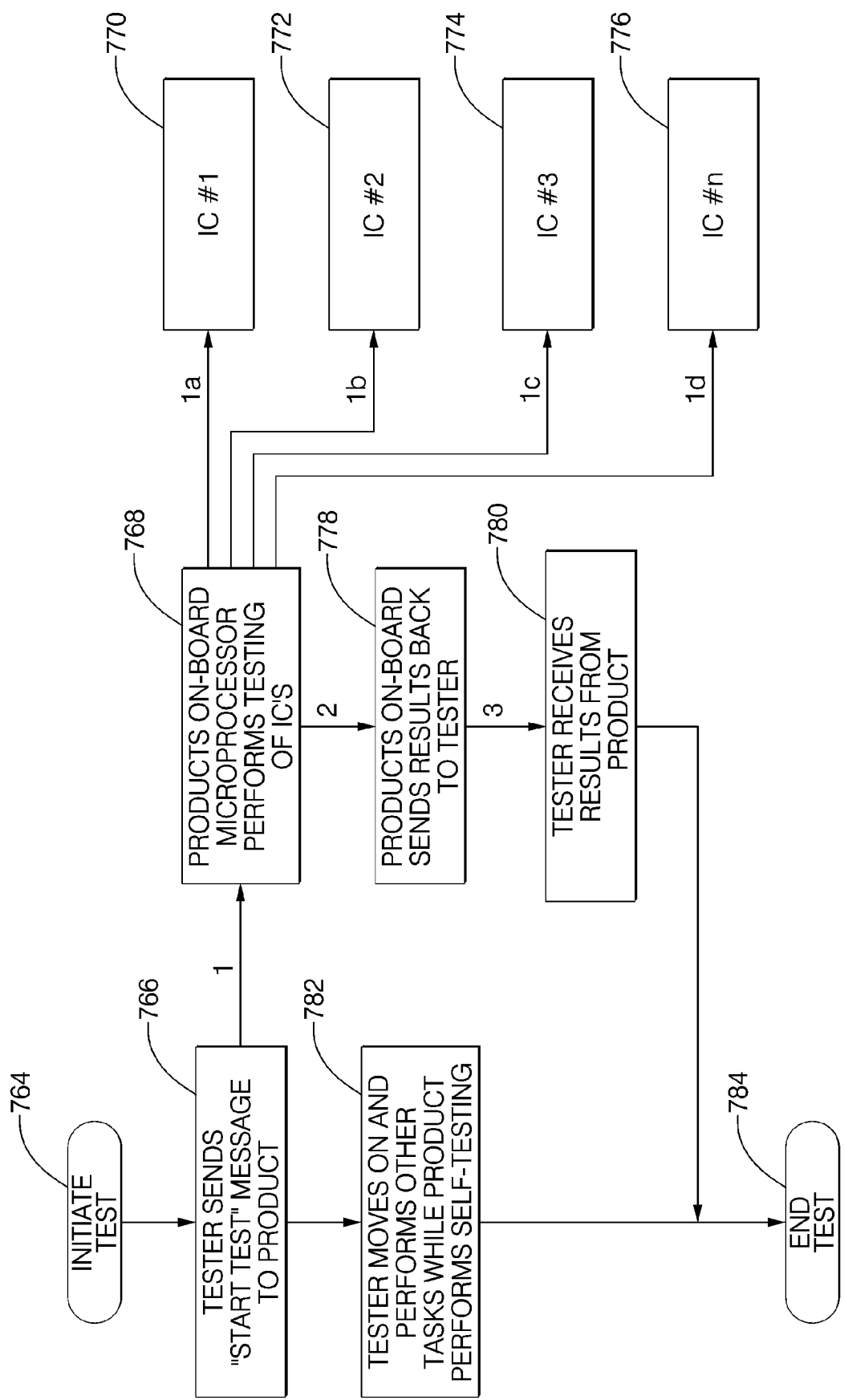
FIG. 56, is a process flow chart for end of line detection of fault codes from ICs on the PCB in response to a microprocessor embedded test code.

Referring to FIG. 56, the present invention saves substantial time in end-of-line testing by embedding the test routines within the memory and microprocessor contained within the audio unit being tested. This allows simultaneous testing of multiple audio units and virtually eliminates "wait-time". The testing sequence of the present invention follows the following process steps. The test is initiated at step 764 and the tester sends a "start test" message to the audio product at step 766 which initiates a subroutine in an on-board microprocessor for fault testing other ICs within that audio product at step 768. The on-board testing performs fault tests and collects results for each IC 770, 772, 774 and 776 within the audio product at step 778. Thereafter, the accumulated test results for the audio product are sent to the production line tester at step 780. Immediately following step 766, the tester immediately sends a "start test" message to the next audio unit in the production queue at step 782 without waiting for the results of previously initiated tests. This testing technique continues as long as there are audio products in the manufacturing queue to be tested. When the queue is empty, the testing is ended at step 784.

WWV Time Set for Radio (17)

In the alignment of a radio, one of the steps taken is to calibrate the local oscillator. This is done by comparing the natural frequency of the oscillator to a known standard and recording the difference as an offset, which is stored in memory and is used to make sure the clock is accurate.

Figure 57:
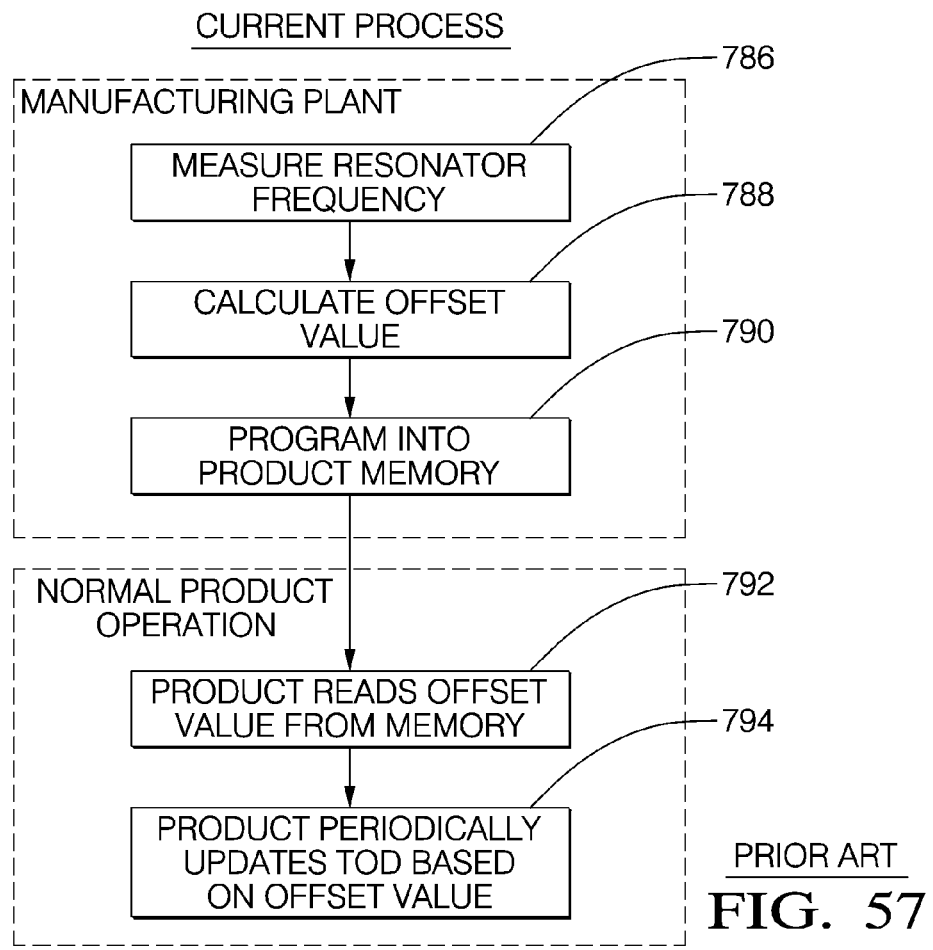
FIG. 57, is a process flow chart for a prior art system for updating time of day employing radio resonator offset.

Referring to FIG. 57, a typical prior art process for calibrating the local oscillator of an automotive radio comprises the steps of measuring the resonator frequency at the point of manufacture at step 786. Thereafter, an offset value reflecting the difference between the radio oscillator and a known standard is calculated at step 788. Finally, the calculated offset value is programmed into memory of the specific automotive radio at step 790. Thereafter, once the automotive radio is installed in a host vehicle and is in the field, the radio reads the offset value from its internal memory at step 792. Lastly, the automotive radio periodically updates its time of day display based upon the read offset value at step 794.

In the present invention, the need for a known standard and running this test at all in the factory is eliminated. The radio will be programmed to tune to WWV on 100 KHz periodically and use their calibration frequency as the known standard for calculating the offset. The correct time will also be updated when this takes place.

Figure 58:
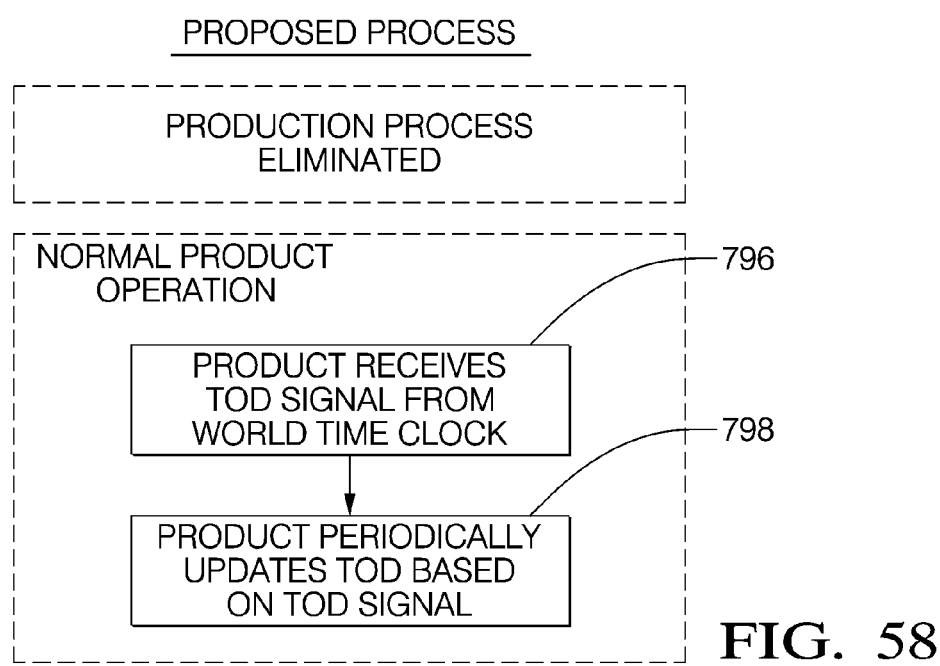
FIG. 58, is a process flow chart for setting and periodically updating the time of day by programming the radio to tune to WWV on 100 KHz as a known standard.
Figure 59:
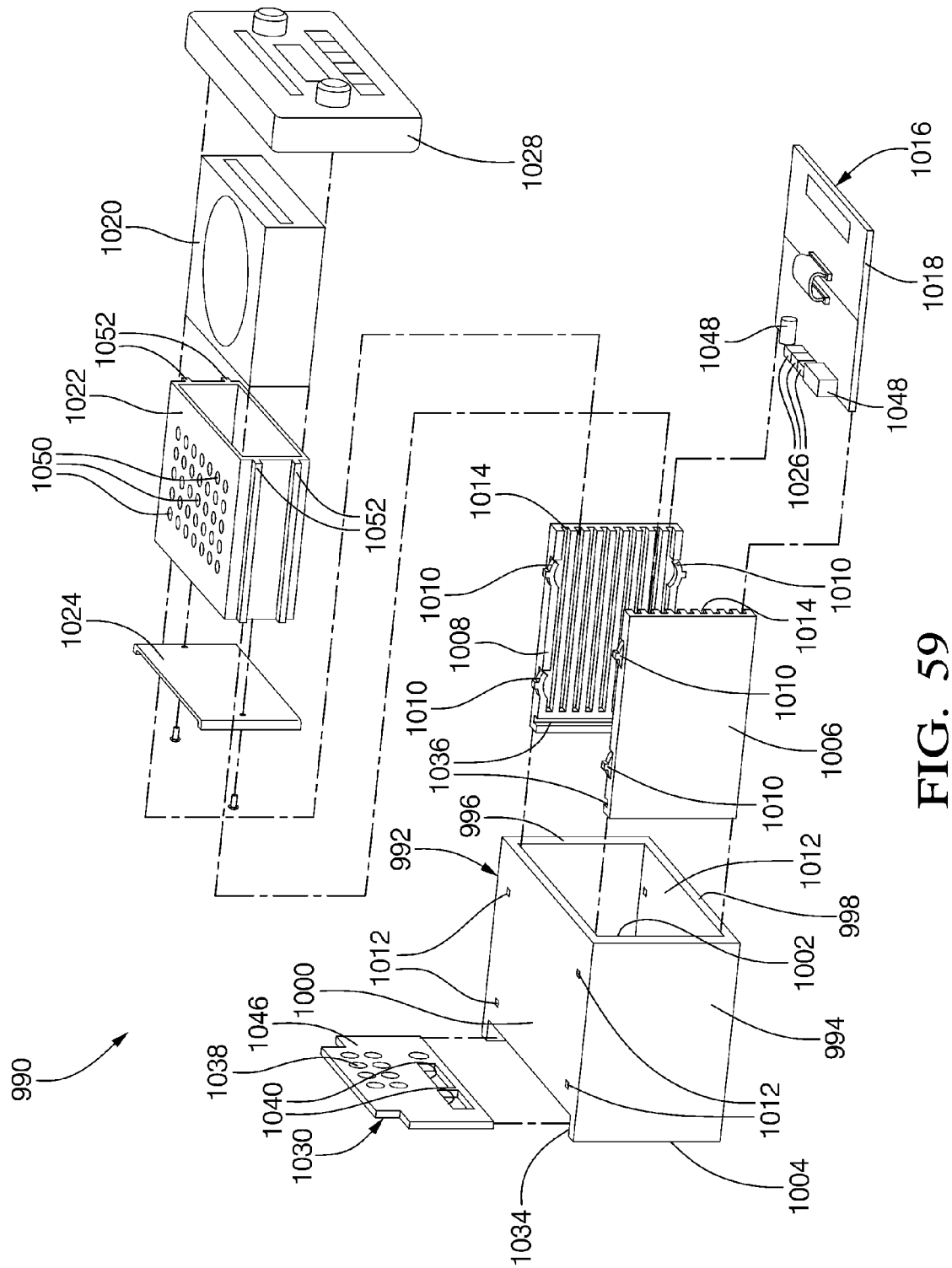
FIG. 59, is an exploded, perspective view of an alternative embodiment of a radio/CD player featuring an adjustable shelving feature for positioning a CD player and one or more PC boards.
Figure 60:
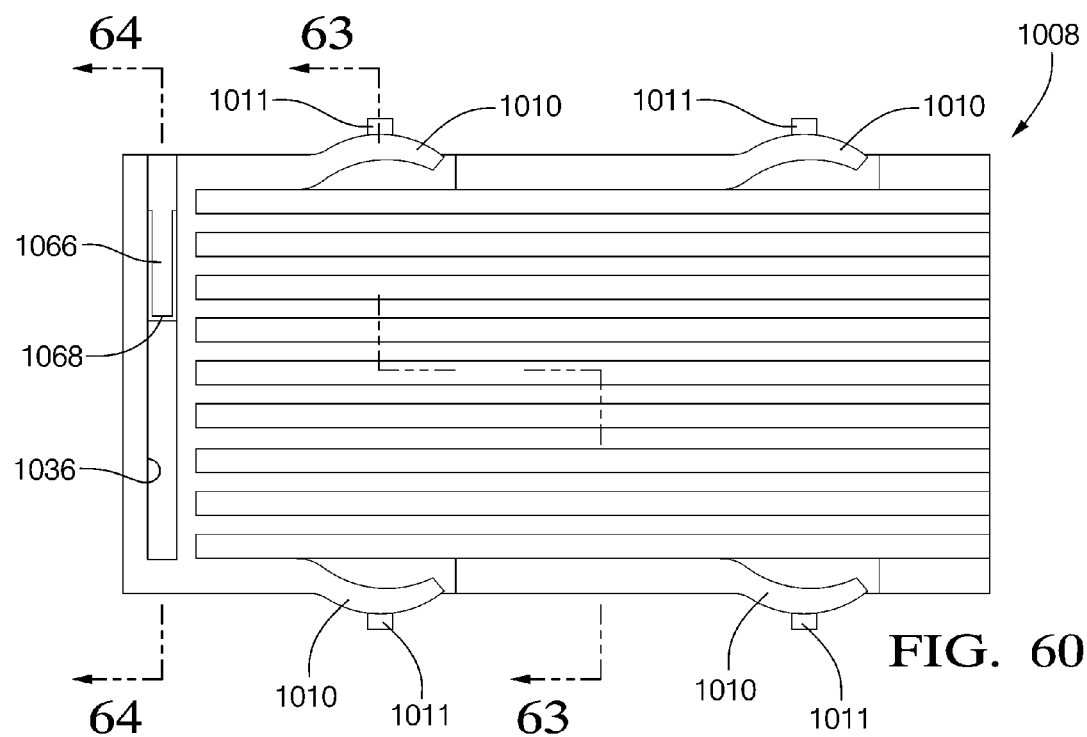
FIG. 60, is a front plan view of one of two shelf guide inserts employed in the radio/CD player embodiment of FIG. 59.
Figure 61:
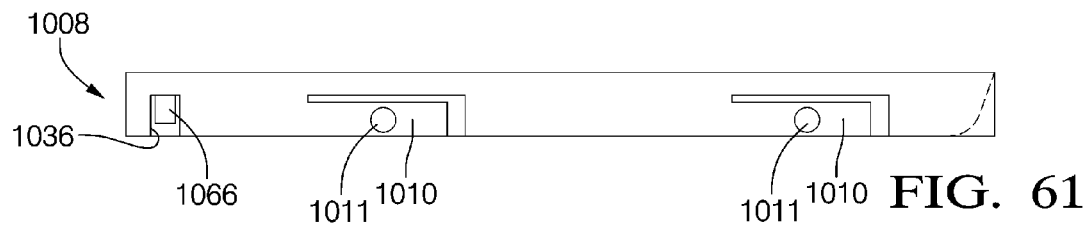
FIG. 61, is a top plan view of the shelf guide insert of FIG. 60.
Figures 62, 63, 64:
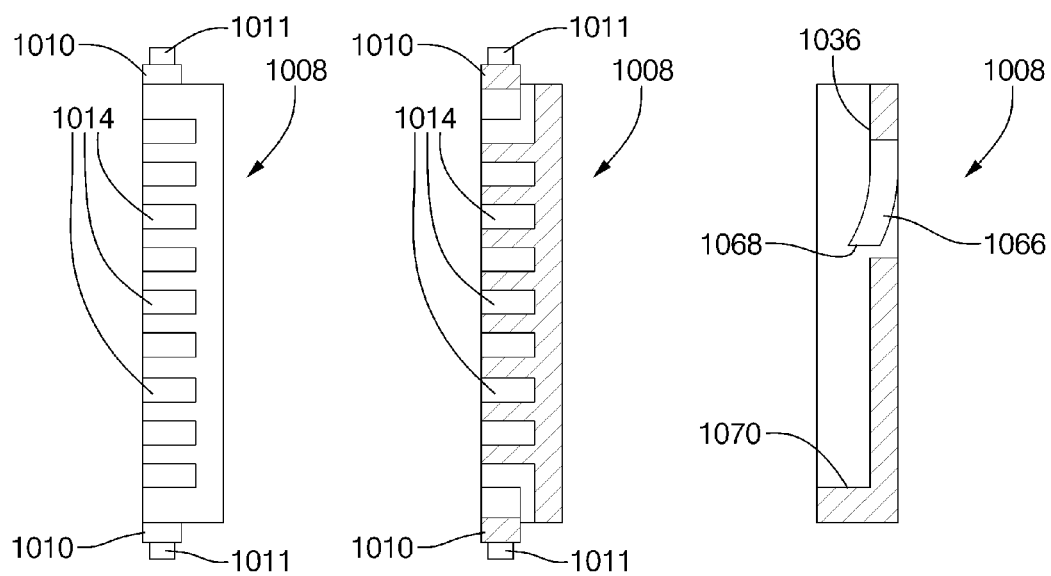
FIG. 62, is a front plan view of the shelf guide insert of FIG. 60.
FIG. 63, is a cross-sectional view of the shelf guide insert taken on broken lines 63-63 of FIG. 60.
FIG. 64, is a cross-sectional view of the shelf guide insert taken on lines 64-64 of FIG. 60.
Figure 65:
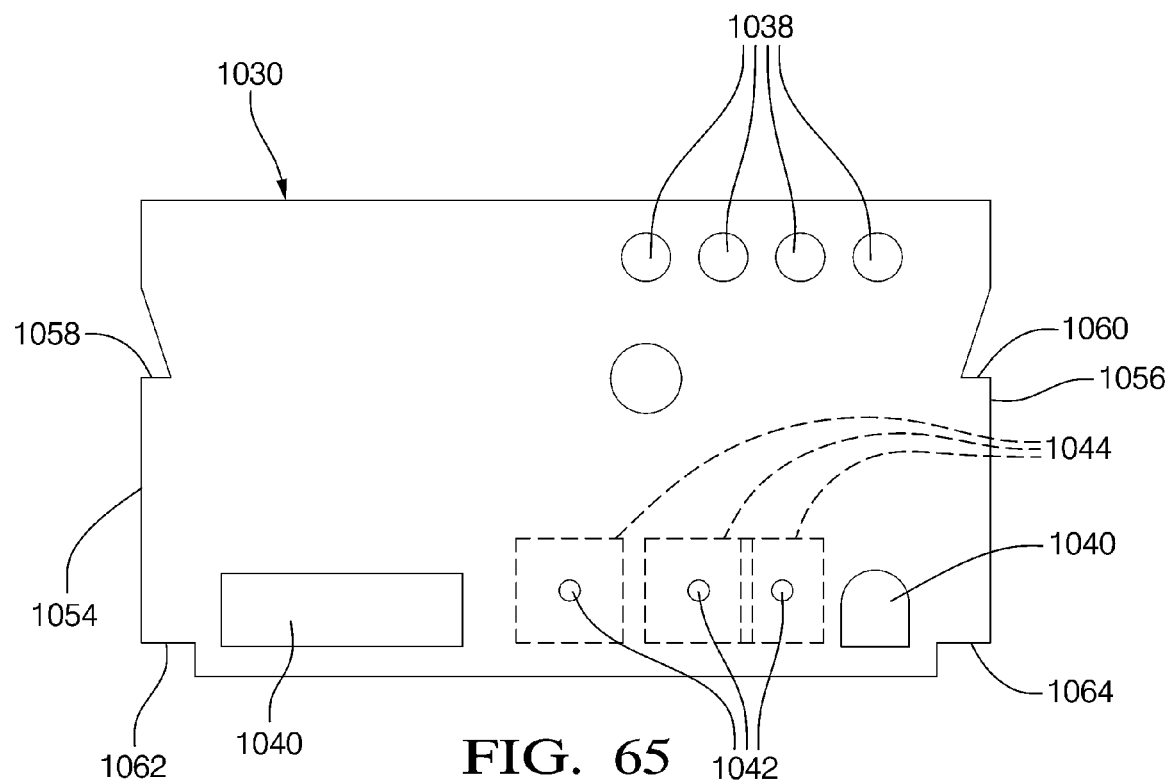
FIG. 65, is a front plan view of a heat sink employed in the radio/CD player embodiment of FIG. 59.

Referring to FIG. 58, a simplified process for easily and reliably updating the time of day indication for an automotive radio is described, involving receiving a time of day signal from a World Time Clock at step 796 and then periodically updating the time of day indication of the automotive radio in response to the time of day signal from the World Time Clock.

Devices such as automotive radios/CD players use a low cost resonator circuit to provide a reference frequency for the Time of Day (TOD) Clock. Due to inherent inaccuracies in this resonator frequency, periodic adjustments must be made to the TOD to retain it's accuracy. Previously, during the production process, the frequency of the resonator is measured and it's actual value is compared to an expected value. This difference is then stored into product memory and the TOD clock is periodically updated. This method requires a special process during production (i.e. a high capital investment) to measure the resonator frequency. In the present invention, during normal operation, the receiver can periodically tune to the World Time Clock (WWV) and receive a time signal. This time signal can then be used to update the TOD clock. This inventive method does not require a special manufacturing process and can be accomplished using existing product hardware design.

The accuracy of a free running clock is limited by accuracy of the underlying crystal. A 25 ppm (parts per million) error in crystal frequency results in over a minute error per month for a clock. The traditional solutions are to either purchase expensive high accuracy crystals or to align the crystal circuit for each individual unit. Alignment can be by either physically adjusting the crystal circuit or by providing a frequency offset to software. Either case requires highly accurate measurement of the actual circuit frequency. Additionally, alignment only corrects the nominal crystal error. It does not compensate for temperature or age drift.

An alternate solution is to use a cheaper, lower accuracy, unaligned circuit to maintain the running time and to periodically correct the time setting by referencing an external highly accurate clock. WWV provides such an external signal on multiple radio frequencies. The unique part of this solution is the shared use of a general purpose AM/FM receiver block with a method to avoid the disruption of the use of the tuner and minimize the use of standby current.

Figure 87:
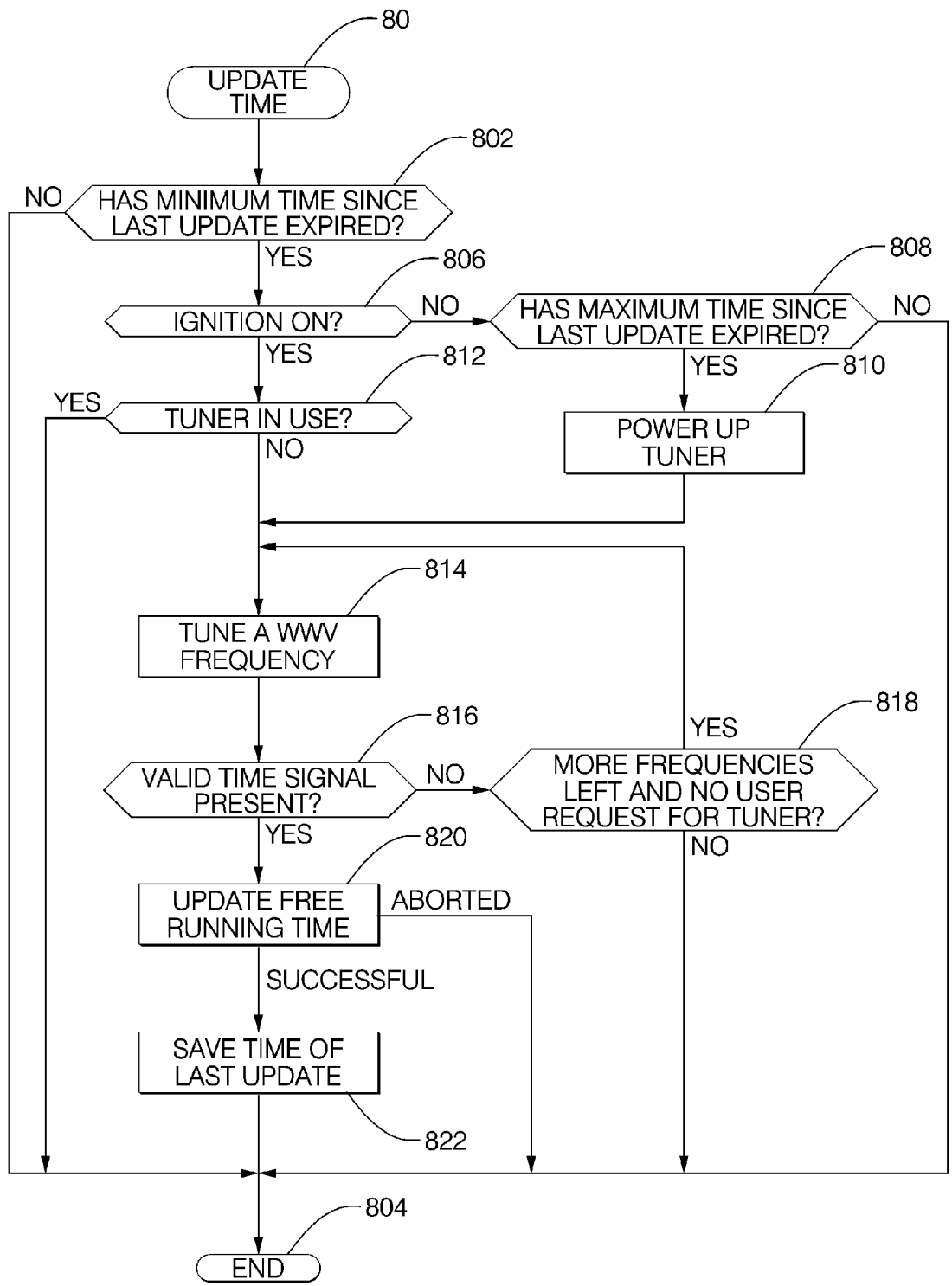
FIG. 87, is a process flow chart illustrating the basic algorithm for a radio received time update process.
Figure 88:
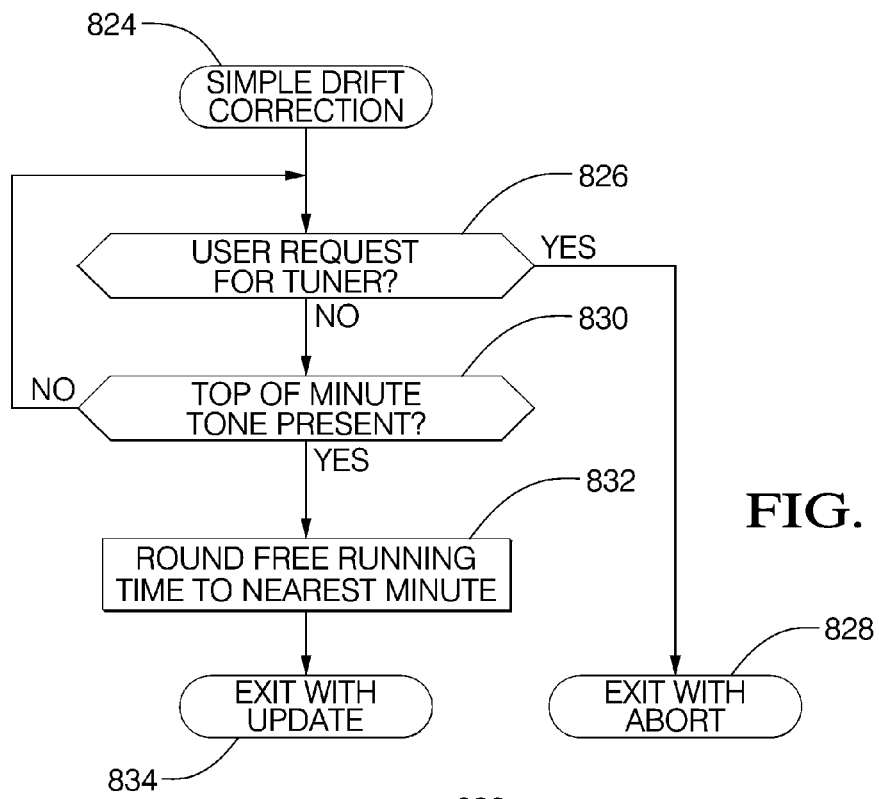
FIG. 88, is a process flow chart illustrating the first level of a two level time update process of FIG. 87, wherein the update of the free running timer simply rounds the current time value to the nearest minute.
Figure 89:
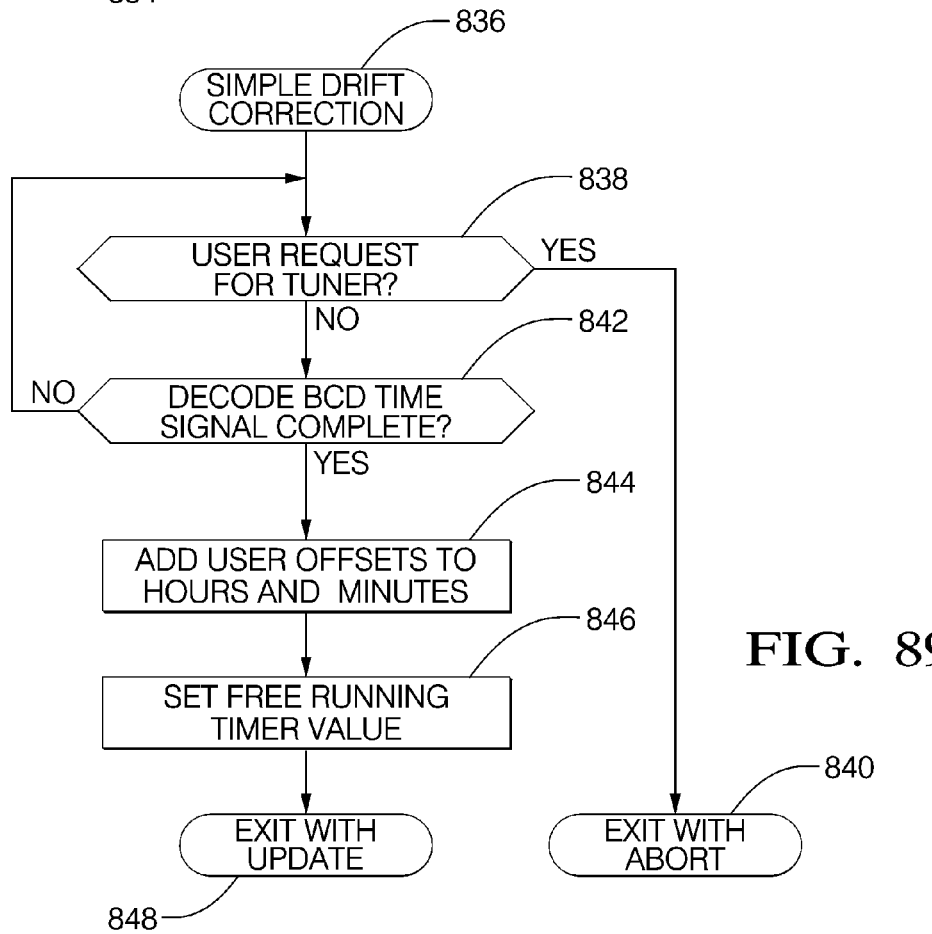
FIG. 89, is a process flow chart illustrating the second level of a two level time update process of FIG. 87, wherein the clock is set based upon BCD encode time information in the WWV signal.
Figure 90:
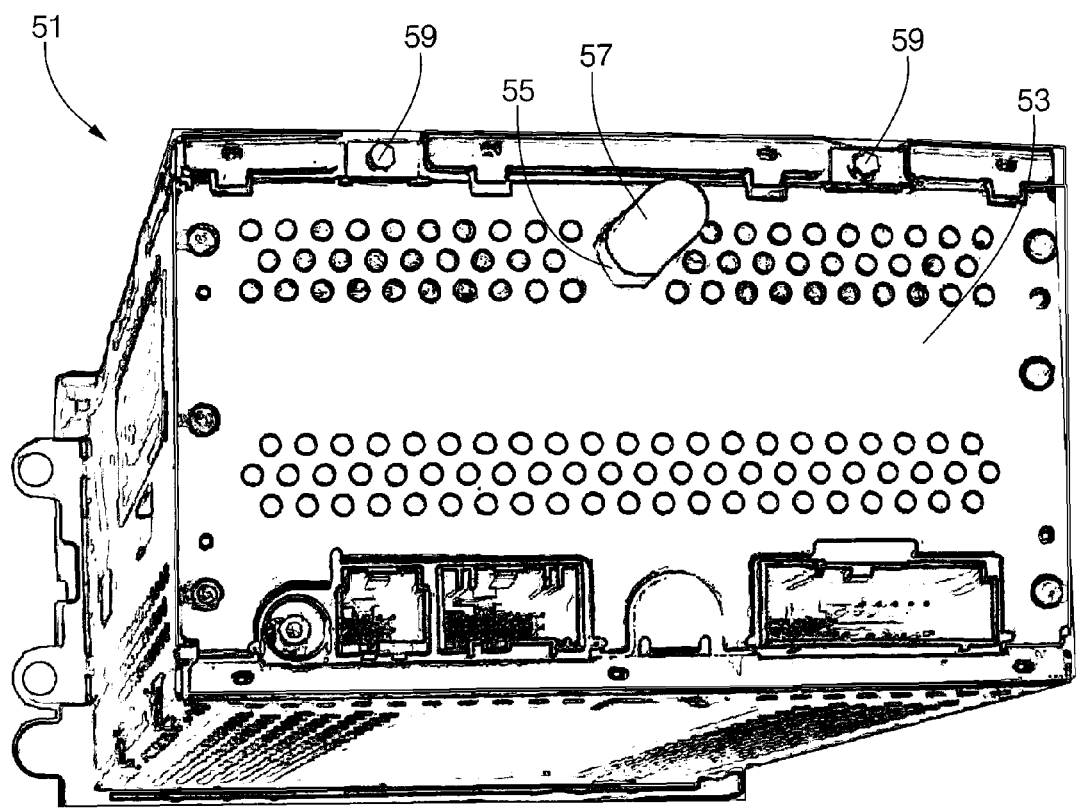
FIG. 90, is a rear perspective view of a prior art automotive radio/CD player combination substantially similar to the device depicted in FIG. 1.
Figure 91:
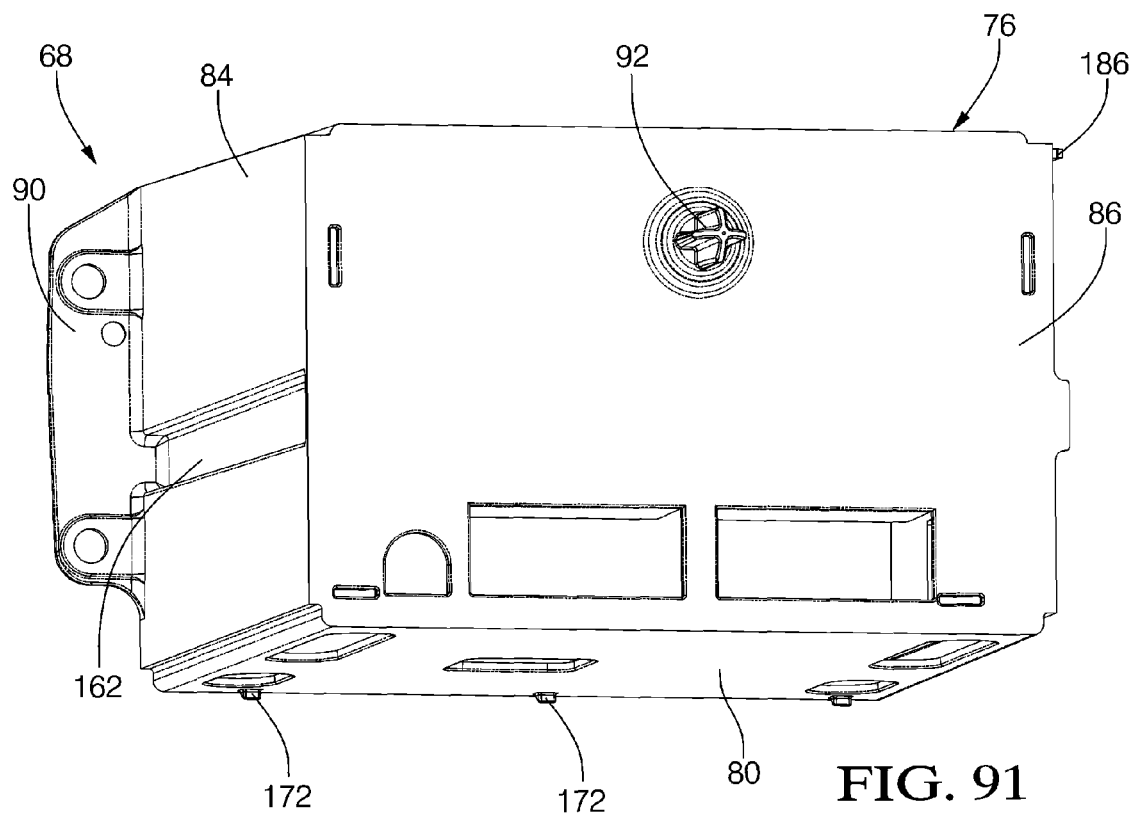
FIG. 91, is a rear perspective view of the case/back-end for a radio/CD player embodying the present invention substantially similar to the case depicted in FIGS. 2, 3 and 5-10, illustrating molded, one piece polymer construction.
Figure 92:
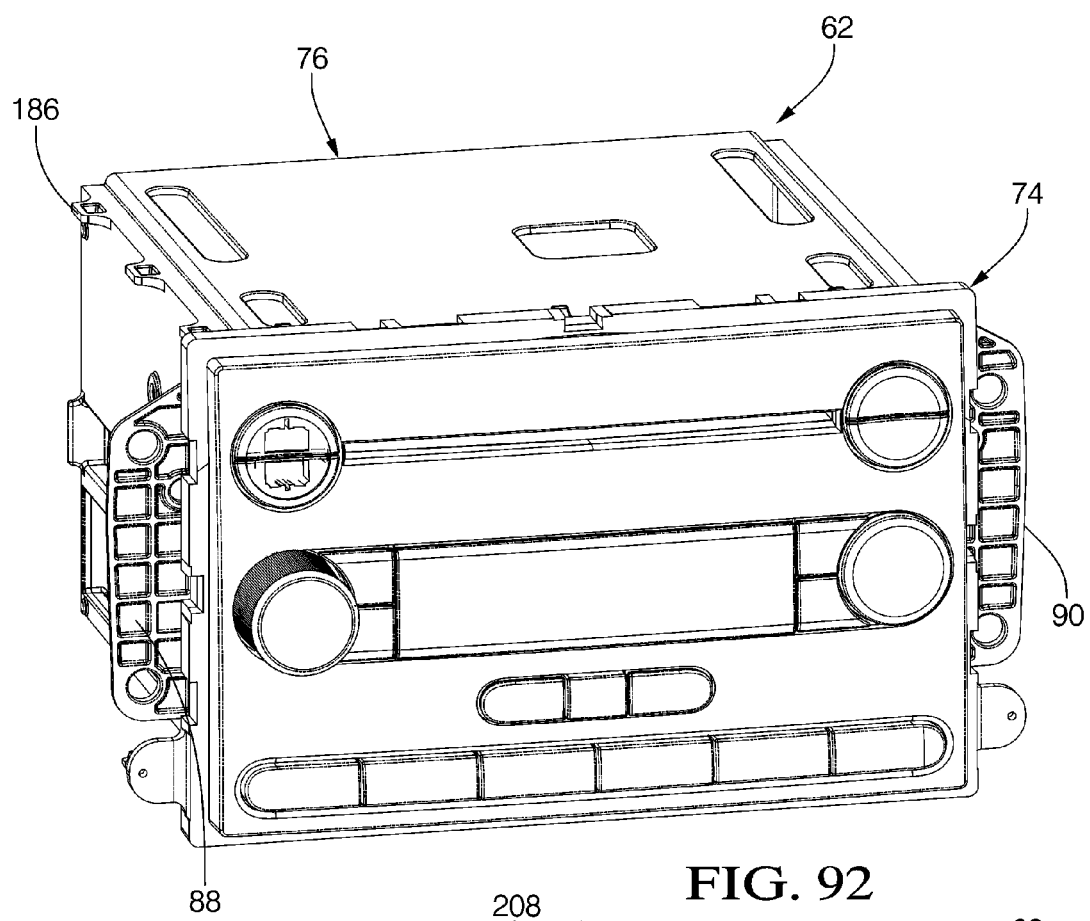
FIG. 92, is a front perspective view of the preferred embodiment of the invention, substantially similar to that of FIG. 2, but with I/O control device function graphical detail highlighted.

The algorithms illustrated in FIGS. 87-89 collectively allow a single tuner to be used both as a general purpose AM/FM receiver and to maintain the accuracy of a free running time of day clock. It also affects minimal current draw when the unit is battery powered.

The controlling factors for determining when to update the clock are the minimum update time and the maximum update time. For a typical clock that displays minutes, these two times should be less than the time for the worst case drift of the running timer to accumulate 15-20 seconds of error. The minimum update time limits the rate of updates to minimize potential disruptions and current usage. The time limit should be set based on the time for the free running timer to accumulate significant error (e.g., 5 seconds of drift). If the radio is already in a high current operational state and the timer is not in use (for example, the radio is in CD mode), an attempt to update the time occurs immediately. The update is also delayed, if the tuner is currently being used (i.e., the user is listening to an AM or FM broadcast). If the radio is in a low current state, a time update attempt is delayed until the maximum update time is exceeded.

Referring to FIG. 87, a process for updating the time of day indication of an automotive radio comprises the steps of initiating a time of day indication update at step 800. Initially, a logical step 802 determines if a minimum time since the last update has expired. If no, the process is ended at step 804. If yes, process moves to a logical step 806 which determines if the ignition in "on". If no, the process moves to a logical step 808 which determines if the maximum time since the last update has expired. If no, the process is ended at step 804. If yes, the tuner is powered up at step 810. If the ignition is on, the process determines if the tuner is presently in use at logical step 812. If yes, the process is ended at step 804. If no, the radio tunes to a known WWV frequency at step 814. Thereafter, the process moves to a logical step 816 which determines if a valid time signal is present. If no, it determines if there are alternative frequencies left and there is no user request at the tuner at logical step 818. If yes, the process returns to the input of step 814. If no, the process is ended at step 804. If a valid time signal is present, the process updates the free running time at step 820. If the free running time update is successful, the process saves the time of the last update at step 822. If the free running time update is not successful, the process is aborted and ended at step 804.

A dual level of service can be provided. As illustrated in FIG. 88, the first level requires the user to manually set the time and simply corrects for drift of the free running timer. This requires the tuner only to be able to detect a 440-600 Hz tone present at the top of the minute. The update of the free running timer simply rounds the current time value to the nearest minute. This provides equivalent functionality as a clock based upon either a high accuracy or aligned crystal based system.

The simple drift correction process of FIG. 88 begins at step 824 and moves to logical step 826 which determines if there is a user request for the tuner. If yes, the process is aborted and exits at step 828. If no, the process moves to logical step 830 which determines if a top of the minute tone is present. If no, the process returns to the input of logical step 826. If no, the process rounds the free running time to the nearest minute at step 832. The process then exits with an update at step 834.

As illustrated in FIG. 89, the second level of service is to actually set the clock based on BCD encode time information in the WWV signal. This method requires a more sophisticated decoder to detect the 100 Hz sub-carrier and decode the time information encoded in the sub-carrier. On each update, non-volatile offsets for hours and minutes would be added to the received values to compensate for time zones and user "adjustments". The user would still have to have a method to adjust the hours for setting the time zone. Optionally, the system could allow the user to adjust the minutes offset, for people who wish to run their clocks fast or slow on purpose. The primary advantage of this approach is that if the running time value is lost (for example, after a battery disconnect), the clock will recover with the correct time at the next update. Furthermore, the clock will automatically adjust for daylight savings changes.

Referring to FIG. 89, an exact time of day correction is initiated at step 836 and thereafter moves to a logical step 838 which determines if there is a user request for the tuner. If yes, the process aborts and exits at step 840. If there is no user tuner request, the process moves to a logical step 842 which determines if the decoding of the BCD time signal is complete. If no, the process is returned to the input of logical step 838. If yes, the process adds user offsets to the hours and minutes settings at step 844. Thereafter a free running timer value is set at step 846. Finally, the process exits with an update at step 848.

Guillotine Heat Sink (18)

The guillotine heat sink uses a flat aluminum plate as a heat sink. It slides down a slot on each side of the plastic box until it comes to rest on the quad bridge amplifier (QBA) IC and the power supply IC. Each IC will have a silpad on top to provide compliance and facilitate heat transfer. A downward force will be applied to the heat sink through a molded leaf spring in the lid of the plastic bob when it is snapped into place. An additional feature of the plastic box is to provide pillars under the FR-4 board in the location of the power ICs to provide a backstop for the leaf spring force.

Referring to FIGS. 38-40, a fastener-less electronic device 850 includes a housing assembly 852, an electrical assembly 854 and a heat sink structure 856. The housing assembly 852 comprises a generally box-like case 858 and a closure member 860. The case 858 and closure member 560 form guideways for positioning and supporting the heat sink 856 and electrical assembly 854.

In the illustrated embodiment, the case 858 and closure member 860 are formed of polymer based material. The case 858 includes left and right side wall portions 862 and 864, respectively, a lower wall portion 866 a rear wall portion 868 and a front wall portion (not illustrated) substantially similar to the rear wall portion 868 in configuration and function. The case 858 includes ramped, outwardly extending features 870 integrally formed on outside wall surfaces 872 which cooperatively engage catch features 874 integrally formed on edges 876 of the closure member 860 which snap-lock with the ramped features 870 to affect tool-less, fastener-less assembly of the case 858 and closure member 860.

Longitudinally extending inwardly opening guideways or slots 878 and 880 are formed in the lower portion of the left and right sidewalls 862 and 864 for slidably receiving edge surfaces 881 and 883 of a carrier 882 such as a PCB. First and second heat generating electrical components 884 and 886, respectively, are mounted to the upper surface 888 of the PCB 882. Localized pillars 890 and 892 are integrally formed in the lower wall portion 866 defining upper abutment surfaces 894 and 896, respectively, supporting the lower surface 898 of the PCB 882 in locations registering with the electrical components 884 and 886.

Vertically extending inwardly opening guideways or slots 900 and 902 are formed in the left and right case sidewalls 862 and 864 for slidably receiving edge guide surfaces 904 and 906, respectively, of the heat sink 856. Slots 900 and 902 are longitudinally aligned with the electrical components 884 and 886 as well as the pillars 890 and 892. The heat sink 856 is substantially planer and formed of aluminum. The heat sink has a bottom edge 908 including two integrally formed extensions 910 and 912, respectively which laterally register with the electrical components 884 and 886, respectively. The heat sink extensions 910 and 912 are configured to either bear downwardly against the exposed upper heat liberating surfaces of the electrical components 884 and 886 or, alternatively, can support "silpads" or similar thermal coupling devices 914 and 916 therebetween.

A leaf spring 911 is integrally formed within an opening 913 in closure member 860. The leaf spring 911 extends as a cantilever downwardly below a lower surface 918 of the closure member 860. The leaf spring 911 is elongated along an axis that extends laterally and in register with a top edge 920 of the heat sink 856.

The electronic device 850 is assembled simply by manually engaging the edge surfaces 881 and 883 of the PCB 882 of the electrical assembly 854 within the slots 878 and 890 and displacing it rearwardly into its illustrated design position. Next, the edge surfaces 904 and 906 of the heat sink 856 are manually positioned in their respective vertical slots 900 and 902 and the heat sink lowered "like a guillotine" until its extensions 910 and 912 abut their respective heat generating components 884 and 886 (possibly with an intermediate silpad 914 and 916). The closure member 860 is then manually snapped into its illustrated assembled position wherein the leaf spring 914 continuously bears downwardly against the top edge 920 of the heat sink 856 for radiating heat away from the heat generating components 884 and 886.

Button Tree Concept (19)

In the button tree concept, as many buttons as possible are treed together in the molding process to reduce handling of buttons in subsequent operations. The paint fixture will be placed on a machine that singulates the tree and transfers the buttons to the trim plate. Buttons are currently molded one-up and must be placed in the paint fixture one at a time and then transferred to the trim plate one at a time.

Referring to FIGS. 51-54 and 170, a method and apparatus for efficiently fabricating push buttons and assembling the push buttons on associated individual actuator devices, such as the switch assemblies described in connection with FIGS. 48-50 herein, as part of an automotive audio system assembly is described hereinbelow.

Figure 51:
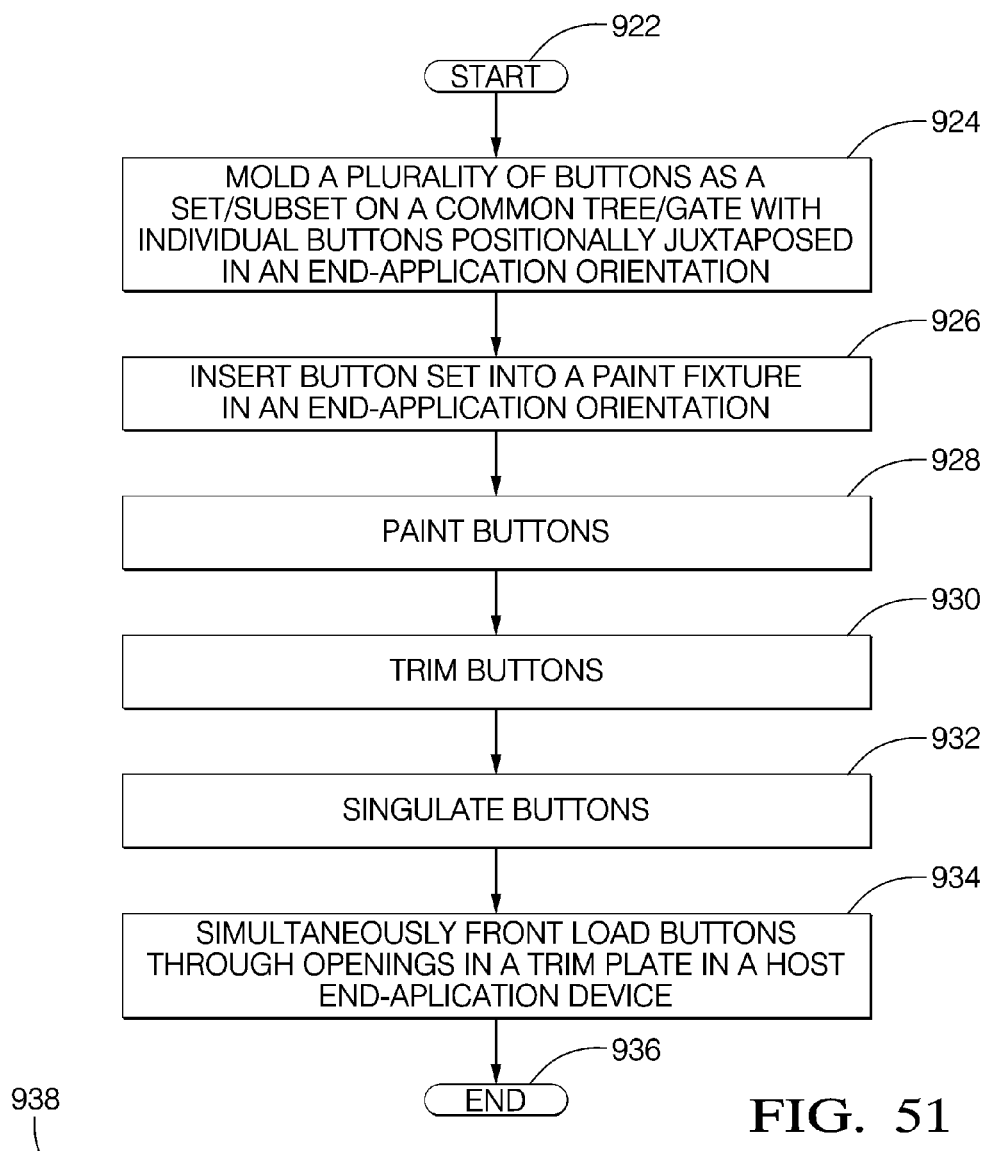
FIG. 51, is a process flow chart for molding, painting trimming, singulating and installing a button set in a host end-application device while continuously maintaining the individual buttons of the set in their end-application juxtaposition.

Overall, the inventive process is outlined in FIG. 51 in a number of process steps including initiating the process at step 922, molding a plurality of buttons as a set or subset on a common tree or gate with the individual buttons positionally juxtaposed in an end-application orientation at step 924, inserting the button (sub)set into a paint fixture in an end-application orientation in step 926, painting selected surfaces of each button of the (sub)set of buttons while in the fixture at step 928, trimming extraneous material from each button at step 930, singulating the buttons of the (sub)set by removing the common tree while maintaining them in fixed juxtaposition at step 932, simultaneously front loading the (sub)set of buttons through assigned end-application apparatus trim plate openings associated with the associated individual actuator devices at step 934, and ending the process at step 936.

Figure 52:
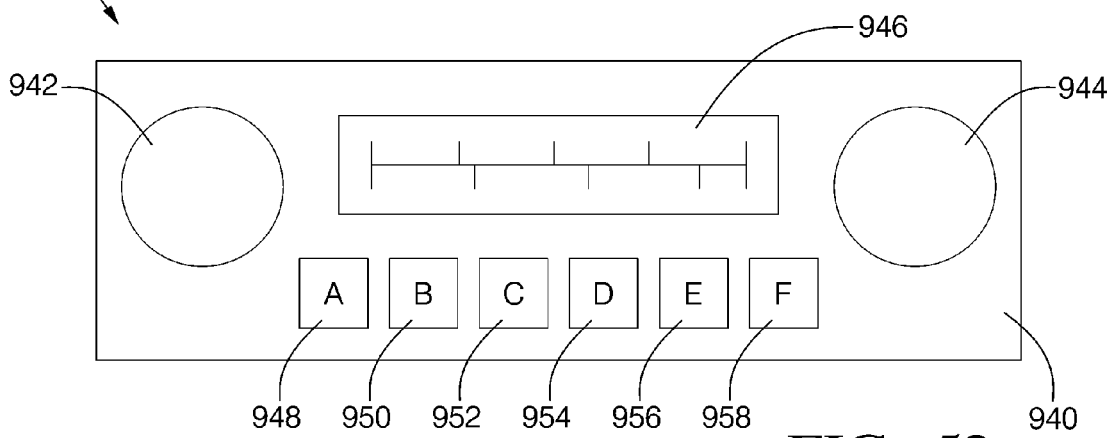
FIG. 52, is a plan view of an operator control panel of an end-application device with the buttons installed in their final orientation.
Figure 53:
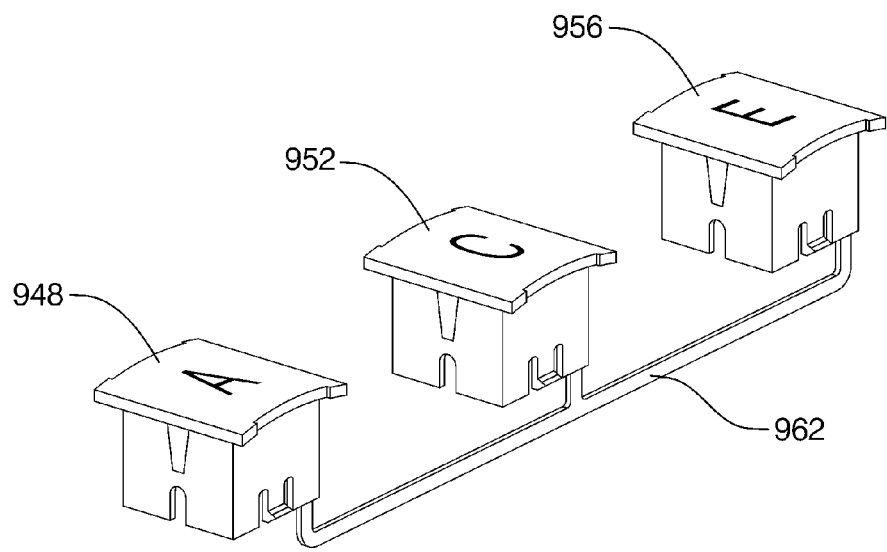
FIG. 53, is a perspective view of a subset of three buttons in their as molded state prior to installation in a paint fixture.
Figure 54:
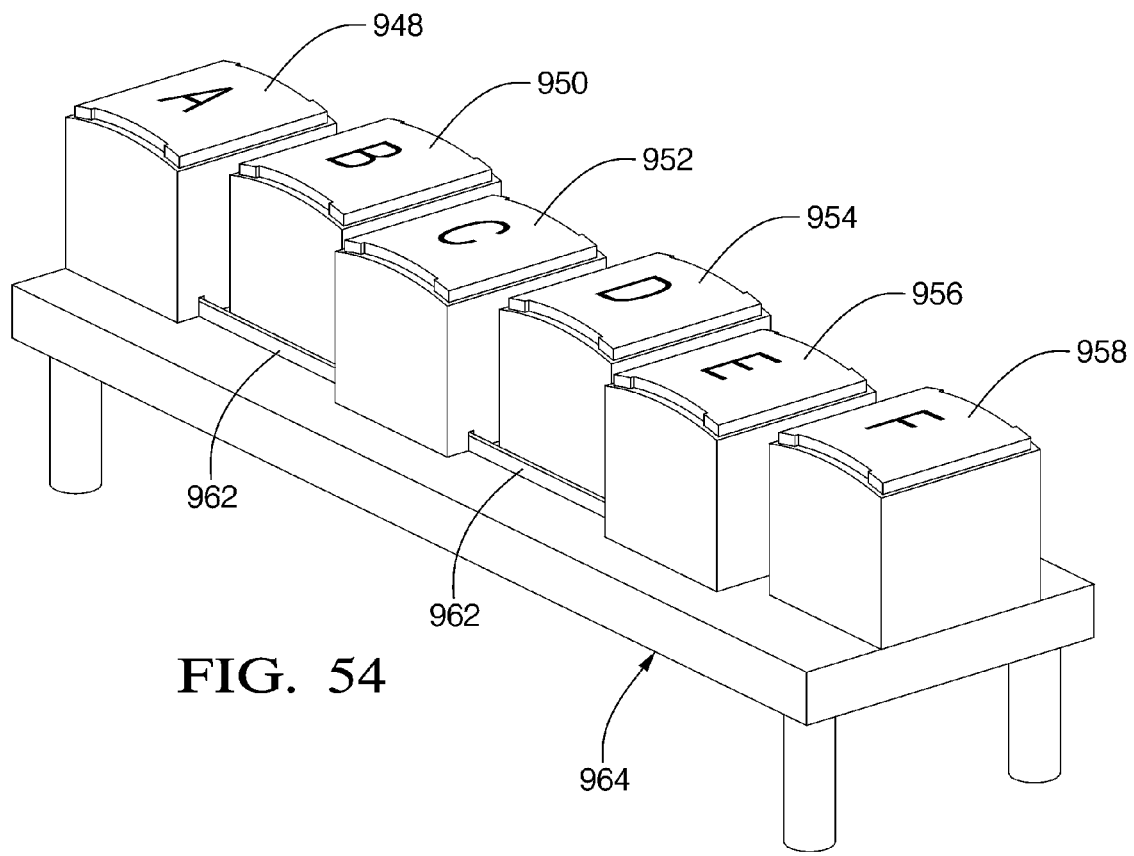
FIG. 54, is a perspective view of two three-button subsets installed in a paint fixture.

Referring to FIGS. 52-54, a simplified application of the present inventive concept is described for the sake of clarity. FIG. 52 represents a standard automotive radio receiver 938 including a front trim plate 940 and various operator controls and displays such as an on-off-volume and treble-bass control 942, a tuning and speaker balance control 944, an liquid crystal (LCD) display 946 and a ganged array of push buttons 948-958. Each of the push buttons 948-958 are front mounted (i.e. applied to trim plate 940 of the radio receiver 938 from the front) engaging individual associated actuator devices (not illustrated) located behind the trim plate 940.

The typical prior approach of producing such a receiver would entail either individually injection molding each of the push buttons or molding them on a common tree, but with no regard to their relative juxtaposition during the molding process vis-à-vis their relative juxtaposition in their end application. This is because the individual push buttons are typically immediately separated from their common tree and thereafter handled and processed separately.

The present invention, in essence, maintains a set or subset of buttons destined for a common end application in a fixed juxtipositional relationship corresponding to their end application design arrangement from their initial formation during the molding process, through trimming, decorating, painting, finishing, singulation (i.e. removal from their tree/gate) and installation in an end-application apparatus.

Referring to FIGS. 52-54, for purposes of the present example, it is assumed that the dimensional constraints and layout of the push buttons 948-958 in the radio receiver 938 prohibit simultaneous molding of all six push buttons 948-958. A preferred option, then, is to separately injection mold two subsets of push buttons. A first subset 960 containing alternating push buttons 948 ("A"), 952 ("C") and 956 ("E"), connected by a common tree/gate 962, is illustrated in FIG. 53. A second subset containing alternating push buttons 950 ("B"), 954 ("D") and 958 ("F"), connected by a common tree/gate, is not illustrated. As illustrated in FIG. 54, the two subsets of push buttons are interdigitated to assume their end-application orientation when placed in a processing fixture 964. The push buttons remain in the fixture in their relative end-application orientation through all of the above-described processing steps. As a final step, automated equipment simultaneously removes the six push button set from the processing fixture 964 and simultaneously installs them in the radio receiver 938. In addition to substantially reducing labor cost, this novel process virtually eliminates improper assembly of the push buttons and many other common quality related issues.

Referring to FIG. 170, a single front loaded color shifting push button 966 is illustrated in an installed position on a back loaded actuator control member 968 extending through an opening 970 in a trim panel 972 of an audio device 974. The core 976 of push button 966 is formed of clear material suitable for back-illumination by a light emitting diode (LED) 978 mounted axially within the control member 968. Prior to final assembly, the push button 966 is processed as described hereinabove, including the application of overlayments of a light diffusing layer 980, a light fluorescing layer 982, a coloration under-layer 984, and a decorative opaque topcoat 986 forming decorative indicia and clear or translucent light transmitting regions 988. It is also contemplated that other related process steps, such as dual or tri-shot, multi color injection molding techniques and second surface decorative finishing can be employed within the present invention.

Screwless Power Clip (20)

The screwless power clip is an extension of a clip that Grundig uses in automotive radios produced in Europe today. The Grundig clip uses a long lever arm that must be snapped after the PCB is assembled into the metal wrap around. This requires an operator to reach in with a tool and snap (distend and release) the clip.

In the present invention, the long lever arm is eliminated. The present invention uses the assembly action of hooking the bottom of the heat sink into plastic stirrups and rotating the top of the heat sink until it snaps at the top of the plastic box to provide the lever action. This assembly technique can be accomplished by an operator without the use of expensive or specialized tools.

An additional approach to this idea is to eliminate the clip altogether and to employ a spring material as part of the lead frame.

Refer to FIGS. 41-43, described hereinabove.

Adjustable Shelf Case

In this mechanical configuration the case starts out as a sheet metal sleeve. Plastic inserts for the left and right side are then snapped into place that contain/define slides for the circuit boards and for a plastic shelf that would hold the CD mechanism at the proper height for registering with its associated CD slot. The back of the receiver would be an aluminum plate guillotine heat sink that slides in slots in the back of the plastic inserts.

Referring to FIGS. 59-69, an automotive audio system 990 is configured to be hand assembled and is virtually fastenerless. Furthermore, this embodiment is easily reconfigurable, both at the time of original manufacture and later in service life to facilitate field repairs and change-over to upgraded technology. The audio system comprises a simple sheet metal housing sleeve 992 defining left and right side walls 994 and 996, respectively, a bottom 998, a top 1000, and front and rear openings 1002 and 1004, respectively. Plastic inserts 1006 and 1008 are snap-engaged adjacent the inner surface of the left and right walls 994 and 996, respectively, within the sleeve 992 by a system of resilient tabs 1010 integrally formed as cantilevers within inserts 1006 and 1008 and cooperating locking holes 1012 formed in the top 1000 and bottom 998 of the sleeve 992. Each resilient tab 1010 includes a vertically extending pin 1011 integrally formed thereon. The inserts 1006 and 1008 have a plurality of vertically spaced, longitudinally extending mirror-image slots and grooves 1014 formed therein for receiving audio components such as a radio receiver circuit 1016 carried on a PCB assembly 1018, and a CD player subassembly 1020 carried within a vented inner sleeve 1022. The sleeve has a vertically disposed heat shield 1024 affixed to the rear surface thereof which, in assembly, bifurcates the cavity defined by the sleeve 992 into a relatively warm rear portion containing the heat generating electrical power devices 1026 on the PCB assembly 1018, and a relatively cool front portion containing the CD player subassembly 1020 as well as the low power electrical components on the PCB assembly 1018. A trim plate subassembly 1028 snap engages the sleeve 992 to close the open front end 1002.

Referring to FIGS. 59-66, a modified "guillotine" type heat sink 1030 closes the open rear end 1004 of sleeve 992 by sliding vertically downwardly through a recess 1034 formed in the rear portion of the sleeve 992 and edge engaging vertical slots 1036 formed in the inserts 1006 and 1008. The heat sink 1030 forms convection air cooling openings 1038, audio system interconnection ports 1040, and electrical power device attachment passages 1042 therein. The attachment passages 1042 register with their respective electrical power devices 1026 whose profile outlines are indicated in phantom at 1044. The electrical power devices are attached to the inside surface 1040 of the heat sink 1030 by screws (not illustrated) extending inwardly through passages 1042 or alternatively, by other screw-less resilient means as described elsewhere herein. Ports 1040 register with audio system connecter assemblies 1048 carried on the rear portion of the PCB assembly 1018.

FIGS. 60-64 illustrate the structural detail of the right side insert 1008. The slots 1014 are equally dimensioned and equally vertically spaced whereby the side edges of the PCB assembly can longitudinally slide therein. The CD player subassembly retaining inner sleeve 1022 has convection cooling passages 1050 in the top surface thereof and parallel, longitudinally extending guide bosses 1052 projecting laterally outwardly from the sleeve left and right side walls to engage the slots 1014 in the inserts 1006 and 1008.

The heat sink 1030 form left and right vertical edge surfaces 1054 and 1056, respectively. The edge surfaces 1054 and 1056 define opposed upper steps 1058 and 1060, respectively, and opposed lower steps 1062 and 1064, respectively. The heat sink is manually installed by orienting its lateral edges 1054 and 1056 within the opposed vertical slots 1036 formed in the inserts 1006 and 1008, and lowering in into its installed position. Refer FIG. 68. As the heat sink 1030 descends, the lower step 1064 in the edge surface 1056 will initially slidingly engage a retention tab 1006 (refer FIG. 66) which is integrally formed with insert 1008 and extends (in the relaxed condition) downwardly and laterally inwardly, forming a downwardly facing catch or abutment surface 1068. As the heat sink 1030 further descends, the lower step 1064 will momentarily displace the free end of the retention tab 1066 laterally outwardly. Refer FIG. 67. As the heat sink 1030 approaches its design intent installed position, the upper step 1061 will vertically align with the abutment surface 1068 of the retention tab 1066, which will snap back into its relaxed position, thereby positively locking the heat sink 1030 in the installed position. Refer FIG. 68. The heat sink 1030 assumes its installed position when the lower step 1064 contacts a base surface 1070 of the insert 1008.

The PCB assembly 1018 and the CD player subassembly 1020 are installed like drawers, and can be conveniently exchanged and repositioned within the confines of the sleeve 992, requiring only the replacement of the trim panel 1028 to accommodate any new configuration.

Figure 69:
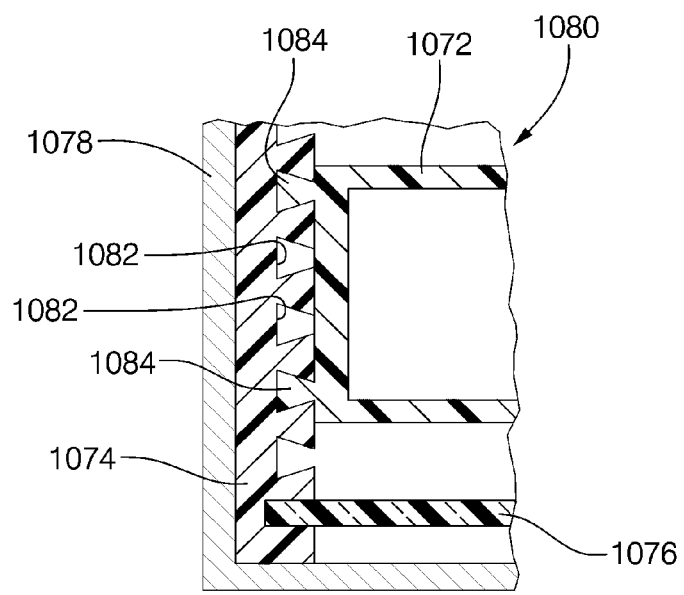
FIG. 69, is a broken, cross-sectional view on an enlarged scale of a variant of the radio/CD player of FIG. 59 wherein the interconnecting features between the shelf guide inserts and the CD player retention shelf are complimentary dovetails.
Figure 66:
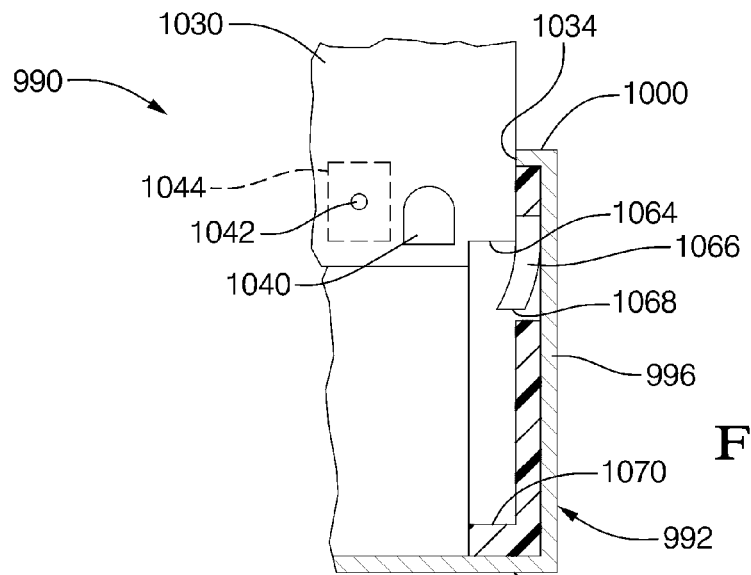
FIG. 66, is a broken, cross-sectional view of initial positioning of the heat sink of FIG. 65 with respect to one of the shelf guide inserts of FIG. 60 as part of the assembly process of the embodiment of the radio/CD player of FIG. 59.
Figure 67:
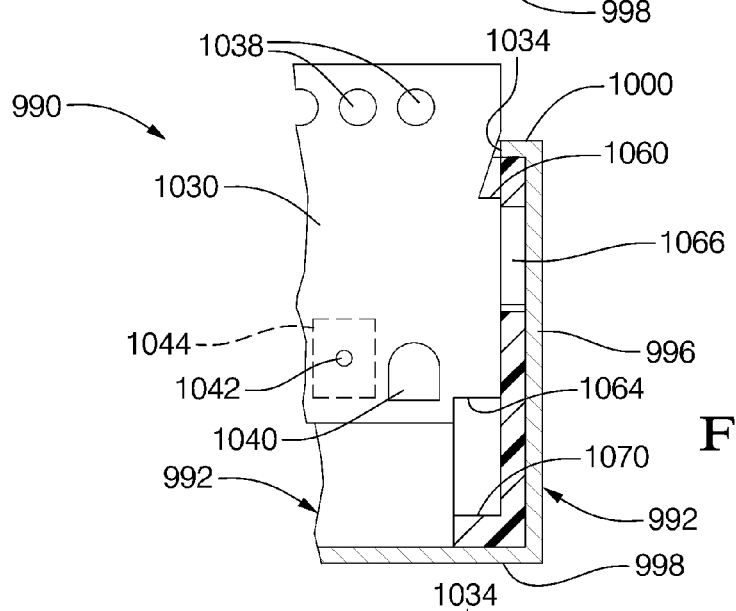
FIG. 67, is a broken, cross-sectional view similar to that of FIG. 66, but with the heat sink in an intermediate position in the assembly process.
Figure 68:
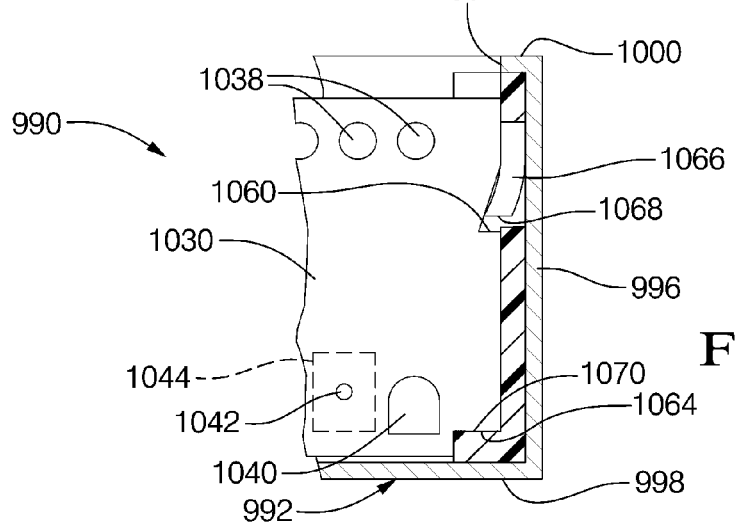
FIG. 68, is a broken, cross-sectional view similar to that of FIG. 66, but with the heat sink in a fully installed position in the assembly process wherein it is self-engaged and retained by an integral engagement tab of the shelf guide inserts.

Referring to FIG. 69, an alternative method of interconnecting a CD player subassembly inner sleeve 1072 with a left side insert 1074 and a PCB assembly 1076 within a housing sleeve 1078 of an alternative automotive audio system 1080 is illustrated. The only material difference of the embodiment of FIG. 69 contrasted with the embodiment of FIGS. 59-68, is the insert 1074 forms vertically spaced longitudinal slots 1082 and the inner sleeve 1072 forms cooperating laterally outwardly extending longitudinal guide bosses 1084 which are of a dovetail configuration to laterally interlock the two.

Fold-Up Case

In this mechanical configuration, the case starts out as a flat set of plastic sides with molded in metal mesh to act as the hinges for folding the case into a three-dimensional structure. This approach allows for bottom-up assembly that starts by snapping the board to molded features in the bottom plate. The heat sink is snapped to features in the back plate and the CD mechanism is attached to the front plate with two screws. The box is then folded up and snapped together.

Figure 71:
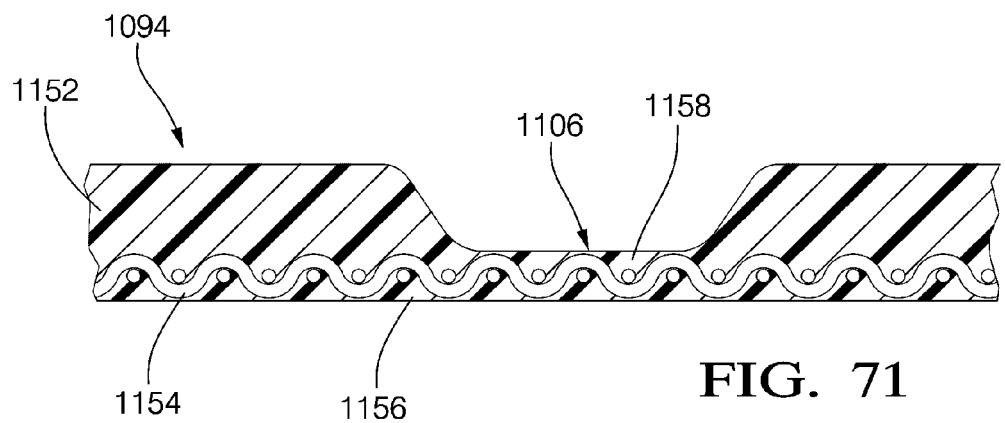
FIG. 71, is a representative cross-section of the case wall structure of the radio/CD player of FIG. 70, on a greatly enlarged scale, illustrating a thin wall section forming a living hinge.
Figures 72, 73:
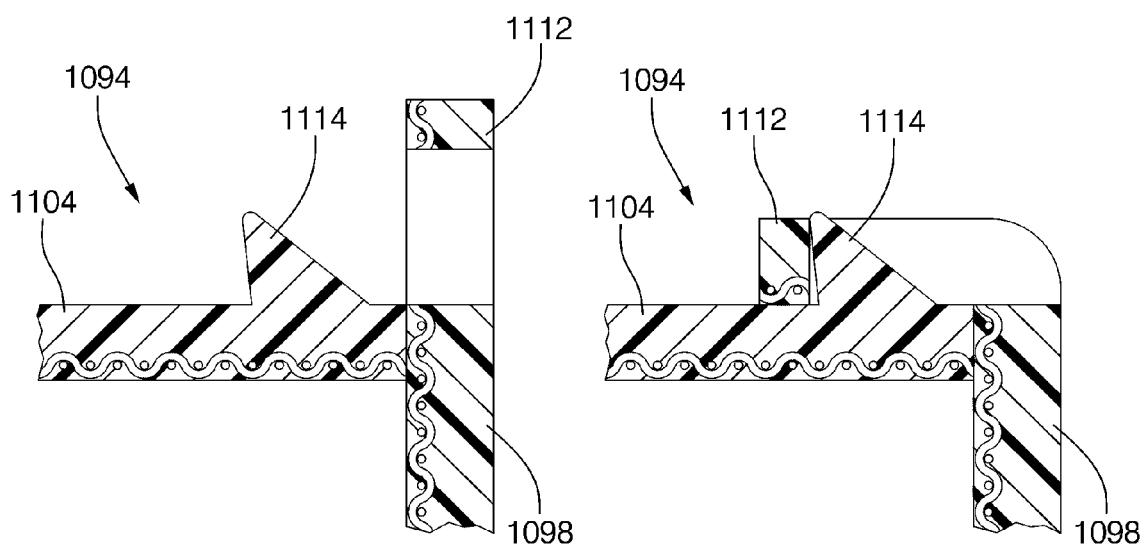
FIG. 72, is a fragmentary, cross-sectional detail of adjacent case panel edge portions of the radio/CD player of FIG. 70, on an enlarged scale, in a post assembly orientation prior to engagement of cooperating integral latch features.
FIG. 73, is a fragmentary, cross-sectional detail of adjacent case panel edge portions of the radio/CD player of FIG. 70, similar to that of FIG. 72, in a post assembly orientation after engagement of cooperating integral latch features.
Figure 74:
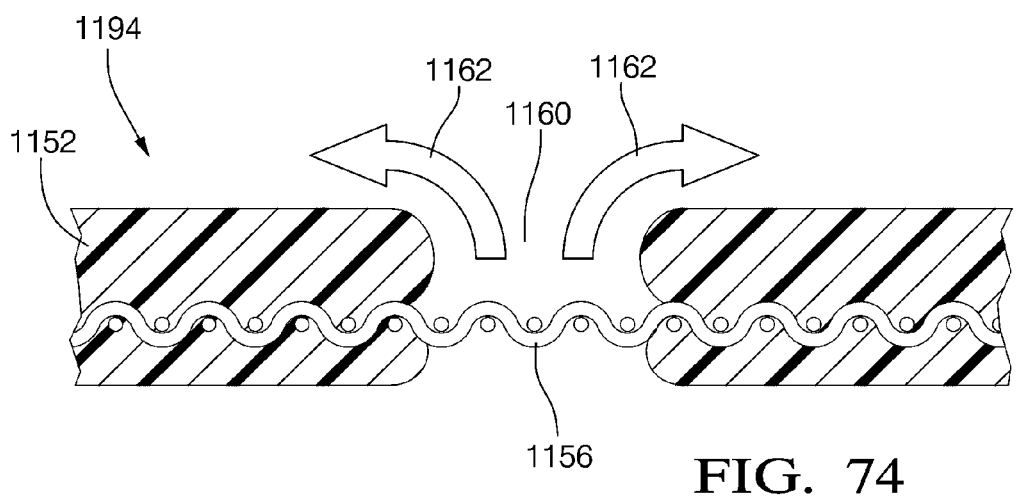
FIG. 74, is a representative cross-sectional detail of a variant of the case wall structure of the radio/CD player of FIG. 70, on a greatly enlarged scale, illustrating a screen only section forming a living hinge.
Figure 76:
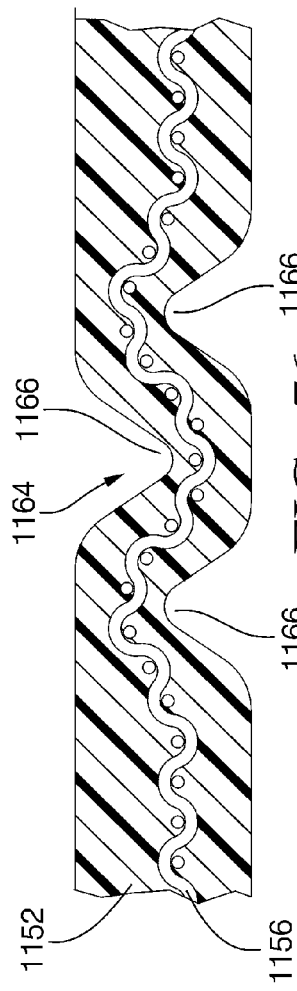
FIG. 76, is a representative view, on a greatly enlarged scale, of laminate case material produced by the process equipment of FIG. 75, illustrating a localized deformation of the material to define a reduced thickness, undulating living hinge section.
Figure 77:
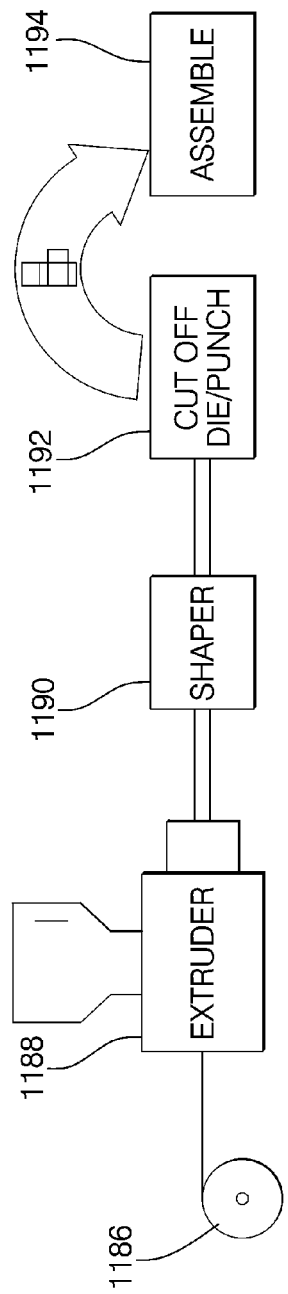
FIG. 77, is a schematic representation of alternative manufacturing process equipment for producing a continuous strip of composite (plastic & screen) material for subsequent formation of a case structure suitable for the radio/CD player of FIG. 70.

The common edges of adjacent case panels define living hinges extending partially or entirely along the length thereof. The living hinge can consist of wire mesh only, where there is a gap in the plastic material, as illustrated in FIG. 74. Alternatively, the living hinge can comprise a thin web of plastic only, wherein the wire mesh has been interrupted. In another embodiment, the plastic-wire mesh composite can be molded to define a thin web as the living hinge, as illustrated in FIG. 71. In another embodiment, the plastic-wire mesh composite can be crushed or deformed to define the living hinge, as illustrated in FIG. 76. Finally, a portion of the plastic and/or wire mesh can be scribed or machined away to expose the wire mesh to define the living hinge. If the case material is thin enough at the hinge point, the hinge can be segmented, rather than continuous.

Referring to FIGS. 70-77, several variants of a housing assembly 1086 for an automotive audio system 1088 are illustrated. This version of the audio system 1088 is configured to be hand assembled and is nearly fastener-less. The fasteners which are employed are extremely elemental and require only the most rudimentary of hand tools to affect assembly. In essence, the audio system housing assembly 1086 comprises a case portion 1090 and a closure member or front plate 1092. The case 1090 is presented to the assembler in an unfolded, two-dimensional arrangement whereby he/she can easily complete the final assembly process on a table top, eliminating complex and expensive tooling fixtures and multiple work stations.

The case portion 1090 is initially created as a sheet-like preform 1094 consisting of a number of flat panels interconnected along their adjacent edges. As best viewed in FIG. 70, the preform 1094 defines five distinct panels, which will constitute a bottom or lower wall portion 1096, a right side wall portion 1098, a left side wall portion 1100, a top or upper wall portion 1102 and a rear wall portion 1104. The adjacent panels are commonly joined or integrally interconnected by living hinges 1106, enabling the panels to be repositioned normally to one another to form a three-dimensional box-like case 1090.

Figure 70:
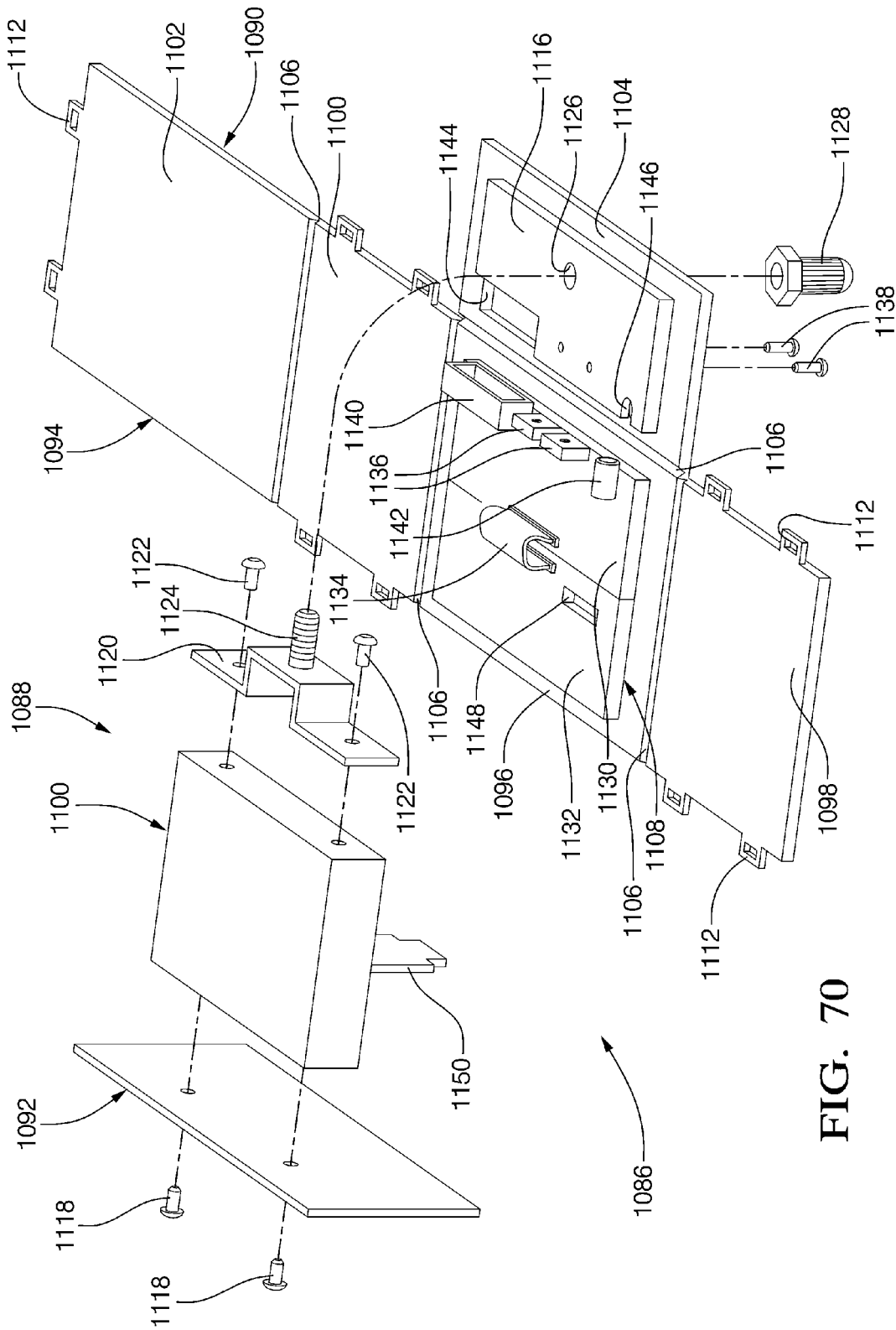
FIG. 70, is an exploded, perspective view of a second alternative embodiment of a radio/CD player featuring an unfolded case which provides a single plane bottom up assembly configuration.

The preform 1094 can be die cut from a continuous sheet of source material or, alternatively, injection molded in a net shape as illustrated in FIG. 70. In either case, the material employed to make the preform is a composite of at least one layer of relatively rigid polymer based material and at least one layer of electrically conductive material capable of shielding audio components, such as a radio receiver circuit 1108 or a CD player subassembly 1110 from electrical anomalies such as radio frequency interference (RFI), electromagnetic interference (EMI), bulk current injection (BCI), and electrostatic discharge (ESD). Cooperating engagement features such as tabs 1112 and catches 1114 are affixed to or integrally formed with the preform 1094. Refer FIGS. 72 and 73. By way of example, after installation of the internal subcomponents, the case preform is folded to assume its ultimate box-like configuration. This places cooperating associated pairs of tabs 1112 and catches 1114 in an assembly orientation with the tab 1112 carried on the edge of one panel (the right side wall portion 1098, for example) and the catch 1114 carried adjacent the edge of a now adjoining panel (the rear wall portion 1104, for example). Final structural fixation of the preform 1094 in the form of the housing case 1086 is completed by simply snap-engaging the tab 1112 with the catch 1114 from the configuration of FIG. 72 to the configuration of FIG. 73. After all of the tab 1112/catch 1114 pairs are interconnected, the formation of the case 1090 is complete.

Prior to folding up the case 1090, the radio receiver circuit 1108 is positioned and affixed to the exposed surface of the lower wall portion 1096. A heat sink 1116 is similarly positioned and affixed to the exposed surface of the rear wall portion 1104. The positioning and attachment of the internal components can be accomplished by features integrally formed in the formation of the preform 1094 (such as snaps, locating guides and the like), adhesives, discrete attachment and guide elements or inter-engagement with the various wall portions and other assembly elements within the case 1090.

After formation of the case 1090, the CD player subassembly 1110 can be pre-assembled with the closure member 1092 via screws 1118 or other interconnecting features described herein. A rear bracket 1124 secured to the back side of the CD player subassembly 1110 by screws 1122 includes a rearwardly extending threaded post 1124 which, upon final assembly extends through registering passageways 1126 in the heat sink 1116 and rear wall portion 1104 and engages a mounting bushing 1128. This arrangement provides an extremely robust overall structure to the overall audio system.

The electrical components comprising the radio receiver circuit 1108 are arranged on a "common" component PCB 1130 and a "unique" PCB 1132. The common and unique PCBs 1130 and 1132 are electrically interconnected by a ribbon connector 1134. The heat generating electrical components 1136 are arranged on the common PCB 1130 and are affixed to the heat sink 1116 by screws 1138 or other suitable means, to enhance thermal coupling therebetween. Electrical connectors 1140 and 1142 are also arranged on the common PCB 1132 in register with port openings 1144 and 1146 in the rear wall portion 1104 of the case 1090. A vertically opening electrical socket 1148 is centrally disposed in the unique PCB 1132 to receive a rigid connector 1150 extending downwardly from the CD player subassembly 1110. This arrangement electrically interconnects the two audio components as well as provides structural support thereof.

One embodiment of the composite material employed for the housing assembly 1086 consists of a layer of elastomeric material 1152 with a continuous wire screen 1154 insert molder therein adjacent an interior wall surface 1156 of the composite structure. Referring to FIG. 71, the living hinges can be formed by an extremely locally thin (or non-existant) layer 1158 of polymeric material and the wire screen 1156.

Referring to FIG. 74, air vents 1160 can be provided in the case 1090 by locally eliminating the polymeric material layer 1152 while maintaining the continuity of the wire screen 1156 to permit airflow, as indicated by arrows 1162, therethrough.

Referring to FIG. 76, an alternative living hinge 1164 can be formed post-production of the composite material by pressing alternating undulations 1166 therein along the axis of the intended living hinge 1164.

Figure 75:
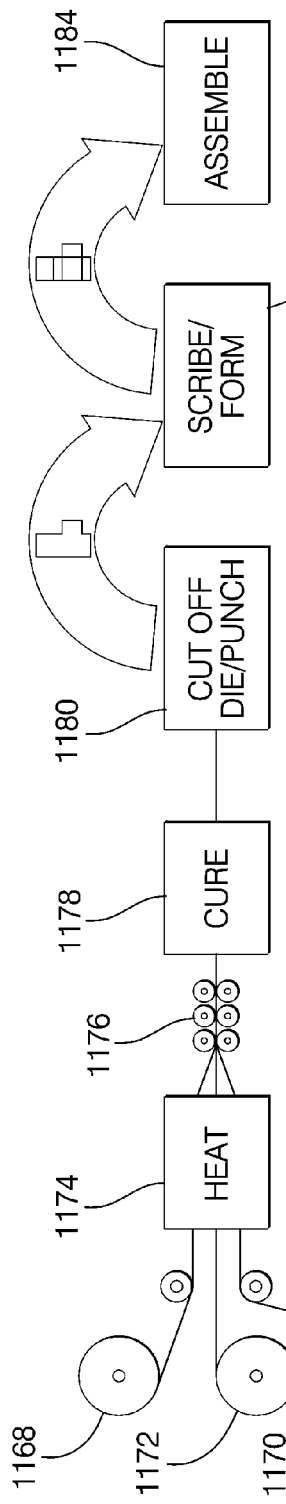
FIG. 75, is a schematic representation of manufacturing process equipment for producing a continuous strip of composite/laminate (plastic-screen-plastic) material for subsequent formation of the case structure of the radio/CD player of FIG. 70.

Referring to FIG. 75, a first process for producing composite material is illustrated, including drawing polymeric sheet material off upper and lower continuous rolls 1168 and 1180 to enclose an intermediate layer of wire screen from a third roll 1172. The three discrete sheets are heated at station 1174, rolled together at station 1176, cured at station 1178, cut-off or die cut to form performs at station 1180, scribed, punched treated and/or formed at a station 1182, and, finally, assembled at a workstation 1184.

Referring to FIG. 75, a second, alternative process for producing composite material is illustrated drawing a continuous sheet of wire screen off a roll 1186 and drawing it through a continuous extruder/molder 1188 to form the composite structure. Thereafter, the composite sheet is shaped at station 1190, cut off and/or punched at a station 1192, and, finally, assembled at a work station 1194.

Assembly of the audio system 1088 is completed by affixation of a trim plate subassembly (not illustrated) such as the device described in connection with FIGS. 2-10 hereinabove.

I-Beam

In this mechanical configuration, the case starts out as a "I-beam" allowing the CD mechanism to be attached (bottom-up) to the top of the I-beam for high slot designs then the unit can be flipped over and the board installed (bottom-up) on the bottom of the I-beam. The rectangular solid nature of the I-beam allows it to sit squarely on a table top no matter what the orientation eliminating the need for expensive fixtures at each work station.

Referring to FIGS. 78 and 79, an automotive audio system 1192 is configured to be hand assembled and is virtually fastener-less. Furthermore, this embodiment provides a partition structure providing upper and lower (reversible) assembly surfaces with integral closure members. The audio system 1192 comprises a simple sheet metal housing sleeve 1194 defining left and right side walls 1196 and 1198, respectively, a bottom 1200, a top 1202, and front and rear openings 1204 and 1206, respectfully. An H-shaped (when viewed from the side) partition member 1208 is configured and dimensioned to establish a slip-fit within the sleeve 1194. The partition member 1208 is constructed of upper and lower U-shaped sheet metal channel portions 1210 and 1212, respectively. The upper channel portion 1210 comprises a horizontal base portion 1214, a laterally extending vertically upwardly directed front panel 1216 and a laterally extending vertically upwardly directed rear panel 1218. The lower channel portion 1212 comprises a horizontal base portion 1220, a laterally extending vertically downwardly directed front panel 1222 and a laterally extending vertically downwardly directed rear panel 1224. When the partition 1208 is in the installed position illustrated in FIG. 79, the two front panels 1216 and 1222 are substantially co-planer and close the front sleeve opening 1204. Likewise, when the partition 1208 is in the installed position, the two rear panels 1218 and 1224 are substantially co-planer and close the rear sleeve opening 1206. Accordingly, the sleeve 1194 and the partition member 1208 co-act to define a substantially closed housing assembly 1226, which is subdivided into upper and lower chambers or cavities. A trim plate subassembly 1228 snap engages the sleeve 1194 to complete the assembly of the audio system 1192.

In addition to serving as a closure member, the partition member 1208 is configured to facilitate the installation of audio system subcomponents such as a radio receiver circuit subassembly 1234 (illustrated in phantom) and a CD player subassembly 1236 (illustrated in phantom). Prior to its insertion into the sleeve 1194, the partition member 1208 serves as a reversible assembly fixture that can be conveniently applied on a flat work surface, without dedicated, expensive hard fixtures and tools. For example, with the partition member 1208 disposed in the illustrated, upright position, the radio receiver circuit subassembly 1234 can be manually installed on the horizontal base portion 1214 and/or the inner surfaces of the vertical panels 1216 and 1218 from above via self-positioning, self-engaging attachment features (not illustrated) of the types described elsewhere herein. Thereafter, the partition member 1208 can be inverted and the CD player subassembly 1236 can be manually installed on the horizontal base portion 1220 and/or the inner surfaces of the vertical panels 1222 and 1224 from above via self-positioning, self-engaging attachment features (not illustrated) of the types described elsewhere herein. Note that, in this scenario, the CD player subassembly would be installed from above, but in the inverted position.

The vertical height (H2) of the panels 1222 and 1224 of the lower U-channel portion 1212 are dimensioned approximately 150% greater than the vertical height (H1) of the panels 1216 and 1218 of the upper U-channel portion 1210. This relationship permits the audio system 1192 to be easily reconfigured between a top-mount CD player or a bottom-mount CD player (by way of example only) either in the factory or in the field, merely with the replacement of the trim panel subassembly 1228.

The U-channel portions 1210 and 1212 can be formed as a single integral unit, can be fabricated separately and subsequently joined such as by welding, or can be pre assembled with their respective audio component subassemblies and separately installed within the sleeve 1194. Certain details, such as the heat sink, electrical connectors, and the like have been deleted here to avoid redundancy. It is contemplated that such features, as described elsewhere herein, can be applied in the present embodiment.

Interlocking Block/Clam-Shell

In this mechanical configuration, the bottom of the case is plastic and contains slots for the assembly of the boards. The sides of the case bottom provide a shelf for the CD mechanism to sit on. The back of the case contains a vertical slot for a guillotine heat sink to be installed. The top of the box, also plastic, then slides over the CD mechanism and heat sink and snaps to the bottom trapping all of the components in place. A plastic molded leaf spring in the back of the top would apply a controlled down force on the heat sink for good thermal transfer from the power devices.

Figure 80:
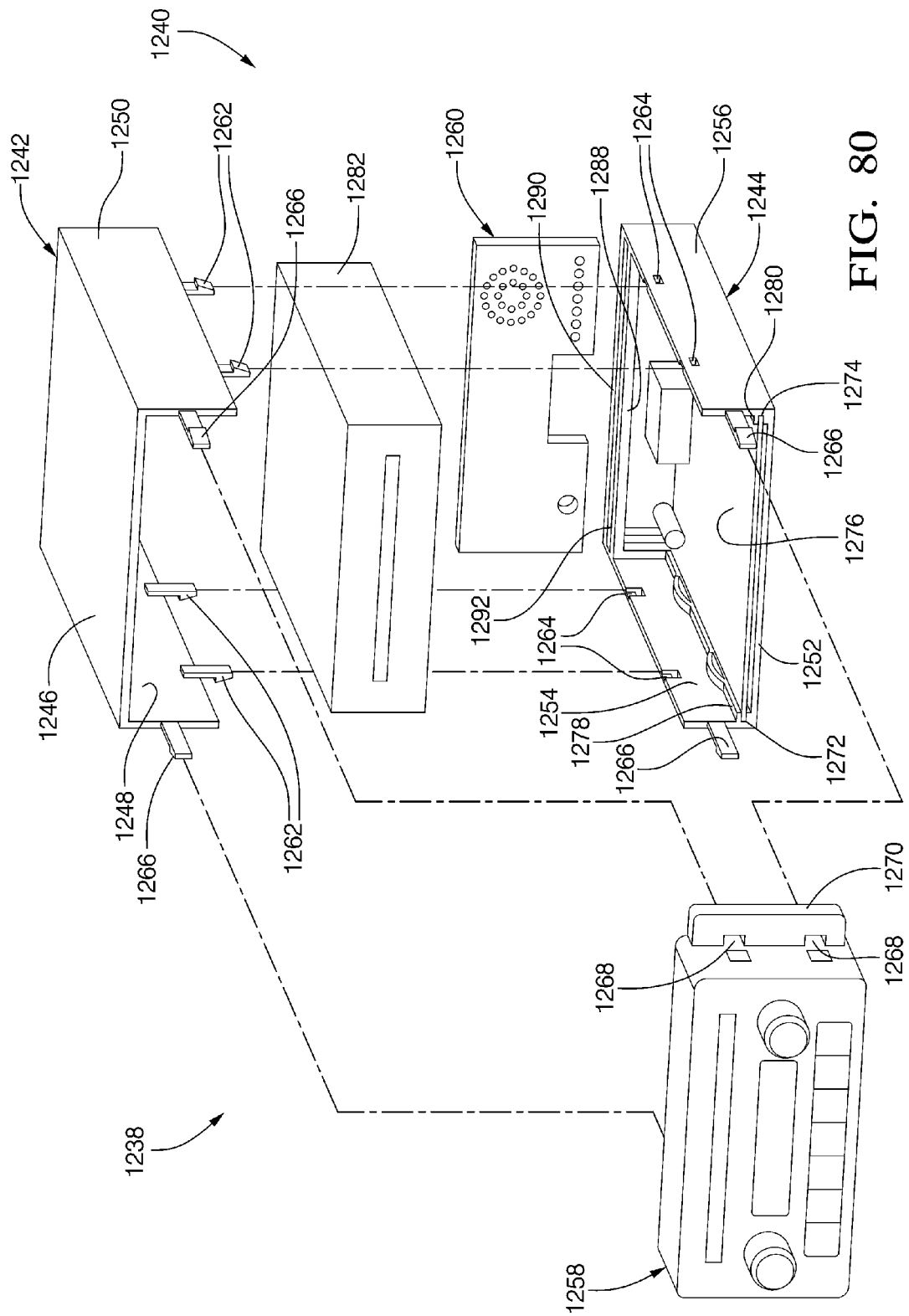
FIG. 80, is an exploded, perspective view of a fourth alternative embodiment of a radio/CD player featuring "clamshell" or "interlocking block" upper and lower self-engaging case halves.

Referring to FIGS. 80-82, an automotive audio system 1238 is configured to be hand assembled and is virtually fastener-less. Furthermore, this embodiment provides a "clam shell" type case assembly wherein one of the case halves can be employed as an assembly fixture. The audio system 1238 comprises a housing assembly 1240 including upper and lower case halves 1242 and 1244, respectively. With the exception of specifics described hereinbelow, the case halves 1242 and 1244 are substantially symmetrical. The upper case half 1242 is shaped generally as an inverted "U", including a top wall portion 1246 and left and right downwardly extending integral half-walls 1248 and 1250. The lower case half 1244 is shaped generally as a "U", including a bottom wall portion 1252 and left and right upwardly extending half-walls 1254 and 1256. Collectively, the case halves 1242 and 1244 form front and rear openings 1257 and 1259. A trim plate subassembly 1258 serves as a front case closure member and a "guillotine type" heat sink 1260 serves as a back closure member.

The upper case half 1242 has a number of integrally formed downwardly directed snap tabs 1262 extending from the half-walls 1248 and 1250 thereof which are configured to self-locate and self-engage a like number of mating snap receiving recesses 1264 integrally formed in the half-walls 1254 and 1256 of the lower case half 1244. Similarly, the half-walls 1248, 1250, 1254 and 1256 each have an integral forwardly extending snap tab 1266 which self-locates and self-engages corresponding snap receiving recesses 1268 integrally formed in left and right integral mounting flanges 1270 (only the right flange is illustrated) in the trim plate subassembly 1258 for the retention thereof with the audio system 1238.

The half walls 1254 and 1256 of the lower case half 1244 integrally form lower longitudinally extending guideways in the form of opposed, laterally facing slots 1272 and 1274 for slidably receiving the PCB of a radio receiver circuit subassembly 1272 and upper longitudinally extending guideways in the form of opposed stepped guide surfaces 1278 and 1280 for slidably guiding the bottom surface of a CD player subassembly 1282. Resilient localized spring fingers 1284 are cantilevered from the half-walls 1254 and 1256 to continuously bias the CD player subassembly 1282 upwardly against an upper stop 1286 integrally formed in the upper case half 1230 to prevent vibration and rattles. The snap tabs 1262 extend laterally inwardly sufficiently to laterally embrace the CD player subassembly 1282.

The lower case half 1244 has a longitudinally spaced pair of cross-support members 1288 and 1290 integrally formed therewith defining and framing a vertically extending slot 1292 therebetween. Likewise, the upper case half 1242 has a substantially mirror image longitudinally spaced pair of cross-support members 1294 and 1296 integrally formed therewith defining and framing a vertically extending slot 1298 therebetween. The cross-support members 1288 and 1290 provide lateral support for the upper rear portion of the lower case half 1244, and the cross-support members 1294 and 1296 provide lateral support for the lower rear portion of the upper case half 1242. The slots 1292 and 1298 longitudinally coincide for receiving the heat sink 1260 therein. A finger spring 1300 integrally formed in the top wall portion of upper case half 1242 extends as a cantilever and continuously bears downwardly against the upper surface of the heat sink 1260 to prevent vibration and rattles.

A major advantage of the present embodiment is that the lower case half 1244 serves as an assembly fixture, which can be conveniently applied on a flat work surface, without dedicated, expensive hard fixtures and tools. Furthermore, all of the internal components can be manually inserted within the lower case half 1244 from above before the upper case half 1242 is snap-fit into place completing the assembly process, with the sole exception of attaching the trim plate subassembly 1258.

"H" Shaped Case

In this mechanical configuration, the brackets traditionally placed on each end of the CD mechanism become the left and right side of the radio. These end brackets provide slots in the bottom for the boards to be assembled and a slot in the back for a guillotine heat sink. The bottom and top of the case are then snapped into place to complete the assembly.

Referring to FIGS. 83 and 84, an automotive audio system 1302 is configured to be hand assembled and is virtually fastener-less. Furthermore, this embodiment employs a portion of the structure of an audio component subassembly, such as a CD player subassembly 1304, to be incorporated within a housing assembly 1306 of the audio system 1302 to form a portion of the outer walls of the housing assembly 1306.

The CD player subassembly 1304 includes a generally rectangular self-contained enclosure including top and bottom panels 1308 and 1310, respectively, left and right side panels 1312 and 1314, respectively, a front panel 1316 and a rear panel (not illustrated). The side panels 1312 and 1314 are extended vertically above the top panel 1308 and below the bottom panel 1310. Furthermore, the side panels 1312 and 1314 are extended longitudinally forward or the front panel 1316 and rearward of the rear panel. Thus constituted, the CD player subassembly 1304, when viewed by itself from the front or rear, is configured to approximate an "H". The side panels 1312 and 1314 can be integral extensions of traditional configuration side panels formed at the time of manufacture of the CD player subassembly 1304 as an off-line process, or can be formed as discrete elements and affixed to a conventionally configures CD player during final assembly of the audio system.

The housing assembly 1306 includes an upper closure member 1318 configured as an inverted "U" defining a top portion 1320 and downwardly directed, longitudinally extending left and right skirt portions 1322 and 1324, respectively. The housing 1306 includes a bottom closure member 1326 configured as a "U" defining a bottom portion 1328 and upwardly directed, longitudinally extending left and right skirt portions 1330 and 1332, respectively. The side panels 1312 and 1314 combine with the upper and lower closure members 1318 and 1326 to form a box-like case 1334 defining a front opening 1336 and a rear opening 1338. During final assembly of the audio system 1302, the front opening 1336 is closed by a trim plate subassembly 1340 and the rear opening 1338 is closed by a "guillotine type" heat sink 1342. The side panels 1312 and 1314, respectively, the upper and lower closure members 1318 and 1320, respectively, and the trim plate subassembly 1340 are interconnected during final assembly by cooperating self-locating, self-guiding and self-engaging features integrally formed therein, such as, by way of example, snap-lock features, as described elsewhere herein.

A first or upper cavity 1344 is formed within the case 1334 extending vertically between the top panel 1308 of the CD player subassembly 1304 and the top portion 1320 of the upper closure member 1318. Similarly, a second or lower cavity 1346 is formed within the case 1334 extending vertically between the bottom panel 1310 of the CD player subassembly 1304 and the bottom portion 1328 of the bottom closure member 1326. In the presently illustrated embodiment of the audio system 1302, the upper cavity 1344 is employed for routing of electrical cables and convection cooling air flow. The lower cavity 1346 is employed to enclose a second audio subassembly, such as a radio receiver circuit subassembly 1348. The portion of the inner surfaces of the side panels 1312 and 1314 within the lower cavity 1346 have opposed, cooperating guideways 1350 and 1352 formed thereon for slidingly receiving and supporting side edge surfaces 1354 and 1356 of a unique PCB portion 1358 of the radio receiver circuit subassembly 1348. A common PCB portion 1360 of the radio receiver circuit subassembly 1348 is supported by a second, lower set of guideways (not illustrated). The common PCB portion 1360 carries electrical connectors 1362, which are externally accessible through a port opening 1366 in the heat sink 1342, and electrical power devices 1364, which are thermally coupled to engagement surfaces 1368 of the heat sink.

A significant advantage of the present embodiment is that material (and weight) employed for the CD player subassembly closure panels and the audio system case 1334 are conserved by the "compound structure" or hybrid configuration described. Furthermore, the CD player subassembly 1304 serves as an assembly fixture, which can be conveniently applied on a flat work surface in both upright and inverted positions, without dedicated, expensive hard fixtures and tools.

Certain details, such as the snap-acting connector features, heat sink details electrical connectors, and convection cooling passages have been deleted here to avoid redundancy. It is contemplated that such features, as described elsewhere herein, can be applied in the present embodiment.

Laser Labeling of Plastic Case

Since the material for the receiver case will preferably be black or a relatively dark colored plastic, the paper label that is normally applied prior to shipment to identify the model of the radio and the manufacturer and customer part numbers can be eliminated and the information can be laser ablated onto the surface of the plastic at the software programming station at the end of the production line. This improvement not only eliminates the label (and one or more additional part numbers), but also adhesive and/or pre-application backing material which must be removed prior to label application. Furthermore, such automated labeling directly on an outwardly visible surface of the radio case, virtually ensures against production errors such as non-labeling (producing radios without any label), mislabeling (producing radios with a label bearing incorrect information) and misplaced labeling (proper label incorrectly located so as to render it non-machine readable).

Filler material of a contrasting color can also be added during the case molding process to render the laser produced label more easily readable. Such filler material can constitute a distinct inner layer extending throughout the entire part as molded, or can be applied only to a localized region of interest on the molded part.

Figure 85:
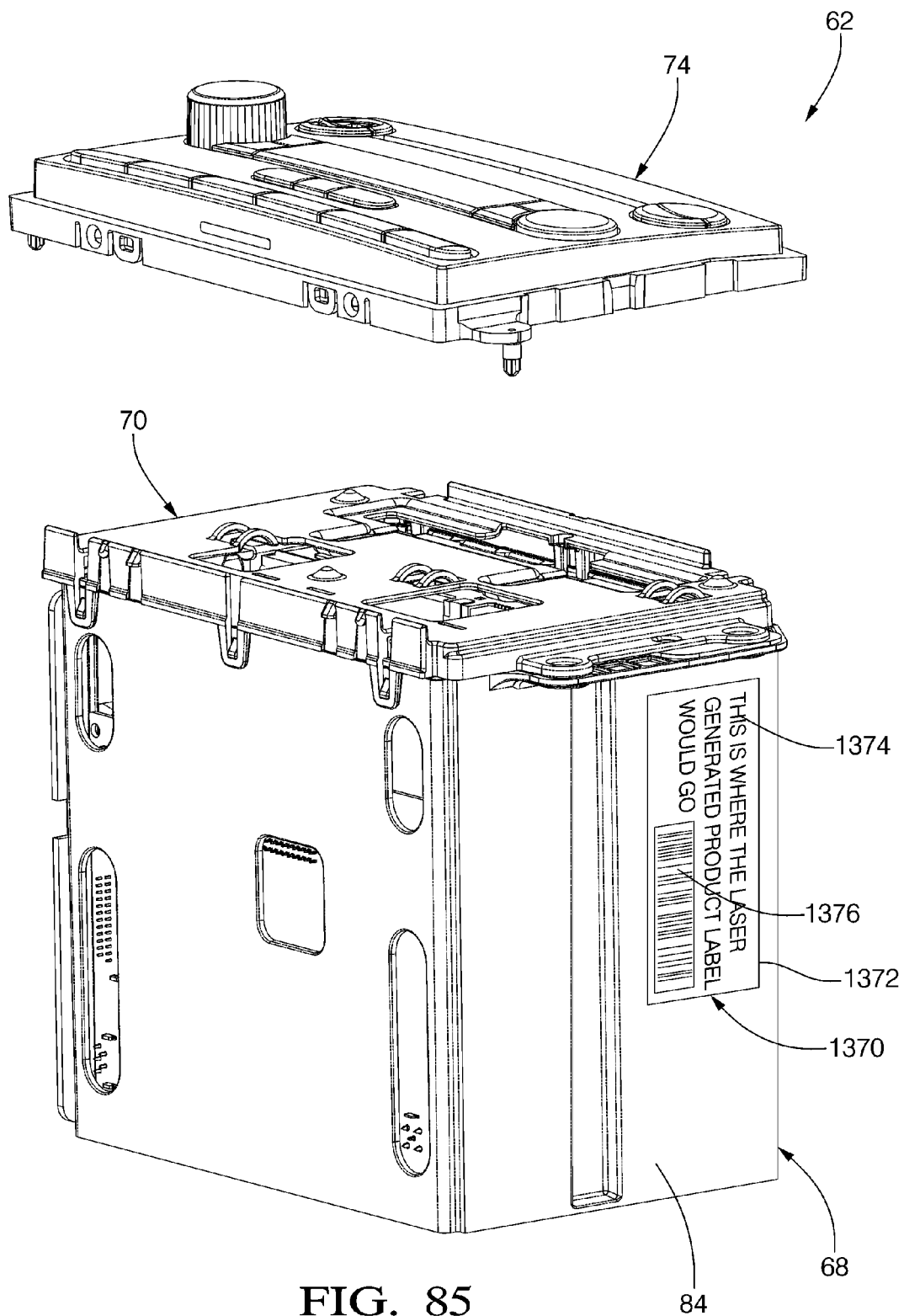
FIG. 85, is an exploded, perspective view of the preferred embodiment of the invention of FIGS. 2-10 from a right bottom perspective with the trim plate assembly removed, as illustrated in FIG. 7, illustrating the laser ablating of both machine and human readable unit specific and unit generic product information directly on an outer surface of the case at or near the end of the production line.
Figure 86:
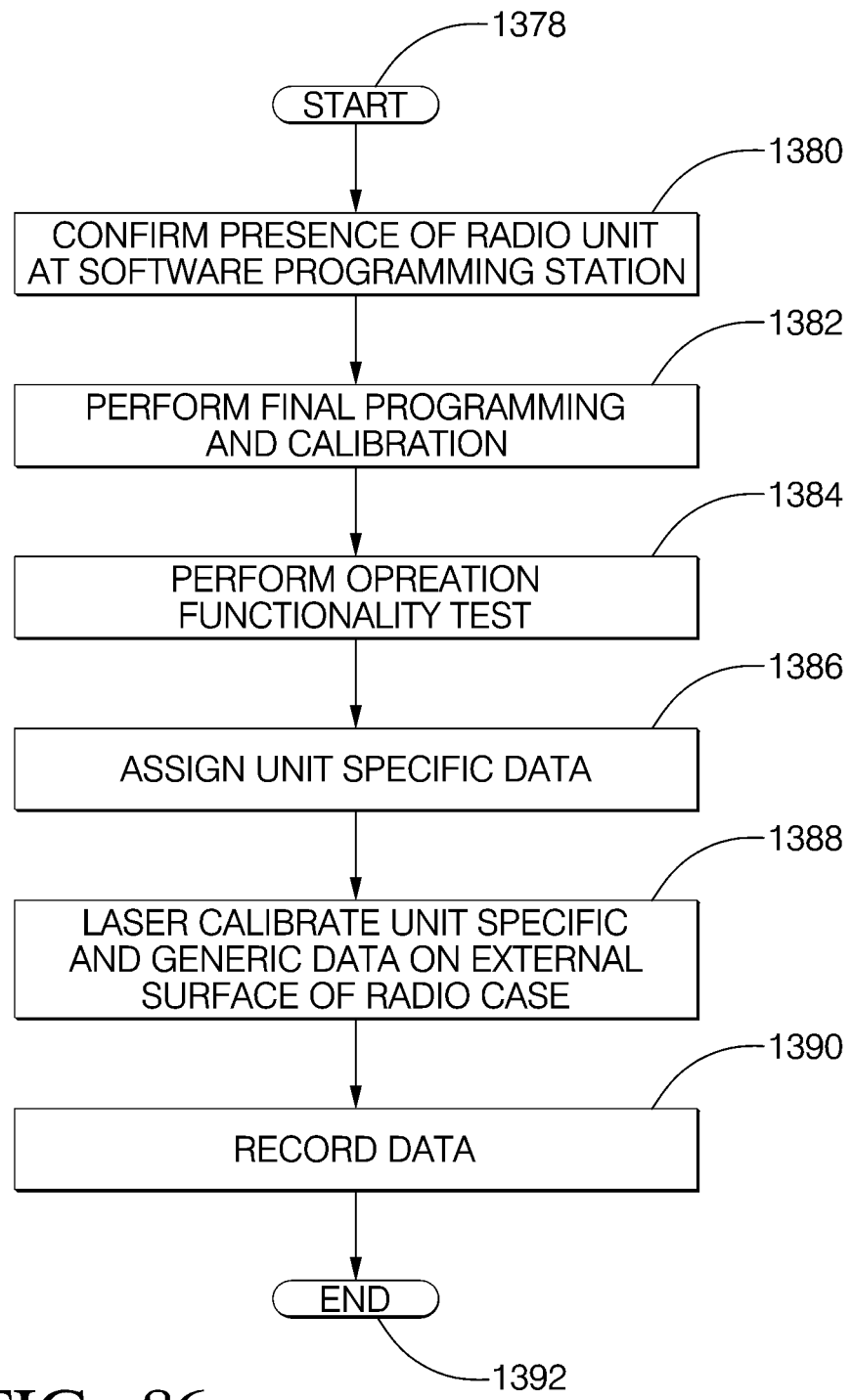
FIG. 86, is a process flow chart illustrating the laser ablating product information on the case as part of a sequence following final programming and calibration and operation functionality testing.

Referring to FIGS. 85 and 86, the physical assembly the automotive radio/CD player 62 described hereinabove in connection with FIGS. 2-10 is essentially complete when the trim plate subassembly 74 is affixed to the closure member 70 which, in turn, has been previously affixed to the housing case 68. For purposes of example, a region 1370 designated by an outline 1372 is reserved on the right side wall portion 84 of the case 68 for the application of permanent product and customer related information in both human and machine readable forms. The information is typically in textual/numerical form 1374 and in bar code form 1376.

The laser labeling or ablating is affected in accordance with the following process. The process is initiated at step 1378, either manually or automatically. The process then flows to a step 1380 of confirming the presence of a production unit 62 at a software programming station on or adjunct to the production line. The process then flows to a step 1382 of performing final programming and calibration of the production unit 62. The process then flows to a step 1384 of performing an operation functionality test. Next, the process flows to a step 1386 of assigning unit specific data to that specific production unit 62. Next, the process flows to a step 1388 of laser calibrating unit specific and generic data in textual and/or bar code form, 1374 and 1376, respectively, within the outline 1372 in the designated region 1370 on the external surface of the case 68. Next, the process flows to a step 1390 of recording the data in a memory device. Finally, the process flows to a step 1392 of ending the program and awaiting the next in line production unit.

Hybrid Case

FIGS. 97-119 describe several variants of hybrid case structures for radio/CD players adapted for automotive applications. A hybrid case is constructed of different materials with disparate properties, such as molded plastic portions in assembly with structurally supportive (stamped) metal frame elements. All or portions of the plastic case, including the faceplate, may have wire mesh insert molded therein to shield against electrical anomalies. The metal frame elements primarily serve to structurally reinforce the plastic portions and can also define internal component and sub-assembly positioning/mounting features. Typically, one or more localized regions of embedded wire screen are exposed, either during the molding/formation process, or thereafter, employing secondary operations. In assembly, the exposed regions are in contact with the metal frame elements to ensure continuity of the shielding effect. The hybrid cases illustrated if FIGS. 97-119 are modified I-beam (refer FIGS. 78 and 79) and interlocking block/clam-shell (refer FIGS. 80-82). The embodiment of the automotive audio system described in connection with FIGS. 83 and 84 elsewhere herein is deemed to be of hybrid construction.

The hybrid case typically includes top and bottom plastic covers of polymer based material (preferably with molded-in wire mesh) and a one-piece multi-fold sheet metal part or chassis to up-integrate all the sheet metal parts together to reduce the screw fasteners, if not to entirely eliminate them. This structure can also be employed in radio architectures employing one-piece PCBs.

Referring to FIGS. 97-104 and 112-114, a first hybrid variant of an automotive radio/CD player assembly 1394 includes a one piece multi-fold sheet metal chassis 1396 which affixes a CD player subassembly 1398, a radio receiver circuit assembly 1400 and a heat sink 1402 within the radio/CD player assembly 1394. A ribbon or flex wire cable 1404 electrically interconnects the radio receiver circuit assembly 1400 with the CD player subassembly 1398. Upper and lower plastic/wire mesh closure members 1406 and 1408, respectively, in combination with the chassis 1396, defines a substantially closed housing assembly 1410. A trim plate subassembly 1412 is affixed to the housing assembly 1410. A rear mounting stud 1414 is affixed to a rearwardly directed member carried by the chassis 1396.

Referring to FIGS. 105-111, a second hybrid variant of an automotive radio/CD player assembly 1416 includes a one piece multi-fold sheet metal chassis 1418 which affixes a CD player subassembly 1420, a radio receiver circuit assembly 1422 and a heat sink 1424 within the radio/CD player assembly 1416. A ribbon or flex wire cable 1431 electrically interconnects the radio receiver circuit assembly 1422 with the CD player subassembly 1420. Upper and lower plastic/wire mesh closure members 1426 and 1428, respectively, in combination with the chassis 1418, defines a substantially closed housing assembly 1430. A trim plate subassembly 1432 is affixed to the housing assembly 1430. A rear mounting stud 1434 is affixed to a rearwardly directed member carried by the chassis 1418.

Referring to FIGS. 115-118, a third hybrid variant of an automotive radio/CD player assembly 1458 includes a one piece multi-fold sheet metal chassis 1460 which affixes a CD player subassembly 1462, a radio receiver circuit assembly 1464 and a heat sink 1466 within the radio/CD player assembly 462. A ribbon or flex wire cable 1468 electrically interconnects the radio receiver circuit assembly 1464 with the CD player subassembly 1462. Upper and lower plastic/wire mesh closure members 1470 and 1472, respectively, in combination with the chassis 1460, defines a substantially closed housing assembly 1474. A trim plate subassembly 1476 is affixed to the housing assembly 1474. A rear mounting stud 1478 is affixed to a rearwardly directed member carried by the chassis 1460.

Faceplate with Integral Lightpipe

Additional part count reduction and assembly simplicity can be achieved by integrally forming light pipes within the front plate of the radio/CD player employing a two-shot molding process. This eliminates or substantially reduces the number of light pipes and fasteners. Refer FIG. 120. Overall quality is also improved by the elimination of the possibility of misassembled and loose or misplaced parts.

The integrally molded light pipes facilitate the subterranean lighting method currently used with side firing surface mount LEDs (5 total) that are attached to the back of the keyboard. Typically, a blue LED distributed light through a clear polycarbonate light pipe and passes the light through the pushbutton which is painted and laser etched for the nighttime viewability of the graphics on the pushbuttons of the radio. The LEDs are preferably mounted on the back of the keyboard. The forward facing extensions depending from the light pipes typically extend through registering holes (not illustrated) in the keyboard to specifically illuminate a particular button or device on the keyboard.

The preferred material for the light pipe is polycarbonate as well as the front plate. White polycarbonate would be used for the front plate with an opacifier (to stop light bleed) to enable the light to be more efficient passing there through. Black material would draw light energy from the light pipe.

The present invention, now permissible because of the plastic front plate, enables better assembly and better tolerance stack-up of parts. This would take four separate parts and combine them into one. It also opens up possibilities of using acrylic for the light pipe now there is no need for a fastener or snap (acrylic is more brittle than polycarbonate, but offers more preferred light characteristics for different wavelengths of light over long runs).

The two-shot front plate with integral light pipes combines four separate parts that must be assembled into one multifunctional part. Typically, the light pipes must be assembled with relative accurate locating features that are aligned to accommodate the minimized air gap required for an efficient light entry from the source leds used to illuminate the push buttons and halo rings of the trim plate assembly for the radio. Often, these parts are fastened with snaps or screws or a combination thereof to enable retention of the assembly under a multitude of environmental and driving conditions. Due to the relative brittleness of the better light pipe materials, screws may be required for the material of the light pipe may not be robust enough to survive the stress of a snap. These characteristics often make light pipe assembly a tedious task for the assembler and the designer to provide the optimal light delivery without degradation from misalignment or damage during the assembly process.

The two shot plastic process enables combining two different materials into a single piece part which in this case permits the best features of both materials to perform the functions needed to achieve a successful component. The light pipes can be the first shot to be ganged to be consistently located in the most accurate locations needed for optimal light entry from the leds and light exit for the respective delivery points to the backlit areas of the trim plate assembly. The second shot would enable the light blocking and the structural component to provide the snap retention features of the front plate as well as the normal front plate functional items.

Often the concern with light pipes might be the close proximity of a black material that may absorb the light energy that travels through the light pipe. This is typically why there is an air gap between any black material component and any adjacent light pipe. To overcome this potential degradation, the front plate can be molded with a white material, even with an opacifier if needed. Another method would be to limit the points of contact between the light pipe material and the structural frame-like material component. This induces an air gap in the areas of illumination and still provides interface between the materials to form a single part.

The two shot process typically has a first shot of material into a mold. Next the mold is rotated and the second shot of material is provided to complete the part. In this case, the first shot would be the light pipe portion, followed by the structural portion.

This inventive design will also offer greater flexibility for assembling the trim plate and case assembly as well.

Although this lighting approach is primarily intended for use on the front plate, it could also be employed in the radio case itself if a controlled light output in non traditional directions from the radio assembly is desired.

It is contemplated that screen mesh can be insert molded within the front face simultaneously with the above described subterranean 2-shot light pipe forming process. In this case, the screen mesh would preferably be positioned inwardly of the light pipes within the front plate structure. Alternatively, the screen and light pipe positions can be reversed. However, this would be more complex and require that the light pipe extensions pass through registering apertures in the screen.

Figure 120:
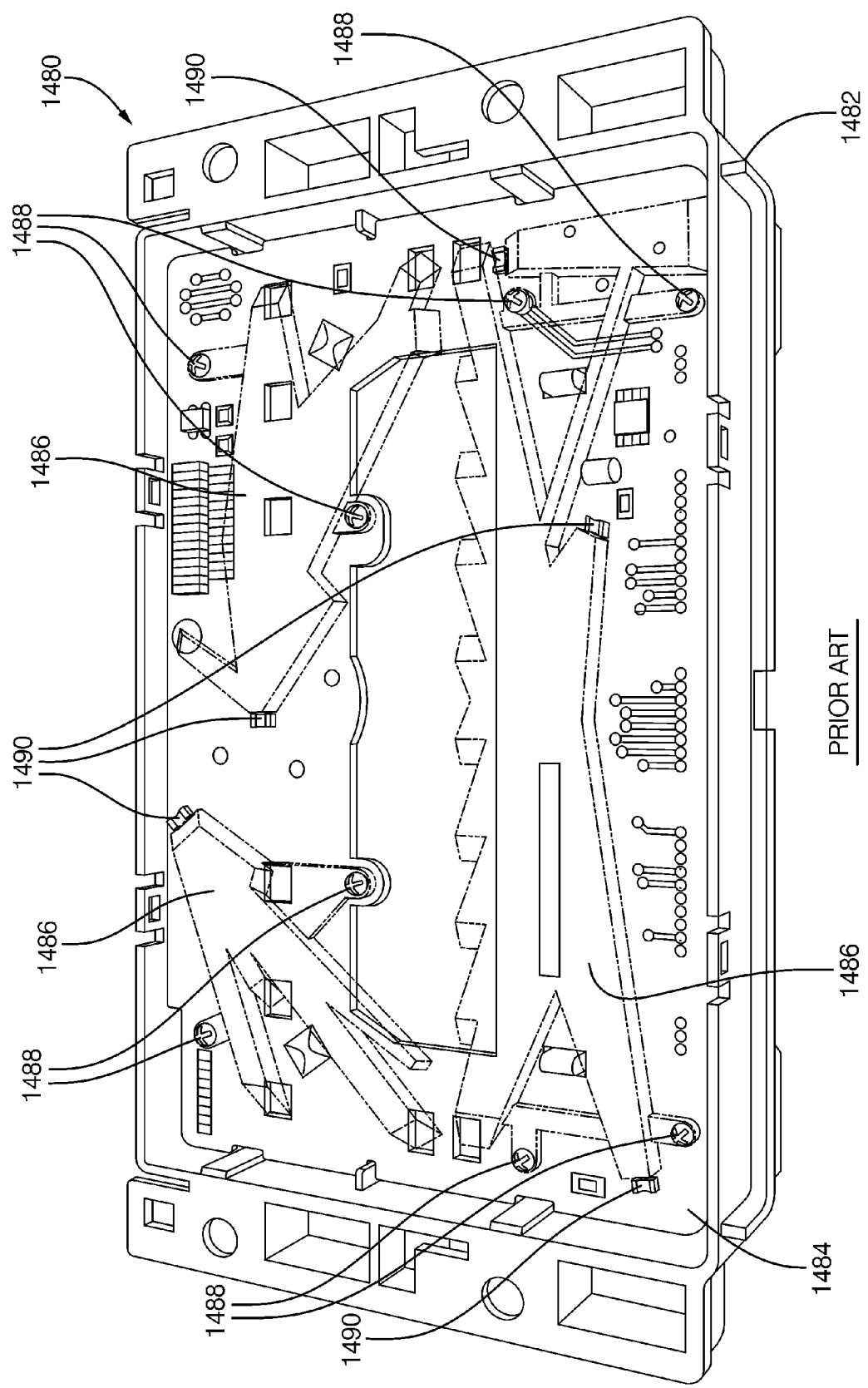

Referring to FIG. 120, a known trim plate assembly 1480 is illustrated to highlight the substantial complexity, high part count, and design shortcomings resulting from providing back-illumination using traditional design and assembly techniques. The trim plate assembly 1480 includes a black plastic front panel 1482 (with operator controls and displays affixed on the opposed side), a printed circuit board (PCB) 1484 mounted on the exposed face of the front panel 1482, three separate and discrete lightpipes 1486 mounted on the exposed face of the PCB 1484 by eight fastening screws 1488 and five light emitting diodes (LEDs) 1490 carried on the PCB 1484.

Referring to FIG. 165, a generic two-shot injection molded article 1492 is formed from a two-shot molding process wherein the first shot is of clear acrylic and results in a buried light pipe portion 1494 and an extension portion 1496 directed toward the viewer (arrow) 1498. The second shot is of white acrylic with an opacifier, simultaneously forming a mask and robust structural element 1500. The mask/structural element 1500 is integrally formed with the lightpipe portion 1494 and extension portion 1496. A pocket 1502 is formed in the mask/structural element 1500 for receiving an LED 1504 which is electrically interconnected with a PCB (not illustrated) via leads 1506.

The two shot process eliminates the necessity for using separate fasteners and permits use of optically preferable materials such as acrylics. There are no small parts to come loose or be misassembled.

Figure 121:
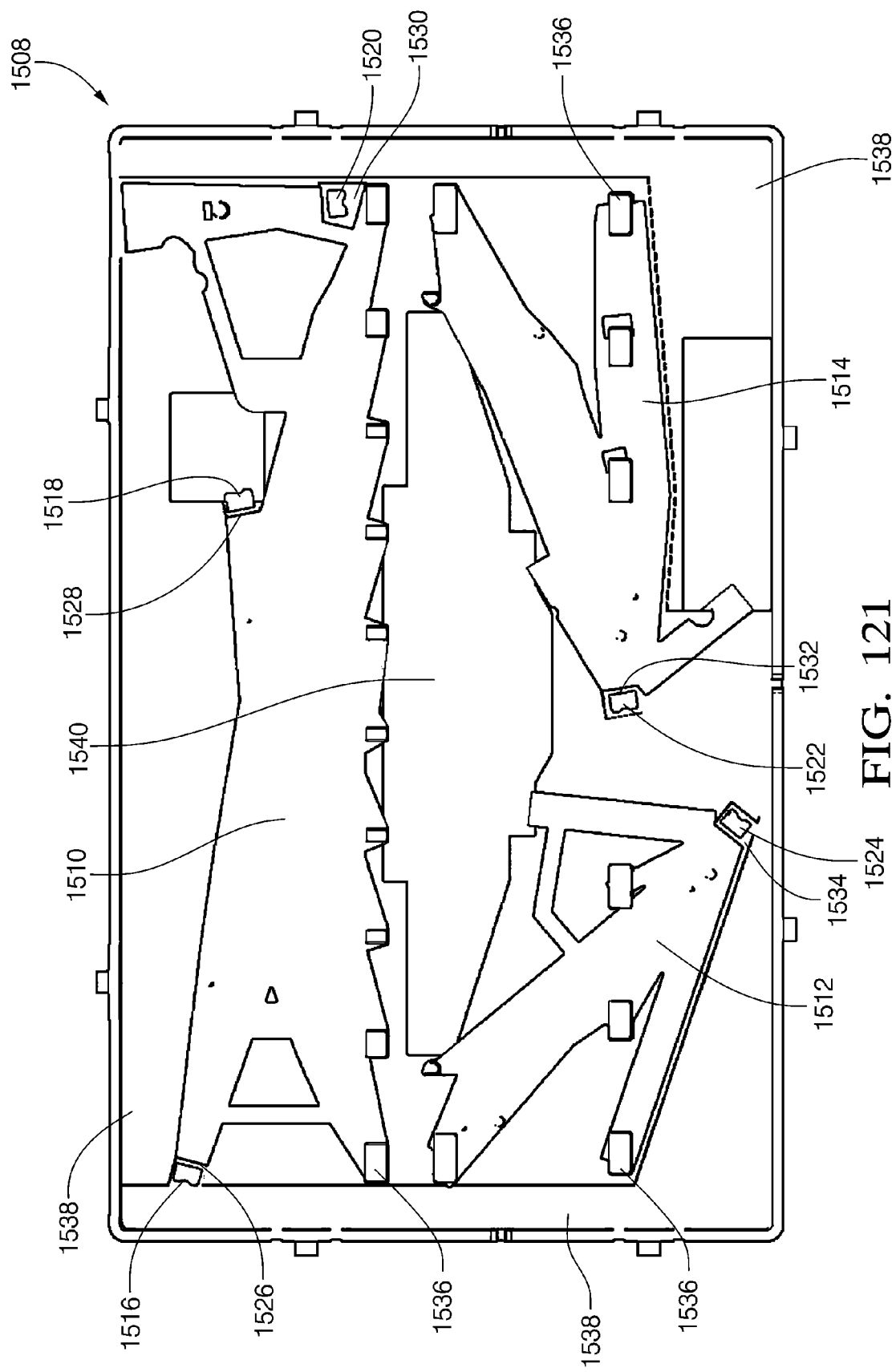
Figure 122:
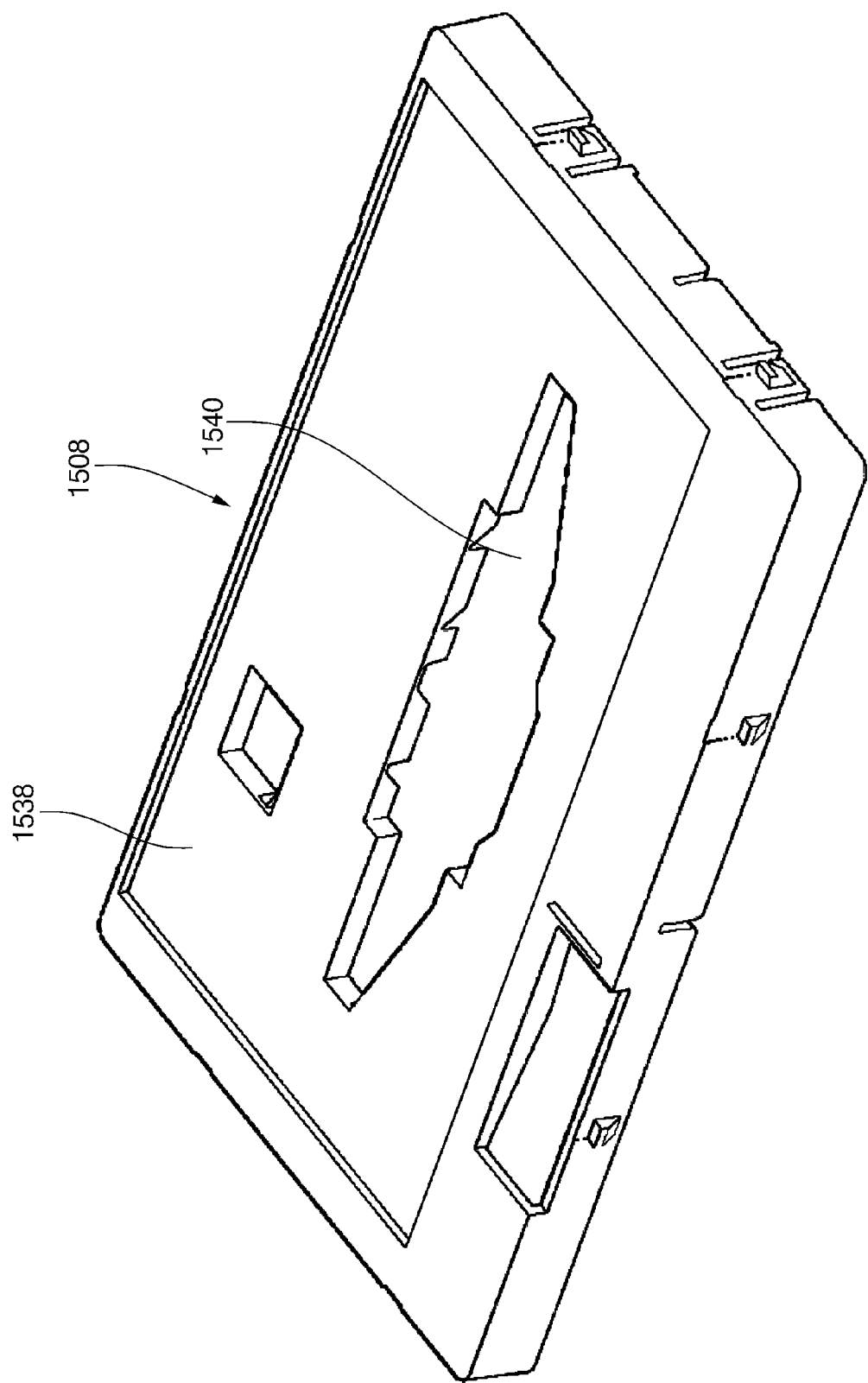
Figure 123:
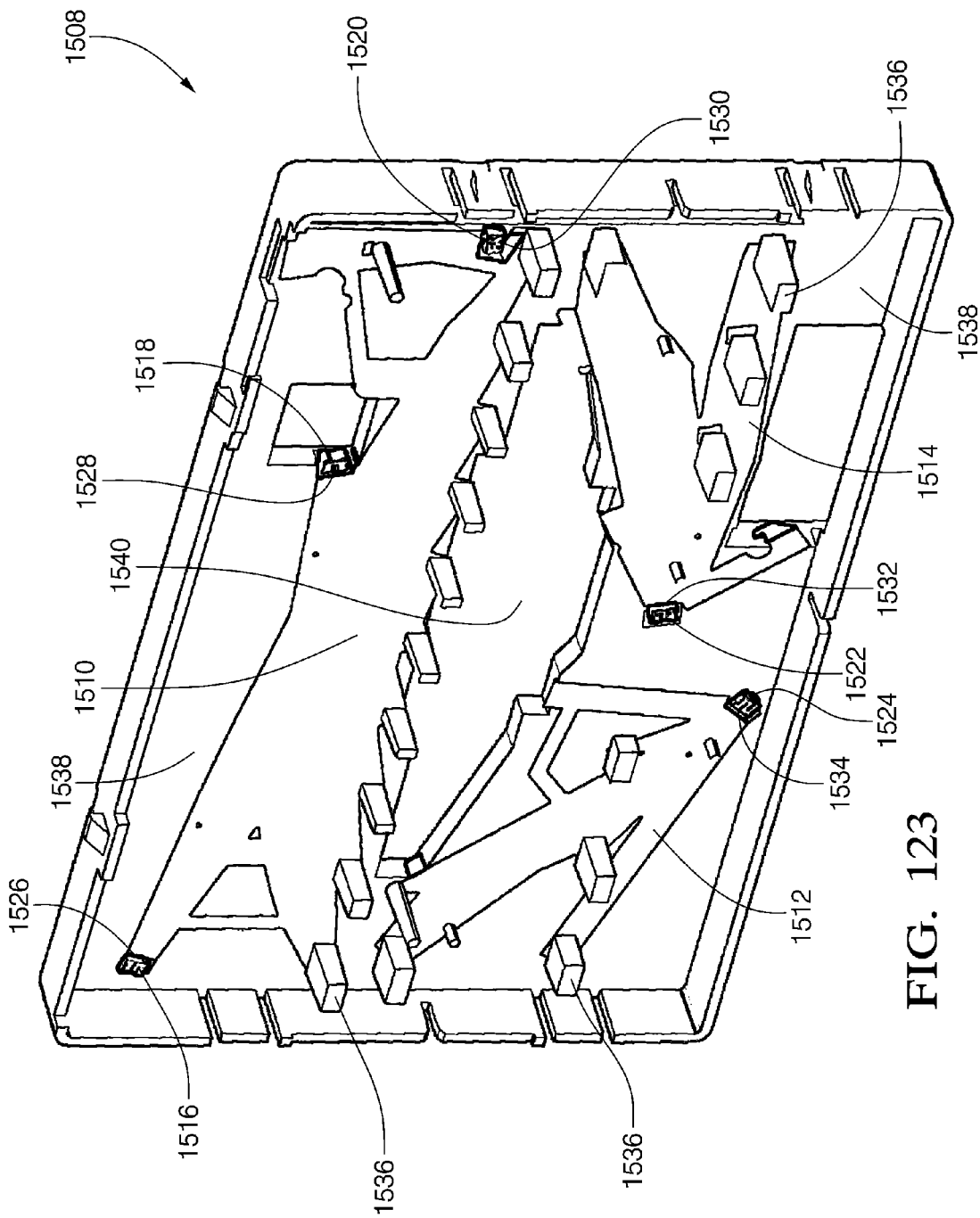

Referring to FIGS. 121-126, the structural configurations of the first shot polymeric material and the second shot polymeric material are illustrated separately and in combination. FIGS. 121 and 123 illustrate a fully formed two-shot audio system housing assembly closure member 1508. The closure member 1508 includes three lightpipes 1510, 1512 and 1514 formed as first shots of clear acrylic material. After final assembly with the trim panel subassembly and PCB, five LEDs 1516, 1518, 1520, 1522 and 1524 will be arranged in respective pockets 1526, 1528, 1530, 1532 and 1534 for illuminating the lightpipes 1510, 1512 and 1514. Multiple extensions 1536 extend outwardly (toward the trim plate assembly). The closure member further includes a mask/structural portion 1538 formed as a second shot of white acrylic material, including an opacifier. A shaped opening 1540 is formed in the closure member 1508 to provide access to a CD player subassembly behind the closure member 1508.

Referring to FIG. 122, the reverse side of closure member 1508 reveals only the second shot mask/structural portion 1538.

Figure 124:
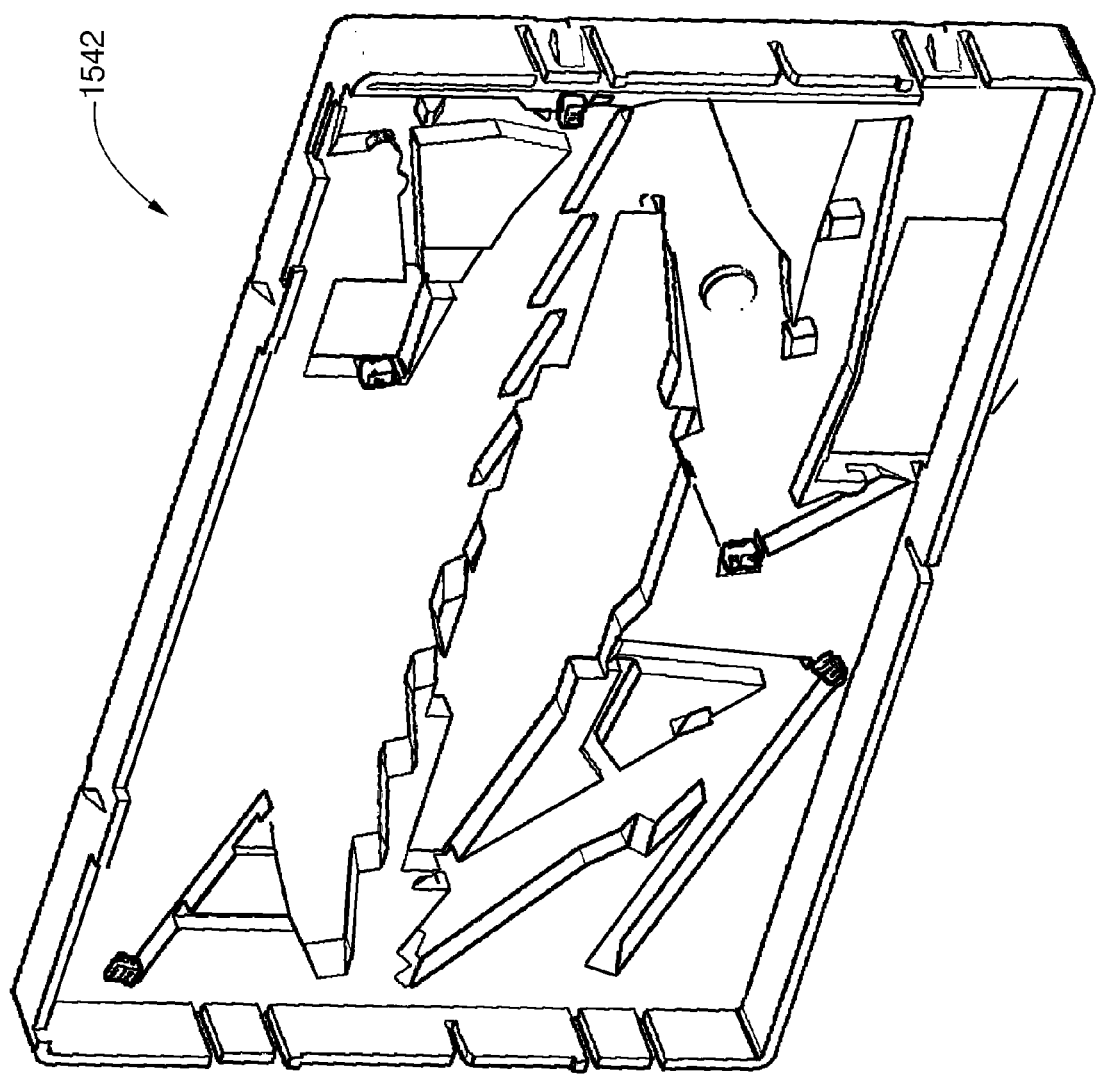

Referring to FIG. 124, a three dimensional envelope 1542 of the mask/structural portion of the closure member formed by the second shot alone is illustrated as viewed from the front side.

Figure 125:
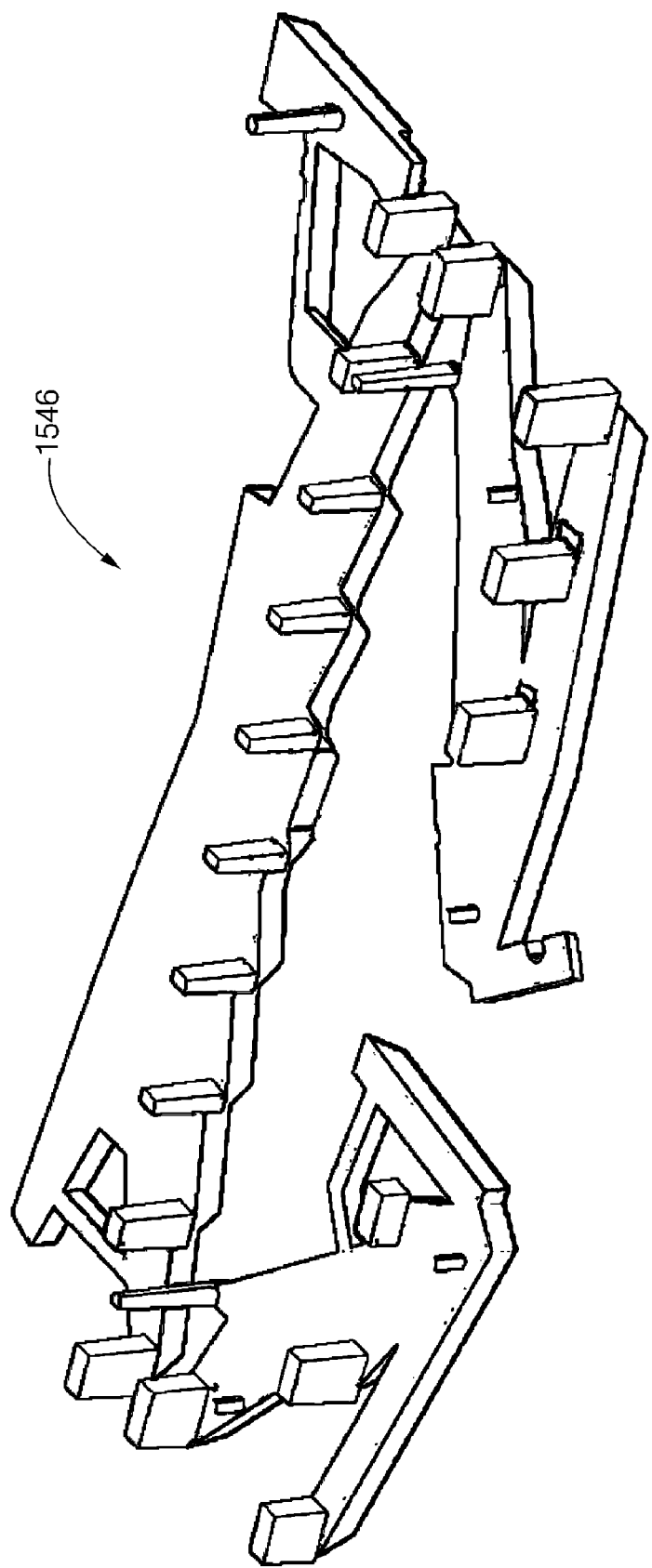

Referring to FIG. 125, a three-dimensional envelope 1544 of the three lightpipes of the closure member formed by the first shot alone is illustrated as viewed from the front side.

Figure 126:
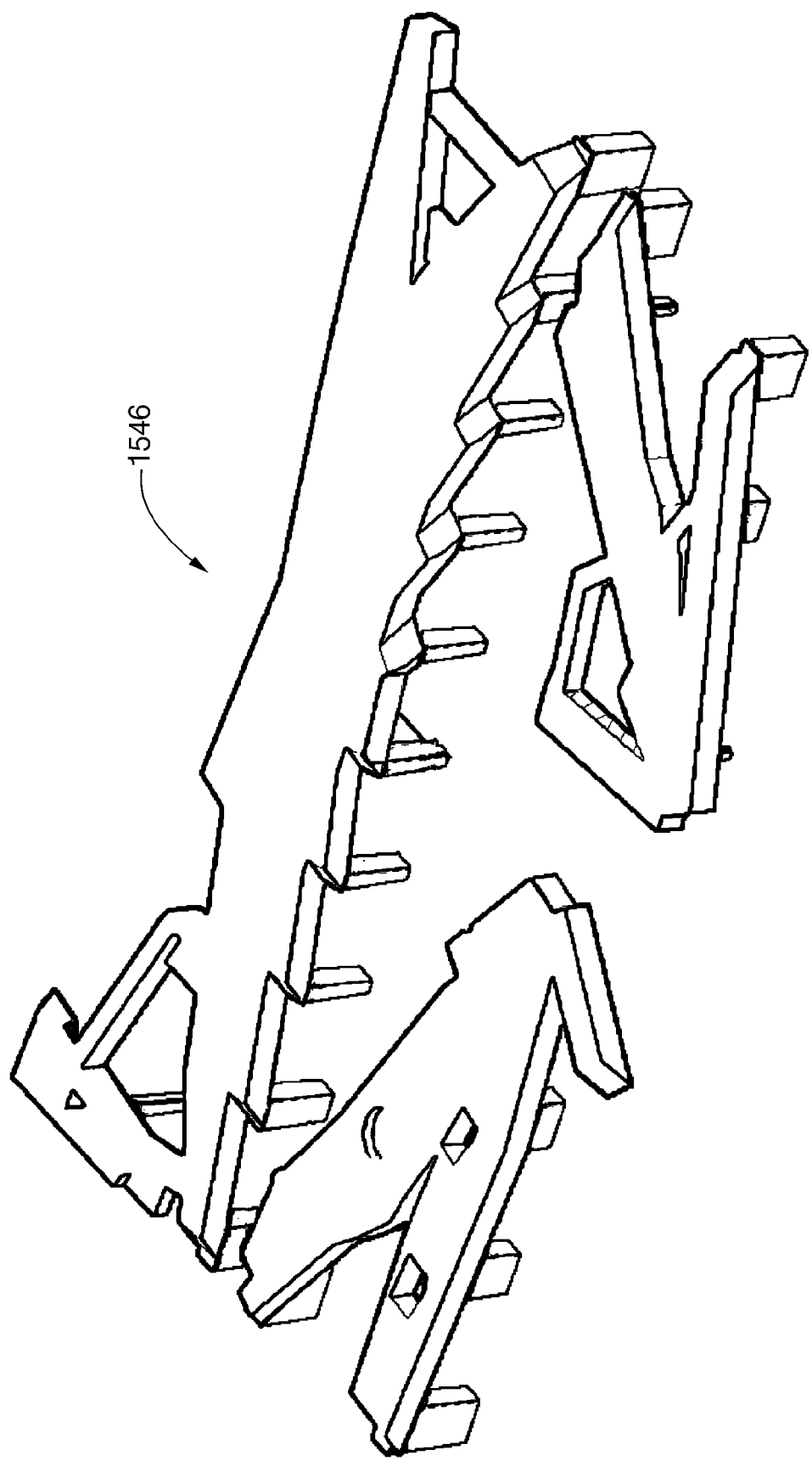

Referring to FIG. 126, the three-dimensional envelope 1544 of the three lightpipes of the closure member formed by the first shot alone is illustrated as viewed from the back side.

Media Drawer for Automotive Audio System

With the 2DIN radio or audio system configuration, there exists enough internal volume within the housing assembly to configure the pushbuttons and display layout to accommodate a front accessible area that can enable a platform or drawer to hold multiple devices such as an iPod™ or similar player, and also a flash memory stick. This platform or drawer would then be pushed and seated within the radio to enable a secure mechanical retention as well as making an electrical connection to allow the devices to be powered and communicate with the audio system radio, even when the drawer is closed and secured.

The front of the platform or drawer matches the opening of the radio chassis both aesthetically and structurally, and be of a style that could be detached and applied to an updated or alternative platform or drawer, should the desired devices change or evolve during the lifetime of the host vehicle. The electrical and mechanical interconnects are largely standardized and, thus, would be the same, enabling the consumer to change the platform or drawer at any time depending upon his/her personal requirements.

Presently, detachable faceplates for single DIN radios exist that have both the electrical connection and mechanical retention that could be used in this format. However single DIN radios are not large enough to accommodate multiple audio subassemblies such as a radio receiver circuit subassembly and a CD player subassembly while reserving enough contiguous internal volume to accommodate a flush-mount media drawer.

The present invention allows the existing radio to be updated or modified according to the wants and desires of the customer regarding the preferred music device without having to remove the radio from the instrument panel or impacting the normal production run of the radio. The size of the platform or drawer would be a standard as well as the electrical and mechanical interfaces to enable continuous offerings as dealer and after-market stock for customizing the radio.

The nature of the component having electrical connection capability enables incorporation of other desired features like "Bluetooth"™ connectivity as yet another option that could be incorporated into the platform or drawer.

With front panel accessibility, there would be the capability for the radio manufacturer to provide reflash programming capability with minimal service impact (like having to remove the radio from the instrument panel), by using the electrical interconnect and to the access provided to the radio by the present invention.

The present invention eliminates the need for costly harness attachment through the glove box. It would maintain the device location within the confines of the audio system/radio housing to prevent contamination or damage and eliminate any issue with vehicle occupant impact during a braking event or crash. Furthermore, when installed within the drawer, the device is relatively secreted from view from outside the host vehicle, and is thus less likely to attract unwanted attention from a prospective miscreant. With the connection flexibility due to the interchangeable platform or drawer, virtually any known device can be accommodated to permit direct control through the radio, enhancing driver/passenger convenience and safety as opposed to trying to control a separate device away from the immediate driver view.

Figure 127:
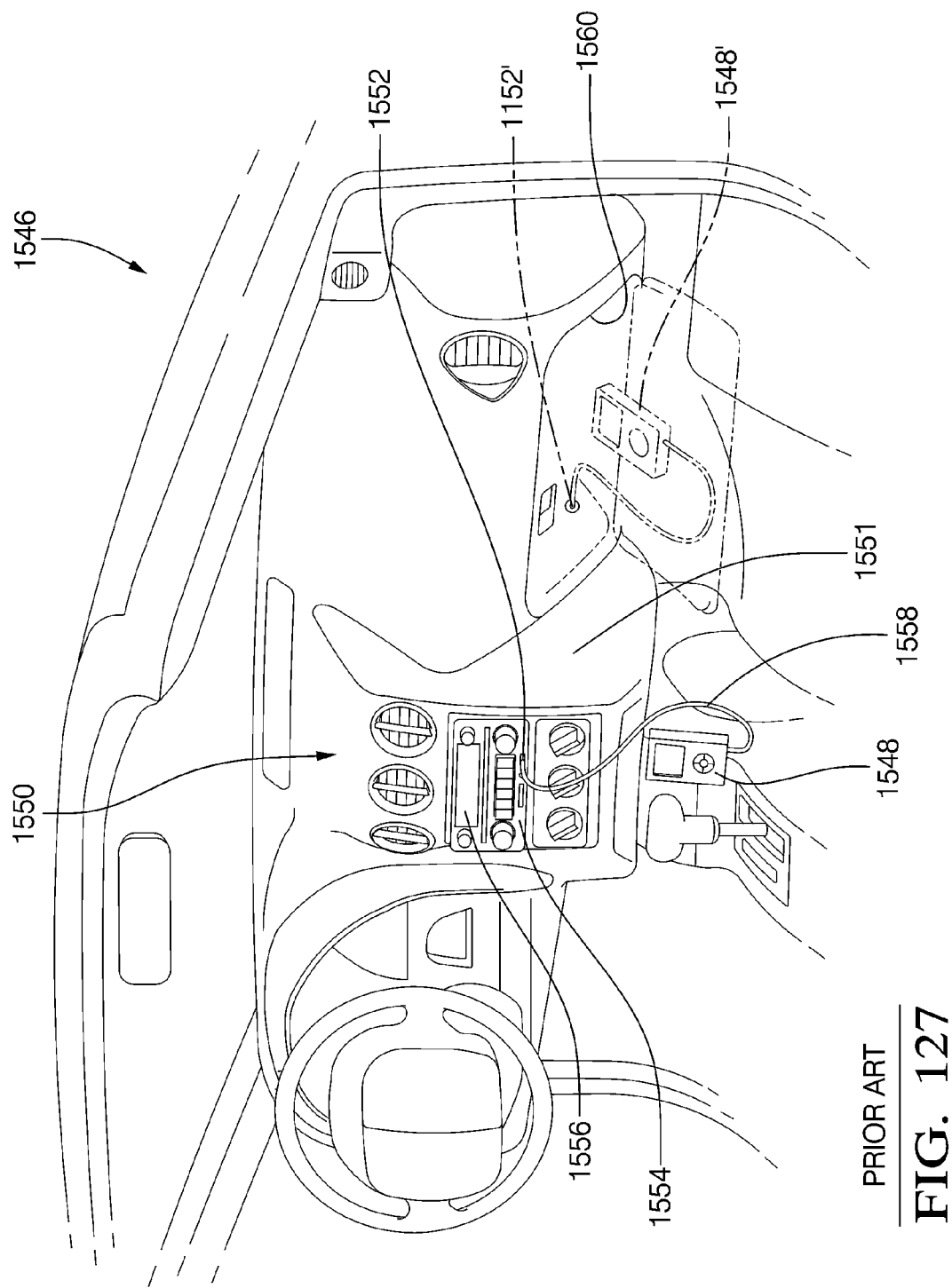

FIG. 127 illustrates known approaches for configuring ports within an automobile 1546 for interfacing a personal portable digital device (PPDD) 1548 with the an audio system 1550 embedded within the vehicle's instrument panel 1551 to access the vehicle's electrical network. Most typically, such capability is employed for playing pre-recorded music files stored in the PPDD 1548 through the vehicle's speaker system. Ports or auxiliary jacks 1552 most often are incorporated in the exposed front face or control panel 1556 of the vehicle's radio. Interconnection of the PPDD 1548 is affected by an umbilical cable 1558 extending therebetween. Unfortunately, the PPDD 1548 is frequently placed in areas such as a vehicle cup holder, ash tray, arm rest or the like not designed for securing such articles. In addition to being aesthetically undesirable, this can expose the PPDD to damage or theft, and can be distracting to the driver. Furthermore foreign articles placed in vehicle passenger cabins can pose an impact risk or entanglement between the umbilical cable 1558 and vehicle occupants, controls or other electrical/electronic devices (e.x. cell phones, laptop computers, portable DVDs, television monitors, power/recharging cables, and the like). A partial solution has been proposed of locating the port or auxiliary jack 1552' within the vehicle's glove box. However, this can exacerbate the distraction issue by locating the PPDD 1548' further from the driver's field of vision. Furthermore, it can result in the vehicle being operated for sustained periods with the glove box door remaining in the open position. Lastly, PPDDs located in the glove box are subject to damage or inadvertent resetting of their controls by impacting other objects in the glove box. In both traditional locations, the PPDD is not typically secured and is prone to falling or damage.

Referring to FIGS. 128-132, 166A and 166B, an exemplary embodiment of this aspect of the invention is illustrated. A large format audio system 1562 includes a plastic/wire screen composite case 1564 and a plastic/wire screen composite closure member/front plate 1566 which combine to form a housing assembly 1568. A front trim plate 1570 is mounted to the closure member 1566 for installation in a host vehicle passenger compartment or instrument panel for access by an operator or passenger to the controls and displays arranged about the outer visible surface 1571 thereof. A laterally elongated rectangular opening 1572 in the lower portion of the front trim panel subassembly 1570 provides access to a cavity 1574 within the housing assembly 1568. A media drawer 1576 is configured and dimensioned to be longitudinally inserted into said cavity 1574 through the trim panel opening 1570 and, in application, is manually operable for displacement between a "closed" position illustrated in FIG. 130 and an "open" position illustrated in FIGS. 129 and 129.

The media drawer 1576 is configured to approximate a relatively shallow, open-top box including a vertical front panel 1578, a bottom panel or platform 1580, parallel left and right vertical side panels 1582 and 1584, respectively, and a vertical rear panel 1586. The panels 1578, 1580, 1582, 1584 and 1586 are integrally formed from injection molded polymer material or, preferably, a polymer/wire screen composite. Laterally outwardly projecting, longitudinally extending bosses 1588 are integrally formed on the outer walls of the left and right side walls 1582 and 1584 to define drawer guide surfaces which mate with cooperating guideways 1590 formed on the inner surfaces of the audio system case sidewalls 1592, or other suitable internal housing assembly structure. When the media drawer 1576 is closed, a front surface or face 1594 of the front panel is substantially flush with the front face 1571 of the front trim panel 1570.

The faces 1571 and 1595 are aesthetically stylized to mask or obfuscate the presence of drawer 1576. Unobtrusive instructional indicia 1596 may be added on the front drawer surface 1594 as an aid for the user. The bosses 1588 and cooperating guideways also include integral features (not illustrated) to establish longitudinal stops, preventing the media drawer 1576 from inward longitudinal displacement beyond the position illustrated in FIG. 130 and outward longitudinal displacement beyond the position illustrated in FIGS. 128 and 129.

Referring to FIGS. 129 and 130, the audio system 1562 includes audio components such as a radio receiver circuit assembly 1598 and a CD player subassembly 1600 mounted within the housing assembly 1568. As described in greater detail elsewhere herein, the radio receiver circuit assembly 1598 has its circuit components mounted on a unique PCB 1602 or a common PCB 1604. A flexible, elongated cable 1606 is connected to the common PCB via a plug 1608 at one end and to the rear panel 1586 via a port 1610. The cable 1606 is routed above and behind the media drawer 1576, entirely within the housing assembly 1568, so as to be hidden from the operator, and is long enough to maintain continuity between the common PCB and the port 1610, independent of the position of the media drawer 1576.

The cable 1606 can provide an electrical ground path between the wire screen embedded within the media drawer to the wire screen embedded within the housing assembly case 1564 and closure member 1566. Alternatively, exposed adjacent wire screen portions in the media drawer 1576 and case 1564 can provide a direct, continuous ground path.

Referring to FIGS. 166A and 166B, additional convenience can be provided in the operation of the media drawer 1576, by providing a "push-push" type latching and unlatching mechanism 1612, which is known in other unrelated applications such as push-button electrical switches. For example, refer U.S. Pat. No. 5,727,675, the specification of which is incorporated herein by reference. In essence, the push-push mechanism 1612 selectively interconnects the media drawer 1576 and the housing assembly 1568 and provides a slight "lost motion" to the media drawer 1576 longitudinally inwardly of the position depicted in FIG. 130. As illustrated in FIG. 130, the media drawer 1576 is latched in the closed position, whereby vehicle operation will not result in unintended opening. Whenever an operator desires to gain access to the media drawer, he/she need merely momentarily push the drawer slightly longitudinally inwardly. The inward movement of the drawer will release the latch 1614 and a compression spring 1616 will displace the drawer 1576 to the position illustrated in FIGS. 128 and 129. Conversely. Whenever an operator desires to close the media drawer 1576, he/she need merely again push the drawer 1576 longitudinally inwardly to a position slightly inwardly of that illustrated in FIG. 130 and thereafter release the drawer 1576. This motion will cause the latch 1614 to self engage and the drawer will again be fixed in the closed position of FIG. 130. Alternatively, a handle or finger catch (not illustrated) can be employed.

The media drawer 1576 is dimensioned and configured for flexibility for receiving all known (current and future) PPDDs. However, as new technologies emerge, it is envisioned that the drawer 1576 can be easily exchanged for a newly configured design without modifying the host audio system 1562 and vehicle. As described herein, many current PPDDs can be interfaced with a host vehicle audio system simply by opening the media drawer, plugging a PPDD 1618 into the port 1610 via a PPDD supplied interface cable 1620, placing the PPDD 1618 and its cable 1620 into the drawer 1576 and closing the drawer 1576.

Referring to FIG. 131, an alternative media drawer 1642 is illustrated. The media drawer 1642 includes integrally formed front panel 1644, a bottom panel 1648, side panels 1650 and a rear panel 1652 similar to those of media drawer 1576 described hereinabove. In some applications, an application specific interface electronic device 1654 may be required to establish compatibility between a PPDD 1656 and the host audio system. The electronic device 1654 can be built into the media drawer 1642 and interconnected to the PPDD via a cable 1658 as well as the host audio system as described elsewhere herein. Multiple, supplemental non dedicated ports 1655 and 1657 can also be provided within the media drawer 1642.

Referring to FIG. 132, a second alternative media drawer 1660 is viewed from the rear, and includes a front panel 1662 and a bottom panel 1664. The front panel 1662 has interface wiring embedded therein and provides multiple ports, such as a "memory stick" port 1666, a large format connector (such as USB type) 1668 for attaching large, out-size peripheral devices, as well as a port (not illustrated) for connecting with a PPDD 1670. Hold-down features, such as integrally formed resilient self-latching tabs depend from the platform/bottom panel 1664. Laterally outwardly directed, longitudinally extending guide bosses 1674 can be integrally formed in the bottom panel 1664.

Squirts

To further the innovative construction of the present invention, "squirts" or screwless retention features are employed. Restated, squirts are a drawn feature from a structural element, or a styled protrusion at the interface of two structural elements. Although applicable broadly, squirts are principally applied in the preferred embodiment of the invention to secure the CD player subassembly to the left and right CD player guide brackets. This allows the elimination of six additional screws.

A squirt is a retention feature which is integrally formed in a typically planer region of a structural member, such as a CD player guide bracket, which extends above one surface thereof and, during assembly, self-engages within an opening formed in an adjacent structural element, such as a hole in the outer case of the CD player subassembly. Squirts permit assembly of the guide brackets to the CD player assembly by hand without the need for special fixtures and power tools.

The squirts are formed from stock material during formation of the brackets themselves and do not add significant cost to the finalized bracket component. Similarly, mating holes can be easily punch formed in the adjacent case panels of the CD player subassembly.

In addition to reduced cost and ease of assembly, the squirt self-aligns the respective components during the attachment process, thereby ensuring their precise juxtaposition. Furthermore, the squirt is permissive of lower tolerances in the forming and assembly of its associated elements. In fact, the presence of slightly misshapen features or metal flash resulting from low tolerance punching operations can actually result in enhanced retention performance.

Referring to FIGS. 140-143, the application of "squirts" 1676 to affix the left and right side mounting brackets, 106 and 108, respectively to the multi-disc CD player unit 104 to form the CD player subassembly 66, is illustrated. The squirts are preferable die-punch formed simultaneously with the formation of the mounting brackets 106/108 themselves. It is noted that the brackets 106/108 can be configured symmetrically, whereby one design can be used for both sides of the CD player unit 104, thereby further reducing the overall part count. The squirts 1676 are preferably formed on relatively regions 1678 of their associated bracket 106/108. A single through passage 1680 if formed in the planer region 1678. Two or more substantially symmetrical forms 1682 extend radially inwardly from the edge of the through passage 1680. Each form 1682 has a neck region 1684 and a tapered region or sector 1686. The tapered region 1686 is supported as a cantilever by the neck region 1684. The tapered regions 1686 collectively co-act to define (in the case of two forms) a bisected frustoconical form, wherein each tapered region 1686 defines an outside peripheral surface 1688 which are acutely converging upon an axis normal to the planer region 1678. The taper of an imaginary cone 1700 extended from surfaces 1688 is designated by the angle ω. As illustrated by alternative phantom depictions, the overall shape of the imaginary cone 1700 can be parabolic or hyperbolic. The outer peripheral surface 1688 of each tapered region or sector 1686 has a circumferential range designated by the angle θ, which with two forms is preferably in the range of 90°-120°.

In application, the collective outer peripheral surface of the sectors 1686 engage a surface forming the outer diameter of a recess or through hole 1702 in an adjacent structure 104 to which the bracket 106/108 is to be attached. As illustrated in FIG. 141, the maximum diameter edge surface 1704 sectors 1686 effect line contact to maximize pull-out performance.

Referring to FIG. 143, localized radially outwardly projecting knurls, ridges or extensions 1706 to provide point contacts with the adjacent structures.

Attachment of the squirt 1676 to an adjacent structures is affected simply by aligning the sector 1686 with the through hole 1702 and pressing inwardly, as indicated by the phantom finger tip and resultant force arrow 1708.

Plug-in Satellite Communication Module

Satellite radio is enabled through three primary approaches in the OEM radio market. There is an auxiliary box that plugs in-line to the radio. There is a separate shielded and enclosed module that is attached mechanically and electrically to the inside of the radio on the main circuit board. They are typically enclosed by two die cast halves or a sheet metal enclosure. There is also a component block of electrical parts that is soldered to the main circuit board inside the radio that may require a shield for electrical protection.

While these approaches enable satellite radio, the shortcomings are they may require distinction of either XM or Sirius as the provider and with the exception of the separate in-line auxiliary box, are not upgradable should the provider change or hardware updates become available.

The present invention employs a plug-in module enabling the OEM radio to be configured at either end of the assembly area to accommodate any satellite radio provider or hardware upgrade. Because it is a direct plug-in to the radio, there is less reliability concerns than the in-line auxiliary box and less real estate required in the vehicle. With the module plugging into the rear of the radio, the module can be easily changed or upgraded at the vehicle dealer or an aftermarket retailer by simply extracting the radio, disconnecting the existing module, and replacing it with a new module. The module has the integrated in-molded mesh in plastic technology described elsewhere herein to provide any required shielding/grounding. The plastic allows for slide lock, snap lock assembly to the radio chassis. The electrical connection can be through a docking style connector or even a ziff format ribbon cable (similar to the CD mechanism). With internal attachment modules, there is not the flexibility to interchange modules or upgrade without disassembling the radio and desoldering the unit.

Another advantage of the plug-in module is the ease of assembly of the module itself. The in-molded mesh in plastic approach allows for a screwless assembly and provides less handling concerns over a die cast or sheet metal enclosure. The cost should be substantially less than the die cast and equal to or less than that of the sheet metal.

Referring to FIGS. 146-149, an automotive audio system 1710 includes a housing assembly 1712 enclosing one or more audio system subassemblies, such as a radio receiver circuit assembly 1714. The housing assembly 1712 includes a box-like housing case 1716 and a front closure member (not illustrated) which enclose the audio system subassemblies 1712. The housing case 1716 and the closure member are each preferably formed as a composite including wire screen insert molded within a polymer based material. FIG. 147 illustrates a left side wall portion 1718, a rear wall portion 1720 and a bottom wall portion 1722 of the audio system case 1716. All of the constituent wall portions of the case 1716 are preferably injection molded as a single part to simplify assembly, minimize part cost and to maximize the wire screen's effectiveness in shielding the audio components from electrical anomalies including RFI, EMI, BCI and ESD.

One of the wall portions (e.g. the rear wall portion 1720) has an opening 1724 formed therein for receiving a plug-in module 1726 for affecting satellite radio reception capability for the otherwise terrestrial radio receiver 1714 within the audio system 1710. The radio receiver circuit assembly 1714 includes a PCB 1728 carrying a docking type connector 1730 aligned with the opening 1724 whereby an electrical plug (not illustrated) carried on the plug-in module 1726 engages the docking connector 1730 upon insertion of the plug-in module 1726 within the opening 1724 as illustrated in FIGS. 146 and 147. Alternatively, an elongated, flexible ribbon-type connector can be affixed the radio circuit PCB 1728 which, when a plug-in module 1726 is to be installed, is first manually drawn out of the case 1716 through the opening 1724, attached to the module electrical plug, and reinserted back through the opening 1724 in assembly with the module 1726.

The plug-in module 1726 includes a housing 1732 which is generally rectangular in shape. The module housing 1732 has upper and lower wall portions, 1734 and 1736, respectively, left and right side wall portions (as viewed from the bask of the housing assembly 1712) 1738 and 1740, respectively, a front wall portion (facing outwardly) 1742 and a back wall portion 1744 (facing inwardly) 1744. The housing 1732 is preferably formed as a composite including wire screen insert molded within a polymer based material and has a "clamshell" type architecture. The housing can be assembled from two discrete elements, one including the upper wall portion 1734 integrally formed with top half-wall portions of the side walls 1738 and 1740, the front wall 1742 and the back wall 1744, and the other including the lower wall portion 1736 integrally formed with bottom half-wall portions of the side walls 1738 and 1740, the front wall 1742 and the back wall 1744. Each of the two discrete elements can include self-aligning, self-guiding and self-engaging features integrally formed therewith. Alternatively, the two elements can be molded as a single element with one set of opposed edges interconnected via an integral web or living-hinge. For example, refer FIGS. 161-163. Upon assembly of the plug-in module 1726, the electrical plug is supported at and extends from the back wall portion 1744. A connector (co-axial) 1746 extends outwardly from the front wall portion which is adapted for interconnection with a host vehicle satellite antenna system.

The wire screen contained within the plug-in module 1726 can be grounded to the wire screen contained within the audio system housing assembly 1712 by either providing adjacent exposed portions of wire screen that are configured to remain in intimate contact or, alternatively, they can be grounded remotely via mating conductors in the associated radio connector and module plug.

The plug-in module 1726 is retained in its installed position within the audio system 1710 by two, opposed snap-acting retention arms 1748 and 1750 integrally formed with the module housing 1732. Retention arm 1748 includes a base portion 1752 integrally formed with the right sidewall portion 1740 of the module housing 1732 and extending laterally outwardly therefrom. The retention arm 1748 also includes an elongated lever arm portion 1754 which is integrally formed with its associated base portion 1752 and extends longitudinally rearwardly therefrom as a cantilever beyond both the exterior wall portion 1742 of the module housing 1732, and the housing case rear wall portion 1720. The rearwardmost end of the lever arm portion 1754 is exposed and defines a finger grip surface 1756. The lever arm portion 1754 forms a localized laterally outwardly directed upset 1758 therein forming a forwardly facing ramp surface 1759 and a rearwardly facing abutment surface 1760. When assembled, the rearwardly facing abutment surface 1760 on the lever arm 1754 longitudinally aligns with a forwardly facing abutment surface 1762 formed in the case opening 1724.

The other retention arm 1750 is a mirror-image of retention arm 1748 and functions as described hereinabove. Retention arm 1750 has a cantilever lever arm portion 1764 which extends rearwardly beyond both the exterior wall portion 1742 of the module housing 1732, and the housing case rear wall portion 1720. The rearwardmost end of the lever arm portion 1764 is exposed and defines a finger grip surface 1766 laterally opposite finger grip surface 1756 of lever arm portion 1754.

When the plug-in module is installed, guideways (not illustrated) within the audio system housing assembly 1712 adjacent the opening 1724 cooperate with guide surfaces defined by outer surfaces of the module housing 1732 to affect self-location, self-guiding and self-engagement of the plug-in module 1726 within the audio system housing assembly 1712. As the module enters into the opening 1724, the ramp surfaces 1759 cause the lever arms 1754/1764 to be laterally displaced toward one another. Once the abutment surfaces 1760 and 1762 align, the natural resiliency of the lever arms will result in their snapping back into their illustrated positions, thereby interlocking the module 1726 in its design location. The module can be removed simply by simultaneously gripping the two surfaces 1756 and 1766 and squeezing them together, thereby releasing the respective pairs of abutment surfaces 1760 and 1762.

Although much of the forgoing description has been focused on automotive audio based entertainment systems, the explosive growth of communications and navigation technologies have somewhat blurred their traditional distinctions. This issue is particularly acute in automotive systems and personal portable digital devices. Referring to FIGS. 161-163, as an example, a telematic device, i.e. a device employed for one or two way communications is illustrated. The telematic device 1768, when packaged for automotive application, employs design methodologies which overlap into traditional, purely passive automotive entertainment systems. The telematic device 1768 of the present invention includes a one-piece housing 1770 molded as a composite of polymeric material with a wire screen insert such as described elsewhere herein in the context of other applications.

Referring to FIGS. 167-169, the "slide-lock" and "snap-lock" aspect of the inventive features described elsewhere herein is also applied to assembly of a closure member or front plate 1772 with trim plate subassembly 1774 including a display/control panel PCB 1776, a trim plate bezel 1778 and a trim plate facia 1780. The front plate 1772 is injection molded of relatively rigid polymer based material, and includes features integrally formed therewith for affecting fastener-less interconnection with the housing case (not illustrated) of a lightweight automotive audio system 1782. Although the closure member 1772 is depicted as being formed entirely of polymer based material, it is contemplated that it could have a composite structure of polymer and electrically conductive material such as wire screen. Furthermore, the closure member could also be injection molded of optically optimized material such as acrylic in a two-shot process for integrating light pipes therein to provide back illumination of trim plate controls and displays. In this case, the light pipes would include a number of integral, longitudinally outwardly directed extensions passing through registering apertures in the display/control panel PCB 1776 (not illustrated).

Preferably, the closure member 1772 includes several split snap-catches 1782 extending forwardly from the closure member front surface 1786. The snap-catches 1784 extend through registering apertures 1788 in the display/control panel PCB 1776. Each of the snap-catches 1784 also include an integral standoff 1790 which functions to space the PCB from the closure member front surface 1786 to provide component clearance and enhance cooling. The closure member 1772 includes a number of outwardly extending ramped tabs 1792 distributed about the exposed periphery 1794 thereof.

The trim plate bezel 1778 is constructed of substantially opaque molded polymer material suitable for decorative finishing by painting or a deposition process. The bezel 1778 has openings/through holes (not illustrated) therein registering with an array of rear loaded actuator devices and displays carried on the display/control panel PCB 1776, and associated front loaded pushbuttons. The bezel 1778 also forms openings or transparent/translucent windows for back lighting of the push buttons, displays and informational indicia (not illustrated). The bezel 1778 has a peripherally extending step 1796 formed on the inside surface 1798 thereof which abuts the outer surface 1800 of the PCB 1776 to ensure precise spacing and registration between the control devices/displays and their respective openings/through holes. Tab engaging extensions 1802 including abutment recesses 1804 are integrally formed with the bezel step 1796 and extend rearwardly therefrom to engage corresponding ramped tabs 1792.

The bezel 1778 has a longitudinal riser defining a peripheral edge 1806 extending between the step 1796 and the bezel front face 1810. The bezel 1778 includes a number of circumferentially arranged outwardly extending ramped tabs 1810 integrally formed on the peripheral edge 1806 thereof.

The trim plate facia 1780 can be employed in certain applications to comply with extremely high color and finish requirements and to avoid aesthetically objectionable distortions sometimes inherently resulting from the bezel 1778 injection molding process. The facia 1780 has a very thin section and is preferably injection molded of high quality polymer based material suitable for decorative finishing or a deposition process. As best illustrated in FIGS. 168 and 169, the facia has an abbreviated peripheral side wall portion 1812 forming circumferentially arranged tab receiving recesses 1814 on the inside surface 1816 thereof. The facia 1780 has openings/through holes (not illustrated) therein registering with corresponding openings/through holes in the bezel 1778. The facia also has openings or transparent/translucent windows for back lighting of the push buttons, displays and informational indicia. When installed, the inside face 1818 of the facia is disposed in intimate contact with the outside face 1820 of the bezel 1778.

FIG. 168 illustrates a bezel 1778 constructed of opaque material with a "first surface" finish layer 1822. FIG. 169 illustrated an alternative bezel 1780' including an inside face 1818' and a side wall portion 1812' having an inside surface 1816' forming a tab receiving recess 1814'. The alternative bezel 1780' is constructed of optically clear or monochromatically tinted polymer based material with a "second surface" finish layer 1824.

Referring to FIG. 144, the outer surface 1826 of a closure member/front plate 1828 for an automotive audio system includes three split snap-catches 1830 integrally formed thereon. In addition, two integral locator pins 1832, including standoffs 1833 cooperate with the split snap-catches 1830 to self-orient, self-guide and self-engage a display/control panel PCB 1834 in assembly with the front plate 1828, as illustrated in FIG. 145. As described elsewhere herein, the front plate includes three integral spring ground clips 1836 formed thereon and extending forwardly thereof to resiliently engage corresponding cooperating grounding pads (not illustrated) on the PCB 1834. Refer FIG. 96. In addition to ensuring that the PCB 1834 remains precisely spaced above the outer surface 1826 of the closure member 1828 for component clearance and cooling purposes, the split snap-catches 1830 and locator pin standoffs 1833 effect reliable electrical connection of the PCB grounding pads with exposed wire mesh suspended in the spring ground clips 1836. Refer FIG. 17.

Referring to FIG. 145, a subassembly 1838 depicts the closure member 1828 of FIG. 144 in assembly with the PCB 1834. Split snap-catches 1830 extend through registering openings 1840 in the PCB 1834 to secure the two components together. Similarly, the locator pins 1832 extend through openings 1842 in the PCB 1836 to ensure correct positioning thereof.

It is to be understood that the invention has been described with reference to specific embodiments and variations to provide the features and advantages previously described and that the embodiments are susceptible of modification as will be apparent to those skilled in the art.

Furthermore, it is contemplated that many alternative, common inexpensive materials can be employed to construct the basis constituent components. Accordingly, the forgoing is not to be construed in a limiting sense.

The invention has been described in an illustrative manner, and it is to be understood that the terminology, which has been used is intended to be in the nature of words of description rather than of limitation.

Obviously, many modifications and variations of the present invention are possible in light of the above teachings. For example, a number of the various radio/CD player case constructions illustrated herein are illustrated as being formed of solid molded polymer material for the sake of simplicity and clarity of understanding. It is to be understood, however, that the wire mesh depicted, for example in FIG. 93, can be employed in the other configurations and embodiments with equal success. Furthermore, several of the housing assembly structures are described herein as being formed of metal. However, a wide range of material substitutes, including plastics, ceramics, non-ferrous metals and composites can be substituted without departing from the spirit and scope of the present invention. The terms "snap-engaging" and "self-engaging" are intended to interpreted very broadly inasmuch as innumerable structural, process (e.g. weldments) and chemical (e.g. adhesives) equivalents are available. It is, therefore, to be understood that within the scope of the appended claims, wherein reference numerals are merely for illustrative purposes and convenience and are not in any way limiting, the invention, which is defined by the following claims as interpreted according to the principles of patent law, including the Doctrine of Equivalents, may be practiced otherwise than is specifically described.

The following documents are deemed to provide a fuller disclosure of the inventions described herein and the manner of making and using same. Accordingly, each of the below-listed documents are hereby incorporated in the specification hereof by reference:

U.S. Pat. No. 6,384,355 B1 to M. Murphy et al. entitled "Parallel Guide Mechanism for a Switch".

U.S. Pat. No. 5,913,581 to F. Stephan et al. entitled "Integrated Slides for High Volume Production of Electronic Components".

U.S. Pat. No. 5,784,254 to F. Stephan et al. entitled "Slide Mount Spring-Clip Arrangement for Attaching an Electrical Component to a Convector".

U.S. Pat. No. 6,054,647 to Ridener entitled "Grid Material for Electromagnetic Shielding".

U.S. Pat. No. 4,685,563 to Cohen et al. entitled "Packaging Material and Container having Interlaminate Shield and Method of Making Same".

U.S. Pat. No. 5,061,341 to Kildal et al. entitled "Laser-Ablating a Marking in a Coating on Plastic Articles".

U.S. Patent Application Publication No.: US 2006/0179446 A1 to Bickford et al. entitled "Electrostatic Discharge Device and Method for Media Devices".

U.S. Pat. No. 6,663,250 to Rada et al. entitled "Integrated Vehicle Display Lighting Assembly".

U.S. Pat. No. 6,072,135 to O'Connor entitled "Self-Aligning Button Retainer".

U.S. Pat. No. 7,021,811 B2 to Sylvester et al. entitled "Light Distribution Hub".

U.S. Pat. No. 6,905,901 B1 to Fye et al. entitled "Method of Manufacturing a Cover of a Backlit Display Using Fluorescing Materials".

U.S. Pat. No. 5,521,342 to Bartley et al. entitled "Switch Having Combined Light Pipe and Printed Circuit Board".

U.S. Patent Application Publication No.: US 2006/0250813 A1 to Lippmann et al. entitled "Illuminated Display System" and assigned to the assignee of the present application.

U.S. patent application Ser. No. 11/194,173 filed 1 Aug. 2005 to Snider et al. entitled "Display Apparatus".

Audio Product Manual 04-RDPD-12-MA-F entitled "2004 Model Year Ford Freestar Radios" (38 pages).

U.S. Pat. No. 7,180,745 B2 to Mandel et al. entitled "Flip Chip Heat Sink Package and Method".

U.S. Pat. No. 5,991,151 to Capriz entitled "Heat Sink, in Particular for Electronic Components".

U.S. Pat. No. 4,683,359 to Wojtanek entitled "Illuminated Switch Assembly with Combined Light and Light Shield".

U.S. Pat. No. 5,727,675 to Leveque et al. entitled "Latching Pushbutton Switch Assembly".

U.S. Pat. No. 6,499,191 B1 to Howie, Jr. entitled "Knob with a Composite Light Pipe having a Colored Face and a Light Pipe".

U.S. Pat. No. 6,951,365 B2 to Chase et al. entitled "Flexible Lamp Mounting".

What is claimed is:

1. An automotive radio receiver comprising:
a housing assembly adapted for mounting within the passenger compartment of a host vehicle, said housing assembly including a box-like case having integrally formed wall portions configured to enclose audio system subassemblies within a cavity defined by said housing assembly;

a radio receiver circuit assembly disposed within said case;

an externally accessible, plug-in communication module operative to convert said radio receiver from terrestrial to satellite radio frequency signal reception, said communication module comprising a discrete box-like enclosure configured to shield electronic components within said module affecting said conversion from said radio receiver circuit assembly and external electrical anomalies, said communication module adapted for nesting engagement within said housing assembly through an opening formed in one of said wall portions;

a system of guideways integrally formed within said case operative to effect self-alignment and engagement of said communication module within said cavity;

a port disposed within said case for interfacing the radio receiver with said communication module; and connector means carried by said communication module for interconnecting said communication module with an external satellite antenna.

2. The automotive radio receiver of claim 1, wherein both said housing assembly and said communication module enclosure are formed of a composite of relatively rigid polymer material and electrically conductive material operable to shield said at least one audio component from electrical anomalies including RFI (radio frequency interference), EMI (electromagnetic interference), BCI (bulk current injection), and ESD (electrostatic discharge).

3. The automotive radio receiver of claim 1, wherein both said housing assembly and said communication module enclosure are formed of a composite of relatively rigid polymer material and electrically conductive material operable to shield said at least one audio component from electrical anomalies.

4. The radio receiver of claim 3, wherein said electrically conductive material comprises a wire screen insert molded within said polymer material and extending substantially continuously along the wall portions of said case and said front closure member, as well as said communication module enclosure.

5. The automotive radio receiver of claim 1, wherein said port comprises a connector body fixedly disposed within said housing assembly in register with a cooperating interface plug carried on a leading edge surface of said communication module.

6. The automotive radio receiver of claim 1, wherein said port comprises an elongated flexible cable enabling interconnection of said housing assembly and communication module prior to installation of said communication module through said wall portion opening.

7. The automotive radio receiver of claim 1, wherein said latch means comprises at least one elongated cantilevered latch member integrally formed with and extending rearwardly from a corresponding side surface of said communication module.

8. The automotive radio receiver of claim 7, wherein said cantilevered latch member extends externally of said wall portion opening.

9. The automotive radio receiver of claim 7, wherein said latch means comprises an opposed pair of elongated cantilevered latch members.

10. The automotive radio receiver of claim 9, wherein both said housing assembly and said communication module enclosure are formed of a composite of relatively rigid polymer material and electrically conductive material operable to shield said at least one audio component from electrical anomalies.

11. The automotive radio receiver of claim 10, wherein said electrically conductive material comprises a wire screen insert molded within said polymer material and extending substantially continuously along the wall portions of said case and said front closure member, as well as said communication module enclosure.

* * * * *